United States Patent
Zerbe et al.

(10) Patent No.: US 8,199,859 B2
(45) Date of Patent: Jun. 12, 2012

(54) INTEGRATING RECEIVER WITH PRECHARGE CIRCUITRY

(75) Inventors: Jared L. Zerbe, Woodside, CA (US); Bruno W. Garlepp, Austin, TX (US); Pak S. Chau, San Jose, CA (US); Kevin S. Donnelly, Los Altos, CA (US); Mark A. Horowitz, Menlo Park, CA (US); Stefanos Sidiropoulos, Palo Alto, CA (US); Billy W. Garrett, Jr., Mountain View, CA (US); Carl W. Werner, San Jose, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 12/897,661

(22) Filed: Oct. 4, 2010

(65) Prior Publication Data

US 2011/0140741 A1 Jun. 16, 2011

Related U.S. Application Data

(60) Continuation of application No. 12/624,365, filed on Nov. 23, 2009, now Pat. No. 7,809,088, which is a continuation of application No. 11/368,012, filed on Mar. 3, 2006, now Pat. No. 7,626,442, which is a division of application No. 09/478,916, filed on Jan. 6, 2000, now Pat. No. 7,124,221.

(60) Provisional application No. 60/158,189, filed on Oct. 19, 1999.

(51) Int. Cl.
*H03D 1/24* (2006.01)
*H03K 7/02* (2006.01)

(52) U.S. Cl. ........ 375/320; 375/331; 375/332; 375/335; 375/353; 327/336; 327/374

(58) Field of Classification Search .................. 375/286, 375/287, 317, 340, 264, 353, 320, 331, 332, 375/335; 327/34, 336, 374, 51–57
See application file for complete search history.

(56) References Cited

U.S. PATENT DOCUMENTS 2,732,431 A 1/1956 Boughtwood ................ 370/201
(Continued)

FOREIGN PATENT DOCUMENTS

| DE | 43 20 930 | 1/1995 |
|----|-----------|--------|
| EP | 0 094 624 | 11/1983 |
| EP | 0 352 869 A2 | 7/1989 |
| EP | 0 463 316 A1 | 1/1992 |

(Continued)

OTHER PUBLICATIONS

"4 Modulation Schemes for High Bit Rate Data Transmission in the Loop Plant," www.bib.frilippe.de-voltext-dipl-schlegd-chapter4.htm, Apr. 19, 2001.

(Continued)

*Primary Examiner* — Vibol Tan
(74) *Attorney, Agent, or Firm* — Morgan, Lewis & Bockius LLP

(57) ABSTRACT

An integrated circuit device includes a sense amplifier with an input to receive a present signal representing a present bit. The sense amplifier is to produce a decision regarding a logic level of the present bit. The integrated circuit device also includes a circuit to precharge the input of the sense amplifier by applying to the input of the sense amplifier a portion of a previous signal representing a previous bit. The integrated circuit device further includes a latch, coupled to the sense amplifier, to output the logic level.

31 Claims, 65 Drawing Sheets

U.S. PATENT DOCUMENTS

| | | | | |
|---|---|---|---|---|
| 2,912,684 A | 11/1959 | Steele | | 341/57 |
| 3,051,901 A | 8/1962 | Yaeger | | 375/242 |
| 3,078,378 A | 2/1963 | Burley et al. | | 327/411 |
| 3,267,459 A | 8/1966 | Chomicki et al. | | 341/56 |
| 3,381,245 A | 4/1968 | Guanella | | |
| 3,484,559 A | 12/1969 | Rigby | | 379/245 |
| 3,508,076 A | 4/1970 | Winder | | 326/35 |
| 3,510,585 A | 5/1970 | Stone | | 375/286 |
| 3,560,856 A | 2/1971 | Kaneko | | 375/292 |
| 3,569,955 A | 3/1971 | Maniere | | 341/56 |
| 3,571,725 A | 3/1971 | Kaneko et al. | | 375/287 |
| 3,587,088 A | 6/1971 | Franaszek | | 341/51 |
| 3,648,064 A | 3/1972 | Mukai et al. | | 326/80 |
| 3,697,874 A | 10/1972 | Kaneko | | 375/292 |
| 3,731,199 A | 5/1973 | Tazaki et al. | | 375/288 |
| 3,733,550 A | 5/1973 | Tazaki et al. | | 375/288 |
| 3,753,113 A | 8/1973 | Maruta et al. | | 375/292 |
| 3,754,237 A | 8/1973 | de Laage de Meux | | 341/56 |
| 3,761,818 A | 9/1973 | Tazaki et al. | | 375/293 |
| 3,772,680 A | 11/1973 | Kawai et al. | | 714/801 |
| 3,798,544 A | 3/1974 | Norman | | 375/211 |
| 3,832,490 A | 8/1974 | Leonard | | 375/290 |
| 3,860,871 A | 1/1975 | Hinoshita et al. | | 375/290 |
| 3,876,944 A | 4/1975 | Mack et al. | | 375/286 |
| 3,927,401 A | 12/1975 | McIntosh | | 341/57 |
| 3,978,284 A | 8/1976 | Yoshino et al. | | 348/24 |
| 3,988,676 A | 10/1976 | Whang | | 375/293 |
| 4,038,564 A | 7/1977 | Hakata | | 326/60 |
| 4,070,650 A | 1/1978 | Ohashi et al. | | 340/825.57 |
| 4,079,373 A | 3/1978 | Brown | | 341/119 |
| 4,086,587 A | 4/1978 | Lender | | 341/56 |
| 4,097,859 A | 6/1978 | Looschen | | 341/57 |
| 4,131,761 A | 12/1978 | Giusto | | 370/257 |
| RE30,182 E | 12/1979 | Howson | | 375/290 |
| 4,181,865 A | 1/1980 | Kohyama | | 327/75 |
| 4,280,221 A | 7/1981 | Chun et al. | | 375/288 |
| 4,373,150 A | 2/1983 | Jacobsthal | | 341/56 |
| 4,373,152 A | 2/1983 | Jacobsthal | | 340/347 |
| 4,382,249 A | 5/1983 | Jacobsthal | | 341/56 |
| 4,398,287 A | 8/1983 | Spencer | | 370/85 |
| 4,403,330 A | 9/1983 | Meyer | | 375/214 |
| 4,408,135 A | 10/1983 | Yuyama et al. | | 326/60 |
| 4,408,189 A | 10/1983 | Betts et al. | | 341/56 |
| 4,438,491 A | 3/1984 | Constant | | 341/56 |
| 4,481,625 A | 11/1984 | Roberts et al. | | 370/464 |
| 4,528,550 A | 7/1985 | Graves et al. | | 710/106 |
| 4,571,735 A | 2/1986 | Furse | | 375/293 |
| 4,602,374 A | 7/1986 | Nakamura et al. | | 375/287 |
| 4,620,188 A | 10/1986 | Sengchanh | | 325/59 |
| 4,628,297 A | 12/1986 | Mita et al. | | 341/56 |
| 4,748,637 A | 5/1988 | Bishop et al. | | 375/221 |
| 4,779,073 A | 10/1988 | Iketani | | 341/55 |
| 4,805,190 A | 2/1989 | Jaffre et al. | | 375/287 |
| 4,821,286 A | 4/1989 | Graczyk et al. | | 375/214 |
| 4,823,028 A | 4/1989 | Lloyd | | 327/64 |
| 4,825,450 A | 4/1989 | Herzog | | 375/288 |
| 4,841,301 A | 6/1989 | Ichihara | | 341/26 |
| 4,860,309 A | 8/1989 | Costello | | 375/286 |
| 4,875,049 A | 10/1989 | Yoshida | | 341/59 |
| 4,888,764 A | 12/1989 | Haug | | 375/219 |
| 4,899,152 A | 2/1990 | Barrow et al. | | 341/154 |
| 5,003,555 A | 3/1991 | Bergmans | | 375/233 |
| 5,023,488 A | 6/1991 | Gunning | | 307/475 |
| 5,023,841 A | 6/1991 | Akrout et al. | | 365/205 |
| 5,045,728 A | 9/1991 | Crafts | | 326/60 |
| 5,046,050 A | 9/1991 | Kertis | | 365/208 |
| 5,115,450 A | 5/1992 | Arcuri | | 375/219 |
| 5,121,411 A | 6/1992 | Fluharty | | 375/293 |
| 5,124,951 A | 6/1992 | Slemmer | | 365/230.06 |
| 5,126,974 A | 6/1992 | Sasaki et al. | | 365/207 |
| 5,153,459 A | 10/1992 | Park et al. | | 326/86 |
| 5,172,338 A | 12/1992 | Mehrotra et al. | | 365/185 |
| 5,191,330 A | 3/1993 | Fisher et al. | | 341/56 |
| 5,194,765 A | 3/1993 | Dunlop et al. | | 326/87 |
| 5,230,008 A | 7/1993 | Duch et al. | | 375/292 |
| 5,243,625 A | 9/1993 | Verbakel et al. | | 375/317 |
| 5,254,883 A | 10/1993 | Horowitz et al. | | 326/30 |
| 5,259,002 A | 11/1993 | Carlstedt | | 375/260 |
| 5,280,500 A | 1/1994 | Mazzola et al. | | 375/286 |
| 5,287,108 A | 2/1994 | Mayes et al. | | 341/156 |
| 5,295,155 A | 3/1994 | Gersbach et al. | | 375/214 |
| 5,295,157 A | 3/1994 | Suzuki et al. | | 375/229 |
| 5,315,175 A | 5/1994 | Langner | | 326/21 |
| 5,331,320 A | 7/1994 | Cideciyan et al. | | 341/56 |
| 5,373,473 A | 12/1994 | Okumura | | 365/208 |
| 5,408,498 A | 4/1995 | Yoshida | | 375/286 |
| 5,412,689 A | 5/1995 | Chan et al. | | 375/288 |
| 5,425,056 A | 6/1995 | Maroun et al. | | 375/316 |
| 5,426,739 A | 6/1995 | Lin et al. | | 710/305 |
| 5,438,593 A | 8/1995 | Karam et al. | | 375/317 |
| 5,459,749 A | 10/1995 | Park | | 375/286 |
| 5,471,156 A | 11/1995 | Kim et al. | | 326/60 |
| 5,473,635 A | 12/1995 | Chevroulet | | 375/287 |
| 5,483,110 A | 1/1996 | Koide et al. | | 307/147 |
| 5,508,570 A | 4/1996 | Laber et al. | | 327/563 |
| 5,513,327 A | 4/1996 | Farmwald et al. | | 395/309 |
| 5,525,983 A | 6/1996 | Patel et al. | | 341/57 |
| 5,534,795 A | 7/1996 | Wert et al. | | 326/81 |
| 5,534,798 A | 7/1996 | Phillips et al. | | 326/108 |
| 5,539,774 A | 7/1996 | Nobakht et al. | | 375/232 |
| 5,546,042 A | 8/1996 | Tedrow et al. | | 327/538 |
| 5,553,097 A | 9/1996 | Dagher | | 375/240 |
| 5,596,439 A | 1/1997 | Dankberg et al. | | 398/35 |
| 5,604,468 A | 2/1997 | Gillig | | 331/176 |
| 5,604,605 A | 2/1997 | Moolenaar | | 358/3.03 |
| 5,608,755 A | 3/1997 | Rakib | | 375/219 |
| 5,633,631 A | 5/1997 | Teckman | | 341/58 |
| 5,640,605 A | 6/1997 | Johnson et al. | | 710/61 |
| 5,644,252 A | 7/1997 | Watarai | | 326/27 |
| 5,644,253 A | 7/1997 | Takatsu | | 326/35 |
| 5,684,833 A | 11/1997 | Watanabe | | 375/286 |
| 5,694,424 A | 12/1997 | Ariyavisitakul | | 375/232 |
| 5,703,582 A | 12/1997 | Koyama et al. | | 341/120 |
| 5,734,294 A | 3/1998 | Bezzam et al. | | 327/552 |
| 5,740,201 A | 4/1998 | Hui | | 375/286 |
| 5,742,591 A | 4/1998 | Himayat et al. | | 370/286 |
| 5,751,168 A | 5/1998 | Speed, III et al. | | 326/83 |
| 5,757,712 A | 5/1998 | Nagel et al. | | 365/226 |
| 5,761,246 A | 6/1998 | Cao et al. | | 375/287 |
| 5,793,815 A | 8/1998 | Goodnow et al. | | 375/286 |
| 5,793,816 A | 8/1998 | Hui | | 375/286 |
| 5,796,781 A | 8/1998 | DeAndrea et al. | | 375/288 |
| 5,798,918 A | 8/1998 | Georgiou et al. | | 700/28 |
| 5,809,033 A | 9/1998 | Turner et al. | | 370/522 |
| 5,825,825 A | 10/1998 | Altmann et al. | | 375/293 |
| 5,852,637 A | 12/1998 | Brown et al. | | 375/316 |
| 5,864,584 A | 1/1999 | Cao et al. | | 375/244 |
| 5,867,010 A | 2/1999 | Hinedi et al. | | 323/382 |
| 5,872,468 A | 2/1999 | Dyke | | 327/72 |
| 5,887,032 A | 3/1999 | Cioffi | | 375/257 |
| 5,892,466 A | 4/1999 | Walker | | 341/57 |
| 5,898,734 A | 4/1999 | Nakamura et al. | | 375/287 |
| 5,917,340 A | 6/1999 | Manohar et al. | | 326/82 |
| 5,917,856 A | 6/1999 | Torsti | | 375/231 |
| 5,933,458 A | 8/1999 | Leurent et al. | | 375/317 |
| 5,940,442 A | 8/1999 | Wong et al. | | 375/232 |
| 5,942,994 A | 8/1999 | Lewiner et al. | | 341/56 |
| 5,946,355 A | 8/1999 | Baker | | 375/286 |
| 5,949,280 A | 9/1999 | Sasaki | | 329/303 |
| 5,969,579 A | 10/1999 | Hartke et al. | | 332/116 |
| 5,969,648 A | 10/1999 | Garnett | | 341/56 |
| 5,970,088 A | 10/1999 | Chen | | 375/222 |
| 5,973,508 A | 10/1999 | Nowak et al. | | 326/81 |
| 5,977,798 A | 11/1999 | Zerbe | | 326/98 |
| 5,982,741 A | 11/1999 | Ethier | | 370/201 |
| 5,986,472 A | 11/1999 | Hinedi et al. | | 326/68 |
| 6,005,895 A | 12/1999 | Perino et al. | | 375/288 |
| 6,006,169 A | 12/1999 | Sandhu et al. | | 702/132 |
| 6,009,120 A | 12/1999 | Nobakht | | 375/129 |
| 6,018,550 A | 1/2000 | Emma et al. | | 375/317 |
| 6,034,993 A | 3/2000 | Norrell et al. | | 375/232 |
| 6,037,824 A | 3/2000 | Takahashi | | 327/337 |
| 6,038,260 A | 3/2000 | Emma et al. | | 375/259 |
| 6,038,264 A | 3/2000 | Uesugi | | 375/316 |
| 6,048,931 A | 4/2000 | Fujita et al. | | 525/67 |
| 6,049,229 A | 4/2000 | Manohar et al. | | 326/83 |
| 6,052,390 A | 4/2000 | Deliot et al. | | 370/528 |

| | | | | |
|---|---|---|---|---|
| 6,061,395 | A | 5/2000 | Tonami | 375/232 |
| 6,067,326 | A | 5/2000 | Jonsson et al. | 375/286 |
| 6,078,627 | A | 6/2000 | Crayford | 375/286 |
| 6,084,931 | A | 7/2000 | Powell, II et al. | 375/355 |
| 6,088,400 | A | 7/2000 | Abe | 375/316 |
| 6,094,075 | A | 7/2000 | Garrett, Jr. et al. | 327/108 |
| 6,094,461 | A | 7/2000 | Heron | 375/317 |
| 6,097,215 | A | 8/2000 | Bialas, Jr. et al. | 326/68 |
| 6,100,713 | A | 8/2000 | Kalb et al. | 326/30 |
| 6,101,561 | A | 8/2000 | Beers et al. | 710/66 |
| 6,114,979 | A | 9/2000 | Kim | 341/57 |
| 6,122,010 | A | 9/2000 | Emelko | 348/461 |
| 6,130,632 | A | 10/2000 | Opris | 341/120 |
| 6,140,841 | A | 10/2000 | Suh | 326/60 |
| 6,160,421 | A | 12/2000 | Barna | 326/63 |
| 6,181,740 | B1 | 1/2001 | Yasuda | 375/232 |
| 6,195,397 | B1 | 2/2001 | Kwon | 375/288 |
| 6,204,785 | B1 | 3/2001 | Fattaruso et al. | 341/120 |
| 6,215,635 | B1 | 4/2001 | Nguyen | 361/103 |
| 6,222,380 | B1 | 4/2001 | Gerowitz et al. | 326/38 |
| 6,246,353 | B1 | 6/2001 | Elliott et al. | 341/156 |
| 6,262,611 | B1 | 7/2001 | Takeuchi | 327/159 |
| 6,275,540 | B1 | 8/2001 | Barrett, Jr. et al. | 375/316 |
| 6,282,184 | B1 | 8/2001 | Lehman et al. | 370/342 |
| 6,289,045 | B1 | 9/2001 | Hasegawa et al. | 375/231 |
| 6,307,824 | B1 | 10/2001 | Kuroda et al. | 367/53.11 |
| 6,307,906 | B1 | 10/2001 | Tanji et al. | 375/376 |
| 6,373,911 | B1 | 4/2002 | Tajima et al. | 375/375 |
| 6,396,329 | B1 | 5/2002 | Zerbe | 327/336 |
| 6,397,408 | B1 | 6/2002 | Veloskey et al. | 4/504 |
| 6,665,351 | B2 | 12/2003 | Hedberg | 375/296 |
| 6,772,351 | B1 | 8/2004 | Werner et al. | 713/300 |
| 6,965,262 | B2 | 11/2005 | Zerbe | 327/336 |
| 7,072,415 | B2 | 7/2006 | Zerbe et al. | 375/232 |
| 7,093,145 | B2 | 8/2006 | Werner et al. | 713/300 |
| 7,124,221 | B1 * | 10/2006 | Zerbe et al. | 710/106 |
| 7,126,408 | B2 | 10/2006 | Zerbe | 327/336 |
| 7,161,513 | B2 | 1/2007 | Werner et al. | 341/119 |
| 7,259,606 | B2 | 8/2007 | Ku et al. | 327/235 |
| 7,269,212 | B1 | 9/2007 | Chau et al. | 375/229 |
| 7,308,058 | B2 | 12/2007 | Zerbe et al. | 375/353 |
| 7,535,933 | B2 * | 5/2009 | Zerbe et al. | 370/516 |
| 7,627,029 | B2 | 12/2009 | Ho et al. | 375/229 |
| 7,809,088 | B2 | 10/2010 | Zerbe et al. | 375/320 |
| 7,859,436 | B2 | 12/2010 | Werner et al. | 341/89 |
| 2001/0010712 | A1 | 8/2001 | Hedberg | 375/296 |
| 2001/0016929 | A1 | 8/2001 | Bonneau et al. | 714/735 |
| 2001/0019584 | A1 | 9/2001 | Azazzi et al. | 375/233 |
| 2001/0021987 | A1 | 9/2001 | Govindarajan et al. | 714/705 |

FOREIGN PATENT DOCUMENTS

| | | |
|---|---|---|
| EP | 0 482 392 A2 | 4/1992 |
| EP | 0 490 504 A2 | 6/1992 |
| JP | 52127887 | 10/1977 |
| JP | 54051343 | 4/1979 |
| JP | 54060850 | 5/1979 |
| JP | 56168711 | 10/1981 |
| JP | 5854412 A | 3/1983 |
| JP | 59036465 | 2/1984 |
| JP | 60087551 | 5/1985 |
| JP | 60191231 | 9/1985 |
| JP | 60194647 | 10/1985 |
| JP | 02128201 | 5/1990 |
| JP | 02140676 | 5/1990 |
| JP | 04044691 | 2/1992 |
| JP | 05143211 | 6/1993 |
| JP | 08202677 | 8/1996 |
| JP | 08286943 | 11/1996 |
| JP | 09181778 | 7/1997 |
| JP | 10200345 | 7/1998 |
| WO | WO 95-31867 | 11/1995 |
| WO | WO 96-31038 | 10/1996 |
| WO | WO 98-33306 | 7/1998 |
| WO | WO 99-10982 | 3/1999 |

OTHER PUBLICATIONS

Allen, A.O., "Probability, Statistics, and Queuing Theory with Computer Science Applications," 2nd Edition, Chapter 7, pp. 450, 458-459 (1990).

Ariyavisitakul, S., et al., "Tap-Selectable Decision-Feedback Equalization," IEEE Transactions on Communications, 45(12):1497-1500 (1997).

Ariyavisitakul, S., "Reduced-Complexity Equalization Techniques for broadband wireless Channels," IEEE Journal on Selected Areas in Communications, 15(1), pp. 5-15, (1997).

Azdet, K., et al., "A Gigabit Transceiver Chip Set for UTP CAT-6 Cables in Digital CMOS Technology," IEEE International Solid State Circuits Conference, pp. 306-307, (2000).

Bazes, M., "Two Novel Fully complementary Self-Biased CMOS Differential Amplifiers," IEEE Journal of Solid State Circuits, vol. 26 No. 2, Feb. 1991.

Chappell, T.I., et al., "A 2ns Cycle, 4ns Access 512 kb CMOS ECL SRAM," IEEE International Solid State Circuits Conference, pp. 50-51, (1991).

Cova, S.D., et al., "Characterization of Individual Weights in Transversal Filters and Application to CCD's," *IEEE Journal of Solid State Circuits*, SC17(6), pp. 1054-1061, (1982).

Current, K.W., "Current-mode CMOS multiple-valued logic circuits," IEEE Journal of Solid-State Circuits 29(2):95-107, (1994).

Dally, W.J., et al., *Digital Systems Engineering*, Cambridge University Press, New York, NY, pp. 344-347 and 352, 1998.

Dally, W.J., et al., "Multi-gigabit Signaling with CMOS," DARPA funded presentation, May 12, 1997.

Donnelly, K.S., et al.; "A 660 MB-s Interface Megacell Portable Circuit in 0.3 μm-0.7 μm CMOS ASIC," IEEE Journal of Solid State Circuits, vol. 31, No. 12, pp. 1995-2003, Dec. 1996.

Farjad-Rad et al., "An equalization scheme for 10Gb-s 4-PAM signaling over long cables," Center for Integrated Systems, Department of Electrical Engineering, Stanford University, Jul. 28, 1997.

Farjad-Rad et al., "A 0.4-.μm CMOS 10-GB-s 4-PAM pre-emphasis serial link transmitter," IEEE Journal of Solid-State Circuits 34(5):580-585, May 1999.

Fiedler, A., et al., "A 1.0625Gbps Transceiver with 2x-Oversampling and Transmit Signal Pre-Emphasis," IEEE-ISSCC, Feb. 1997.

IBM Technical Disclosure Bulletin, "High performance impedance controlled CMOS Drive," pp. 445-448, Apr. 1995.

IBM Technical Disclosure Bulletin, "Multi level logic testing," pp. 5903-5904, Apr. 1983.

IBM Technical Disclosure Bulletin, "3-state decoder for external 3-state buffer," pp. 477-478, Apr. 1995.

IBM Technical Disclosure Bulletin, "Common front end bus for high-performance chip-to-chip communication," pp. 443-444, Apr. 1995.

IBM Technical Disclosure Bulletin, "Multilevel CMOS sense amplifier," pp. 1280-1281, Aug. 1986.

IBM Technical Disclosure Bulletin, "High speed complimentary metal oxide semiconductor input-output circuits," pp. 111-114, Feb. 1995.

IBM Technical Disclosure Bulletin, "Bidirectional communications within a binary switching system," pp. 2865-2866, Feb. 1976.

IBM Technical Disclosure Bulletin, "Multilevel bidirectional signal transmission," pp. 2867-2868, Feb. 1976.

IBM Technical Disclosure Bulletin, "Circuit for multilevel logic implementation," pp. 4206-4209, Feb. 1981.

IBM Technical Disclosure Bulletin, "Coding data transmission," pp. 1295-1296, Jan. 1968.

IBM Technical Disclosure Bulletin, "Clock recovery circuit," pp. 219-220, Jul. 1969.

IBM Technical Disclosure Bulletin, "Use of multibit encoding to increase linear recording densities in serially recorded records," pp. 14-15, Jun. 1967.

IBM Technical Disclosure Bulletin, "Transmission by data encoding," pp. 1519-1520, Nov. 1970.

IBM Technical Disclosure Bulletin, "Multi-level encoded high bandwidth bus," pp. 444-447, Nov. 1992.

IBM Technical Disclosure Bulletin, "Multilevel signal transfers," pp. 1798-1800, Oct. 1978.

IBM Technical Disclosure Bulletin, "Push-pull multi-level driver circuit for input-output bus," pp. 1649-1651, Sep. 1985.

IBM Technical Disclosure Bulletin, "Propagation Over Multiple Parallel Transmission Lines Via Modes," pp. 1-6, Apr. 1990.

IBM Technical Disclosure Bulletin, "Servo Control of analog Power Supplies Purpose Interface Card," 36(4):283-286, Apr. 1993.

IEEE—802.3ab—A Tutorial Presentation, Mar. 1998.

IEEE—P802.3ad-Draft Supplement to Carrier Sense Multiple Access with Collision Detection (CSMA-CD) Access Method & Physical Layer Specifications: Link Aggregation, (1999).

Ishibe, M., et al., "High-Speed CMOS 1-0 Buffer Circuits," IEEE Journal of Solid State Circuits, vol. 27, No. 4, Apr. 1992.

Lau. B., et al., "A 2.6-Gb-s multipurpose chip-to-chip interface," IEEE J. Solid-State Circuits, vol. 33, pp. 1617-1626, Nov. 1998.

Lee, J., et al., "A 80ns 5v-Only Dynamic RAM", ISSCC Proceedings, Paper 12.2 ISSCC 1979.

Kobayashi, T., et al., "A current-controlled latch sense amplifier and a static power-saving input buffer for low-pressure architecture," IEEE Journal of Solid State Circuits, vol. 28, No. 4., Apr. 1993.

Kuczynski, M.A., et al., "A 1Mb-s Digital Subscriber Line Transceiver Signal Processor," IEEE Digital and Video Signal Processing-ISSCC, pp. 26-32, 1999.

Matick, R.E., "Transmission Lines for Digital and Communication Networks," IEEE Press, New York, NY, pp. 268-269, 1995.

Moncayo, A., et al., "Bus design and analysis at 500MHz and beyond," Design SuperCon, 1995.

Perez-Alvarez, I.A., et al., "A Differential Error Reference Adaptive Echo Canceller for Multilevel PAM Line Codes," IEEE, pp. 1707-1710, 1996.

Pilo, H., et al.; "A 300 MHz 3.3V 1 Mb SRAM Fabricated in a 0.5 μm CMOS Process," IEEE International Solid State Circuits Conference, pp. 148-149, 1996.

Portmann, C., et al., "A Multiple Vendor 2.5-V DLL for 1.6-GB-s RDRAMs." IEEE VLSI Circuits Symposium, Jun. 1999.

Raghavan, S.A., et al., "Nonuniformly Spaced Tapped-Delay-Line Equalizers," IEEE Transactions on Communications, 41(9), pp. 1290-1295, 1993.

Schlegel, "4 Modulation Schemes for High Bit Rate Data Transmission in the Loop Plant," www.bib.frilippe.de-voltext-dipl-schlegd-chapter4.htm, Apr. 19, 2001.

Schumacher, H.J. et al.; "CMOS Subnanosecond True-ECL Output Buffer," IEEE Journal of Solid State Circuits, vol. 25, No. 1, pp. 150-154, Feb. 1990.

Scott, "Propagation Over Multiple Parallel Transmission Lines Via Modes," IBM Technical Disclosure Bulletin, U.S., 32(11): Apr. 1-6, 1990.

Sidiropoulos, S., et al., "A 700 Mbps-pin CMOS Signaling Interface Using Current Integrating Receiver," 1996 Symposium on VLSI Circuits Digest of Technical Papers, Honolulu, pp. 142-143, 1996.

Singh, "Four valued buses for clocked CMOS VLSI systems," Proceedings of the IEEE 17$^{th}$ Int'l Symposium on Multiple-Valued Logic, Boston, Massachusetts, May 26-28, 1987, pp. 128-133, 1987.

Smith, "The prospects for multivalued logic: a technology and applications view," IEEE Transactions on Computers, C-30(9):619-634, 1981.

Seki, T., et al., "A 6-ns. 1-Mb CMOS SRAM with Latched Sense Amplifier," IEEE Journal of Solid State Circuits, vol. 28, No. 4, Apr. 1993.

Taborek, "Multi-Level Analog Signaling Techniques for 10 Gigabit Ethernet," IEEE, 802.3 Tutorial, Jul. 1999.

Thirion, "10 Gig PMD Technologies," IEEE Plenary, Kauai, Hawaii, Nov. 1999.

Thompson, G., "How 1000BASE-T Works," Presentation at IEEE 802.3 Plenary Session, 1997.

Tomasini, L., et. al., "A fully differential CMOS line driver for ISDN," IEEE Journal of Solid State Circuits, vol. 25, No. 2, Apr. 1990.

Vogt, A.W., et al., "A 10-Bit High Speed CMOS DAC Macrocell," IEEE 1989 Custom Integrated Circuits Conference, 1989, pp. 6.7.1-6.7.4.

Vranesic, "Multivalued signaling in daisy chain bus control," Proceedings of the 9th Int'l Symposium on Multiple-Valued Logic, Bath, England, pp. 14-18, 1979.

Yang, K., et al., "A Scalable 32Gb-s Parallel Data Transceiver with On-Chip Timing Calibration Circuits," IEEE International Solid State Circuits Conference, pp. 258-259, 2000.

Yang, T.S., et al.; "A 4-ns 4Kx 1-bit Two-Port BiCMOS SRAM," IEEE Journal of D-State Circuits, vol. 23, No. 5, pp. 1030-1040, Oct. 1988.

Yeung, E., et al., "A 2.4Gbps per pin simultaneous bidirectional parallel link with per pin skew calibration", ISSCC 2000, 2000.

Sidiropoulos et al., "A 700 Mb/s/pin CMOS Signaling Interface Using Current Integrating Receivers," IEEE Journal of Solid-State Circuits, vol. 32, No. 5, pp. 681-690, May 1997. 10 pages.

Ramin Farjad-Rad et al., "A 0.3-μm CMOS 8-Gb/s 4-PAM serial link transceiver," IEEE Journal of Solid-State Circuits, vol. 35, No. 5, pp. 757-764, May 2000. 8 pages.

Yeung et al., "A 2.4 Gb/s/pin Simultaneous Bidirectional Parallel Link with Per-Pin Skew Compensation," IEEE Journal of Solid-State Circuits, vol. 35, No. 11, pp. 1619-1627, Nov. 2000. 10 pages.

Zerbe, Notice of Allowance and Fee(s) Due with mail date of Jun. 3, 2010 re U.S. Appl. No. 12/624,365. 18 Pages.

Werner, Response dated Jul. 13, 2010 re U.S. Appl. No. 12/258,285 to Office Action dated Apr. 8, 2010. 7 Pages.

Werner, Notice of Allowance with mail date of Aug. 20, 2010 for U.S. Appl. No. 12/258,285. 6 pages.

* cited by examiner

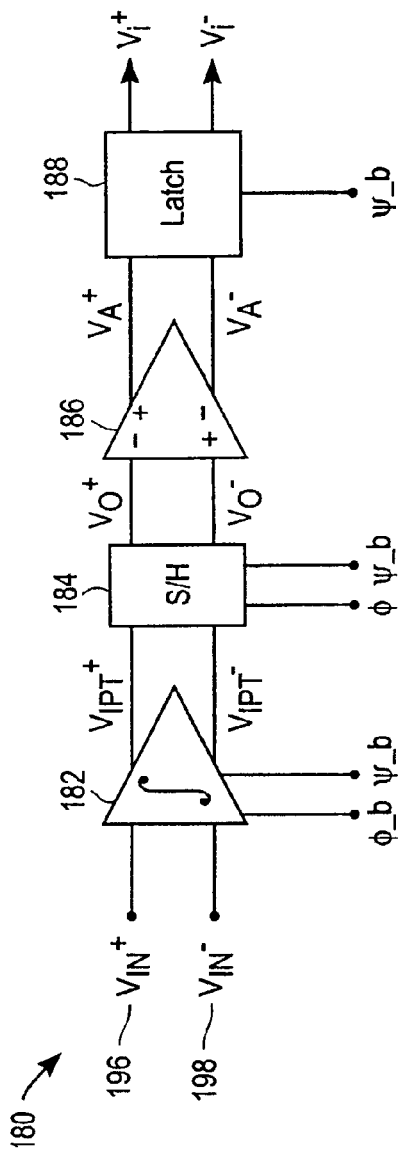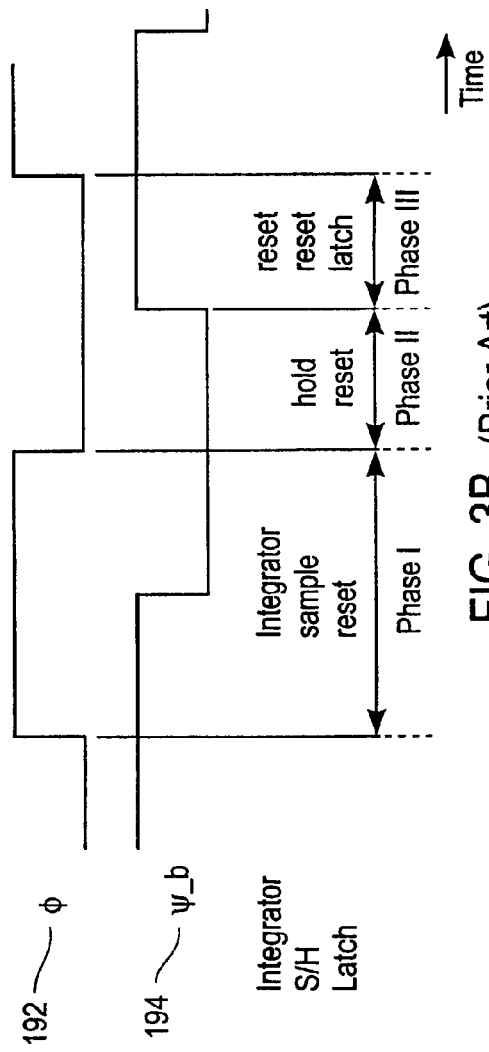
FIG. 3A (Prior Art)
FIG. 3B (Prior Art)

Timing Diagram of Precharge and Sense Signals

Circuit for Timing Diagram of Fig.17C

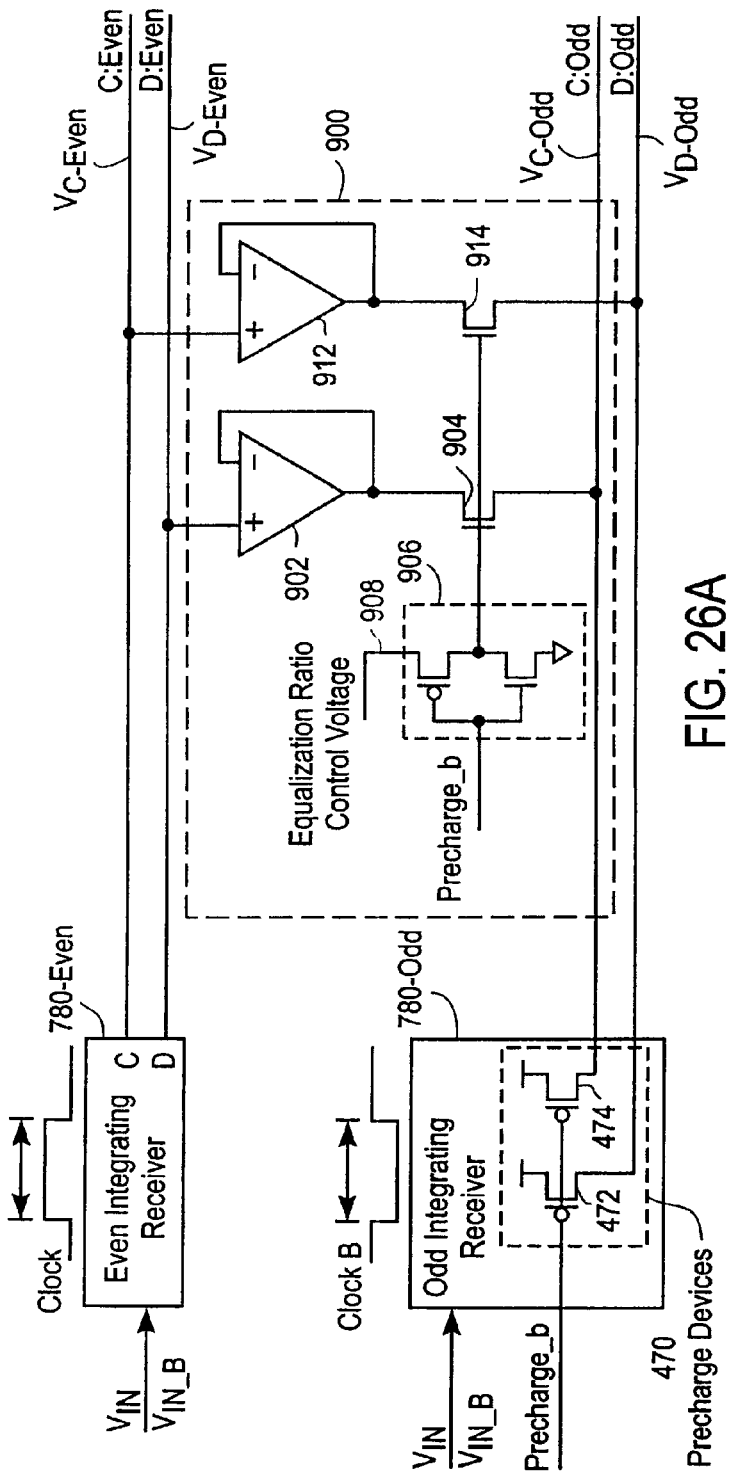
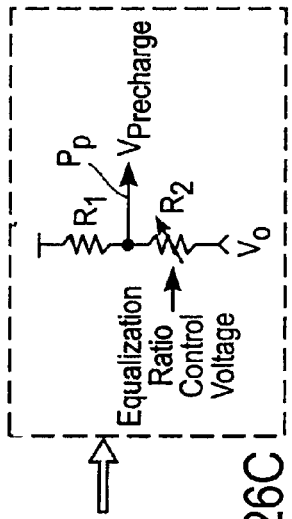
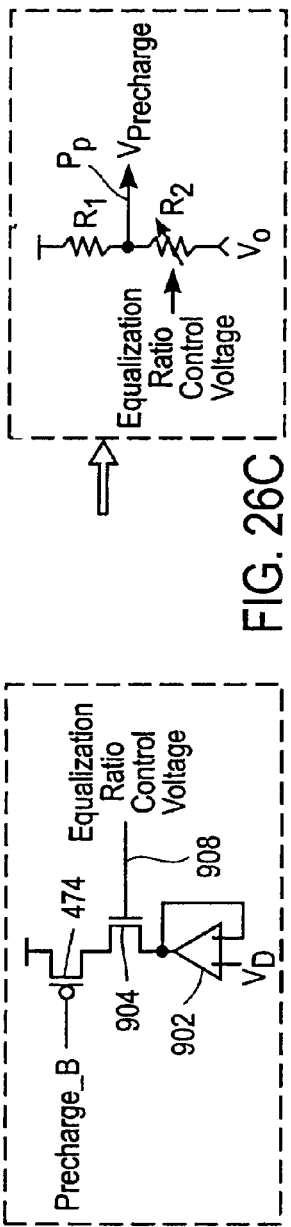
FIG. 26A
FIG. 26C
FIG. 26B

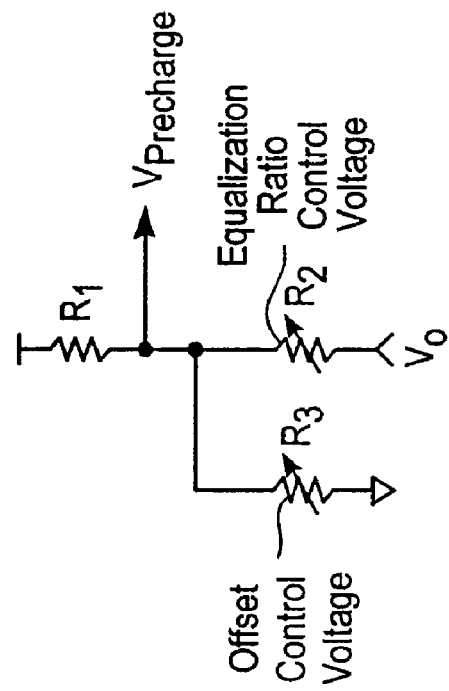
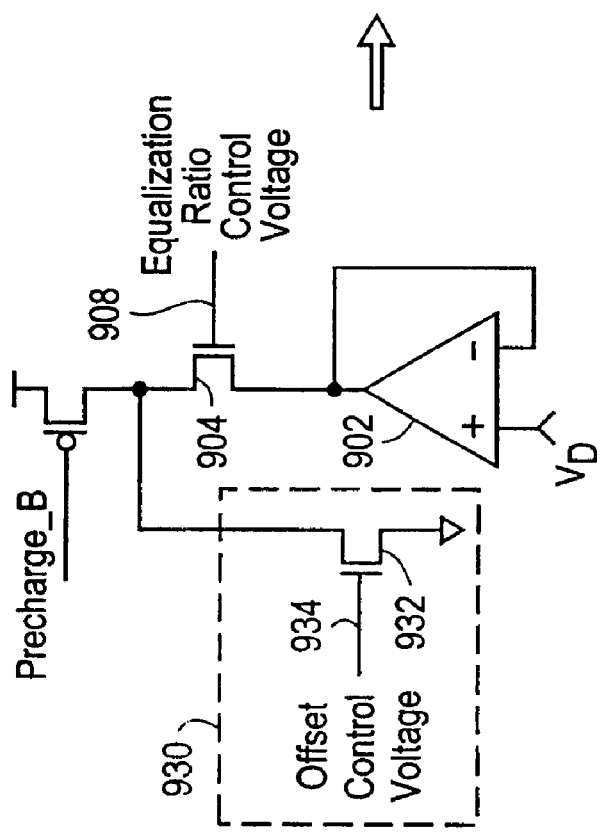
FIG. 27B
FIG. 27A

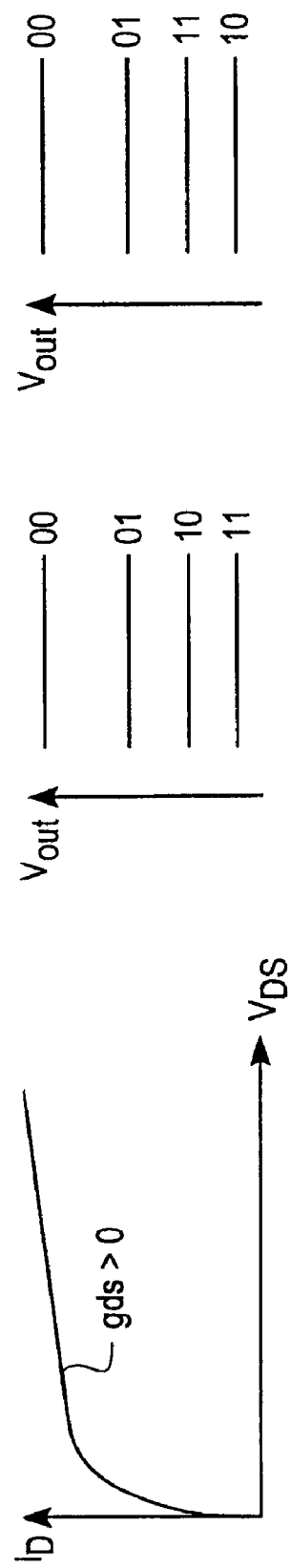

Gray Code Generator

Circuit to Reduce Switching Noise

GDS Compensated Multi-PAM Output Driver

GDS Compensated Multi-PAM Output Driver with Current Control

Circuit for Calibrating the GDS Compensated Output Driver with Current Control

Method for Calibrating the GDS Compensated Output Driver with Current Control

Multi-PAM Receiver

Multi-PAM Pre-Amplifier

Multi-PAM Pre-Amplifier

Multi-PAM Pre-Amplifier

Multi-PAM Pre-Amplifier for MSB

Receiver Delay Generator

Automatic Detection of 2-PAM or 4-PAM Mode

Controlling the Data Rate in a 2-PAM / 4-PAM System

Method for Determining 4-PAM / 2-PAM Signalling as a Function of Error Rate

INTEGRATING RECEIVER WITH PRECHARGE CIRCUITRY

CROSS REFERENCE TO RELATED APPLICATIONS

This application is a continuation of U.S. patent application Ser. No. 12/624,365, filed Nov. 23, 2009 now U.S. Pat. No. 7,809,088, which is a continuation of U.S. patent application Ser. No. 11/368,012, filed Mar. 3, 2006, now U.S. Pat. No. 7,626,442, which is a divisional of U.S. patent application Ser. No. 09/478,916, filed Jan. 6, 2000, now U.S. Pat. No. 7,124,221, which claims priority to U.S. Provisional Patent Application 60/158,189, filed Oct. 19, 1999, titled "A Method and Apparatus for Receiving High Speed Signals with Low Latency," which are hereby incorporated by reference in their entirety for all purposes.

BRIEF DESCRIPTION OF THE INVENTION

The present invention relates generally to a high frequency digital signal bus, and more particularly to a digital signal bus that uses multi-level signaling to increase the data rate of the bus.

BACKGROUND OF THE INVENTION

An efficient high speed signaling system requires the use of well-controlled waveforms. For example, in a high speed signaling system with a clock cycle time in the range of approximately one to two nanoseconds, the amplitude of the voltage swing, the rise and fall times, and the duty cycle of the signaling waveform should be within well-defined limits. The term "voltage swing" refers to a difference between a minimum predetermined voltage and a maximum predetermined voltage of a signal. For example, typical limits may include a voltage swing of approximately one volt, a near fifty percent duty cycle, and a rise and a fall time of approximately one hundred picoseconds (ps). In some systems, the voltage swing of CMOS signals ranges from a low of zero volts to a high of five volts. In other systems, the voltage swing of the CMOS signals ranges from a low of zero volts to a high of 2.5 volts.

A receiver system that receives and converts the high-speed, low swing waveforms to CMOS signals requires careful design, especially when multiple high-speed waveforms are received simultaneously and where noise is a significant factor.

The following naming convention will be used for signals. For example, the name "system clock" will refer to one signal, while that signal's complement will be referred to as "system clock B" or "system clock_b." In other words, the complement of a signal will have an upper or lower case "b" following its name.

As shown in FIG. 1, a prior art sampling receiver 100 has a sense-amplifier 102 and a latch 104. The sense amplifier 102 receives, senses and amplifies small changes in the input signal, Data In, with respect to a reference voltage Vref, and outputs a differential signal, A and A_b. The latch 104 amplifies, stores and converts the differential signal, A and A_b, to predetermined low and high values.

Referring also to the timing diagram of FIG. 2, a system clock and its complement, system clock_b, control the operation of the sampling receiver 100. When system clock_b is transitions low the sense amplifier 102 is disabled. Two linear load/precharge transistors 112, 114 become active and pull signals A and A_b at nodes $N_A$ and $N_{A\_b}$ to a high voltage level.

When system clock_b transitions high, the sense amplifier 102 is enabled and senses the voltage of the data input signal, Data In. The two linear load transistors 112, 114 become inactive. When the voltage of the data input signal, Data In, at the gate of input transistor 116 exceeds the reference voltage $V_{REF}$ at the gate of transistor 118, the input transistor 116 becomes active and pulls output signal A_b to a low voltage level via a current sink 120. When the data input signal is less than or equal to the reference voltage $V_{REF}$, the input transistor 116 is inactive (i.e., or at least less conductive than transistor 118) and the output signal A_b remains high.

The cross-coupled transistor pair 122, 124 stores the state of signals A and A_b. Initially, when system clock_b is low, transistors 112 and 114 are enabled and act as linear load devices to the differential pair 116, 118. When system clock_b transitions high, transistors 112 and 114 become inactive and the cross-coupled pair 122, 124 is enabled to sense and amplify variations of the input data signal, Data In. When the voltage of the input signal, Data In, is less than the reference voltage $V_{REF}$, transistor 118 is active and pulls the voltage of signal A at node $N_A$ to ground, which causes the voltage of signal A_b at node $N_{A\_b}$ to transition high. When the voltage of the input signal Data In exceeds the reference voltage $V_{REF}$, transistor 116 becomes active and pulls the signal A_b at node $N_{A\_b}$ low; in addition, transistor 118 becomes inactive and the signal A_b at node $N_{A\_b}$ is pulled high. The cross-coupled pair 122, 124 acts as an amplifier for small changes in the voltage of the input signal Data In with respect to the reference voltage $V_{REF}$.

When system clock_b transitions low, sense amplifier 102 is disabled and the complementary output signals A and A_b from the sense amplifier 102 are stored in latch 104. Latch 104 is enabled by the system clock.

In latch 104, an equalizing transistor 126 becomes active when the system clock transitions low and drives the output signals Out and Out_b to the same voltage level. When the system clock transitions high, the equalizing transistor 126 becomes inactive, latch-enable transistors 128, 130 become active and enable the latch-data-input transistors 132, 134 to act as a pull-down circuit when responding to the differential output signals A and A_b from the sense amplifier 102. In particular, when the system clock is high, the latch-data-input transistors 132, 134 are responsive to the amplified signals A and A_b. A four transistor latch circuit 136 latches the associated state of signals A and A_b, and generates the latched-output signals, Out 142 and Out_b 144. The four transistor latch circuit 136 includes transistors 152, 154, 156 and 158.

When the system clock transitions low, latch-enable transistors 128, 130 become inactive thereby causing the latch 104 to become non-responsive to signals A and A_b. In this way, the latch 104 captures the state of A and A_b at the high-to-low transition of the system clock. To reduce the probability of errors caused by noise, the timing of the high-to-low transition of the system clock should occur at a time when the differential amplitude between the A and A_b signals is greatest. In addition, when a system has multiple receivers and drivers operating simultaneously, the likelihood of noise injection on $V_{REF}$ and, consequently, errors is increased.

The circuit of FIG. 2 senses even data values, D0 and D2, in response to the falling edge of the system clock, and latches the even data values in response to the rising edge of the system clock. Another circuit, similar to the circuit of FIG. 2, operates on opposite clock edges senses and latches odd data values (e.g., sensing in response to the rising edge of the system clock) and latching in response to the falling edge of the system clock.

A Prior Art Integrating Receiver

In FIG. 3A, an integrating receiver 180 improves performance in a noisy environment. The integrating receiver 180 is a type of matched filter. In the integrating receiver 180, an integrator 182, a sample and hold (S/H) circuit 184, an amplifier 186 and a latch 188 are connected in series and receive and output differential signals. The integrating receiver 180 integrates a bias current $I_{BIAS1}$ based on the difference between the differential input signals $V_{IN+}$ and $V_{IN-}$ over a given period of time, called the integration interval. Prior to the start of the integration interval, the output value of the integrator 182 is initially set equal to zero volts. After integration is complete and additional processing, the latch 188 stores the result of the integration.

Referring also to FIG. 3B, the integrating receiver 180 operates according to three phases—an integration phase (Phase I), a hold phase (Phase II) and a latch phase (Phase III). A first timing signal ϕ 192 and a second timing signal Ψ_b 194 define the phases and control the operation of the integrating receiver 180. The first timing signal ϕ defines the integration interval or phase and is a clock that operates at the system clock frequency. The second timing signal Ψ_b defines the hold and latch phases when the first timing signal ϕ is no longer in the integration phase. In some implementations, the first timing signal ϕ is phase shifted with respect to the system clock.

During Phase I, the integration interval, when the first timing signal ϕ is high, the integrator 182 receives differential input signals $V_{IN+}$ 196 and $V_{IN-}$ 198. The integrator 182 integrates a predetermined amount of current based on the polarity of the data input signals $V_{IN+}$ 196 and $V_{IN-}$ 198 and generates a differential integrated signal. The sample and hold circuit 184 receives the differential integrated signal output by the integrator 182, and the latch 188 is held in a reset state.

During Phase II, when the first timing signal ϕ and the second timing signal Ψ_b are low, the sample and hold circuit 184 samples and holds the state of the differential output signal from the integrator 182. The amplifier 186 also amplifies the output of the sample and hold circuit 184 and generates an amplified signal.

During Phase III, when the second timing signal Ψ_b is high and the first timing signal ϕ is low, the amplified signal is captured in the latch 188. The integrator 182 and the sample and hold circuit 184 are reset to receive the next differential data bit.

One important metric of the integrating receiver is its overall delay or latency, referred to herein as the input-to-output latency. The input-to-output latency is measured from the time when the data input signals $V_{IN+}$ 196 and $V_{IN-}$ 198 are validly present at the integrator input to the time when the captured signal is validly present at the output of the latch 188. In high-speed signaling systems and, in particular, in memory systems, the input-to-output latency should be as small as possible.

In FIG. 4, the integrator 182 and the sample and hold circuit 184 of FIG. 3 are shown in more detail. Integration occurs on nodes $N_{INTA}$ 202 and $N_{INTB}$ 204, with the capacitance of these nodes being determined by the inherent capacitance of the transistors coupled to them. In the integrator 182, a first current steering circuit 210 receives a bias current $I_{BIAS}$ from a current source 212 and steers the bias current $I_{BIAS}$ to either integration node $N_{INTA}$ 202 or $N_{INTB}$ 204 based on the differential input signal, $V_{IN+}$ and $V_{IN-}$. The current source 212 includes a PMOS transistor $M_3$ 214 that supplies the bias current $I_{BIAS}$ in response to a bias voltage $V_{BIAS}$ applied to the gate of transistor 214. In the current steering circuit 210, a first differential input pair, transistors $M_1$ 206 and $M_2$ 208, receives the differential input signal $V_{IN+}$ and $V_{IN-}$, respectively. When $V_{IN-}$ is at a low voltage level, transistor $M_1$ 206 steers the bias current $I_{BIAS}$ to node $N_{INTA}$ 202, thereby charging node $N_{INTA}$ and increasing the voltage $V_{INT+}$ at node $N_{INTA}$. When $V_{IN+}$ is at a low voltage level, transistor $M_2$ 208 steers the bias current $I_{BIAS}$ to node $N_{INTB}$, thereby charging node $N_{INTB}$ and increasing the voltage $V_{INT-}$ at node $N_{INTB}$.

A compensating integration circuit 222 eliminates a source of error in the integrator 182 caused primarily by the gate to drain capacitance of transistors $M_1$ 206 and $M_2$ 208. In the compensating integration circuit 222, a second differential input pair, transistors $M_{C1}$ 224 and $M_{C2}$ 226, receives the differential input signals $V_{IN+}$ 206 and $V_{IN-}$ 208, respectively, and, functions as a current steering circuit to steer compensating bias current $I_{BIASC}$ towards the integration nodes $N_{INTA}$ and $N_{INTB}$. A compensating current source, PMOS transistor $M_{C3}$ 228, provides the compensating bias current $I_{BIASC}$. The amount of current $I_{BIASC}$ supplied by the compensating current source is also determined by the bias voltage $V_{BIAS}$. Transistor $M_{C4}$ 230 pulls up the voltage at node tail to the power supply voltage $V_{DD}$.

An integrator reset circuit 240 resets the integrator 182 by removing any charge from the integration nodes $N_{INTA}$ and $N_{INTB}$ prior to integrating. The integrator 182 is reset during Phase III when ϕ_b and ψ_b are high.

One disadvantage of this integrator 182 is that its input common-mode range is limited. The common mode of differential signals $V_{IN+}$ and $V_{IN-}$ is the average value of the two signals. The input common mode range is low in order that the first current steering circuit 210 can fully steer the integrating current $I_{BIAS}$ and operate at a sufficiently high conductance to keep the PMOS current source transistor $M_3$ 214 in saturation. A low input common mode range limits the types of drivers and termination networks which may be used. Therefore, an integrator 182 with an increased input common mode range is desirable.

Another disadvantage is that the integrator 182 has a low voltage gain when either transistor 206 or 208 of the differential pair does not fully steer the current $I_{BIAS}$ to either of the integration nodes $N_{INTA}$ and $N_{INTB}$. The low voltage gain Av of the integrator 182 is determined by the following relationship:

$$Av=((V_{INT+})-(V_{INT-}))/((V_{IN+})-(V_{IN-})). \quad (1)$$

Because of the low voltage gain Av, the integrator 182 may require large input voltage swings to fully steer the current $I_{BIAS}$ from the current source 214. Therefore, an integrator 182 that fully steers current smaller changes in the input voltage is also desirable.

Sample and Hold Circuitry

The sample and hold circuit 184 (FIG. 4) provides the differential integrated voltages, $V_{INT+}$ and $V_{INT-}$, from the integrator 182 to the sense amplifier and latch, as sample output voltages, Vo+ and Vo−. In the sample and hold circuit 184, transistors S1 250 and S2 252 are connected in series to the integration nodes $N_{INTA}$ and $N_{INTB}$, 202 and 204, respectively. The first timing signal ϕ is supplied to the gates of transistors S1 250 and S2 252, respectively. During Phase I, when the first timing signal ϕ is high, the differential voltage, $V_{INT+}$ and $V_{INT-}$, on the integration nodes, $N_{INTA+}$ and $N_{INTB-}$, is output by the sample and hold circuit 184 as Vo+ and Vo−. During Phase II, when φ is low, transistors S1 250 and S2 252 are inactive and the sampled voltages, Vo+ and Vo−, remain on sampling nodes $N_{SAMPA}$ 260 and $N_{SAMPB}$ 262, respectively, because of the inherent capacitance of the sample and hold circuit 184. During Phase III, a reset circuit 254 drives the sample output voltage Vo+ and Vo− on nodes, $N_{SAMPA}$ 260 and $N_{SAMPB}$ 262, respectively, to circuit ground to reset the sample and hold circuit 184.

Amplifier and Latch

FIG. 5 is a circuit diagram of the amplifier 186 and latch 188 of FIG. 3. The amplifier 186 amplifies the differential output of the sample and hold circuit, Vo+ and Vo−, to generate amplified signals $V_{A+}$ and $V_{A-}$, respectively, during Phases II and III. An amplifier current source 270, PMOS transistor 272, supplies an amplifier bias current $I_{BIASA}$ to a differential PMOS pair, transistors 274 and 276 in response to the bias voltage $V_{BIAS}$. The bias voltage $V_{BIAS}$ is sufficiently low with respect to the supply voltage to operate PMOS transistor 272 in the saturation region.

An amplifier equalizing transistor 278 becomes active during Phase I, when the first timing signal φ is high, to equalize the outputs, $V_{A+}$ and $V_{A-}$, of the amplifier 186 such that the amplifier 186 outputs no differential voltage. During Phases II and III, when the first timing signal φ is low, the equalizing transistor 278 is inactive.

An amplifier load circuit 280 pulls one of the amplifier outputs, $V_{A+}$ and $V_{A-}$, to ground when either of the input voltages Vo+ or Vo− is sufficiently low to cause one of the PMOS transistors, 276 or 274, respectively, to become active. In the amplifier load circuit 280, NMOS transistor pairs 282, 284 connect to the transistors of amplifier differential pair 274, 276, respectively. The NMOS transistor pairs 282, 284 are cross-coupled such that, for example, when the amplifier output voltage $V_{A+}$ is high, NMOS transistor pair 284 is inactive and NMOS transistor pair 282 is active and pulls $V_{A-}$ low. Each NMOS transistor pair 282, 284 includes two NMOS transistors, 286 and 288, 292 and 294, respectively, connected in parallel.

Operating PMOS transistor 272 as a current source provides high gain-bandwidth for the latch 188 and reduces propagation delay. However, supplying the amplifier bias current $I_{BIASA}$ in this way causes the amplifier 186 to consume static direct current and therefore static power. Static power is that power constantly being consumed by a circuit, regardless of its mode or data. Because the amplifier 186 consumes a significant amount of static power, the amplifier 186 may be unsuitable for use in devices that use a large number of receivers. Therefore an amplifier for use in a receiver that reduces static power consumption is desirable.

The latch 188 is reset during Phases I and II, and stores the output of the amplifier 186 during Phase III. During Phases I and II, when Ψ_b is low, a latch-load-circuit that includes PMOS transistors 302 and 304, precharges the differential latch output, $V_{L+}$ and $V_{L-}$, to the supply voltage. Also during Phases I and II, a latch output equalizing transistor 306 becomes active and causes the differential latch output $V_{L+}$ and $V_{L-}$ signals to be the same.

During Phase III, when Ψ_b is high, the latch-load-circuit and the latch output equalizing transistor 306 become inactive. A latch-input pair, NMOS transistors 308 and 310, receives the differential output of the amplifier 186. A first cross-coupled pair, transistors 312, 314, latches the state of the amplifier output signals, $V_{A+}$ and $V_{A-}$. Pass transistors 316, 318 are active and supply the output of the first cross-coupled pair 312, 314 as differential latch output signals, $V_{L+}$ and $V_{L-}$. A second cross-coupled pair, transistors 320, 322, latches the state of the differential latch output signals, $V_{L+}$ and $V_{L-}$, to improve the gain of the latch.

The output of the latch 188, and therefore the output of the integrating receiver 180, is valid after the beginning of Phase III. The input-to-output latency of the integrating receiver 180 is equal to the duration of Phase I plus the duration of Phase II plus the duration of the latch output delay from the beginning of Phase III. Therefore, the input-to-output latency consumes a significant portion of the system clock period. In particular, the input-to-output latency consumes a large amount of time relative to a typical clock cycle time of approximately two nanoseconds (ns) for high speed signaling systems, and potentially limits the performance of the system in which the integrating receiver is used. Therefore, an integrating receiver with reduced input-to-output latency is desirable.

In computer systems, to increase the amount of data transferred on a clock cycle, the number of data lines of the data bus is increased. On the chip, each line of the data bus uses a pin for an external connection. However, the number of pins from the chip is limited. Therefore, an apparatus and method that increases the amount of data transferred during a single clock cycle without increasing the number of output pins is also desirable.

SUMMARY OF THE INVENTION

A memory system uses multiple pulse amplitude modulation (multi-PAM) output drivers and receivers to send and receive multi-PAM signals. A multi-PAM signal has more than two voltage levels, with each data interval now transmitting a "symbol" at one of the valid voltage levels. In one embodiment, a symbol represents two or more bits. The multi-PAM output driver drives an output symbol onto a signal line. The output symbol represents at least two bits that include a most significant bit (MSB) and a least significant bit (LSB). The multi-PAM receiver receives the output symbol from the signal line and determines the MSB and the LSB.

In particular, in a multi-PAM output driver, a first drive block generates an MSB symbol component representing the MSB. A second drive block generates an LSB symbol component representing the LSB. The LSB symbol component is combined with the MSB symbol component to provide the output symbol.

In a multi-PAM bus receiver, an input symbol representing two or more bits is received. Each bit is associated with at least one threshold voltage of a set of threshold voltages. At least one integrator generates integration voltages on integration nodes by integrating a voltage associated with the input symbol, based on one or more threshold voltages of the set of threshold voltages. At least one sense amplifier receives the integration voltages of at least one integrator to generate at least one logic signal representing the relationship of the input symbol to a range of voltages defined by the one or more threshold voltages of the set of threshold voltages.

In another aspect of the invention, in a receiver, an integrator generates integrated signals based on input signals, and a sense amplifier samples and converts the integrated signals to a logic signal. The combination of the integrator and sense amplifier reduces the input-to-output latency from the time when an input signal is valid to when the output of the sense amplifier is valid. This receiver has low static power consumption and a wide input common mode range.

In particular, the receiver accumulates a charge to produce an output voltage during an integration time interval in accordance with a data input signal, samples the output voltage and holds and converts the sampled voltage into a logic signal such that the logic signal represents the polarity of the data input signal. The input-to-output latency is defined as the time from when the data input signal is valid to when the logic signal is valid. This input-to-output latency is approximately equal to the integration time plus the time to convert the sampled voltage. The input-to-output latency is lower than the input-to-output latency of the prior art receivers described above; and therefore improves system performance.

In yet another aspect of the invention, a preamplifier conditions the input signal and provides the conditioned input signal to the integrator.

In another aspect of the invention, rather than using an integrator, a preamplifier is connected to a sense amplifier that incorporates an integration function.

In a system having multiple receivers, each receiver receives adjusted timing signals to compensate for skew in the received signals. In an alternate embodiment, the receivers have an equalization circuit to compensate for intersymbol interference. In another aspect of the invention, an offset cancellation circuit removes any manufacturing induced voltage offsets from mismatched devices in the receiver. In yet another aspect of the invention, a multi-phased receiver system uses multiple receivers to increase bus speed.

A memory device incorporates the integrating receiver of the present invention.

BRIEF DESCRIPTION OF THE DRAWINGS

These and other features, aspects, and advantages of the present invention will become better understood with regard to the following description, appended claims, and accompanying drawings where:

FIG. 3A is a block diagram of a prior art integrating receiver.

FIG. 3B is a timing diagram of control signals used by the integrator of FIG. 3A.

FIG. 26A is a circuit diagram of an equalization circuit that compensates for inter-symbol interference according to another embodiment of the integrating receiver of FIG. 7A.

FIG. 26B is an exemplary equivalent circuit diagram illustrating the components of FIG. 26A that form a voltage divider.

FIG. 26C is an exemplary equivalent circuit diagram representing the circuit of FIG. 26B as a voltage divider.

FIG. 27A is a circuit diagram of a voltage offset cancellation circuit for the integrating receiver according to yet another embodiment of the integrating receiver of FIG. 7A.

FIG. 27B is an exemplary equivalent circuit representing the circuit of FIG. 27A as a voltage divider.

FIG. 32A is a graph showing gds distortion.

FIG. 32B shows the data bits, not in gray code, and the effect of gds distortion on the output voltage of the output driver.

FIG. 32C shows the data bits in gray code, and the effect of gds distortion on the output voltage of the output driver.

DETAILED DESCRIPTION OF THE PREFERRED EMBODIMENTS

Figure 6:
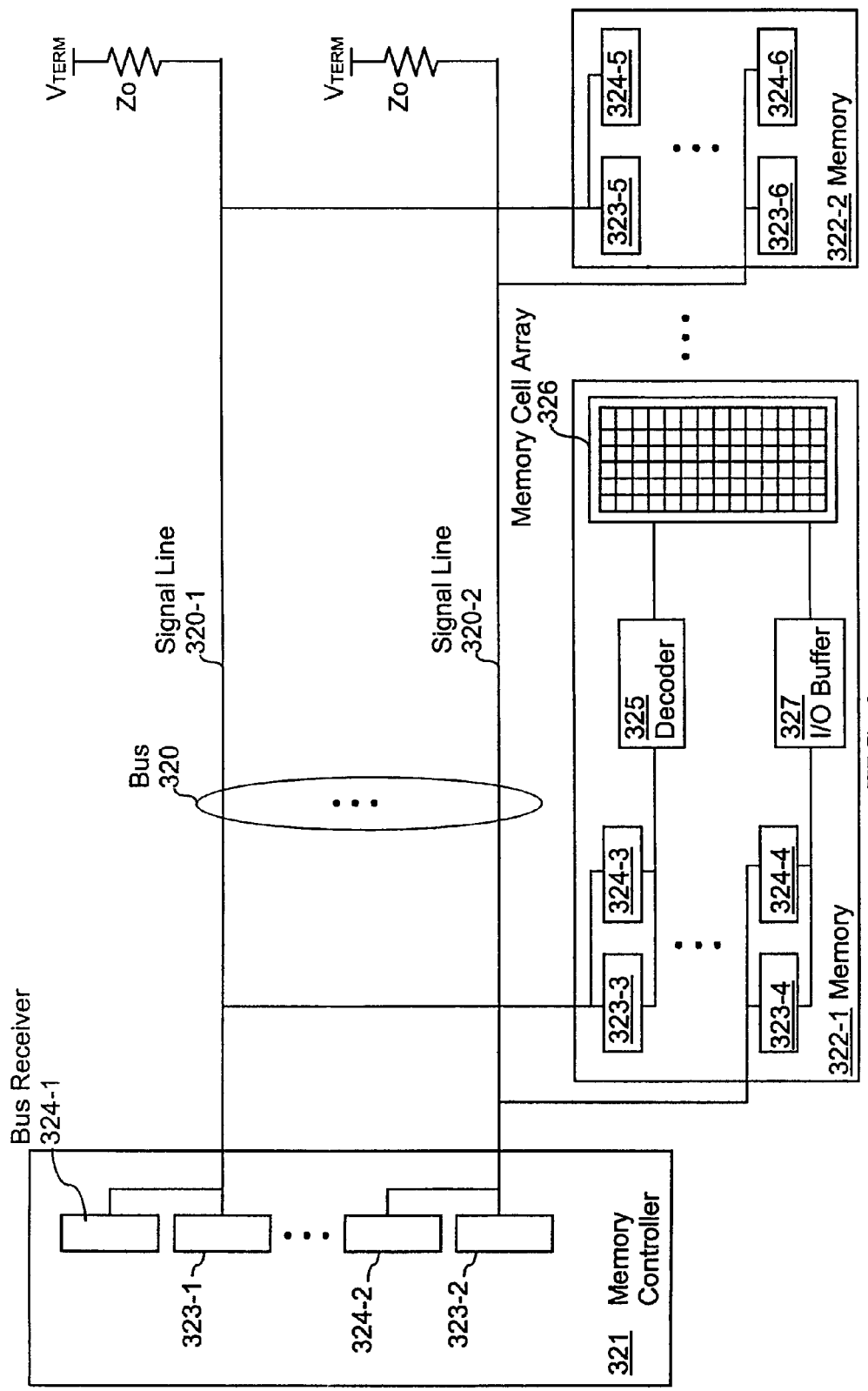
FIG. 6 is a block diagram of a memory controller and memories using an integrating receiver and bus output driver of the present invention.

In FIG. 6, a bus 320 interconnects a memory controller 321 and memories 322. The bus 320 is formed of signal lines 320-1, 320-2 that transmit address, data and control signals. Physically, on each integrated circuit 321, 322, the address, data and control signals are supplied to and output from external connections, called pins, and the bus 320 interconnects respective pins. The bus 320 may be implemented as traces on a printed circuit board, wires or cables and connectors. Each of these integrated circuits 321, 322 has bus output driver circuits 323 that connect to the pins to interface with the bus 320 to transmit signals to other ones of the integrated circuits. In particular, the bus output drivers 323 in the memory controller 321 and in the memories 322 transmit data over the bus 320. Each bus output driver 323 drives a single signal line of the bus 320. For example, bus output driver 323-1 in the memory controller 321 drives bus line 320-1. The bus 320 supports signaling with characteristics that are a function of many factors such as the system clock speed, the bus length, the amount of current that the output drivers can drive, the supply voltages, the spacing and width of the wires or traces making up the bus 320, the physical layout of the bus itself and the resistance of a terminating resistor $Z_0$ attached to each bus.

At least a subset of the signal lines connect to pull-up resistors $Z_0$ that connect to a termination voltage $V_{TERM}$. In some systems, all signal lines connect to pull-up resistors $Z_0$ that connect to the termination voltage $V_{TERM}$. The termination voltage $V_{TERM}$ can be different from the supply voltage $V_{DD}$. In one embodiment, the supply voltage $V_{DD}$ is equal to 2.5 volts, the termination voltage $V_{TERM}$ is equal to 1.8 volts, the bus voltage for a signal at low level $V_{OL}$ is equal to 1.0 volts, and the voltage swing is 0.8 volts. The resistance of the terminating resistors $Z_O$ is equal to twenty-eight ohms.

The output drivers 323 are designed to drive the bus 320 with a predetermined amount of current; and the bus receivers 324 are designed to receive the signals sent by the bus drivers 323 on the bus 320. In a device, each bus receiver 324 receives signals from one signal line of the bus 320. The bus receivers 324 are integrating receivers according to the present invention.

In one embodiment, the memories are random access memories (RAMs). In an alternate embodiment, the memories are read-only memories (ROMs). Alternately, the bus output drivers 323 and bus receivers 324 of the present invention are implemented in other semiconductor devices that use a bus to interconnect various types of integrated circuits such as microprocessors and disk controllers.

In the exemplary memory system of FIG. 6, the memory controller 321 supplies an address to the memory 322-1 using signal line 320-1 to transmit one bit of the address. For simplicity, the other signal lines transmitting the address are not shown. In the memory 322-1, a bus receiver 324-3 receives the address bit and passes the received address to a decoder 325. To receive the entire address, the decoder 325 receives address bits from multiple bus receivers 324. The decoder 325 generates the signals to access the data stored at a particular row and column of a memory cell array 326. In response to other control signals from the bus 320 and the decoder 325, for a read operation, the memory cell array 326 supplies data at the desired address to an input/output (I/O) buffer 327 which supplies the data to the bus 320 via the output driver 323-4. Although data is supplied with multiple signal lines and receivers, for simplicity, only one signal line for supplying data is shown. For a write operation, the memory controller 321 supplies an address which reaches the memory cell array 326 via the decoder 325 as described above. The memory controller 321 also supplies data signals via the output driver 323-2 to the bus 320. The memory 322-1 receives the data signals via the receiver 324-4 and passes the data to the memory cell array 326 for storage via the I/O buffer 327.

Although a bus that uses current mode signaling has been described with respect to FIG. 6, the apparatus and method of the present invention may be used in any signaling system where it is desirable to distinguish between signals having different voltage levels.

Figure 7A:
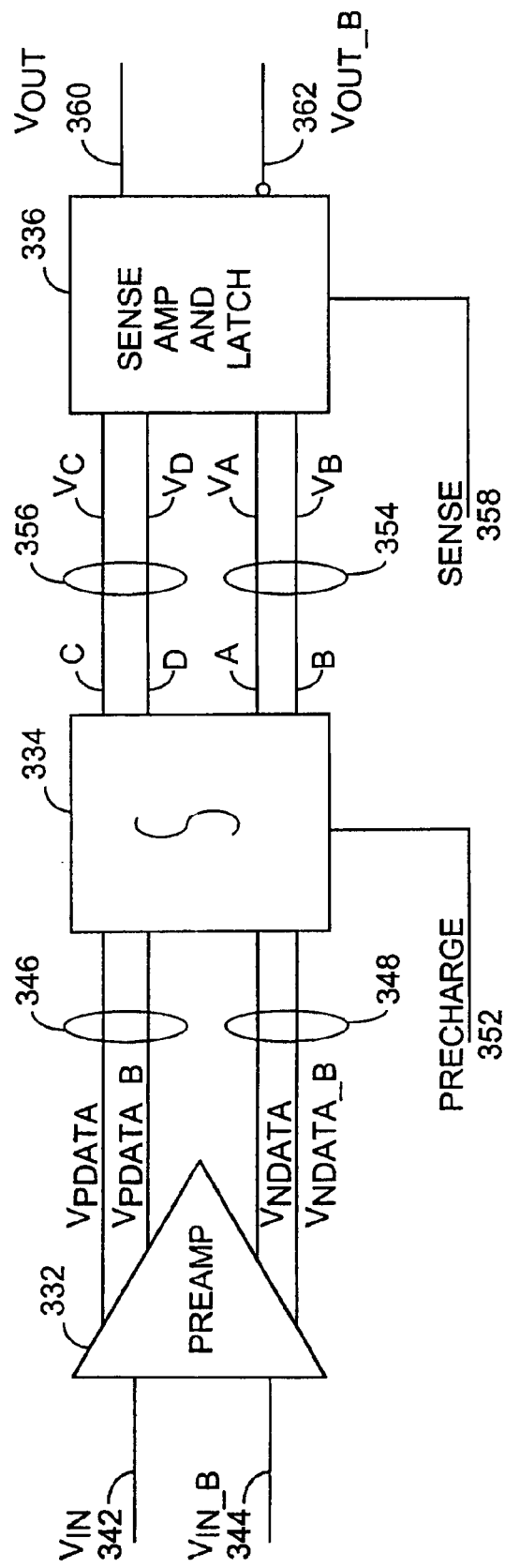
FIG. 7A is a block diagram of the integrating receiver of FIG. 6 according to an embodiment of the present invention.

FIG. 7A illustrates an integrating receiver 330 according to one embodiment of the invention. The integrating receiver 330 has a wide common mode range, a large output voltage swing and low input-to-output latency. In the integrating receiver 330, a preamplifier 332, an integrator 334, and a sense amplifier and latch 336 are connected in series. The preamplifier 332 receives differential input signals $V_{IN}$ 342 and $V_{IN\_B}$ 344 and generates two pairs of differential output signals, $V_{PDATA}$ and $V_{PDATA\_B}$, $V_{NDATA}$ and $V_{NDATA\_B}$, 346 and 348, respectively. The input signals $V_{IN}$ 342 and $V_{IN\_B}$ 344 are supplied externally with respect to the device implementing the integrating receiver 330. In particular, the input signals $V_{IN}$ 342 and $V_{IN\_B}$ 344 are from a bus and may be control, address or data signals.

The integrator 334 integrates current based on the differential output signals 346, 348 from the preamplifier 332 and a precharge signal 352 to generate differential integration voltages $V_A$, $V_B$, $V_C$ and $V_D$ at nodes A, B, C and D, respectively. In particular, the integrator 334 integrates the current based on whether one differential input voltage is greater than the other differential input voltage. The differential integration voltages form pairs 354, 356 as follows: $V_A$ and $V_B$, $V_C$ and $V_D$, respectively. In response to the sense signal 358, the sense amplifier and latch 336 senses the pairs of differential integration voltages $V_A$ and $V_B$ 354, $V_C$ and $V_D$ 356, and converts the integration voltages into CMOS outputs $V_{OUT}$ 360, $V_{OUT\_B}$ 362 for use in subsequent stages of circuitry.

In one embodiment, each differential input signal $V_{IN}$ 342 and $V_{IN\_B}$ 344 is provided on a separate signal line of a data bus, e.g., fully differential signaling. However, this doubles the number of signal lines of the data bus, and doubles the number of pins on the device. In another embodiment, a single input signal is provided on a signal line of a bus. In an alternate embodiment, a single-ended signaling scheme is used in which $V_{IN}$ 342 is received directly from a signal line of the data bus; and, a predetermined reference voltage is supplied to the preamplifier rather than the complement of the input signal $V_{IN\_B}$ 344.

Figure 7B:
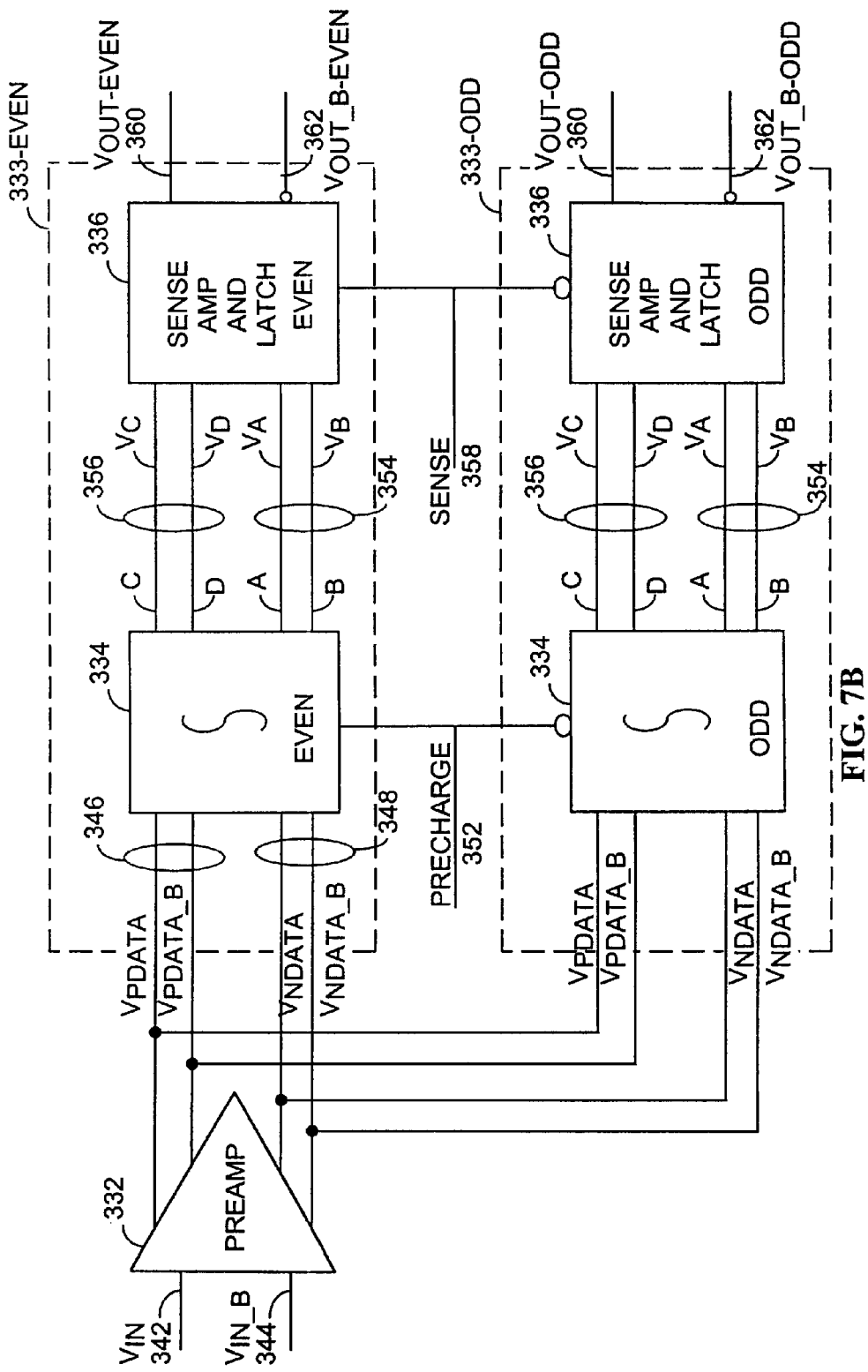
FIG. 7B is a block diagram of the integrating receiver of FIG. 6 that receives data on alternate edges of a clock signal according to another embodiment of the present invention.

FIG. 7B illustrates an alternate embodiment of the integrating receiver of FIG. 6 that further increases data throughput by integrating during both phases of the system clock. FIG. 7B is the same as FIG. 7A except for showing two additional integration-sense amp-latch blocks 333. The integrating receiver of FIG. 7A is also discussed below with respect to FIG. 41.

Figure 1:
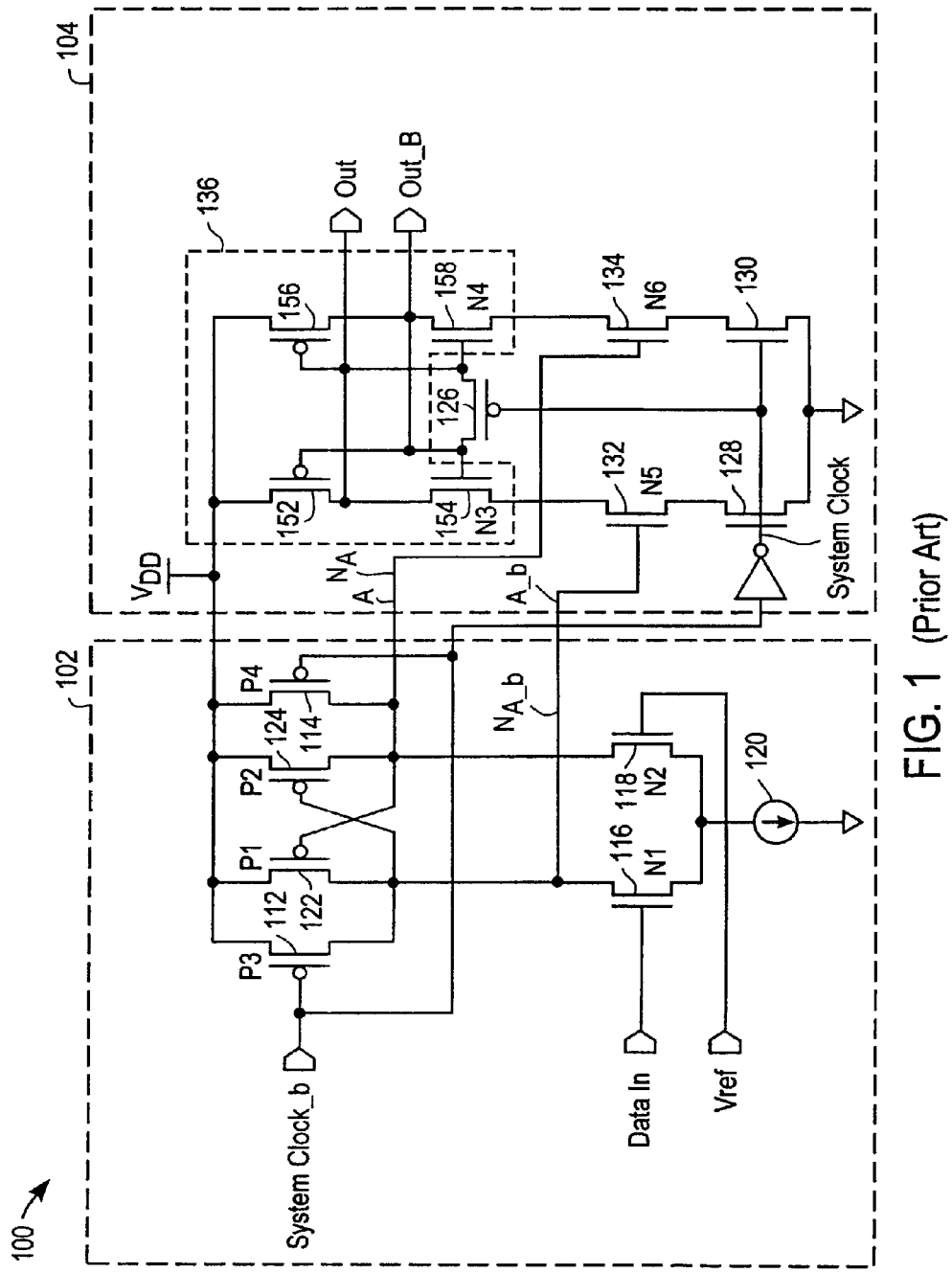
FIG. 1 is a circuit diagram of a prior art sampling receiver.
Figure 2:
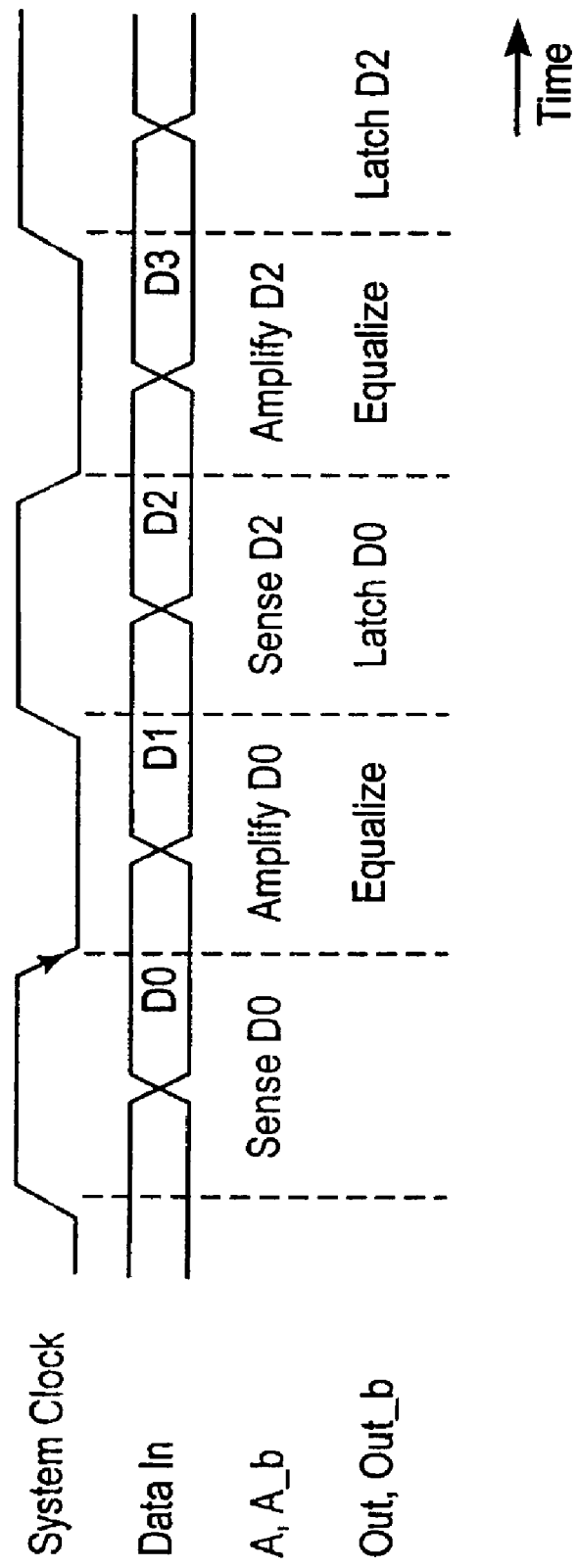
FIG. 2 is a timing diagram of the sampling receiver of FIG. 1.

As discussed above with respect to the circuit of FIG. 2, the circuit of FIG. 7B operates on opposite or complementary clock edges to sense and latch odd data values and even data values. For example, odd data values are sensed and latched in response to one set of edges of the system clock, and even data values are sensed and latched in response to complementary edges of the one set of edges of the system clock.

Figure 8:
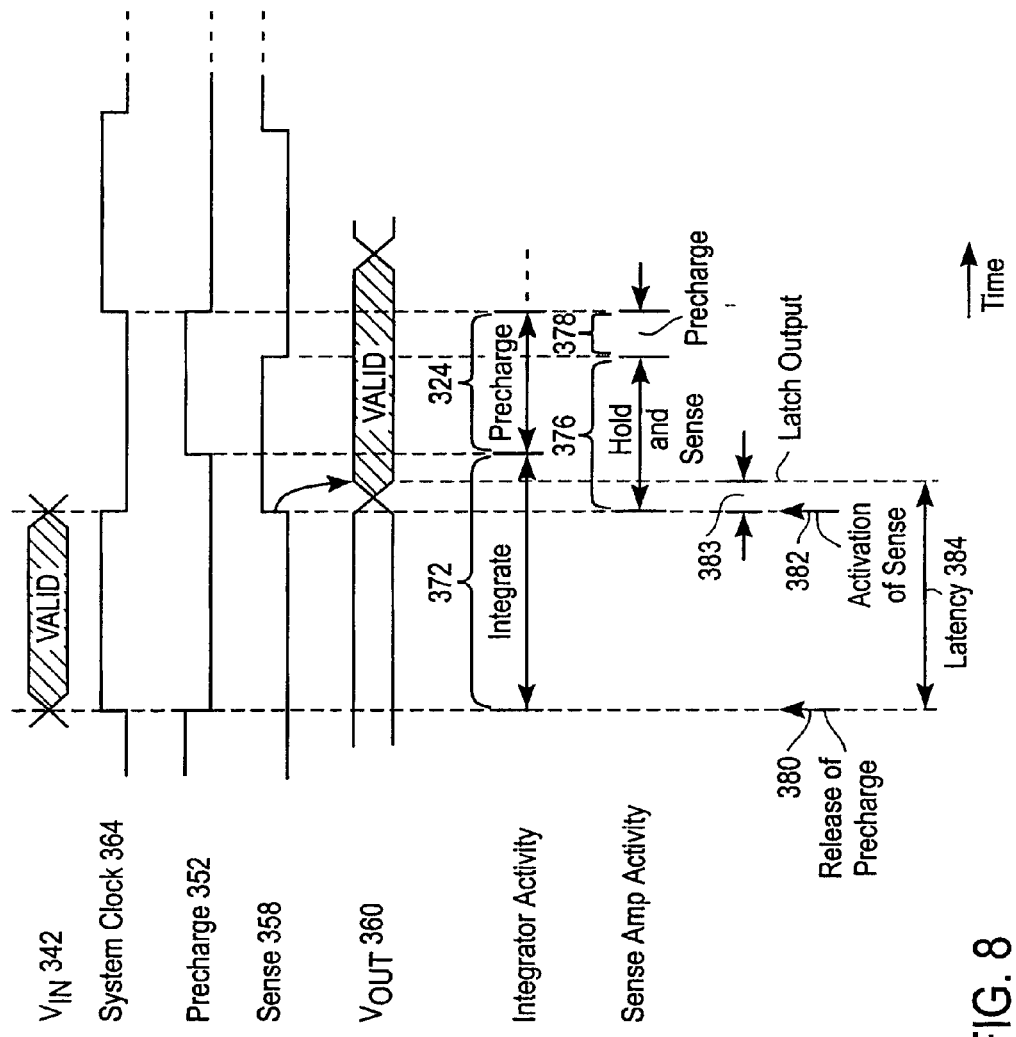
FIG. 8 is a timing diagram of the integrating receiver of FIG. 7A.

As shown in FIG. 8, the timing of the integrating receiver 330 reduces the input-to-output latency as compared to the receiver of FIG. 3A. FIG. 8 shows the relationship between a system clock 364, the input signal $V_{IN}$ 342, the precharge signal 352, the sense signal 358 and the integrating receiver output voltage $V_{OUT}$. The timing diagram for $V_{IN}$ 342 and $V_{OUT}$ 360 also applies to the complementary signals $V_{IN\_B}$ 344 and $V_{OUT\_B}$ 362. However, for simplicity, $V_{IN\_B}$ 344 and $V_{OUT\_B}$ 362 are not shown.

The precharge signal 352 defines two phases of activity for the integrator 334—integrate 372 and precharge 374. The sense signal 358 defines two phases of activity for the sense amplifier and latch 336—hold-and-sense 376 and precharge 378. Two timing events define the boundaries for these phases. The first timing event is the Release of Precharge 380 which starts the integration phase during which the integrator 334 integrates the input signal from the preamplifier 332. The second timing event is the Activation of Sense 382 for the sense amplifier 336, which causes the sense amplifier and latch 336 to resolve the differential integration voltages from the integrator 334 and hold the results. The integration phase 372 of the integrator 334 (FIG. 7) overlaps the hold-and-sense phase 376 of the sense amplifier 336 (FIG. 7) to provide a stable input signal to the sense amplifier and latch 336 (FIG. 7). Because of the overlap between the hold-and-sense phase 376 and the integration phase 372, from the perspective of the sense amplifier 336 (FIG. 7), integration is ended when the sense amplifier 336 (FIG. 7) is activated in response to the rising edge of the sense signal 358, even though the integrator 334 continues to integrate. The output from the sense amplifier and latch 336, $V_{OUT}$ 360 and $V_{OUT\_B}$ 362, is valid shortly after Activation of Sense 382, thereby reducing the input-to-output latency 384 of the integrating receiver by eliminating the separate hold phase.

The timing of the integrating receiver reduces the input-to-output latency because no timing edges control the flow of the sensed data after the activation of sense 382. The output voltages, $V_{OUT}$ 360 and $V_{OUT\_B}$ 362, are available after the propagation delay (the clock-to-Q delay) of the sense amplifier and latch, where the clock-to-Q delay begins at the activation of sense 382. In this way, the input-to-output latency of the receiver is reduced. As shown in FIG. 8, the input-to-output latency 384 is substantially less than the period of the system clock 364. Because the input-to-output latency is reduced, the performance of the system can be increased.

Figure 9:
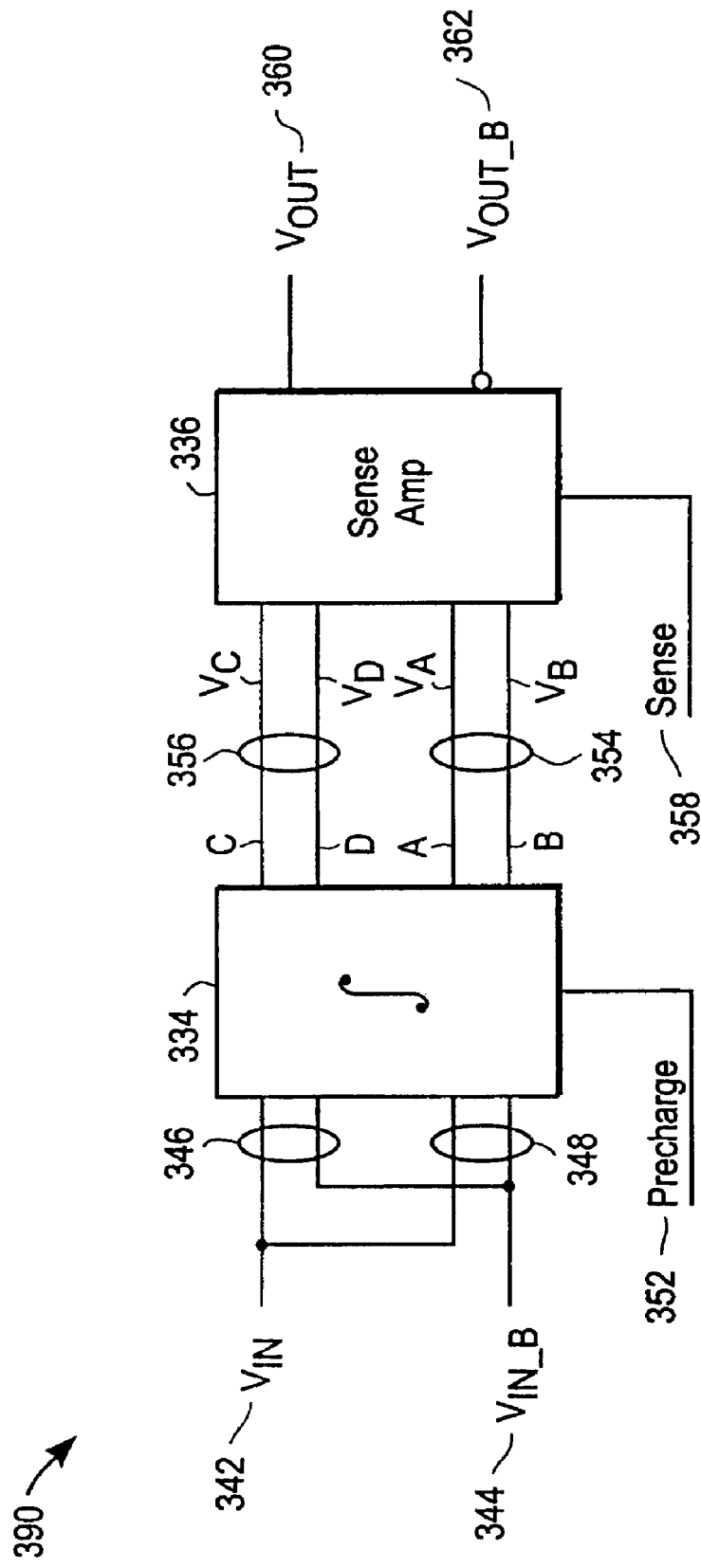
FIG. 9 is a block diagram of the integrating receiver of FIG. 6 according to an alternate embodiment of the present invention.

In FIG. 9, an alternate embodiment of an integrating receiver system 390 of the present invention eliminates the preamplifier 332 of FIG. 7, and uses the integrator 334 and the sense amplifier 336 as described above. Rather than receiving input signals from the preamplifier, the integrator 745 receives the input signals $V_{IN}$ 342 and $V_{IN\_B}$ 344 directly from an external data bus on both differential input pairs 346, 348. In other words, the lines receiving differential input signals $V_{NDATA}$ and $V_{PDATA}$ (FIG. 7) now receive input $V_{IN}$ 342 (FIG. 9), and the lines receiving differential input signals $V_{NDATA\_B}$ and $V_{PDATA\_B}$ (FIG. 7) now receive $V_{IN\_B}$ 344 (FIG. 9). The sense amplifier 336 provides the output of the integrating receiver, $V_{OUT}$ 360 and $V_{OUT\_B}$ 362 for use by subsequent circuit stages. The timing diagram of FIG. 8 also applies to the block diagram of FIG. 9.

By eliminating the preamplifier, the input-to-output latency can be further reduced because precharge can be asserted earlier in the data cycle because the input to the integrator becomes valid earlier. In addition, the integrating receiver 390 has reduced circuit complexity, uses less power, die space is saved and is less expensive than the integrating receiver of FIG. 7.

Circuits that implement each block of FIGS. 7 and 9 will now be described.

Preamplifier

Figure 10:
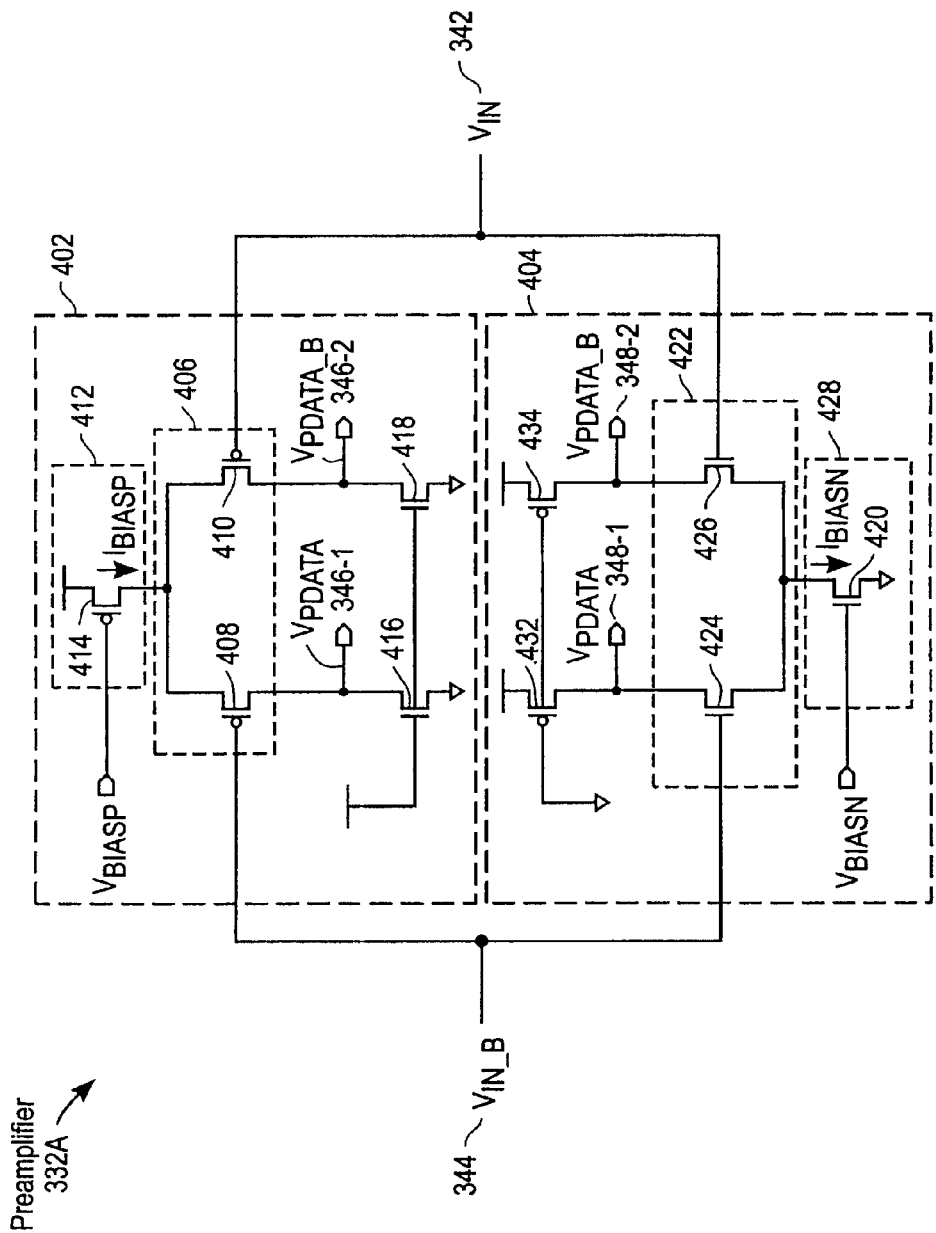
FIG. 10 is a circuit diagram of a preamplifier according to an embodiment of the present invention of FIG. 7A.

FIG. 10 illustrates the preamplifier of FIG. 7, according to one embodiment of the present invention. The preamplifier 332A improves the operation of the integrating receiver by reducing its sensitivity to asymmetries in the input voltage swing by supplying conditioned signals to the integrator based on the input signal. Asymmetric swings in the integrator input voltage can cause errors in the output voltage and timing. The preamplifier 332A allows the voltage swing of the input signal to be reduced while maintaining saturated integrator operation for a given integration current and integration capacitance as the preamplifier 332A provides some gain. As a further advantage, the preamplifier 332A helps to ensure that the inputs to the integrator have a common mode voltage sufficient to maintain saturated current steering as well as current source saturation in the integrator. Fully saturated current steering improves the gain of the integrator.

In single ended signaling schemes, in which one input is a fixed voltage reference rather than the complement of the input signal, the preamplifier 332A reduces timing offsets because the preamplifier 332A provides "pseudo-differential" output signals in which the outputs appear to be differential. As defined above, the common mode of two signals is the average value of the two signals. The common mode of the pseudo-differential output signals changes for single-ended signaling schemes. In contrast, the common mode for differential signaling using $V_{IN}$ 342 and $V_{IN\_B}$ 344 remains substantially unchanged. Using a preamplifier in a single-ended signaling scheme provides output signals that more closely approximate differential output signals and therefore reduces the effect of common mode.

In FIG. 10, the preamplifier 332A receives external input signals $V_{IN}$ and $V_{IN\_B}$, 342 and 344. The preamplifier 332A has two amplifier sections, the p-section 402 and the re-section 404. Each amplifier section 402, 404 receives both input signals $V_{IN}$ and $V_{IN\_B}$, 342 and 344, respectively. The p-section 402 provides differential outputs $V_{PDATA}$ 346-1 and $V_{PDATA\_B}$. The n-section 404 provides differential outputs $V_{NDATA}$ 348-1 and $V_{NDATA\_B}$ 348-2.

In the p-section 402, a p-section amplifier 406 includes a differential PMOS pair which differentially receives input signals $V_{IN}$ 342 and $V_{IN\_B}$ 344. The differential PMOS pair includes PMOS transistors 408 and 410. A PMOS current source 412 is coupled between the sources of the transistors of the PMOS pair 406 and the supply voltage $V_{DD}$. The PMOS current source 412 is a PMOS transistor 414 that is responsive to a PMOS bias voltage $V_{BIASP}$ which determines a PMOS bias current $I_{BIASP}$.

NMOS load transistors 416, 418 are coupled between the drains of the PMOS transistors of the PMOS pair 408, 410, respectively, and ground. The gate of each NMOS load transistor 414, 416 is connected to the supply voltage $V_{DD}$, so that the NMOS load transistors 414, 415 operate in the linear region as resistors. Alternately, resistors may be used. The differential output of the p-section amplifier, $V_{PDATA}$ 346-1 and $V_{PDATA\_B}$ 346-2 is supplied by the drains of the transistors of the PMOS pair 408, 410. Preferably, during operation of the p-section amplifier 402, the common mode voltage of the input signals $V_{IN}$ 342, $V_{IN\_B}$ 344 is low with respect to $V_{DD}$, e.g., between ground and $V_{DD}/2$.

In an n-section amplifier 422, a differential NMOS pair of NMOS transistors 424, 426 differentially receives the input signals $V_{IN}$ 342 and $V_{IN\_B}$ 344. An NMOS current source 428 is coupled between the sources of the pair of NMOS transistors 424, 426 and circuit ground. The NMOS current source 428 is an NMOS transistor 430 that is responsive to an NMOS bias voltage $V_{BIASN}$ which determines an NMOS bias current $I_{BIASN}$. PMOS load transistors 432, 434 are coupled between the drains of the NMOS transistors of the differential NMOS pair 424, 426, respectively, and ground and operate in the linear region. The gate of each PMOS load transistor 432, 434 is connected to ground. The outputs, $V_{NDATA}$ 348-1 and $V_{NDATA\_B}$ 348-2, of the n-section amplifier 404 are supplied by the drains of the transistors of the NMOS pair 424, 426. Preferably, during operation of the n-section amplifier 404, the common mode voltage of the input signals $V_{IN}$ 342, $V_{IN\_B}$ 344 is high with respect to ground, e.g., between ($V_{DD}/2$) and $V_{DD}$.

Using two differential amplifier sections 402, 404 results in a preamplifier capable of handling a wide range of input common mode voltages at least equal to a range between the supply voltages, $V_{DD}$ and ground. The bias voltages $V_{BIASP}$ and $V_{BIASN}$ are selected to operate the current source transistors in saturation and provide a common mode range between zero (circuit ground) and the supply voltage $V_{DD}$. Alternately, to select input voltage thresholds, the bias voltages can be selected to not operate either one of or both the current source transistors in saturation. In another alternate embodiment, the bias voltages are adjusted during operation to dynamically change the common mode range.

Integrator

Figure 11A:
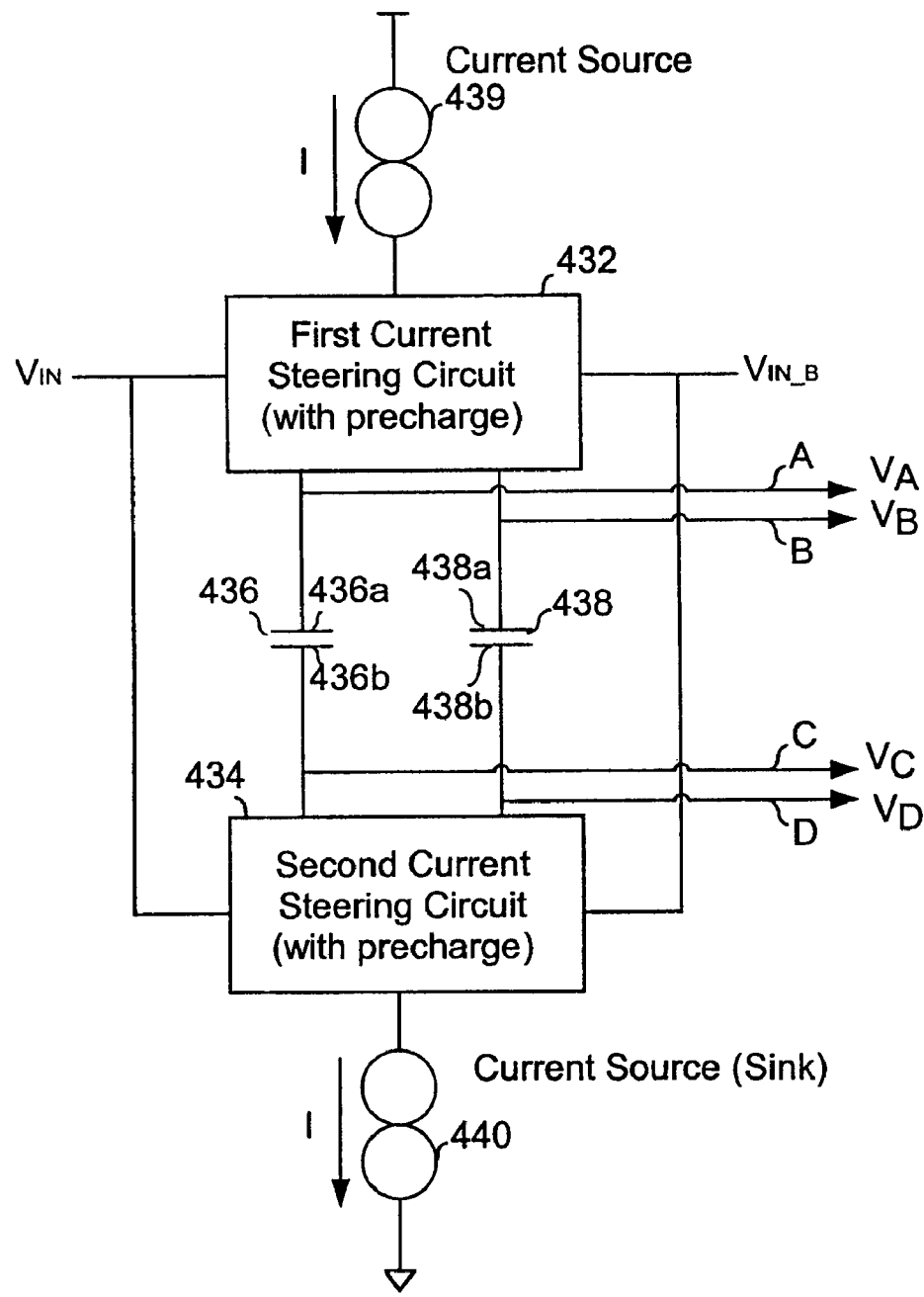
FIG. 11A is a block diagram of an integrator according to an embodiment of the present invention of FIGS. 7A and 9.

As shown in FIG. 11A, in one embodiment, the present invention provides an integrator 334A with a wide common mode range and a large output voltage swing. The integrator 334A generates differential output voltages, $V_A$ and $V_B$, $V_C$ and $V_D$, that are proportional to a predetermined amount of integration current I, rather than the input voltage. In response to the voltage of the input signal $V_{IN}$ 342, first and second current steering circuits 432, 434, steer the predetermined integration current to charge or discharge a pair of capacitive elements 436, 438 which are connected back-to-back. In particular, the current steering circuits 432, 434 charge and discharge the nodes 436A and 436B, and 438A and 438B of the capacitive elements 436, 438, respectively, via the first and second integrator current sources 439, 440, respectively.

As will be seen below, because the first current steering circuit 432 is implemented with PMOS transistors, and the second current steering circuit 434 is implemented with NMOS transistors, the integrator 334 has a wide common mode range, and is, therefore, applicable to a broader range of transmitted data. In addition, by integrating on both sides of the capacitive elements 436, 438, the invention provides a larger output voltage swing and thus a larger voltage gain than is obtained when one side of the capacitive elements 436, 438 is connected to a fixed voltage in a conventional configuration. Because either one of the current steering circuits 432, 434 may integrate the back-to-back capacitive elements 436, 438, the integrator 334 is also less sensitive to asymmetry of the input signal if the voltage of the input signal $V_{IN}$ 342 is outside a range that activates one of the current steering circuits.

The integrator 334 will next be explained with respect to the circuit diagrams of FIG. 11B and FIG. 11C, and then will be explained in more detail with respect to the circuit diagram of FIG. 12. The integrators 334A and 334B of FIGS. 11A and 11B, respectively, correspond to the integrator 334 of FIG. 9.

Figure 11B:
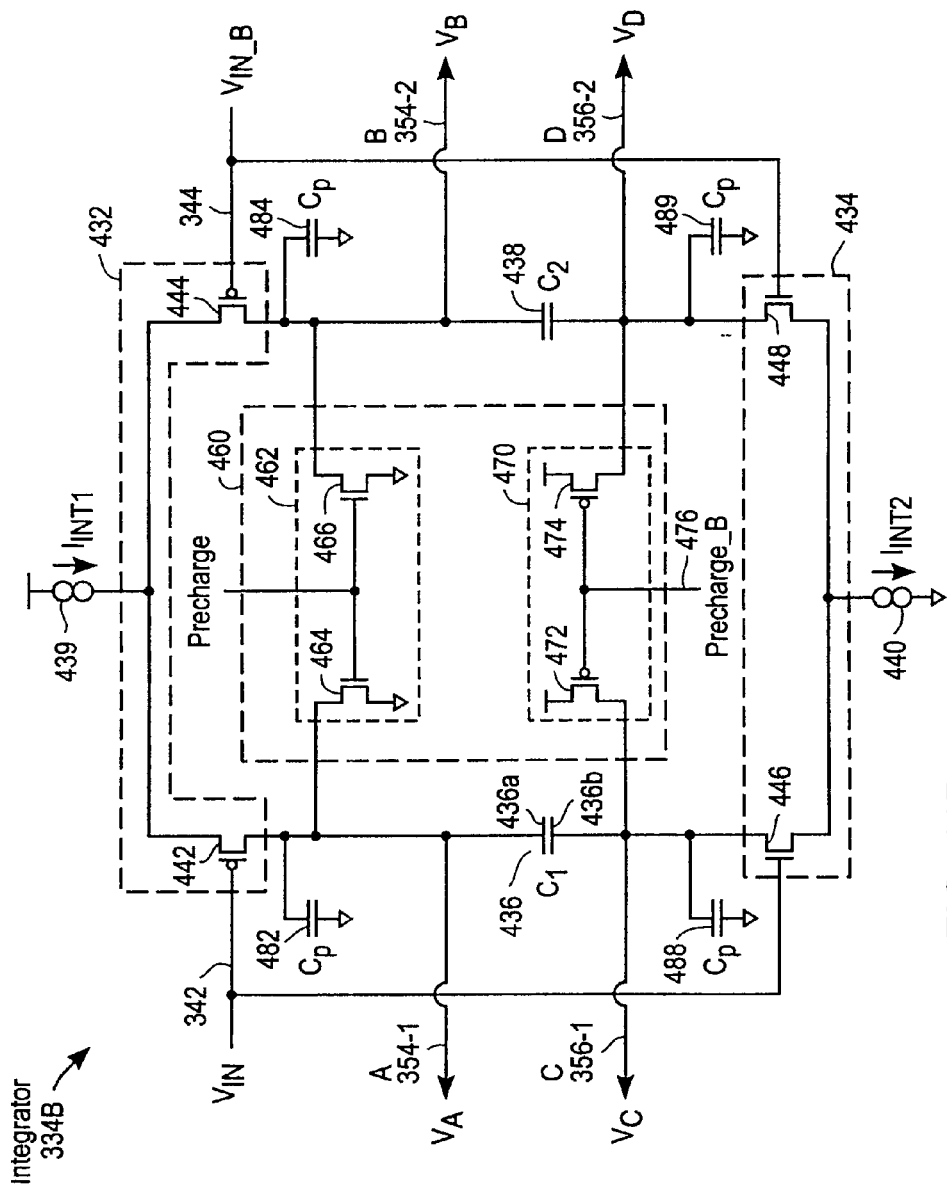
FIG. 11B is a circuit diagram of an integrator according to an embodiment of the present invention of FIGS. 7A and 9.

In FIG. 11B, the integrator 334A of FIG. 11A is shown in more detail. The integrator 334B directly receives the differential input signals $V_{IN}$ 342 and $V_{IN\_B}$ 344, and outputs two pairs of differential voltages $V_A$ and $V_B$, $V_C$ and $V_D$. The first current steering circuit 432 includes a pair of PMOS transistors 442, 444; and the second current steering circuit 434 includes a pair of NMOS transistors 446, 448. The current steering circuits 432, 434 receive the input signals $V_{IN}$ 342 and $V_{IN\_B}$ 344. The first integrator current source 439 is coupled between the sources of the PMOS transistors 442, 444 and the supply voltage $V_{DD}$, and supplies a current $I_{INT1}$. The second integrator current source 440 is coupled between the sources of the NMOS transistors 446, 448 and ground, and sinks an amount of current $I_{INT2}$. Preferably the amount of current $I_{INT1}$ from the first integrator current source 439 is the same as the amount of current $I_{INT2}$ from the second integrator current source 440. The first capacitive element $C_1$ 436 is connected between the drain of PMOS transistor 442 and the drain of NMOS transistor 446. The drain of the PMOS transistor 442 is Node A 354-1 and outputs voltage $V_A$. The drain of NMOS transistor 446 is Node C 356-1 and outputs voltage $V_C$. A second capacitive element $C_2$ 438 is connected between the drain of PMOS transistor 444 and the drain of NMOS transistor 448. The drain of the PMOS transistor 444 is Node B 354-2 and outputs voltage $V_B$. The drain of NMOS transistor 448 is Node D 356-2 and outputs voltage $V_D$.

The timing diagram of FIG. 8 applies to this integrator circuit 334. As discussed above, the integrating activity has two phases, Integrate and Precharge as defined by the precharge signal.

A precharge circuit 460 is coupled to output nodes A, B, C and D. In an A-B precharge circuit 462, a pair of NMOS transistors 464, 466 are coupled to nodes A and B, respectively. To precharge nodes A and B when the precharge signal is high, the NMOS transistors 464, 466 pull output nodes A and B to ground. Therefore the voltages $V_A$ and $V_B$ will be precharged to the circuit ground. In a C-D precharge circuit 470, a pair of PMOS transistors 472, 474 are coupled to output nodes C and D, respectively. When the complement of the precharge signal, Precharge_B 476, is low, the PMOS transistors 472, 474 pull output nodes C and D to the supply voltage $V_{DD}$; therefore the voltages $V_C$ and $V_D$ will be precharged to the supply voltage $V_{DD}$.

In the current steering circuits 432, 434, complete steering of the input transistors 442-448 ensures that the integrator's output voltage will be directly proportional to the polarity of the differential input voltages during the integration interval, rather than being directly proportional to the amplitude of the differential input voltages. During operation, the input transistors may not be fully steered; and the common mode of the input voltages affects the steering of the input transistors. The input voltages $V_{IN}$ and $V_{IN\_B}$ have three common mode ranges, and each common mode range has a different effect on the integrator 334. The common mode ranges will be described with respect to input signal $V_{IN}$, but also apply to the complementary input signal $V_{IN\_B}$. For input signal $V_{IN}$, the first range of common mode voltages is that range near ground which activates PMOS transistor pair 442, 444, but is not sufficiently high to appreciably activate NMOS transistor pair 446, 448. In this first range of common mode voltages, the second integrator current source 440 may not be operating in the saturation region and this may provide less current.

The second range of common mode voltages is that range near the supply voltage which activates the NMOS transistor 446 but is not sufficiently low to appreciably activate the PMOS transistor 442. In this second range of common mode voltages, the first integrator current source 440 may be unable to supply the integration current $I_{INT1}$.

The third range of voltages is a middle range in which both the NMOS and PMOS transistors 446, 442, respectively, are activated, and each current source 439, 440 supplies its respective amount of current. In this third range, the respective nodes 436A and 436b of the capacitive element 436 are charged with current $I_{INT1}$ and discharged with current $I_{INT2}$.

The output of the integrator 334 is the voltage difference between node A and node B added to the voltage difference between nodes C and D. In other words, the output of the integrator 334 can be defined by the following relationship:

$$(V_A - V_B) + (V_C - V_D).$$

Figure 4:
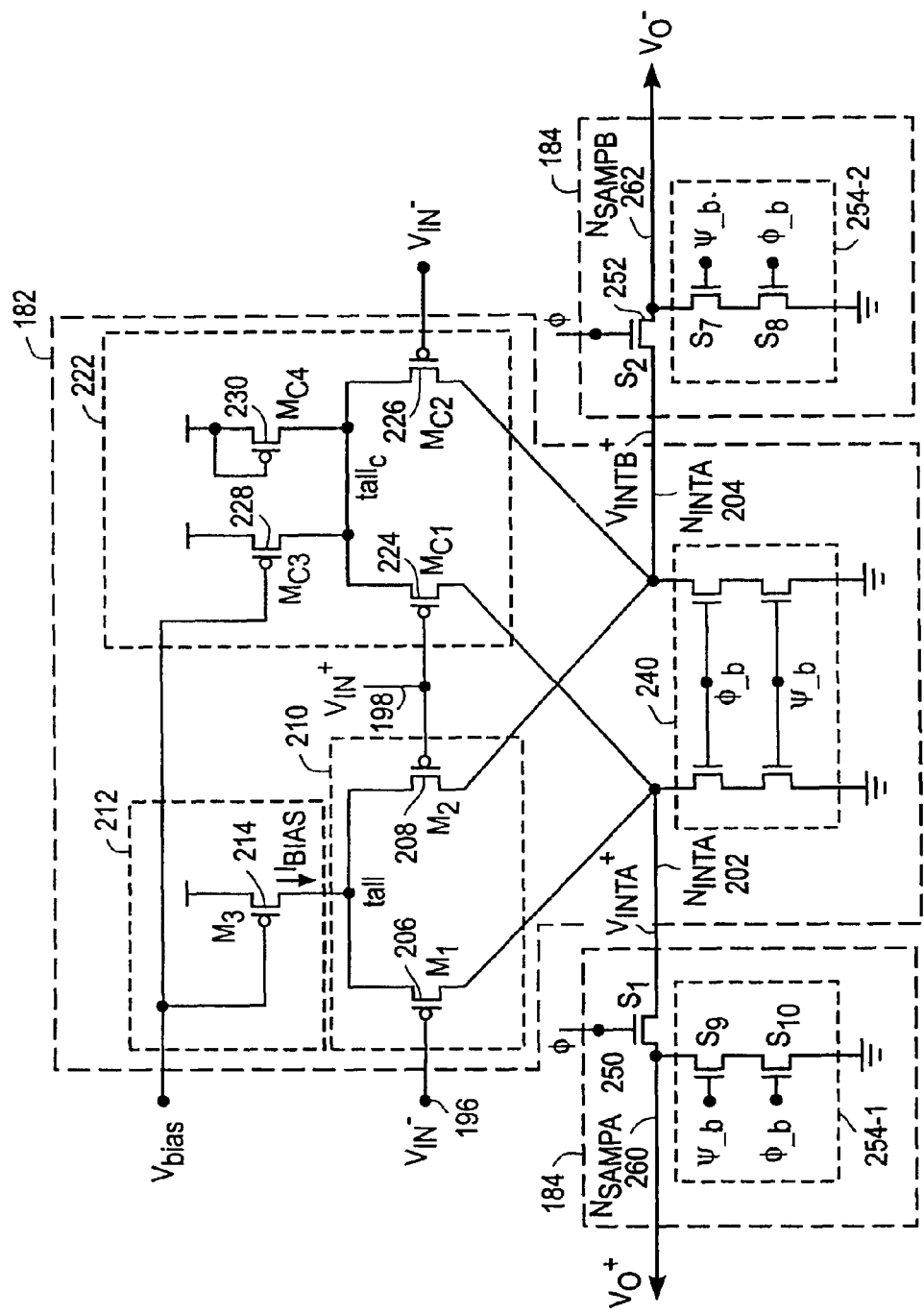
FIG. 4 is a circuit diagram of an integrator and a sample and hold circuit used in the integrating receiver of FIG. 3A.
Figure 5:
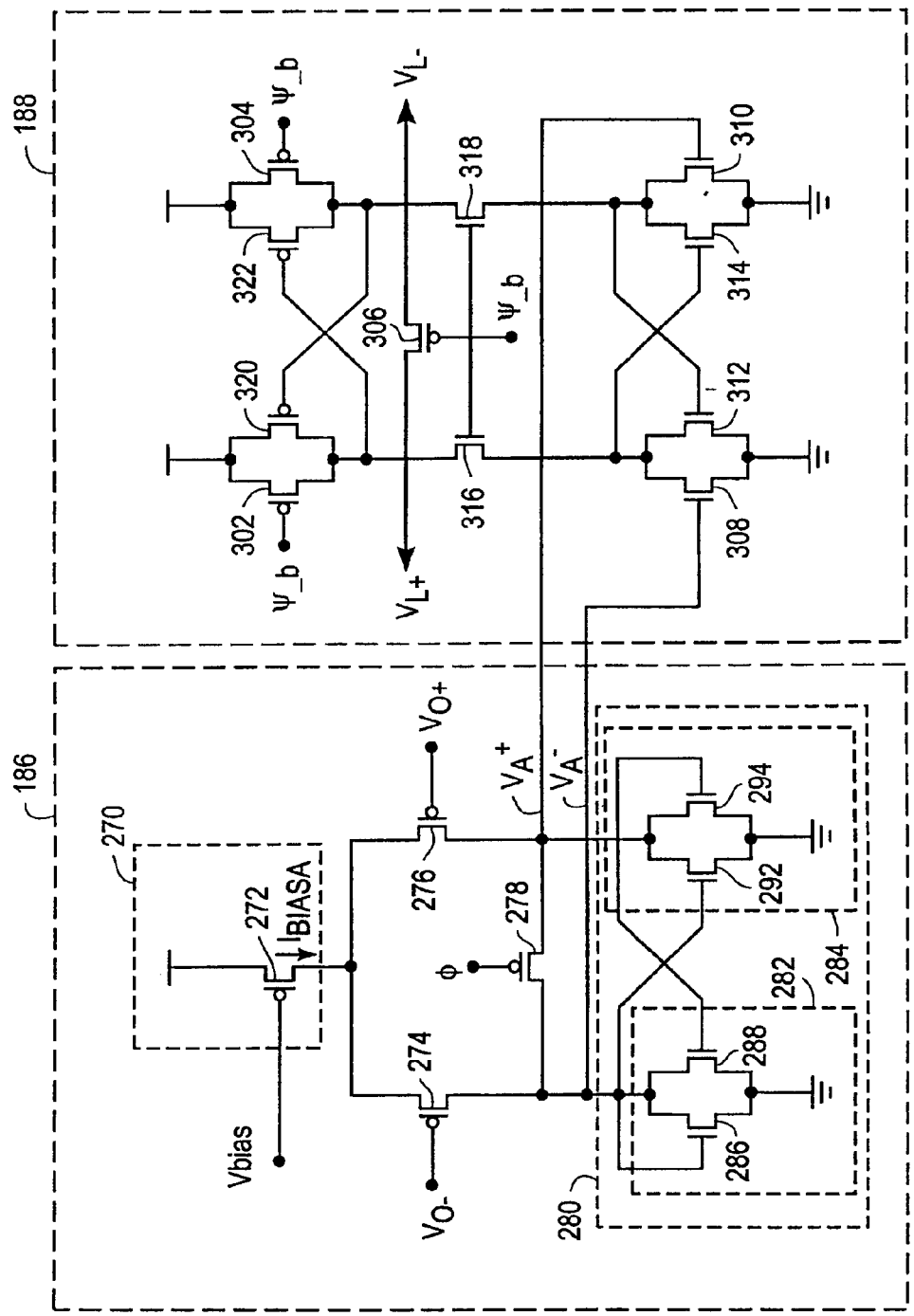
FIG. 5 is a circuit diagram of an amplifier and latch of the integrating receiver of FIG. 3A.

The integrator 334B of the present invention outputs a differential voltage between at least two pairs of nodes and uses at least two current sources. By contrast the prior art integrator discussed above with reference to FIG. 4 outputs a differential voltage between only one pair of nodes and uses one current source. The integrator 334B of the present invention also has at least one pair of transistors that are active in any range of common mode voltages. Preferably, the integrator 334B operates in the third range of common mode voltages in which both current sources charge and discharge the respective nodes of the capacitive elements to increase the gain of the integrator and improve voltage sensitivity.

The amplitude of the differential input voltage swing, $vDM=(V_{IN}-V_{IN\_B})$, is another factor considered in the operation of the integrator. Ideally, the integrator 334 operates based on the polarity of the differential input voltage; and, the magnitude of the differential input voltage swing vDM does not affect the operation of the integrator 334. However, in practice, the magnitude of the differential input voltage vDM affects the operation of the integrator 334. If the magnitude of the differential input swing vDM is not sufficiently large, the input transistor pairs 442, 444, 446 and 448 will not be fully steered and will not act like perfect switches in steering the full amount of current to or from its respective integration node.

Placing the first capacitive element 436 between nodes A and C and the second capacitive element 438 between nodes B and D improves the effective circuit gain in the third or middle range of voltages. The first capacitive element 436 has capacitance $C_1$ and the second capacitive element 438 has capacitance $C_2$. Preferably the first and second capacitive elements have the same capacitance.

The circuit gain G of the integrator 334B is defined as the current I divided by the differential input voltage vDM (i.e., I/(vDM)). The ratio of the circuit gain G to the integration capacitance C, or G/C, is another parameter considered in the integrator operation. The output voltage of the integrator 334B is directly proportional to the circuit gain G and the ratio G/C. The larger the circuit gain and the ratio G/C, the larger the output voltage that is presented to the sense amplifier while maintaining the input transistor pairs in saturation for a given charging or discharging current ($I_{INT\text{-}1}$, $I_{INT\text{-}2}$) and capacitance ($C_1$, $C_2$). When the input pairs 442, 444, and 446, 448 are in switched with large ΔV, the ratio G/C approaches the value 2I/C for the circuit of FIG. 11A, where the current $I_{INT1}$ is equal to the current $I_{INT2}$ with value I, and that current I from the current sources flows to a single capacitor at any time, i.e., perfect switching.

In the circuit of FIG. 11B, the value of the ratio G/C approaches that of perfect switching because the effects of imperfect switching are substantially reduced. During imperfect switching, the portion of integration current not steered to the intended capacitive element is used to charge the other capacitive element. For example, if 0.6I rather than I flows through transistor 442 and capacitive element 436, then 0.4 I would flow through transistor 444 and to capacitive element 438. In other words, the portion of current not flowing into capacitive element 436 is used to charge capacitive element 438. Similarly, if 0.6I flows through transistor 448 from capacitive element 438, then 0.4I flows through transistor 446 from capacitive element 436. In other words, the portion of current not flowing from capacitive element 438 is used to discharge capacitive element 436. Therefore, the charging current for each capacitive element approaches I to maximize the ratio G/C.

Parasitic capacitance Cp, represented by capacitors 482, 484, 486 and 488, on the integration nodes A, B, C and D, respectively, reduces the value of the ratio G/C from the ideal value because the current intended to charge the respective capacitive element is also used to charge or discharge the parasitic capacitance on those nodes.

Figure 11C:
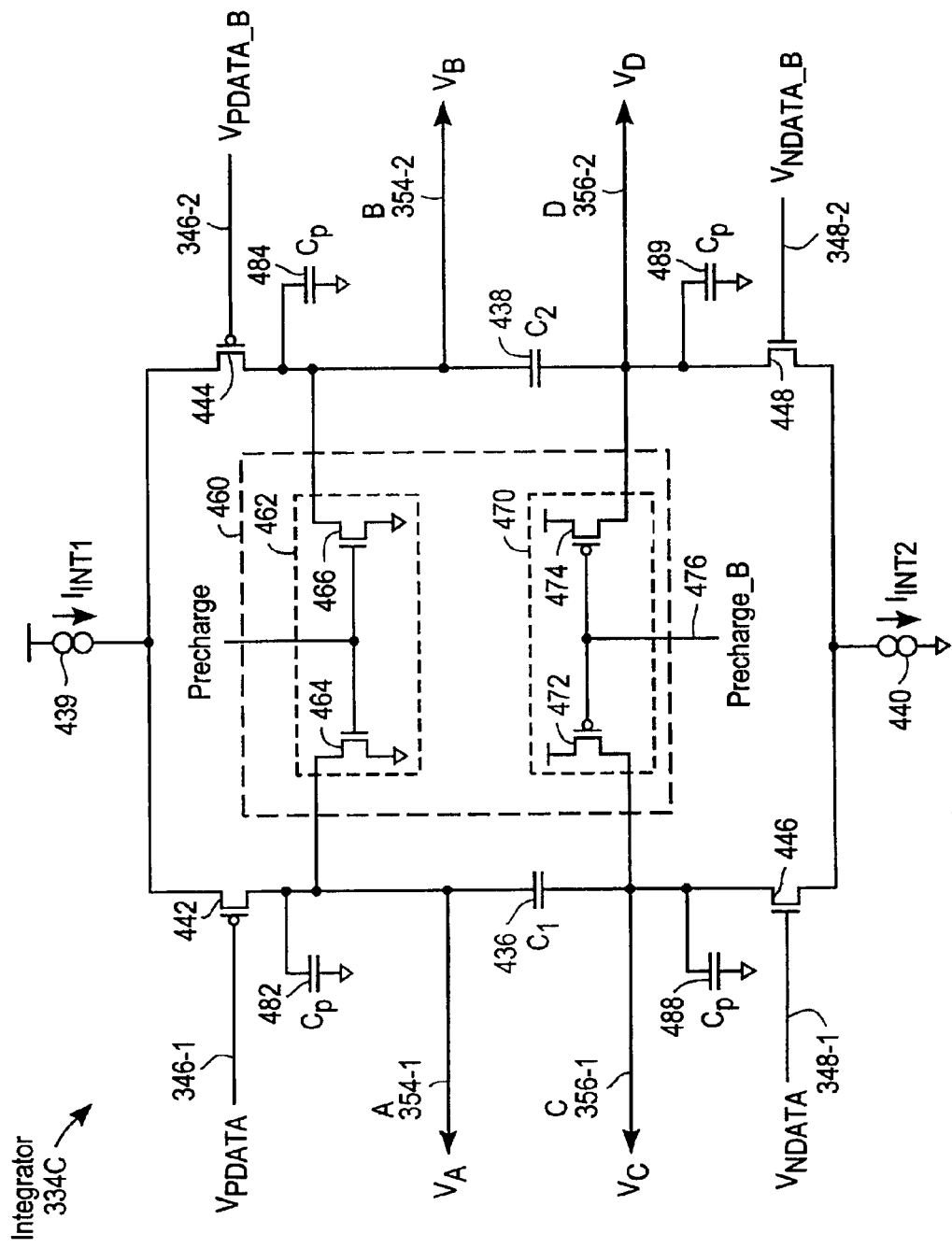
FIG. 11C is a circuit diagram of the integrator of FIG. 11B modified to receive two differential output signals from the preamplifier of FIG. 10 in accordance with the integrator of FIG. 7A.

In an alternate embodiment shown in FIG. 11C, the integrator 334B of FIG. 11B is modified to operate with the preamplifier of FIG. 10. Because the integrator 334C of FIG. 11C is used with the preamplifier, the common mode range of the integrator 334C is improved. The integrator 334C receives two pairs of differential output signals $V_{PDATA}$ and $V_{PDATA\_B}$, and $V_{NDATA}$ and $V_{NDATA\_B}$ from the preamplifier. PMOS input transistors 442 and 444 receive $V_{PDATA}$ and $V_{PDATA\_B}$, and NMOS input transistors 446 and 448 receive $V_{NDATA}$ and $V_{NDATA\_B}$, respectively.

Figure 12:
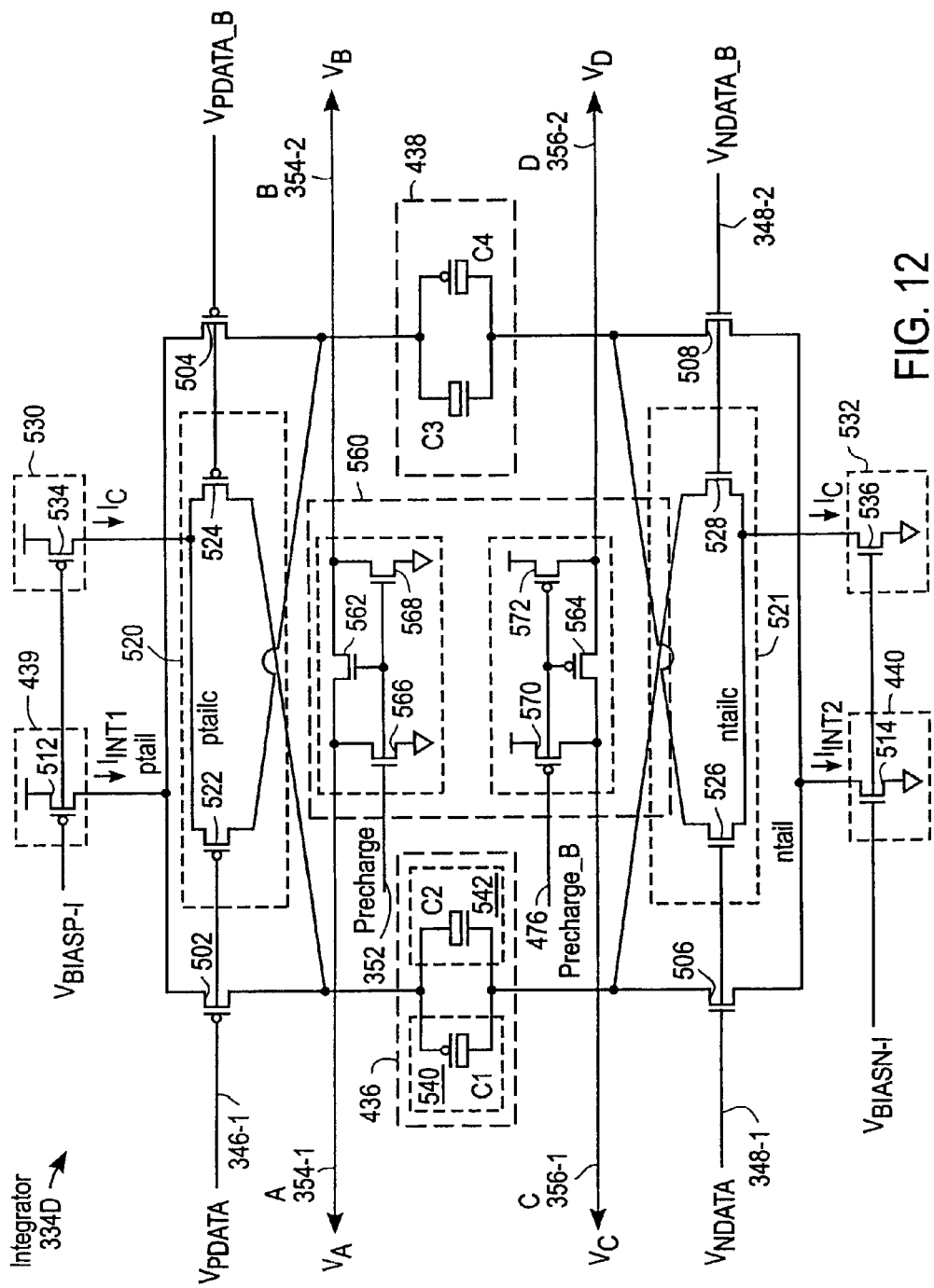
FIG. 12 is a circuit diagram of an integrator according to an alternate embodiment of the integrator of FIG. 7A.

In FIG. 12, another embodiment of the integrator 334D of the present invention compensates for the effects of parasitic capacitance. The integrator 334D receives the two pairs of differential output voltages from the preamplifier, $V_{PDATA}$ and $V_{PDATA\_B}$, $V_{NDATA}$ and $V_{NDATA\_B}$, and outputs two pairs of differential voltages $V_A$ and $V_B$, $V_C$ and $V_D$. In the integrator 334, a first current steering circuit includes a first input differential pair of PMOS transistors 502 and 504, and a second current steering circuit includes a second input differential pair of NMOS transistors 506 and 508. The input signals to the PMOS transistors 502 and 504 are $V_{PDATA}$ and $V_{PDATA\_B}$, respectively. The input signals to the NMOS transistors 506 and 508 are $V_{NDATA}$ and $V_{NDATA\_B}$, respectively. The first and second current steering circuits were described above. The implementation of the first and second integrator current sources, 439 and 440, with a PMOS and NMOS transistor, 512 and 514, and bias voltages, $V_{BIASP\text{-}I}$ and $V_{BIASN\text{-}I}$, respectively, was also described above.

The gate to drain capacitance of the input transistors 502-508 (device overlap capacitance) causes the input signals to couple across the gates to the drains of the input transistors 502-508 and thus into the nodes A and B, and C and D. To compensate for the effects of gate to drain capacitance, first and second compensating current steering circuits 520, 521, respectively, are added to inject matching error currents into the nodes A, B, C and D.

The first compensating current 520 steering circuit includes a pair of PMOS transistors 522 and 524; and the second compensating 521 current steering circuit includes a pair of NMOS transistors 526 and 526. The first and second compensating current steering circuits 520, 521 also receive the input signals, $V_{PDATA}$ and $V_{PDATA\_B}$, and $V_{NDATA}$ and $V_{NDATA\_B}$, respectively. The PMOS transistors 522 and 524 steer current from a first compensating current source 530, while the NMOS transistors 526 and 528 steer current from a second compensating current source 532. The first and second compensating current sources 530 and 532 include transistors 534 and 536 which are biased by bias voltages $V_{BIASP\text{-}I}$ and $V_{BIASN\text{-}I}$, respectively. The first and second compensating current sources 530 and 532 supply a much smaller amount of current Ic than the integration current sources 439 and 440, respectively.

In the first compensating current steering circuit 520, the drains of the input transistors 522 and 524 are connected to nodes B and A, respectively. In other words, the drains of transistors 522 and 524 are connected in a manner opposite to the drains of the input transistors 502 and 504, respectively. In the second compensating current steering circuit 521, the drains of the other pair of input transistors 526 and 528 are connected to nodes D and C, respectively. In other words, the drains of transistors 526 and 528 are connected in a manner opposite to the drains of the input transistors 506 and 508, respectively. Connecting the drains of the input transistors of the respective compensating current steering circuit in the opposite manner to that of the current steering circuit causes the compensating current steering circuit to cancel the charge injected via the gate to drain overlap capacitance.

Parasitic capacitance on nodes ptail and ntail also causes an error by generating an erroneous charge that is injected onto one of the nodes. The compensating current steering circuits 520, 521 also provide a sufficient matching tail capacitance to charge the opposite node to substantially cancel the error from this parasitic capacitance.

The integrator 334D also includes capacitive elements 436 and 438. The capacitive elements 436, 438 are the same, and the following description of capacitive element 436 also applies to capacitive element 438. The capacitive element 436 includes a p-element C1 540 connected in parallel to an n-element C2 542. The p-element 540 is a PMOS device with its source and drain shorted together. The n-element 542 is an NMOS device with its source and drain shorted together.

A first precharge circuit 560 precharges nodes A, B, C and D as described above with respect to FIG. 8, in response to the precharge signal. In the precharge circuit 560, equalizing transistors 562, 564 are used to ensure that the respective nodes are precharged to the same potential. Precharge transistors 566-572 precharge nodes A, B, C, and D as described above with respect to FIG. 11B.

The timing diagram of FIG. 8 also applies to the integrator 334D of FIG. 12. When precharge is active, the precharge circuit 560 sets nodes A and B at the ground potential and nodes C and D to the supply voltage $V_{DD}$. During the integration interval, the precharge circuit 560 is inactive and the capacitive elements 436 and 438 are charged and discharged accordingly. The integrator of FIG. 12 has also two differential output voltages. The first differential output voltage, $V_A$-$V_B$, is supplied by nodes A and B and the second differential output voltage, $V_C$-$V_D$, is supplied by nodes C and D. Combining the first and second differential output voltages provides the total output voltage of the integrator as described in the following relationship:

$$(V_A-V_B)+(V_C-V_D).$$

In an alternate embodiment, the integrator 334D of FIG. 12 receives the inputs $V_{IN}$ and $V_{IN\_B}$ from the data bus directly without the use of the preamplifier. In this way, the preamplifier can be eliminated to save power, reduce die size and reduce the input-to-output latency. To do so, $V_{IN}$ is received rather than $V_{PDATA}$ and $V_{NDATA}$ at transistors 502 and 506; and $V_{IN\_B}$ is received rather than $V_{PDATA\_B}$ and $V_{NDATA\_B}$ at transistors 504 and 508. In another alternate embodiment, a reference voltage is supplied to the integrator 334D, rather than the complementary input signal $V_{IN\_B}$.

Figure 13:
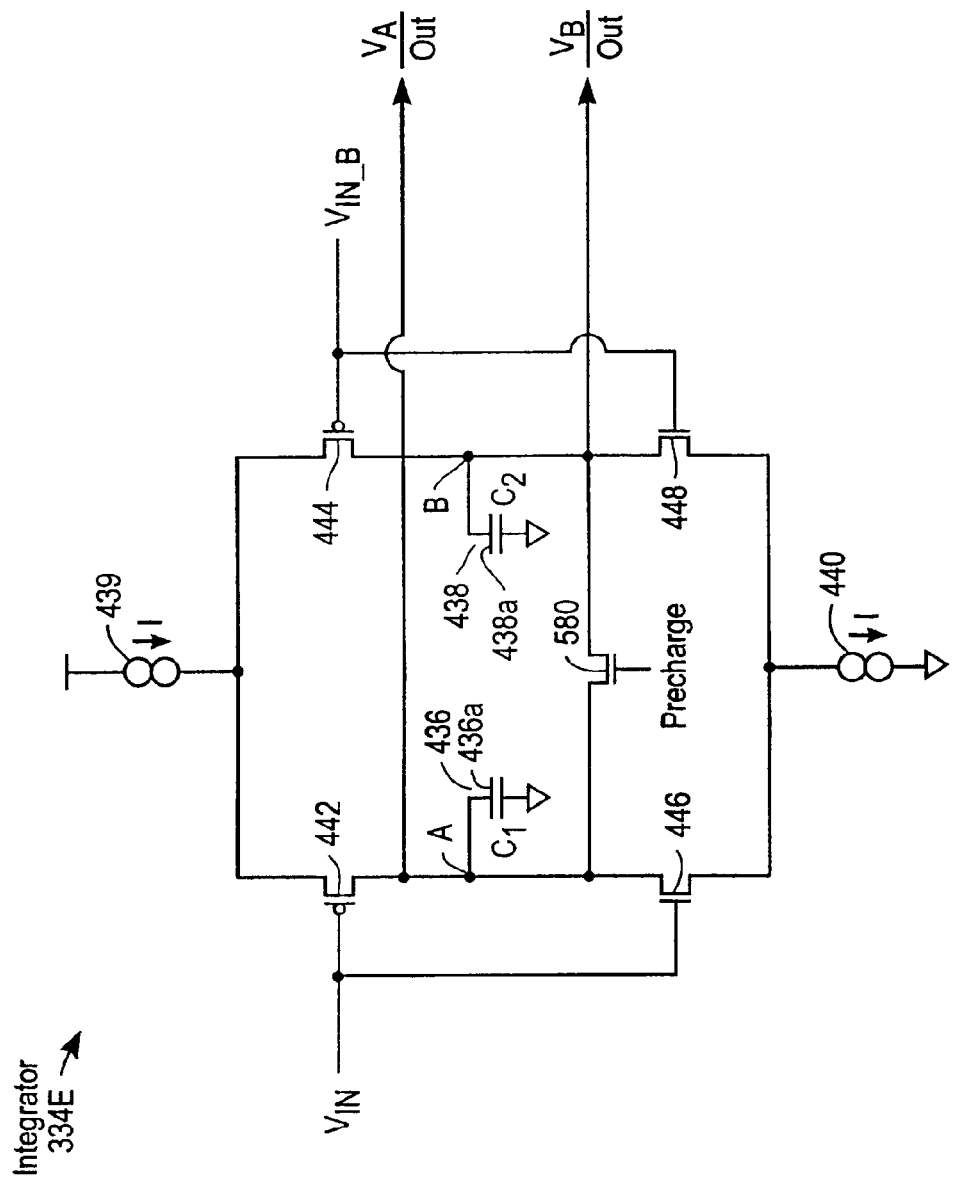
FIG. 13 is a circuit diagram of an integrator of FIG. 7A according to another embodiment of the present invention.

Referring to FIG. 13, an alternate embodiment of an integrator 334E receives the differential data signals $V_{IN}$ and $V_{IN\_B}$ and outputs one pair of differential signals $V_A$ and $V_B$. The integrator 334E of FIG. 13 is another alternate embodiment of the integrator 334 of FIG. 9. In the integrator 334E, a current steering circuit includes transistors 442, 444, 446 and 448. The current steering circuits of FIG. 13 operate in the same manner as the current steering circuits of FIG. 11B and will not be further described. The integrator current sources 439 and 440 supply the integration current I to the current steering circuit. Unlike the integrator 334B of FIG. 11B, the integration node pairs, A and C, and B and D, are connected to respective nodes 436A and 438A of the capacitive elements to provide one pair of integration nodes, A and B, respectively. Each capacitive element 436, 438 is connected between an integration node and ground. In one embodiment, the capacitive elements 436, 438 are capacitors. Alternately, the capacitive elements 436, 438 are implemented with transistors as in FIG. 12. The timing diagram of FIG. 8 also applies to the integrator 334E of FIG. 13.

An equalizing precharge transistor 580 is coupled between the integration nodes A and B. When the precharge signal is high, the equalizing precharge transistor 580 becomes active and equalizes the output voltages $V_A$ and $V_B$, ideally to a level equal to half the supply voltage, $V_{DD}/2$.

When a negative differential input voltage vDM, where vDM is equal to $V_{IN}$-$V_{IN\_B}$, sufficient to fully steer the current of the first and second input pairs, 442-44, 446-448, is received, capacitive element 436 is charged with current I and capacitive element 438 is discharged with current I. The differential output voltage $V_A$-$V_B$ is defined by the following relationship:

$$V_A-V_B=(2I/C)\cdot(\text{Integration Time}).$$

When the differential input voltage vDM is not sufficiently large to operate the input transistors in saturation and fully steer the current I from the current source into one or the other of the integration nodes A and B (partial steering), the differential output voltage $V_A$-$V_B$ is reduced. For example, if the differential input voltage vDM is such that an amount of current equal to 0.6 I flows through transistor 442, an amount of current equal to 0.4 I flows through transistor 444, an amount of current equal to 0.6 I flows through transistor 448, an amount of current equal to 0.4 I flows through transistor 446, and assuming all input transistors are matched, then the differential output voltage, $V_A$-$V_B$, is defined by the following relationship:

$$V_A-V_B=((0.6-0.4)+(0.6-0.4))\cdot(I/C)\cdot(\text{Integration Time})$$

The effects of partial steering on the differential output voltage of the circuit of FIG. 13 is substantially reduced in comparison to the circuits of FIGS. 11A, 11B, 11C and 12. In addition, the integrator of FIG. 13 precharges the integration nodes A and B to a voltage equal to one-half of the supply voltage $V_{DD}$, and does not allow for the voltage levels provided by precharging the integration nodes to ground and the supply voltage.

In an alternate embodiment, the integrator 334E of FIG. 13 is modified to receive two pairs of differential output signals $V_{PDATA}$ and $V_{PDATA\_B}$, and $V_{NDATA}$ and $V_{NDATA\_B}$ from the preamplifier of FIG. 10. PMOS input transistors 442 and 444 receive $V_{PDATA}$ and $V_{PDATA\_B}$, and NMOS input transistors 446 and 448 receive $V_{NDATA}$ and $V_{NDATA\_B}$, respectively.

Sense Amplifier

Figure 14A:
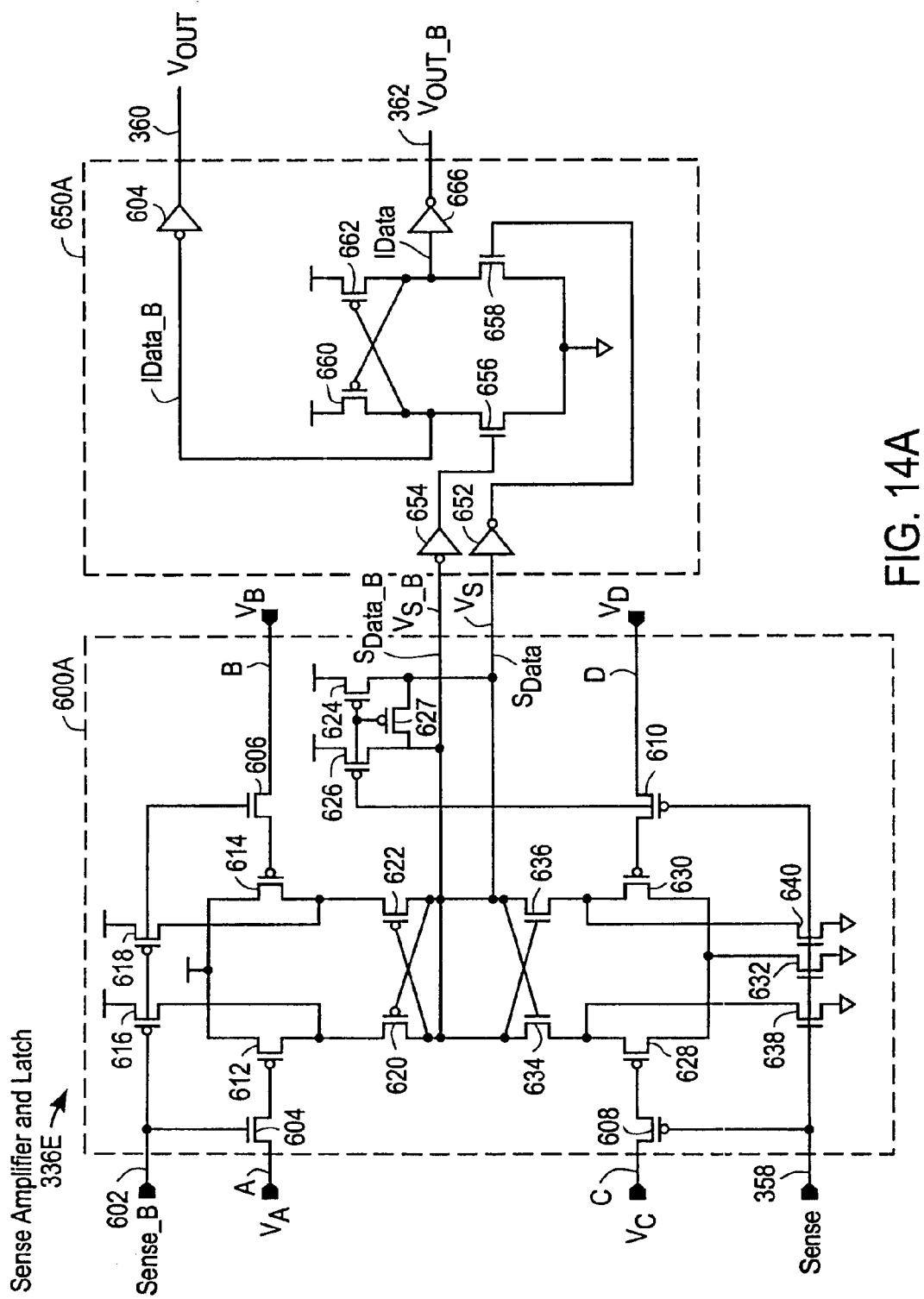
FIG. 14A is a circuit diagram of a sense amplifier and latch according to an embodiment of the present invention of FIGS. 7A and 9.

In FIG. 14A, in one embodiment of the sense amplifier and latch circuit 335 of FIGS. 7 and 9, a sense amplifier and latch circuit 336A that consumes a low amount of static power is shown. In the sense amplifier and latch circuit 336A, a sense amplifier 600A operates in accordance with the timing diagram of FIG. 8, described above, using the Sense and Sense_B signals, 358 and 602, respectively.

When the Sense_B signal 602 is high and the Sense signal 358 is low, NMOS pass transistors 604 and 606 and PMOS pass transistors 608 and 610, become active and allow the received differential input voltages $V_A$ and $V_B$, $V_C$ and $V_D$, respectively, to flow into the sense amplifier circuitry 600. A first differential input pair of PMOS transistors 612, 614 receives the differential input voltages $V_A$ and $V_B$ from the NMOS pass transistors 604, 608, respectively. The sources of the PMOS transistors 612 and 614 of this first PMOS input pair are connected to the supply voltage. When Sense_B is low, PMOS transistors 616, 618 help to charge the drains of the first PMOS input transistor pair 612, 614 to the supply voltage. When Sense_B is high, PMOS transistors 616, 618 are inactive.

A cross-coupled pair of PMOS transistors 620, 622, acts as a latch and couples the differential PMOS pair 612, 614 to the sense amplifier output nodes, sData$_B$ and sData, respectively. The drain of PMOS transistor 612 is coupled to a sense amplifier output node sData_B via PMOS transistor 620. The drain of PMOS transistor 614 is coupled to another output node of the sense amplifier, sData, via PMOS transistor 622. The gate of PMOS transistor 620 is coupled to output node sData and the gate of PMOS transistor 622 is coupled to output node sData_B. The output nodes sData and SDataB are precharged to the supply voltage when the Sense signal is low by PMOS transistors 624 and 626, respectively.

A second differential input pair, NMOS transistors 628, 630 receives the voltages $V_C$ and $V_D$ from the PMOS pass transistors 608, 610, respectively. The sources of the transistors 628, 630 of the second input pair are connected to NMOS transistor 632 at the node labeled as "tail" which drives the voltage on the sources to ground when the Sense signal is high. When the sense signal is low, NMOS transistor 632 is inactive.

Another cross-coupled transistor pair 634, 636, acts as a latch and couples the second differential input pair 628, 630 to the sense amplifier output nodes, sData_B and sData, respectively. The drain of input NMOS transistor 628 is coupled to the output node sData_B via NMOS transistor 634 and the drain of input NMOS transistor 630 is coupled to the output node sData via NMOS transistor 636. The gate of transistor 634 is coupled to output node sData and the gate of pass transistor 636 is coupled to output node sData_B.

When the Sense signal 358 is high, NMOS transistors 638, 640 help to discharge the drains of the transistors of second input pair 628, 630, respectively. When the Sense signal 358 is low, NMOS transistors 638 and 640 are inactive.

During operation when the Sense signal 358 is low, the first and second differential input pairs, 612 and 614, 628 and 630, respectively, do not provide a path for current to flow from the supply voltage to ground. During this time the sense amplifier 600 follows the voltages $V_A$, $V_B$, $V_C$ and $V_D$ supplied at the inputs to the first and second differential input pairs 612 and 614, 628 and 630, respectively.

When the Sense signal transitions high, pass transistors 604-610 become inactive. The NMOS transistor 632 becomes active and couples the tail node to ground so that current can flow through the sense amplifier 600A for a short time, thereby activating the sense amplifier 600A. During this time the sense amplifier 600A determines the output voltages $V_S$ and $V_{S\_B}$ on output nodes sData and sData_B, respectively, according to the state of the input voltages $V_A$, $V_B$, $V_C$ and $V_D$ at the time that the Sense signal 358 transitioned high. When the common mode of the input signals is out of range, PMOS transistors 616, 618 supply current to the drains of the first input pair 612, 614 and NMOS transistors 638, 640 draw current from the drains of the second input pair 628, 630, respectively.

For example, when the input voltage $V_C$ is greater than input voltage $V_D$, the NMOS input pair 628, 630 removes more current from output node sData_B than from output node sData, thereby pulling the voltage $V_{S\_B}$ on node sData_B to ground faster than the voltage $V_S$ on node sData. When the input voltage $V_A$ is greater than the input voltage $V_B$, the PMOS input pair 612, 614, supplies more current to output node sData than to output node sData_B. This tends to pull the voltage $V_S$ on node sData towards the supply voltage faster than the voltage $V_{S\_B}$ on node. While current flows from the supply voltage through NMOS transistor 632 to ground, the cross-coupled transistors 620, 622, 634, 636 will cause the voltage $V_{S\_B}$ on node sData_B to transition to ground and the voltage $V_S$ on node sData to transition to the supply voltage. As the voltage $V_{S\_B}$ on node sData_B decreases, PMOS transistor 622 sources an increasing amount of current and increases the voltage $V_S$ on the node sData. As the voltage $V_S$ on node sData increases, NMOS transistor 634 sinks an increasing amount of current and pulls the voltage $V_{S\_B}$ on node sData_B node to ground. The output voltages $V_S$ and $V_{S\_B}$ on nodes sData and sData_B stabilize rapidly and the cross-coupled pairs 620 and 622, 634 and 636 latch the state of $V_S$ and $V_{S\_B}$ and block the flow of current through the circuit from the supply voltage to ground. Therefore, the sense amplifier 600A again consumes a low amount of dynamic power, and little or no static power. The voltages $V_A$, $V_B$, $V_C$ and $V_D$ applied to the gates of the input transistors 612, 614, 628, 630 are not affected by the operation of the sense amplifier 600 which allows the differential pairs 612, 614, 628, 630 to operate properly during the sense operation.

In an alternate embodiment, the sense amplifier 600A does not include NMOS transistors 638 and 640, and PMOS transistors 616 and 618. The transistors 616 and 618, and 638 and 640, provide alternate paths for current to flow from the supply voltage to ground, respectively, when the input transistors 612 and 614, and 628 and 630 do not provide such a path. An input pair of transistors, 612 and 614, and 628 and 630, does not provide a path for current to flow when operated outside its common mode range.

Latch

In FIG. 14A, a latch circuit 650A receives and stores the output of the sense amplifier 600A. A first pair of inverters 652, 654 receive the voltages $V_S$ and $V_{S\_B}$ from the output nodes sData and sData_B, respectively from the sense amplifier 600A. A differential input pair of NMOS transistors 656, 658 receives the outputs of the first pair of inverters 654, 652, respectively. The sources of the transistors of the NMOS input pair 656, 658 are connected to circuit ground and the drains are coupled to a pair of cross-coupled transistors 660, 662 which act as a latch to store the state of the output voltages $V_S$ and $V_{S\_B}$ from the sense amplifier 600A to provide the latch outputs. To form the cross-coupled pair, the PMOS transistor 660 is coupled between the drain of input transistor 656 and the supply voltage and PMOS transistor 662 is coupled between the drain of input transistor 658 and the supply voltage. The gate of PMOS transistor 660 is coupled to the drain of input transistor 658 and the gate of PMOS transistor 662 is coupled to the drain of input transistor 656. Inverters 664, 666 connect to the output of the cross-coupled pair 660, 662 to generate the latch output voltages, $V_{OUT}$ and $V_{OUT\_B}$, respectively.

The latch 650A stores the state of the voltages $V_S$ and $V_{S\_B}$ on nodes sData and sData_B when one of the voltages $V_S$ or $V_{S\_B}$ is low. When one of the inverters of the first pair of inverters 652, 654 receives a low logic signal, that inverter drives the gate of the corresponding NMOS input transistor high causing the latch to change states if the previous state of the latch was opposite to the current state of the latch. For example, when $V_S$ at node sData is high and $V_{S\_B}$ at node sData_B is low, inverter 654 drives the gate of NMOS transistor 656 high which causes node 1Data_B to transition low and the latch output $V_{OUT}$ to transition high. When node 1Data_B is low, PMOS transistor 662 is active and node 1Data is pulled high. The operation of the latch 650A is not affected when the sense amplifier is precharged because, during precharge, the voltages output by the sense amplifier $V_S$ and $V_{S\_B}$ are pulled high.

Referring to FIGS. 10, 12 and 14A, the operation of the integrating receiver system of FIG. 7 will now be described using the preamplifier of FIG. 10, the integrator of FIG. 12 and the sense amplifier and latch of FIG. 14A.

The preamplifier 332A continuously receives the external input signals $V_{IN}$ 342 and $V_{IN\_B}$ 344 and continuously provides two pairs of differential output voltages, $V_{PDATA}$ 346-1 and $V_{PDATA\_B}$ 346-2, and $V_{NDATA}$ 348-1 and $V_{NDATA\_B}$ 348-2, to the integrator 334.

Referring also to FIG. 8, the integrator 334 operates with two phases, Integrate and Precharge according to the Precharge signal 352. During the Precharge phase, the integrator 334 precharges the voltages $V_A$ and $V_B$ at output nodes A and B, respectively, to ground, and precharges the voltages $V_C$ and $V_D$ at output nodes C and D, respectively, to the supply voltage. The integrator output nodes A and B are coupled to the A and B inputs of sense amplifier 600 and integrator nodes C and D are coupled to the C and D inputs of sense amplifier 600. The sense amplifier 600A operates in response to the Sense signal 358 of FIG. 8. While the integrator 334 and sense amplifier 600A are in their respective precharge phases, the sense amplifier 600A receives the voltages $V_A$ and $V_B$ which are at a ground potential on it's A and B nodes, respectively, and receives the voltages $V_C$ and $V_D$ which are at a supply voltage potential on its C and D nodes, respectively. The pass transistors 604-610 of the sense amplifier 600A couple the voltages $V_A$, $V_B$, $V_C$ and $V_D$ to the gates of the differential input transistors 612, 614, 628, 630 of the sense amplifier 600A, thus precharging internal nodes of the sense amplifier.

The output voltages $V_S$ and $V_{S\_B}$ of the sense amplifier 600A are held at the supply voltage by the precharge transistors 624, 626, and are equalized by an equalizing transistor 627. During precharge, the latch 650A stores the previous state output of the sense amplifier 600A and the output voltages $V_{OUT}$ and $V_{OUT\_B}$ remain unchanged.

The start of a new cycle begins with the Release of Precharge which begins the Integrate phase of the integrator 334 (FIG. 12). During this time integration nodes A, B, C, D are released from their precharged voltages and begin to change or discharge according to the polarity of input signals from the preamplifier $V_{PDATA}$, $V_{PDATA\_B}$, $V_{NDATA}$ and $V_{NDATA\_B}$ and integrating current INT, and the capacitance of the integrator 334. When the input voltage to the preamplifier $V_{IN}$ is less than $V_{IN\_B}$, the output of the preamplifier $V_{PDATA}$ has a lower voltage than $V_{PDATA\_B}$ and $V_{NDATA}$ has a lower voltage than $V_{NDATA\_B}$. The voltages $V_{PDATA}$, $V_{PDATA\_B}$, $V_{NDATA}$ and $V_{NDATA\_B}$ are supplied to the integrator 334 causing the voltage $V_A$ at node A to increase from the precharged ground potential and the voltage $V_D$ at node D to decrease from the precharged supply voltage. During the Integrate time but before the Activation of Sense, the Sense amplifier 600 follows the voltages $V_A$, $V_B$, $V_C$ and $V_D$ at nodes A, B, C and D, respectively. After a predetermined integration time, the Activation of Sense event occurs, which prevents the sense amplifier 600 from following the voltages $V_A$, $V_B$, $V_C$ and $V_D$ and causes the sense amplifier 600A to generate output voltages $V_S$ and $V_{S\_B}$ which represent the state of the voltages present on the input transistor pairs of the sense amplifier at the time the Activation of Sense event occurred. For example, the voltage $V_S$ at node sData becomes a logical one and voltage $V_{S\_B}$ at node sData_B becomes a logical zero. A short time after the sense amplifier 600A determines the logical state of its outputs, latch 650 changes state, if necessary, to cause output the voltage $V_{OUT}$ as a logical one and $V_{OUT\_B}$ as a logical zero.

A short time after the Activation of Sense event, the integration nodes A, B, C and D are precharged for the next cycle, and slightly before the end of the cycle the sense amplifier 600A returns to its sampling state to prepare for the next cycle. The inputs to the differential input pairs of the sense amplifier 600A are also precharged through their respective pass gate transistors during this time.

The latch 650 thus outputs voltages $V_{OUT}$ and $V_{OUT\_B}$ representing a CMOS equivalent of the polarity of input signals, $V_{IN}$ and $V_{IN\_B}$, shortly after the Activation of Sense event. The input-to-output latency 384 of this integrating receiver is approximately equal to the time between the Release of Precharge 380 and Activation of Sense 384 plus the time from Activation of Sense to sense amplifier and latch output 383.

Alternate Embodiment of the Sense Amplifier and Latch

Figure 14B:
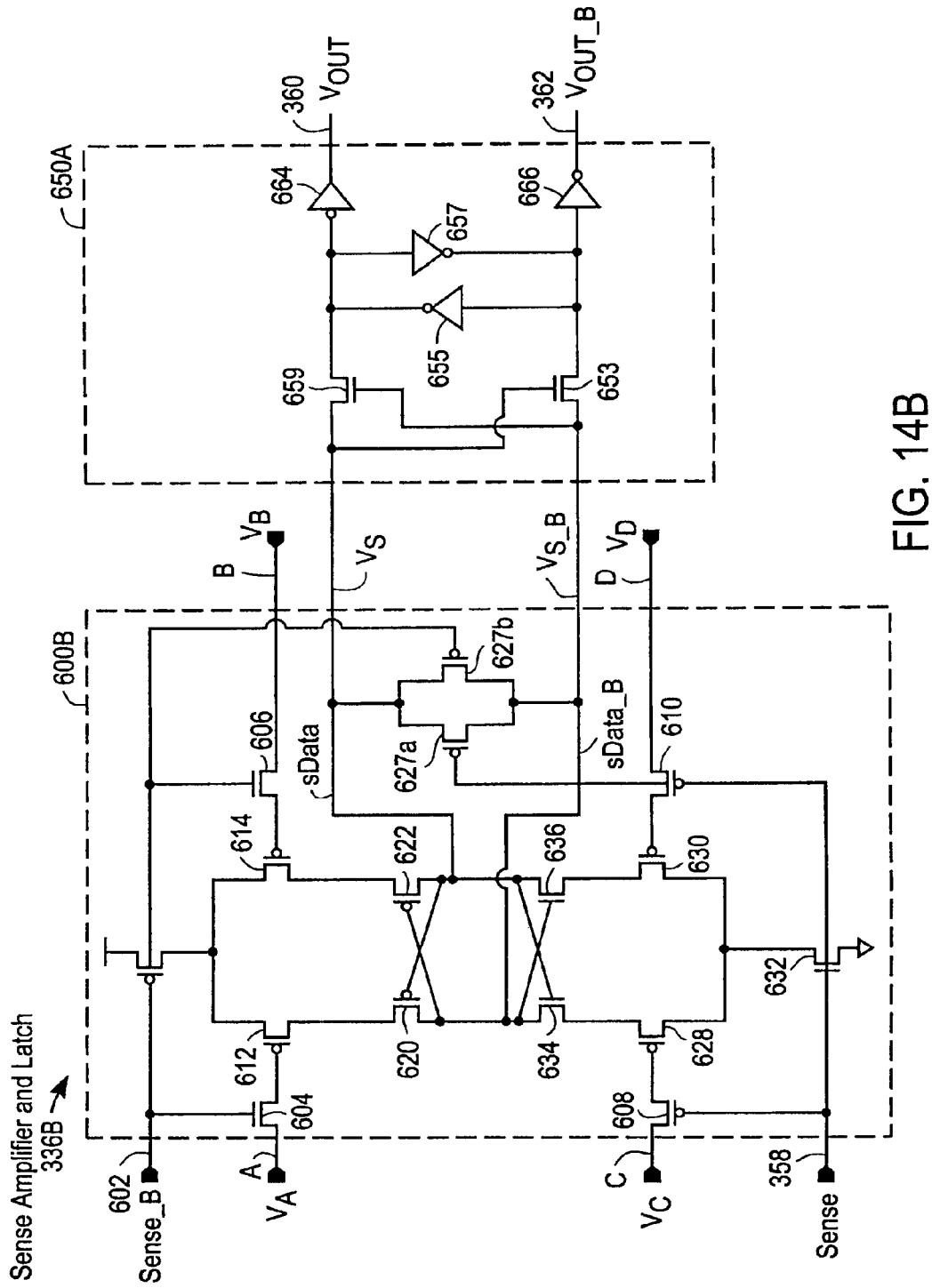
FIG. 14B is a circuit diagram of a sense amplifier and latch according to an alternate embodiment of the present invention of FIGS. 7A and 9.

In FIG. 14B, in another embodiment of the sense amplifier and latch 336 of FIGS. 7 and 9, a sense amplifier and latch 336B consumes even less static power than the sense amplifier and latch 336A of FIG. 14A. The circuit of FIG. 14B is similar to the circuit of FIG. 14A and the differences will be described. In a sense amplifier 600B, PMOS transistors 618 and 618 (FIG. 14A), and NMOS transistors 638 and 640 (FIG. 14A) are not used. The precharge transistors 624 and 626 (FIG. 14A) are also removed. Removing the precharge transistors further reduces the amount of static power consumed. The equalizing transistor 627 (FIG. 14B) is also removed. In the sense amplifier 600B, a differential pair of equalizing transistors 627a and 627b is placed between the sData and sData_B nodes. When the sense and senseb signals are not active, the transistors 627a and 627b are active and cause the sData and sData_B signals to have the same voltage. When the sense and sense_b signals become active, the transistors 627a and 627b become inactive and allow the $V_{S\_B}$ and $V_{S\_B}$ signals on the sData and sData_B nodes, respectively, to transition to the sensed voltages.

In the latch 650, when the $V_S$ and $V_{S\_B}$ signals on the sData and sData_B nodes are equalized, the latch 650 does not change state. When the $V_S$ and $V_{S\_B}$ signals on the sData and sData_B nodes are not equalized, the latch 650 can change state in response to the $V_{S\_B}$ and $V_{S\_B}$ signals. For example, the $V_S$ and $V_{S\_B}$ signals transition between high and a low, respectively, when the voltage difference between the $V_S$ and $V_{S\_B}$ signals is equal to an NMOS threshold voltage of $V_T$. NMOS transistor 653 becomes active and provides a low voltage level to the cross-coupled inverters 655 and 657 which act as a latch; and, NMOS transistor 659 becomes inactive. In response to the low voltage level of the $V_{S\_B}$ signal, inverter 655 outputs a high voltage level, and inverter 657 outputs a low voltage level to latch the state of the $V_S$ and $V_{S\_B}$ signals. Driver inverters 664 and 666 output a low and high voltage level, respectively.

Alternate Embodiment

A Preamplifier and Integrating Sense Amplifier

Figure 15:
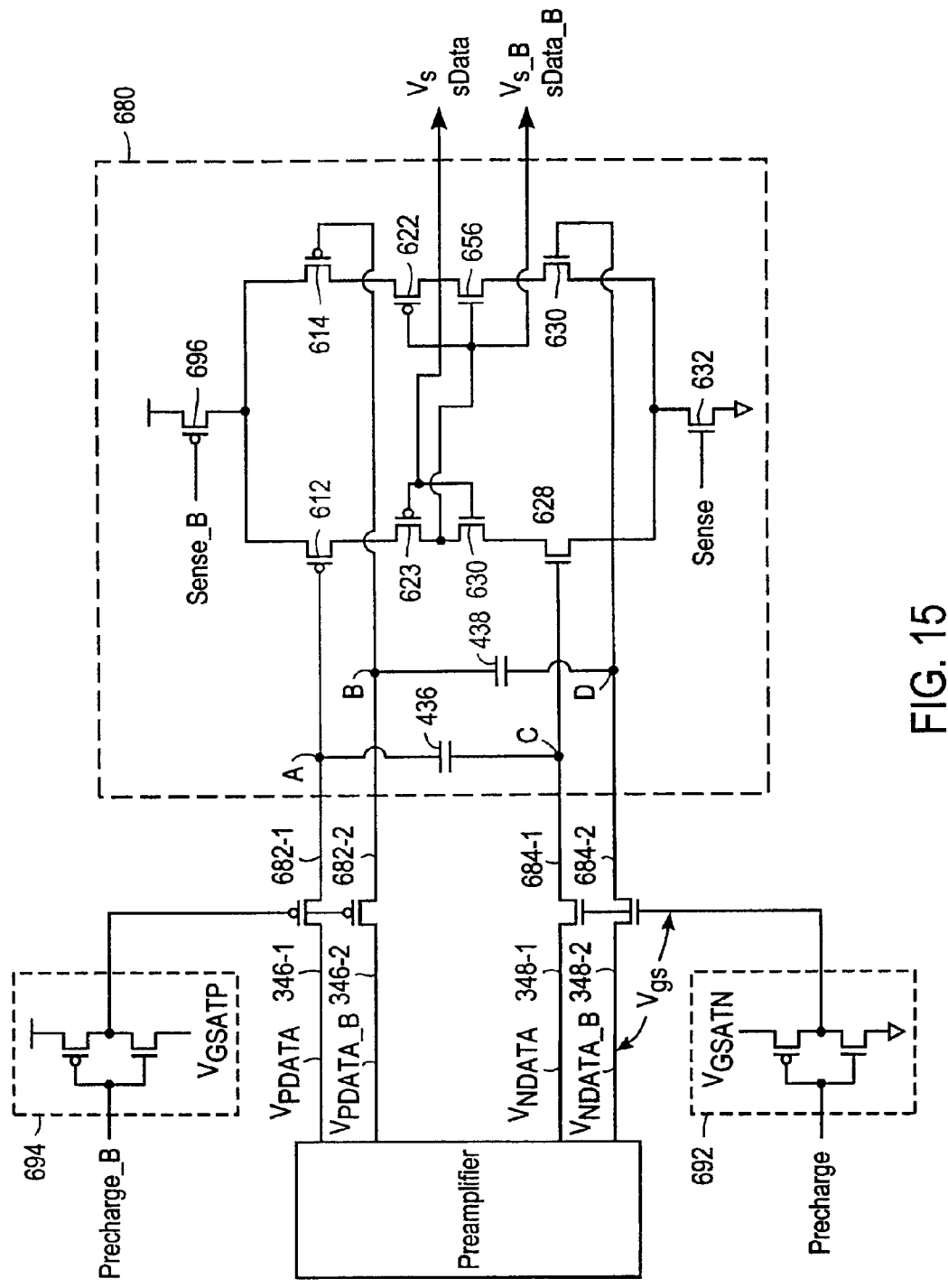
FIG. 15 is a circuit diagram of another embodiment of an integrating receiver that includes the preamplifier of FIG. 10 and a sense amplifier according to the present invention.

In FIG. 15, in another alternate embodiment of an integrating receiver, a sense amplifier 680 performs the integration function by incorporating capacitive elements 436 and 438. In this embodiment, the preamplifier 332A is coupled to a sense amplifier 680 rather than the integrator stage described above with reference to FIG. 7. The sense amplifier 680 is a modified version of the sense amplifiers 600A and 600B of FIGS. 14A and 14B, respectively. The A and B nodes of the sense amplifier 680 receive the preamplifier outputs $V_{PDATA}$ 346-1 and $V_{PDATA\_B}$ 346-2 via pass transistors 682-1 and 682-2, respectively. The sense amplifier 680 receives the preamplifier output $V_{NDATA}$ 348-1 on node C and $V_{NDATA\_B}$ 348-2 on node D via pass transistors 684-1 and 684-2, respectively.

In the sense amplifier 680, capacitive elements 436, 438 are connected between nodes A and C, and B and D, respectively. The capacitive elements 436, 438 are implemented as described with respect to the integrator of FIG. 12. In an alternate embodiment, other known capacitive devices may be used as the capacitive elements 436, 438.

Although not shown, the precharge circuit of FIG. 12 is connected to nodes A, B, C and D.

The pass transistors 682, 684 now perform a switching function and act as a current source to charge or discharge the capacitive elements 436, 438. The pass transistors 682, 684 are active during the integration interval when the precharge signal is low. An inverter 692 receives the precharge signal and drives the gates of the NMOS pass transistors 684. The inverter 692 is connected to a predetermined voltage $V_{GSATN}$, rather than the supply voltage, which causes the inverter 692 to output a logical one equal to the voltage $V_{GSATN}$. The voltage $V_{GSATN}$ is selected such that the pass transistors 684 will operate in saturation when active. Therefore, the current flowing through the respective capacitive element 436, 438 is substantially independent of the drain to source voltage across the pass transistors 684.

The pass transistors 682 are active during the integration interval when the precharge_B signal is high. Another inverter 694 receives the precharge_B signal and drives the gates of the PMOS pass transistors 682. The inverter 694 is connected to a predetermined voltage $V_{GSATP}$, rather than ground or $V_{SS}$, which causes the inverter 694 to output a logical zero equal to the voltage $V_{GSATP}$. The voltage $V_{GSATP}$ is selected such that the pass transistors 682 will operate in saturation when active and therefore the current flowing through the respective capacitive element 436, 438 is substantially independent of the drain to source voltage across the pass transistors 682.

At the end of the integration phase, the activation of the precharge signal deactivates the pass transistors 682, 684. The nodes A, B, C and D store the integration voltages $V_A, V_B, V_C$ and $V_D$, respectively.

The sense amplifier 680 includes a PMOS transistor 696 that couples the differential input PMOS pair 612 and 614 to the supply voltage when the sense_B signal is low. The remaining components of the sense amplifier transistors 632, 612, 614, 620, 622, 634 and 636 and output voltages $V_S$ and $V_{S\_B}$ are the same as described with respect to FIG. 14.

Because no separate integrator circuit is used, this embodiment of an integrating receiver uses fewer components which reduces power and die area. Because fewer components are used, this integrating receiver has fewer parasitic capacitive elements. Therefore, the input voltage swing to the sense amplifier for a given integration current I is larger.

System Issues

Figure 16:
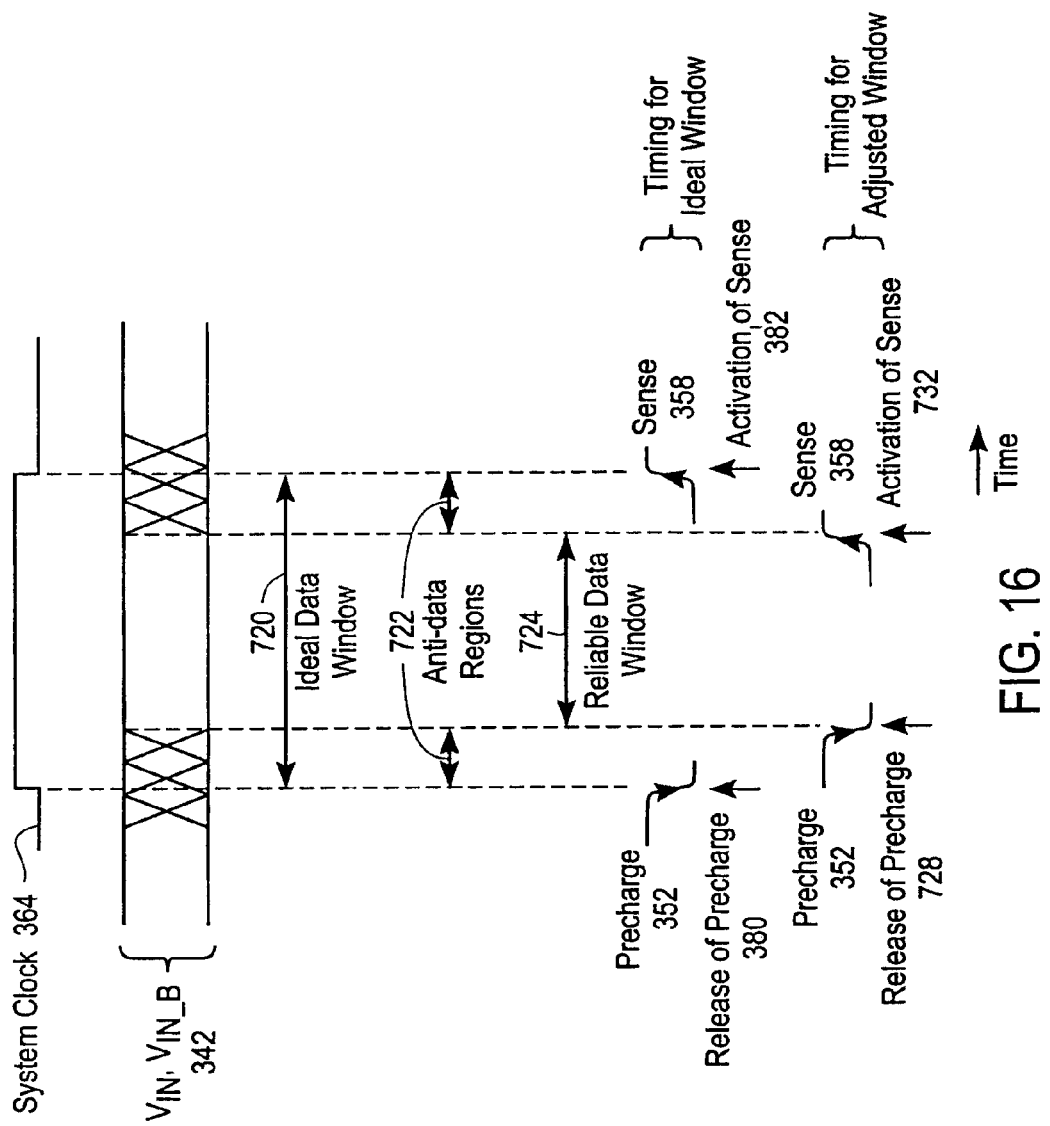
FIG. 16 is a timing diagram of adjusted precharge and sense signals to generate a reliable data window for the integrating receiver of FIG. 7A.

As shown in FIG. 16, another problem in integrating receiver systems is that the data at or near the edges of a nominal data window may be unreliable. The ideal data window 720 extends for one phase of the system clock 364. To avoid supplying the integrator with unreliable data, the integration window is narrowed to avoid the boundary areas 722 of unstable or changing data due to system clock jitter and skew. The boundary areas 722 are referred to as anti-data regions 722. The narrowed integration window is referred to as the "reliable data window" 724. The timing of the precharge and sense signals, 352 and 358, respectively, defines the ideal data window 720 and the reliable data window 724. To generate the reliable data window, the timing diagram of FIG. 8 is modified. The Release of Precharge event of the integrator is delayed from the ideal position 380 to the reliable position 728 and the Activation of Sense event is advanced in time from the ideal position 382 to the reliable position 732, thereby avoiding the anti-data regions.

Figure 17A:
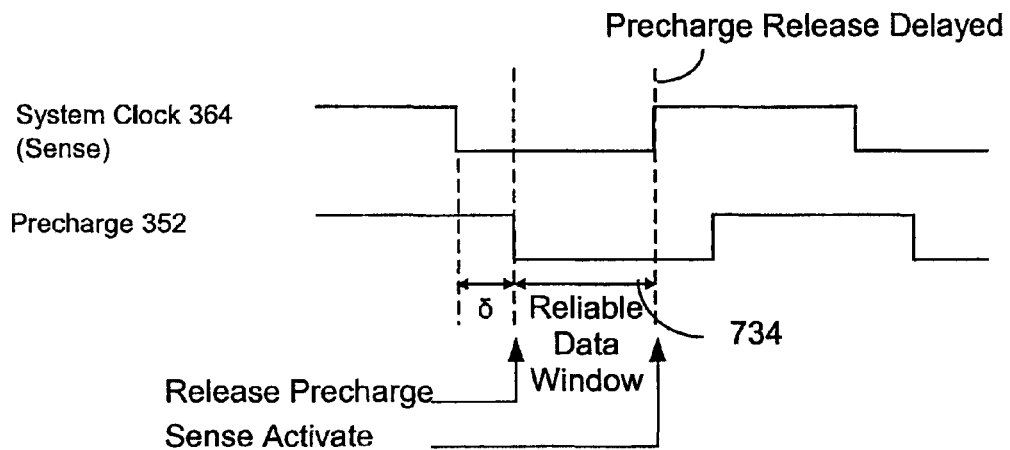
FIG. 17A is a timing diagram of an alternate embodiment of the reliable data window for integrating of FIG. 16.

In FIG. 17A, in an alternate embodiment, the "reliable data window" 724 is re-defined to avoid the anti-data regions. In this alternate embodiment, the reliable data window 724 is defined by the precharge signal 352 and the sense signal 358. The precharge signal is delayed by a predetermined amount δ with respect to the leading edge of the system clock 364. The sense signal is not delayed and becomes active at the trailing edge of the system clock 364.

Figure 17B:
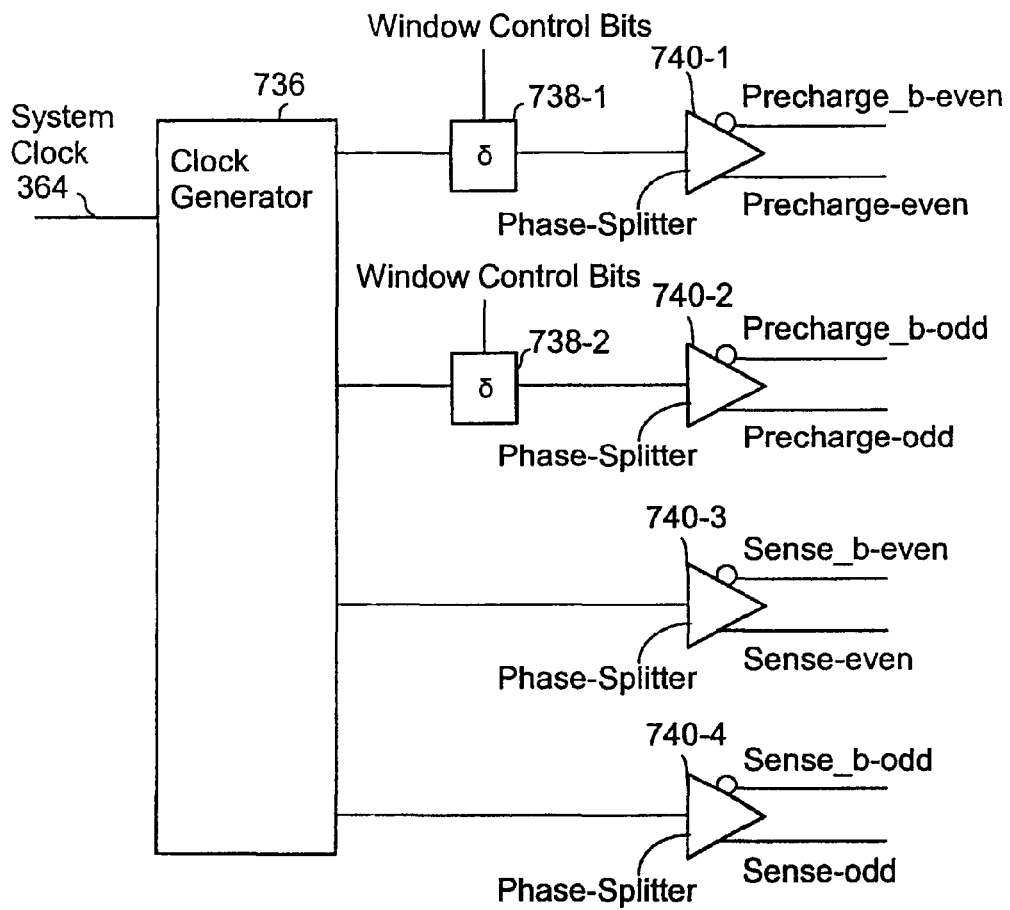
FIG. 17B is a block diagram of a circuit to generate the reliable data window of FIG. 17A.

FIG. 17B is an embodiment of a circuit that implements the timing diagram of FIG. 17A. The system clock 364 is supplied to a timing generation circuit 736 which generates the precharge and sense signals, 352 and 358, respectively, that are synchronized to the system clock 364 as shown in the timing for the ideal data window of FIG. 16. To implement the timing of FIG. 17A, a delay element 738 delays the precharge signal by the predetermined amount δ and provides a delayed-precharge signal 740 to the integrating receiver. The delay element 738 may be a delay line. Alternately, the delay element 738 may the adjustable delay element of FIG. 22, discussed below. The sense signal is not delayed. To receive data during both phases (even and odd) of the system clock, the clock generator 736 supplies separate precharge and sense signals for the even data and the odd data. The precharge signals for the even and odd data each have their own delay element 738. Phase splitters 740 supply each signal and its complement simultaneously without substantial variation, if any, in phase.

Figure 17C:
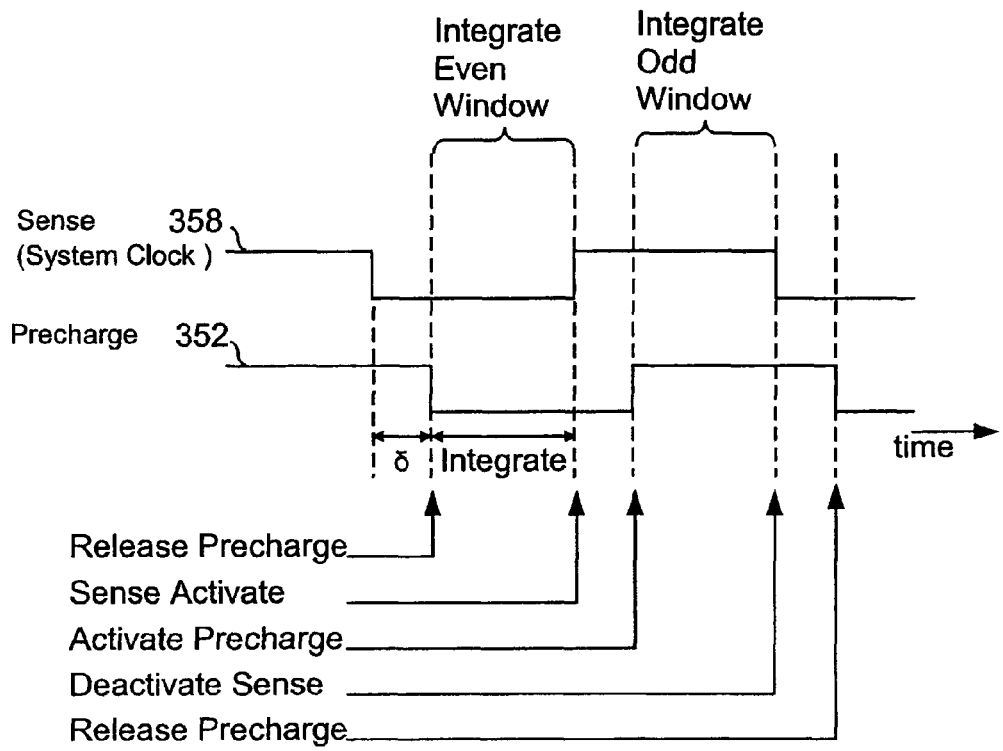
FIG. 17C is a timing diagram of another alternate embodiment for defining the reliable data window for integrating.

In FIG. 17C, in another embodiment of the present invention, a timing diagram of another implementation of the sense and precharge signals, 358 and 352, respectively, is shown. The sense signal 352 is the system clock, and the precharge signal 352 is delayed with respect to the sense signal 352.

Figure 17D:
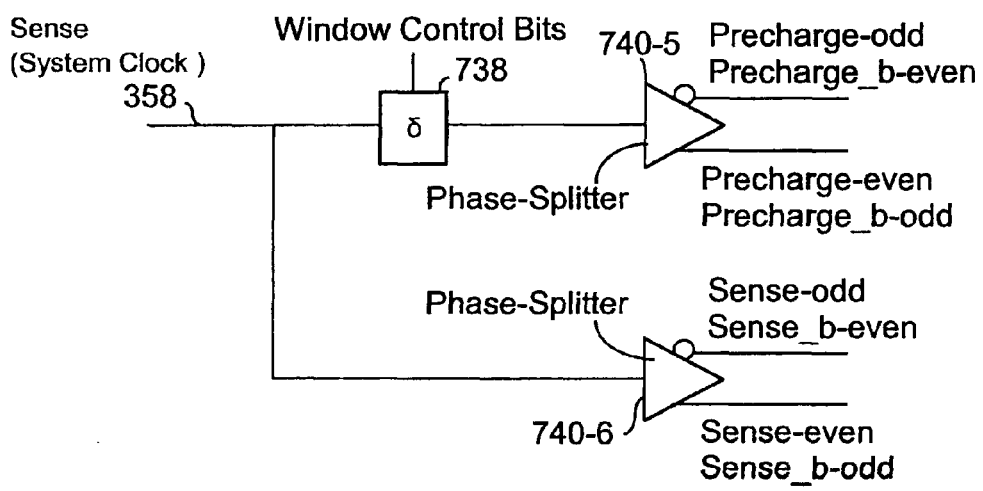
FIG. 17D is a circuit that implements the timing diagram of FIG. 17C.

In FIG. 17D, a circuit implements the timing diagram of FIG. 17C. The sense signal 358 is supplied to a delay element 738 to generate the precharge signal 352. The delay element 738 may be a delay line. Alternately, the delay element 738 may the adjustable delay element of FIG. 22, discussed below. Both the sense signal, 358 and the precharge signal 352 are supplied to phase splitters 740 to generate both the true and complementary signals. In addition, for example, the phase splitter 740-5 generates the precharge-odd signal which is also used as the complementary precharge_b-even signal. Similarly, the phase splitter 740-5 generates the precharge-even signal which is also used as the complementary precharge_b-odd signal. This circuit of FIG. 17D eliminates the clock generator 736, a delay element 736-2, and two phase splitters 740-2 and 740-4 from the circuit of FIG. 17B.

Figure 18:
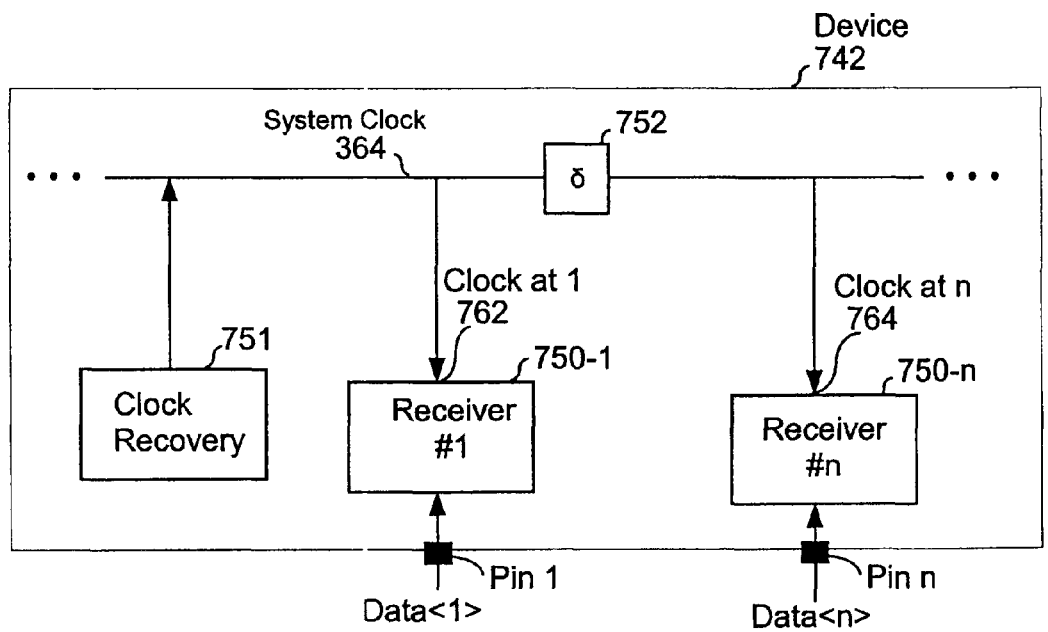
FIG. 18 is a block diagram of the distribution of a system clock in a bus architecture having multiple receivers.

In FIG. 18, an exemplary device 742 has a multiple receiver system. The multiple receiver system includes a system clock 364 and multiple integrating receivers 750 of the present invention. Each receiver 750 receives a data bit (Data<1> to Data<n>) as described above. A clock recovery circuit 751 generates the system clock 364 which is distributed to the receivers 750. However, the data bit supplied to each receiver 760 may be out of phase or skewed with respect to the system clock 364. The receivers 750 experience skew between the system clock 364 and data bits because of, at least in part, clock wiring delays or data wiring delays. As clock frequencies increase and bit-times are reduced, the skew between the system clock and the data bits becomes an increasingly significant part of the overall system timing budget.

In particular, because of delay 752 in the distribution of the system clock 364, each receiver 750 receives a system clock signal that is slightly out-of-phase or skewed with respect to the system clock signal at the clock recovery block and with respect to the system clock signals at other receivers 750. The data bits may also be skewed among themselves because of differences in board or package routing. The result is that the phase relationship or alignment of the system clock to the data is different at each receiver 770.

Figure 19:
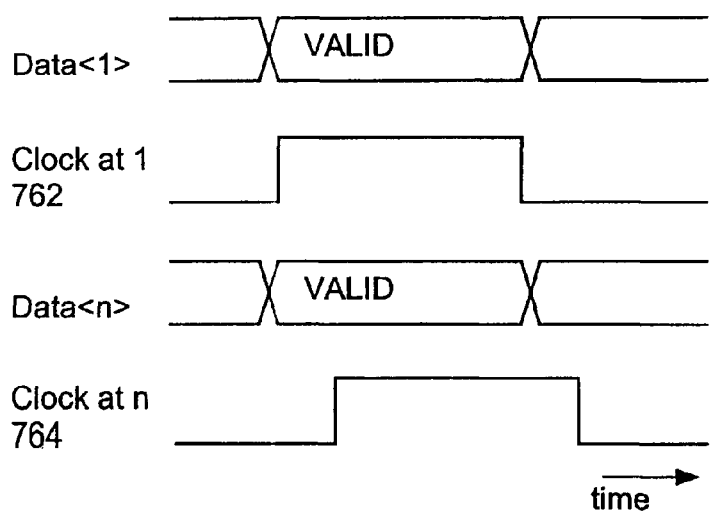
FIG. 19 is a timing diagram of the system clock and exemplary data signals of the bus architecture of FIG. 18.

Referring also to FIG. 19, a timing diagram shows the timing of when the data is valid for data bit one (Data<1>) and data bit n (Data<n>), and the system clock at the respective receiver 750. The signal "clock-at-1" shows the system clock at receiver one 750-1, and the signal "clock-at-n" shows the system clock at receiver n 750-n. The signals "clock-at-1" and "clock-at-n" are out of phase with respect to each other.

Figure 20:
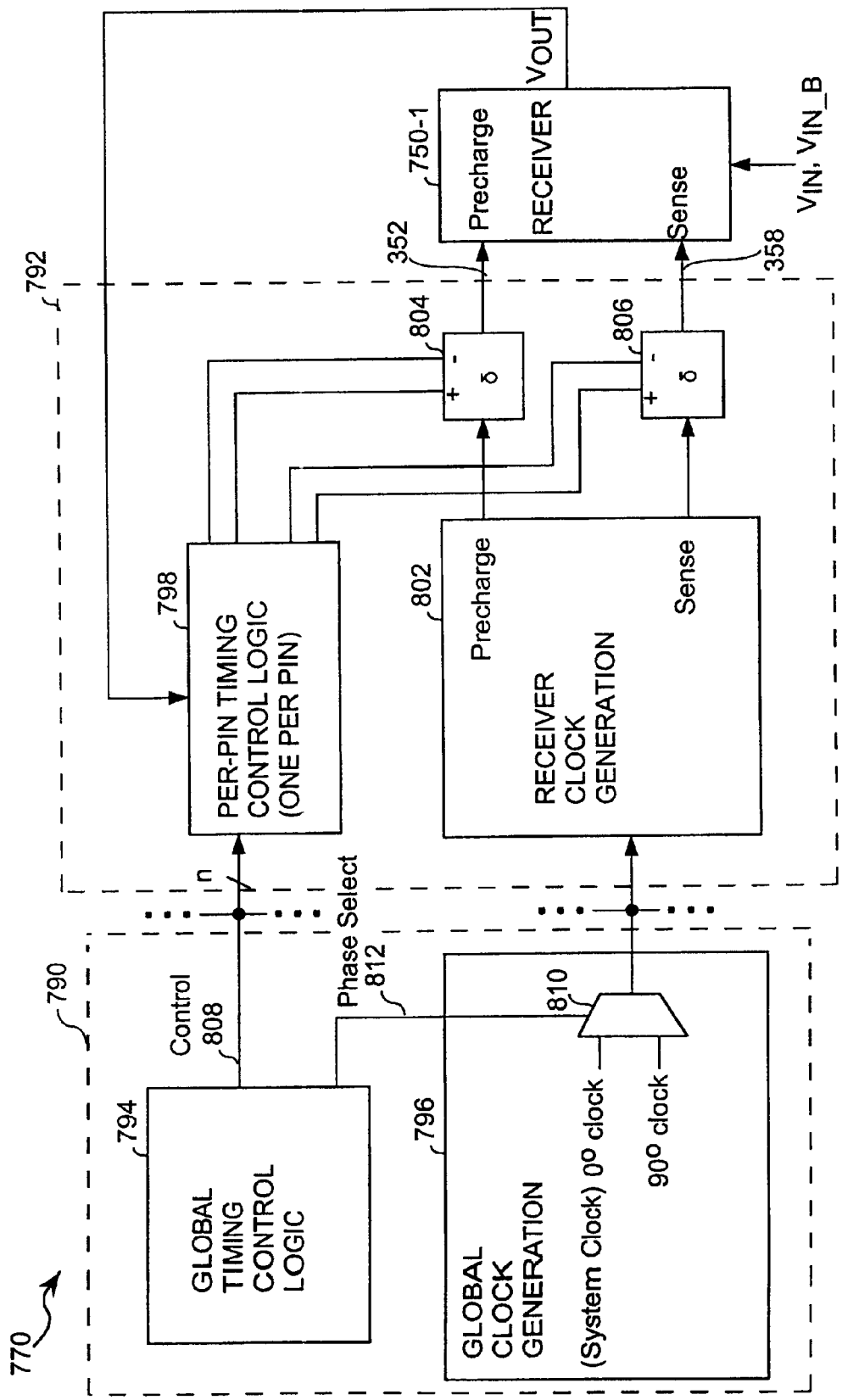
FIG. 20 is a block diagram of an adjustment system that adjusts the timing of the precharge and sense signals of the integrating receivers of FIG. 18.

In FIG. 20, to compensate for the skew between the system clock and the data bits in a device, the timing for each receiver, referred to as per-pin-timing, is adjusted by controlling the precharge and sense signals. Both the timing adjustment for integration windowing and the timing adjustment for per-pin timing calibration are performed with the same circuitry, thus reducing both "anti-data" and clock skew effects.

The adjustment system 770 aligns the system clock of each receiver 750 to the data at that receiver by adjusting the timing of the precharge signal 352 and sense signal 358. The receiver 750 can be any of the receivers described above. The adjustment circuit 770 has one global section 790 and multiple per-receiver sections 792. Each receiver 750 connects to a distinct instance of per-receiver section 792. Each per-receiver section 792 independently adjusts the precise timing of the Release of Precharge and Activation of Sense events for its associated receiver 750. The global section 790 includes Global Timing Control logic 794 and a Global Clock Generation block 796. The per-receiver section 792 includes Per-Pin timing Control logic 798, a Receiver Clock Generation block 802, and two adjustable delay blocks, one for the Precharge signal 804 and one for the Sense signal 806. The Global Timing Control Logic 794 generates control signals 808 that are supplied to the Per-Pin Timing Control Logic 798 and to the Global Clock Generation block 796, respectively. The Global Clock Generation block 796 includes a multiplexor 810 that has zero (0) degree and ninety (90) degree clock inputs, and a phase select input receiving the phase select signal 812 from the Global Timing Control Logic 794. The multiplexor 810 supplies the selected clock to the Receiver Clock Generation block 802. The Per-Pin Timing Control logic 798 and the Receiver Clock Generation Block 802 are coupled to the adjustable delay elements 804 and 806 to provide the specified Precharge and Sense signals for the receiver 750-1. The receiver 750-1 receives the input signals $V_{IN}$ and $V_{IN\_B}$. The Receiver Clock Generation Block 796 generates and supplies the ideal Precharge and Sense signals (see FIG. 8) to the delay elements 804, 806. The Per-Pin Timing Control Logic 798 connects to the select inputs (+ and −) of the adjustable delay elements 804, 806 to precisely adjust the delay the precharge and sense signals. The Per-Pin Timing Control Logic 798 also connects to the output $V_{OUT}$ of the receiver 750-1 to monitor the output signal $V_{OUT}$ with respect to the system clock to change the selected amount of delay, if needed. The connections of the Per-Pin Timing Control Logic 798 create a delay-locked loop for the integrating receiver 750-1.

In this way, the circuit of FIG. 20 provides per-pin-timing to compensate for the skew between the system clock and the data bits in a device.

Figure 21:
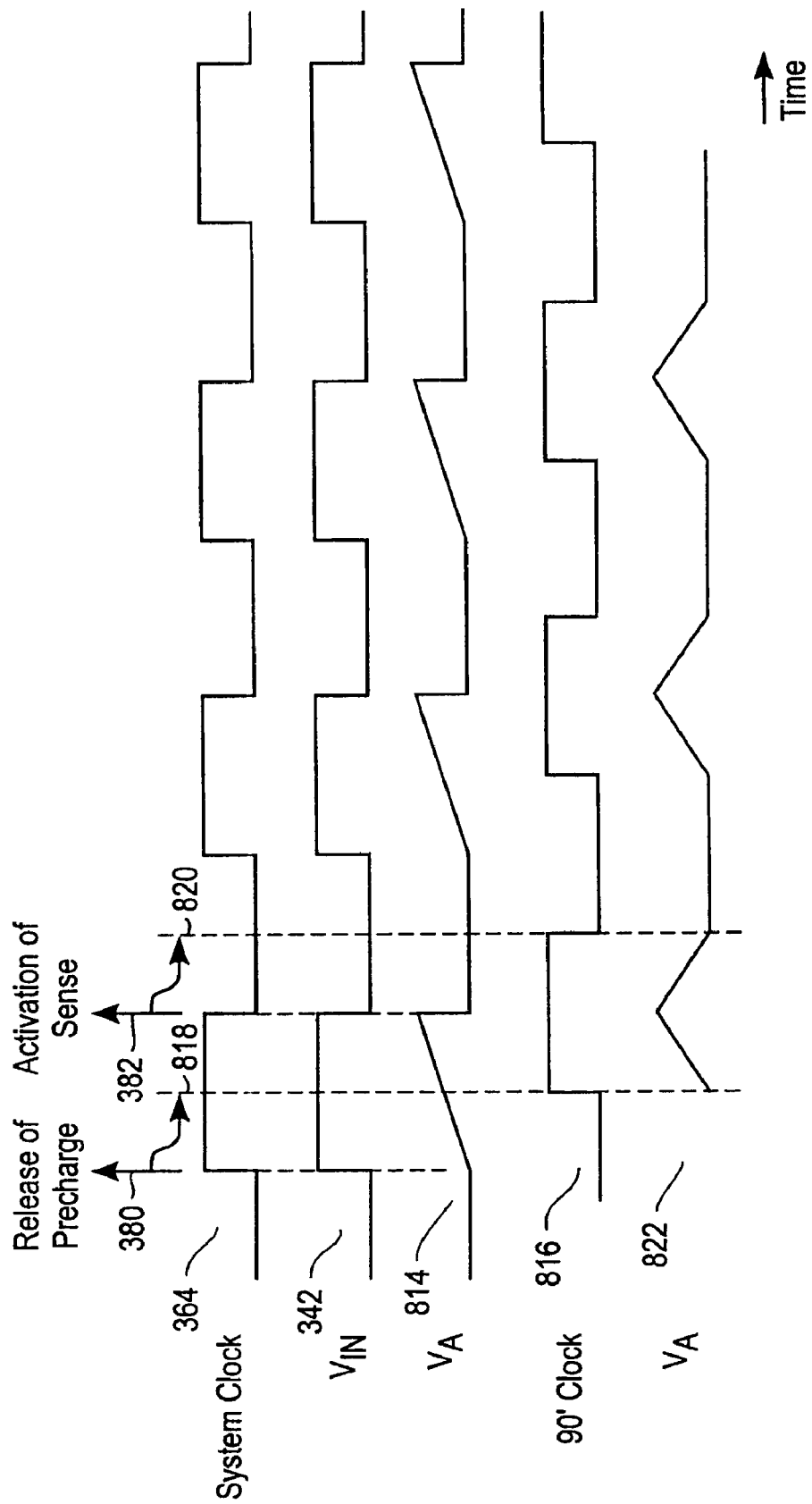
FIG. 21 is a timing diagram for the adjustment system of FIG. 20.

Referring to FIGS. 20, 21 and 12, the timing of the adjustment system will be described.

This description uses the integrator of FIG. 12; however, the adjustment system works with any of the integrators described above. The system clock 364 is shown with the release of precharge event 380 and the activation of sense event 382. The input signal $V_{IN}$ 342 is a stream of alternating zeroes and ones, and the complementary input signal $V_{IN\_B}$ is a stream of alternating ones and zeroes. The voltage of an exemplary integration node $V_A$ 814 corresponding to the system clock 364 and input signal $V_{IN}$ 342 is also shown.

To select the appropriate amount of delay from the delay elements 804, 806, the Global Timing Control Logic 794 first selects the ninety degree clock signal 816 by activating the appropriate Phase Select input 812 of the multiplexor 810 in the Global Clock Generation Block 796. This causes the Receiver Clock Generation Block 802 to shift the nominal Release of Precharge 380 and Activation of Sense 382 events by ninety degrees placing the Release of Precharge in the nominal center 818 of the ideal data window and the Activation of Sense in the nominal center 820 of the next ideal data window. While receiving the input signal of a stream of alternating zeroes and ones, the integrating receiver starts the integration phase when the precharge signal is released in the center 818 of the data window, and the voltage $V_A$ on the integration node will be as shown in waveform 822. When the activation of sense event occurs in the center 820 of the next data window, the output voltage $V_A$ of the integrator will be zero. In practice, the output of the sense amplifier output is equal to one for approximately the same number of integration cycles as it is equal to zero. Therefore, the receiver functions as a phase detector when the timing loop is activated and the system clock is shifted by ninety degrees. When the system clock is shifted ninety degrees and the output $V_A$ of the integrator is equal to zero, the Per-Pin Timing Control Logic 798 has adjusted the delay elements 804 and 806 properly for the particular receiver 750-1. Once each Per-Pin Timing Control Logic block 798 has adjusted the timing for its associated receiver 750-1, the Global Timing Control Logic 794 causes the multiplexor 810 to output the zero degree clock to the Receiver Clock Generation Block 802 so that the receiver system can receive and output data.

In summary, the amount of delay from the delay elements 806, 808, is adjusted for each receiver by using a data input stream of alternating ones and zeroes and shifting the system clock by ninety degrees to operate the receiver as a phase detector to place the center of the ninety degree clock in the center of the integration or reliable data window. In this way, when the global clock generation block supplies the zero degree or unshifted system clock, at least one edge of the zero degree system clock will be aligned with the center of the reliable data window.

Figure 22:
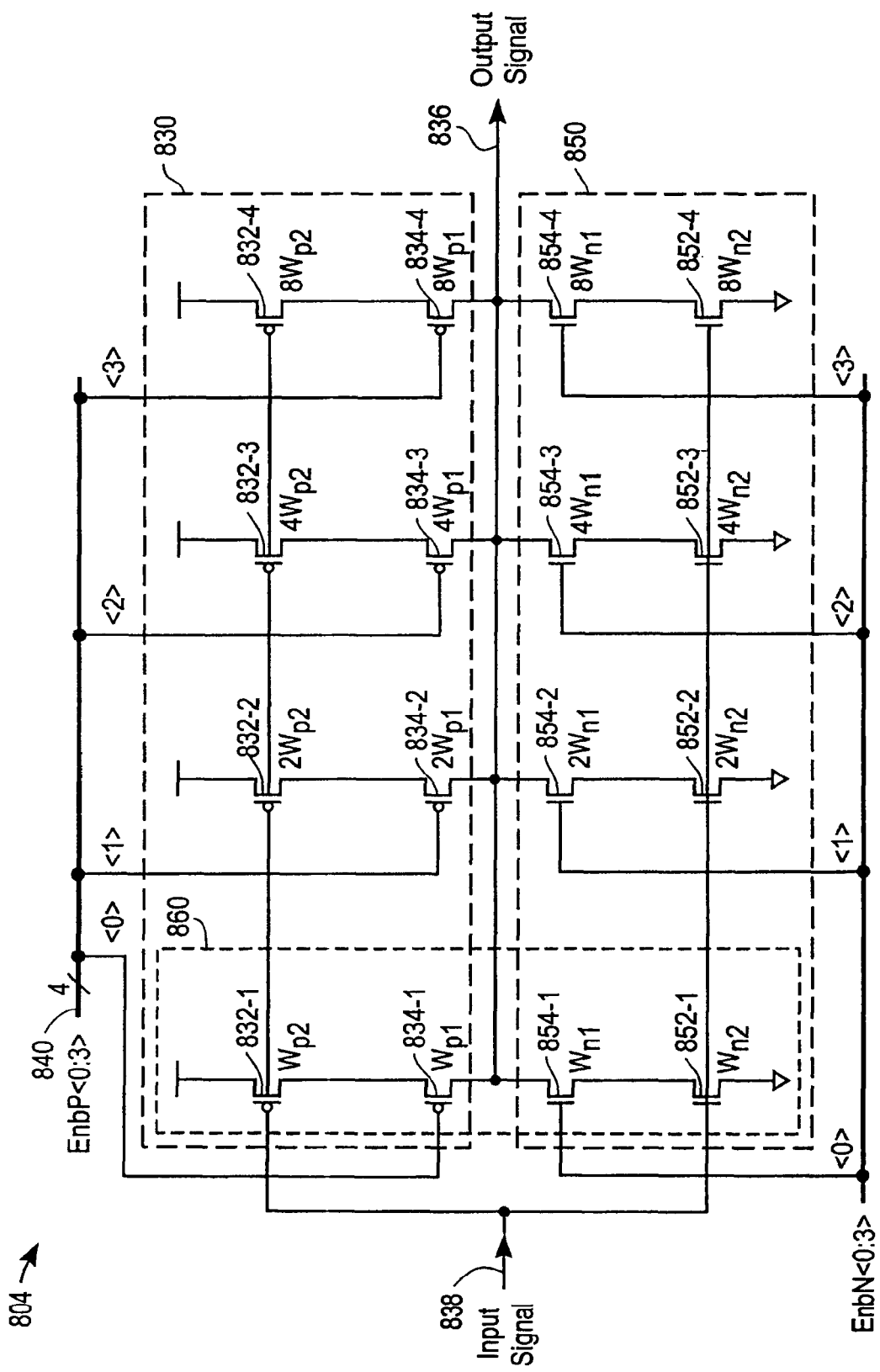
FIG. 22 is a circuit diagram of an adjustable delay element of the adjustment system of FIG. 20.

In FIG. 22, an exemplary adjustable delay element 804 is shown. Delay element 806 is the same as delay element 804, and therefore only delay element 804 will be described. A binary-weighted set 830 of PMOS transistors 832, 834 is coupled between the supply voltage and the output signal line 836. The binary-weighted group 830 of transistors receives an input clock 838 and a set of enable signals EnbP<0:3> 840. Respective pairs of PMOS transistors 832 and 834 are connected in series between the supply voltage and the output signal line 836. Transistors 832 receives the input signal 838 on their gates. Transistors 834 receive a respective one of the enable signals EnbP<0:3> 840 on their gates. When both transistors in a series-connected pair are active, the input signal is delayed by an amount proportional to the binary weighting of the transistors.

The binary weight of each PMOS transistor is indicated next to each transistor. Transistor pair 832-1, 834-1 has a weight of one, transistor pair 832-2, 834-2 has a weight of two, pair 832-3, 834-3 has a weight of four and pair 832-4, 834-4 has a weight of eight. The weights are established by the width to length (W/L) ratio for each transistor. The W/L ratio determines the resistance of the respective transistor, increasing the width W decreases the resistance, while decreasing the width increases the resistance. The resistance and therefore the W/L ratio determines the incremental amount of delay generated by a transistor when that transistor is active.

A set 850 of NMOS transistors 852 and 854 are connected in series between ground and the output signal line 836. The gates of transistors 854 receive a respective one of the enable signals EnbN<0>. The gates of transistors 852 receive the input signal 838. Respective pairs of transistors 852 and 854 are connected in series. The transistors 852, 854 of each pair have the same binary weighting as their corresponding PMOS series-connected pair. For example, pair 852-1, 854-1 has a weight of one, pair 852-2, 534-2 has a weight of two, pair 852-3, 854-3 has a weight of four and pair 852-4, 854-4 has a weight of eight.

When the input signal 838 is low, the transistors in the PMOS group 830 are enabled to drive the output signal high with a predefined resistance, and therefore a predefined time constant, in accordance with to the state of the enable signals EnbP<0:3>. When the input signal 838 is high, the transistors in the NMOS group 850 are enabled to drive the output signal low with a predefined resistance, and therefore a predefined time constant, in accordance with the state of the enable signals EnbN<0:3>. Driving the output signal high with a high resistance, relative to the other transistors, increases the delay between the input signal 838 and the output signal 836. Driving the output signal high with a low resistance decreases the delay between the input signal 838 and the output signal 836. The amount of delay in driving the output signal low is controlled by the resistance of the transistors of the NMOS group 850. In the embodiment of FIG. 22, sixteen different delay adjustments are available.

For example, the transistors 832, 834, 852, 854 can be sized so as to provide an incremental delay of 125 picoseconds (ps) for each increment in the value of EnbN<0:3> and EnbP<0:3>. In a alternate embodiment, binary stages 860 may be added to provide greater precision and/or a greater range of delay values. In other alternate embodiments, the delay circuit 804 can be constructed to provide any particular predefined delay.

Figure 23A:
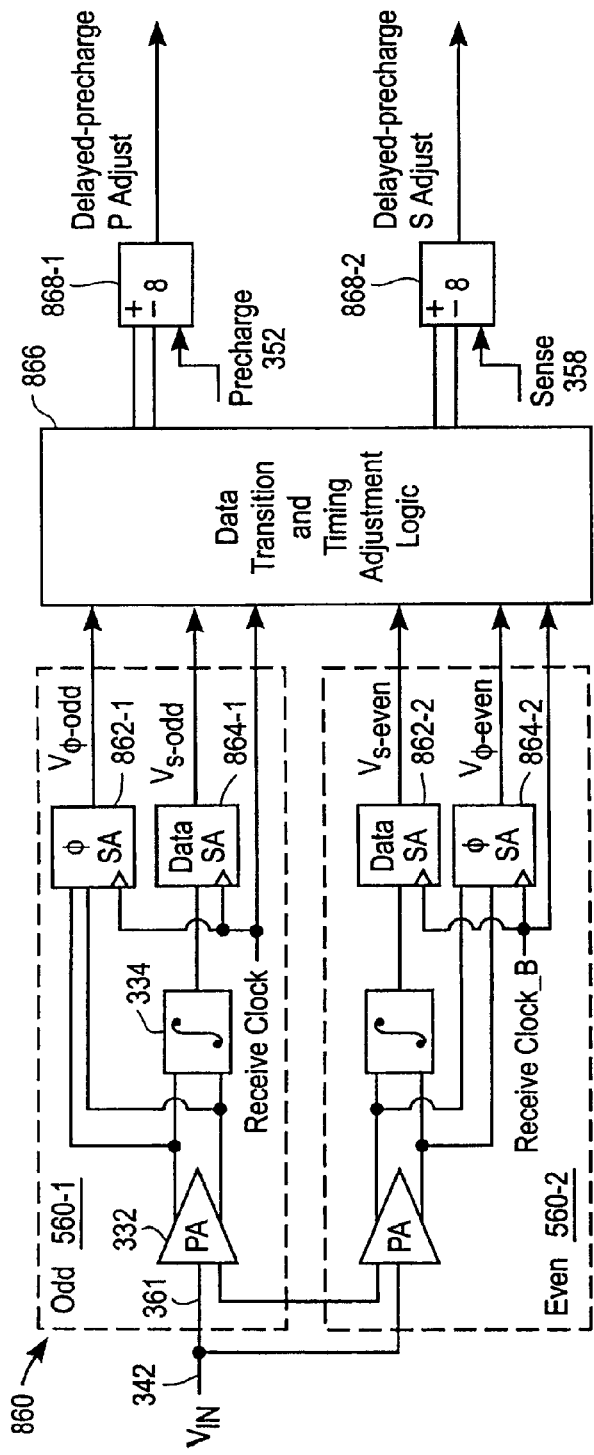
FIG. 23A is an alternate embodiment of an adjustment system to set the timing of each receiver in a system having multiple integrating receivers.

In FIG. 23A, in an alternate embodiment, an adjustment circuit adjusts the timing of the precharge and sense signals for a set of pins that receive incoming signals. For simplicity, an exemplary incoming signal will be referred to as a data signal. In this embodiment, the adjustment circuit adjusts the timing of the precharge and sense signals based on the timing relationship of a transition of a receive clock and a transition of the data signal. Odd and even data bits are received during complementary odd and even phases of the receive clock. The receive clock may be the system clock. An odd timing detector 560-1 provides timing signals V-ODD for the odd phase, and an even timing detector 560-2 provides timing signals V-EVEN for the even phase. Because the odd and even timing detectors 560 operate in the same way, only the odd timing detector 560-1 will be described. A preamplifier 332, such as the preamplifier 332A of FIG. 10, receives the input signal $V_{IN}$ 342. An inverter 861 provides the complementary input signal $V_{IN\_B}$ 344 to the preamplifier 332A. A φ-Sense amplifier 862 receives the preamplifier outputs in response to the receive clock and provides a $V_{\phi\text{-}ODD}$ signal. The φ-Sense amplifier 862 and a data sense amplifier 864 are implemented using the sense amplifier circuit 600 of FIG. 14.

Figure 23B:
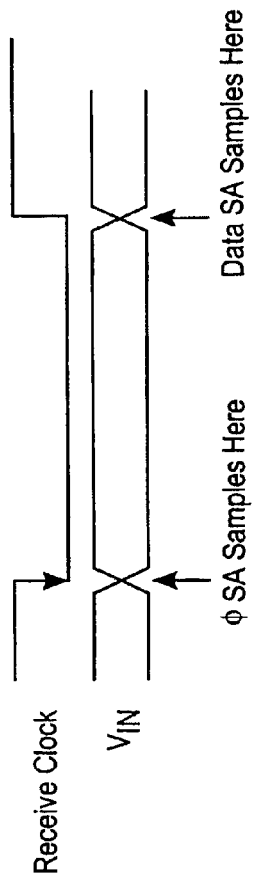
FIG. 23B is a timing diagram for the circuit of FIG. 23A.

Referring also to FIG. 23B, the $V_{\phi\text{-}ODD}$ signal represents the sampled state of the data signal at the positive edge transition of the receive clock. Meanwhile, the integrator 334 generates integration voltages based on the output of the preamplifier 332A, and the Data-sense amplifier 864 samples the state of the integration voltages at the trailing edge of the receive clock and provides a sampled data signal $V_{S\text{-}ODD}$.

The data transition and timing adjustment logic 866 receives the $V_{\phi\text{-}ODD}$, $V_{S\text{-}ODD}$ signals from the sense amplifiers 862, 864, respectively, and outputs selection signals that select the amount of delay from the delay adjustment blocks 868. The respective delay adjustment block 868 delays the precharge and sense signals, 352 and 358, respectively, in accordance with the selected amount of delay. The delay adjustment blocks 868 may be implemented using the circuit of FIG. 22.

The data transition and timing adjustment logic 866 selects an amount of delay based on the timing relationship between the input signal $V_{IN}$ and the receive clock. In this embodiment, the φ-Sense amplifier 862 acts as a phase detector because its metastability point is inherently 90° from the integrator.

For example, if the transition of the input signal $V_{IN}$ is early with respect to the falling edge of the receive clock, then the φ-Sense amplifier 862 will detect the transition of the data signal $V_{IN}$, but the integrator 334 and data sense amplifier 864 may not detect the transition of the input data signal $V_{IN}$ because the integration time will be shorter. Alternately, if the transition of the input signal $V_{IN}$ is late with respect to the falling edge of the receive clock, then the φ-Sense amplifier 862 will not detect the transition of the data signal $V_{IN}$, but the integrator 334 and data sense amplifier 864 may not detect the transition of the input data signal $V_{IN}$ because the integration time will also be shorter.

The data transition and timing adjustment logic 866 compares the signal output by the φ-Sense amplifier 862 to the receive clock using, for example, an exclusive or gate. When the transition of the input signal $V_{IN}$ is late with respect to the negative edge the receive clock, the φ-Sense amplifier 862 will not detect the transition of the input signal $V_{IN}$, although the data-sense amplifier 864 may detect the transition of the input signal $V_{IN}$. By observing and comparing the results of Vφ and Vs, the transition and timing logic block can determine whether a data transition occurred, and when occurred, whether the data transition was early or late.

Multi-Phased Receivers

Performance can be increased by operating the receivers in multiple phases. To achieve data cycle rates in the gigabit range, multiple parallel receivers increase the speed of the data bus by reducing the time to transmit a data bit, the "bit time," without changing process or technology.

Figure 24:
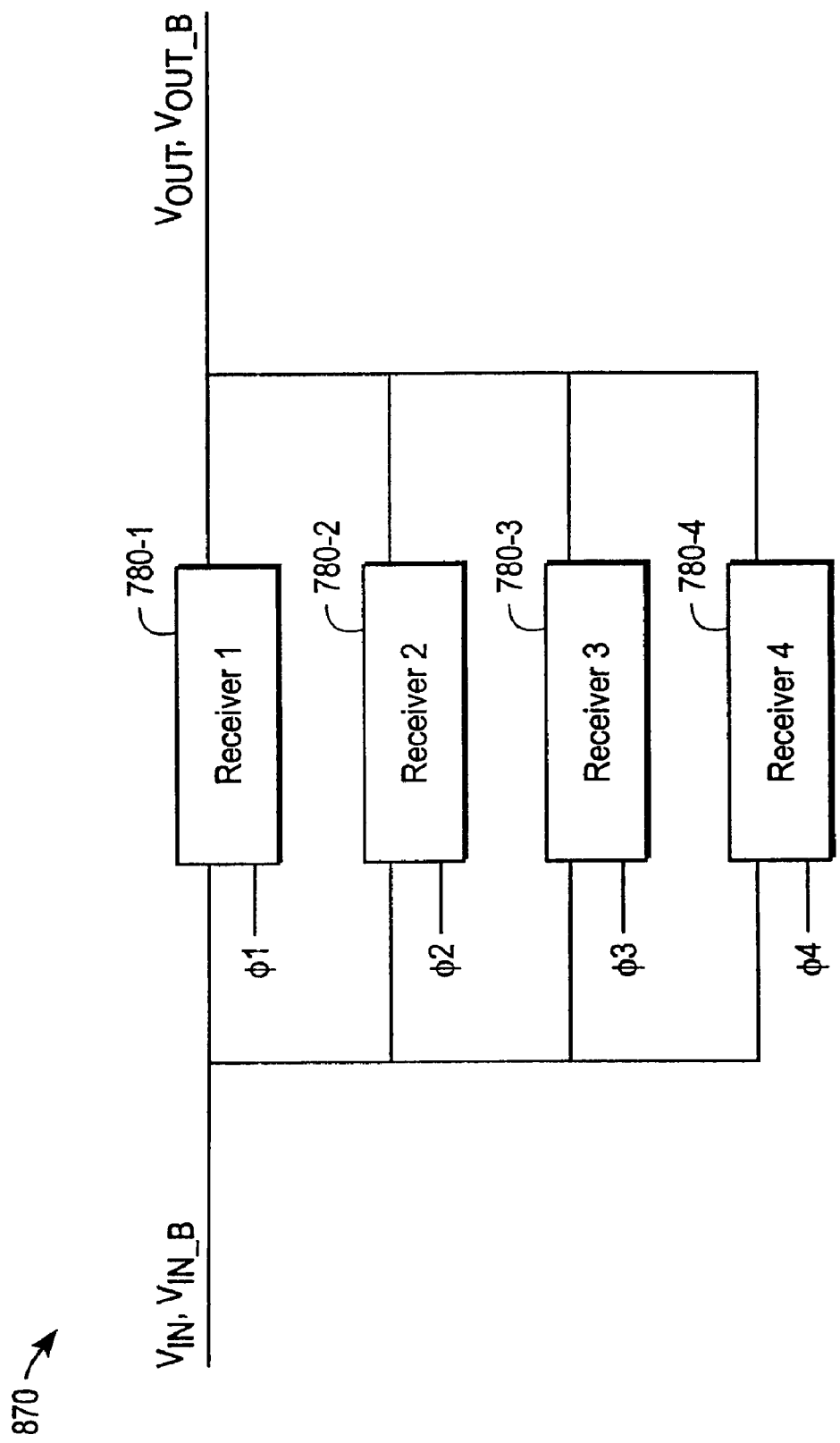
FIG. 24 is a block diagram of a multi-phased bus architecture using four integrating receivers of the present invention.
Figure 25:
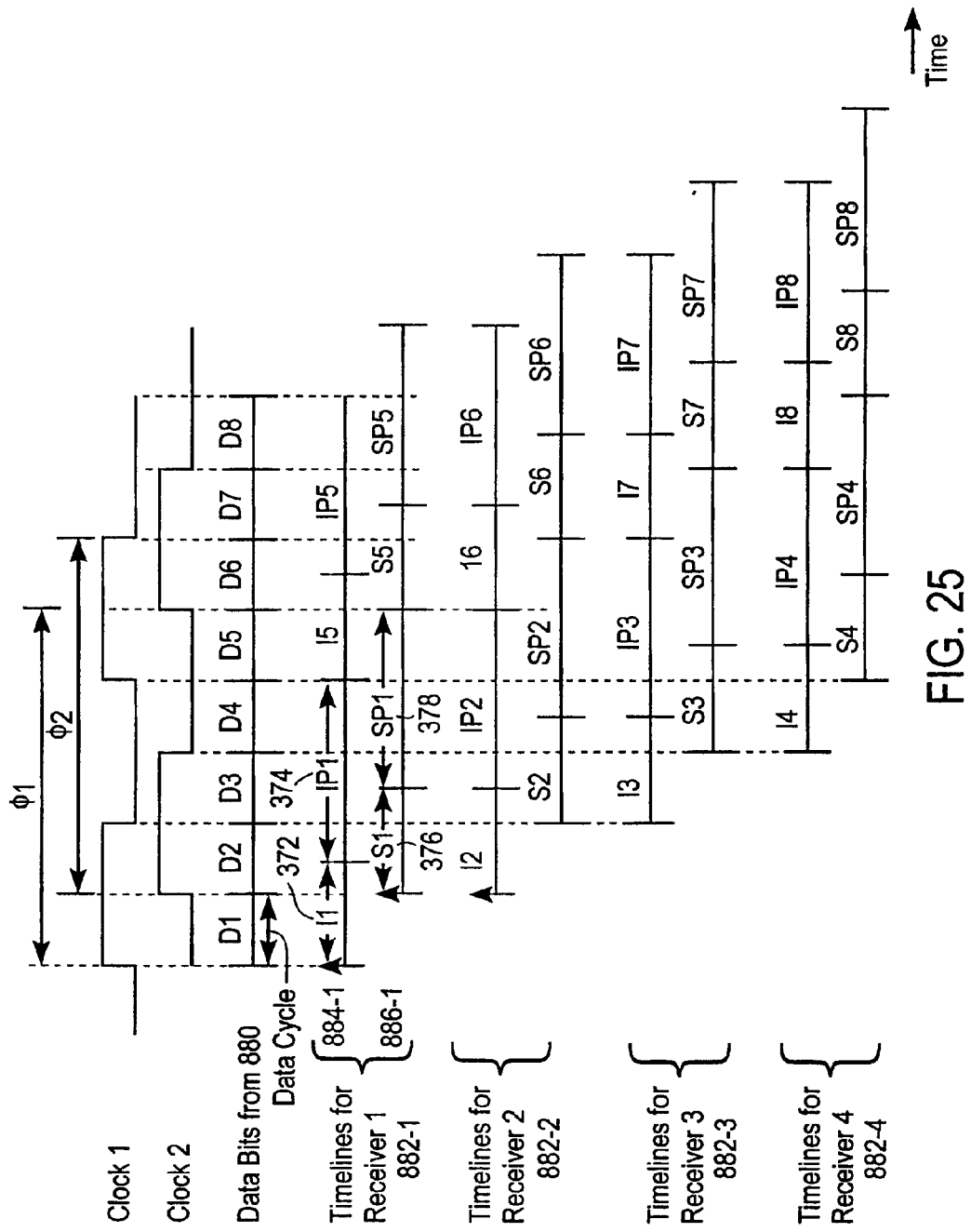
FIG. 25 is a timing diagram for the multi-phased bus architecture of FIG. 24.

In FIG. 24, in a multi-phased receiver system 870, four receivers 780 of the present invention are connected in parallel and operated concurrently in multiple phases using four sets of timing signals φ1, φ2, φ3 and φ4. Referring also to FIG. 25, the operation of the multi-phased receiver system 870 of FIG. 24 will now be described. Data bits are received from a signal line of a bus as shown in timeline 880. Each data bit Di is supplied to the bus for a bit time or data cycle. A pair of timelines 882 is shown for each receiver 780. The pair of timelines 882 represents the timing signals φi that control the receiver 780. The pair of timelines 882 includes an integration timeline 884 and sensing timeline 886. For example, the integration timeline 884-1 has integration intervals, I1 372 for data bit one and I5 for data bit five; and integration precharge intervals IP1 374 for data bit one and IP5 for data bit five. Generally, the Integration interval Ii is the time that the receiver 780 operates in the integration phase for the data cycle of the associated data bit Di. The sensing timeline 886-1 ss divided into sensing intervals S1 376 for data bit one, and S5 for data bit five, and sensing precharge intervals SP1 378 for data bit one, and SP5 for data bit five. For example, for data bit one D1, the timing signals defining φ1 extend from the start of the integration interval I1 to the end of the sense amplifier precharge interval SP1. The integration and sensing timing was described above with respect to FIG. 8. Each receiver 780-2, 780-3, 780-4 has the same timing except that the timing for each respective data bit is phase shifted.

Two clock signals, clock 1 and clock 2, define the boundaries of the data cycles. The clock signal clock 2 is phase shifted by ninety degrees with respect to clock 1. In an alternate embodiment, a single high speed clock that operates at twice the frequency of clock 1 defines the boundaries of the data cycles.

For example, at the beginning of the first data cycle for data bit one D1, the integration phase for receiver 1 780-1 begins. Near or at the end of the first data cycle for data bit one D1, the sensing operation begins. The sensing operation stores the accumulated voltage from the integration phase and converts the output of the integrator to a logic signal, having predetermined high and low voltage levels. The logic signal that represents data bit one from the first data cycle is available at the end of the sensing interval S1. After the integration phase, receiver one 780-1 enters the precharge phase IP1. After the sense amplifier and latch convert the output of the integrator and store the state of the logic signal, respectively, the sense amplifier begins the sensing precharge phase SP1. Since the integration precharge phase IP1 ends in the data cycle for data bit four D4, receiver 1 780-1 is available to receive a new data bit at the data cycle for data bit five D5. Since receiver 1 780-1, and the other receivers, can not receive a new data bit for the three data cycles following the data cycle associated with the data bit being received, four receivers are used. In this way, very high data cycle rates, on the order of at least one gigabit per second, are achieved.

An Equalizer to Compensate for Intersymbol Interference

In high-speed signaling applications, the communications medium may cause problems such as intersymbol interference. The integration nodes of the integrator are used to correct for intersymbol interference using an equalization circuit and an accumulated voltage offset cancellation circuit. To compensate for the intersymbol interference, a filter can be used either at the driver or the receiver. The integrator itself is a form of filter (a matched filter) and with some adjustments can incorporate a form of equalization to substantially counter the intersymbol interference.

In FIG. 26A, an equalization circuit 900 compensates for intersymbol interference by applying a portion of the charge accumulated for the previous data bit to the new data bit by adjusting the amount of precharge on the integration nodes during the precharge cycle. The even and odd receivers 780 receive data bits from two adjacent data cycles such as an even and an odd cycle. The even receiver 780-even receives data on one phase of the clock, and the odd receiver 780-odd receives data on the other phase of the clock. The equalization circuit 900 is coupled between the outputs of the even and odd receivers.

The equalization circuit 900 compensates for intersymbol interference dynamically as data bits are received by applying a portion of the integration voltage generated at an integration node of a previously received bit to precharge the integration nodes for the next bit. The equalization circuit 900 includes a first operational amplifier 902 connected in series with a first NMOS transistor 904. The operational amplifier 902 is connected in a unity gain configuration with its positive input (+) connected one of the integration nodes (D) of the integrator 780-even. The first NMOS transistor 904 is connected between the output of the operational amplifier 902 and an integration node (C) of an adjacent receiver 780-odd. The gate of the first NMOS transistor 904 is controlled by the output of an inverter 906 which receives the complement of the Precharge signal, Precharge_B, and receives power from an Equalization Ratio Control Voltage 908. The equalization ratio control voltage 908 determines the amount of charge supplied to the integration node during the precharge cycle by controlling the resistance of the first NMOS transistor 904 when the Precharge signal is active. The equalization circuit 900 also couples the C output of the even integrator 780-even to the D output of the odd integrator 780-odd using a second operational amplifier 912 and a second NMOS transistor 914.

The A and B nodes of the odd and even integrators are connected in the same manner as the C and D nodes, but are not shown for simplicity. Furthermore, identical operational amplifier circuits (not shown) are provided for transferring charge from the odd integrator outputs A-odd through D-odd to the even outputs A-even through D-even.

Referring to FIG. 26B, the precharge transistors of the precharge circuit 470 of the integrator in combination with equalization circuitry form a voltage divider 920, as shown in FIG. 26C, in which R1 is the equivalent resistance of the precharge transistor 474 and R2 is the variable resistance of transistor 904. During the precharge phase of the odd receiver 780-odd, the voltage on the integration nodes of the integrators in the odd receiver is precharged using $V_{Precharge}$ which is based on the voltage accumulated during the integration phase of the even receiver.

The equalization ratio control voltage 908 determines the amount of charge supplied during the precharge cycle. The equalization ratio control voltage 908 may be loaded into a register and supplied as an analog voltage by a digital-to-analog converter.

Input Voltage Offset Error Compensator

The input voltage offset error includes the voltage offsets inherent in the preamplifier, integrator, and sense amplifier. To compensate for the accumulated voltage offsets of the preamplifier, integrator and sense amplifier, an adjustment is made to the precharge voltage level of the integration nodes of the integrator in each receiver.

In FIG. 27A, a voltage offset cancellation circuit 930 includes an offset transistor, NMOS transistor 932, that connects in parallel with the operational amplifier 902 and transistor 904 of the equalizer circuit, described above, and ground. An offset control voltage 934 is supplied to the gate of the offset transistor 932 to adjust the voltage $V_D$ at integration node D.

In FIG. 27B, a circuit diagram shows the equivalent resistance of the various components. Equivalent resistors R1 and R2 were described above with respect to FIG. 25C. The voltage offset cancellation circuit 930 corresponds to the equivalent variable resistor R3. Although the voltage offset cancellation circuit 930 was described with respect to a single integration node, preferably the same circuit 930 is applied to each integration node.

The offset control voltage 934 may be stored in a register and output by a digital-to-analog converter.

Adjusting the Timing of the System Clock Using an Integrating Receiver

In the embodiments that will now be discussed with reference to FIGS. 28A, 28B, 28C and 28D, an integrating receiver is used as a phase detector in the clock recovery circuit 751 of FIG. 18.

Figure 28A:
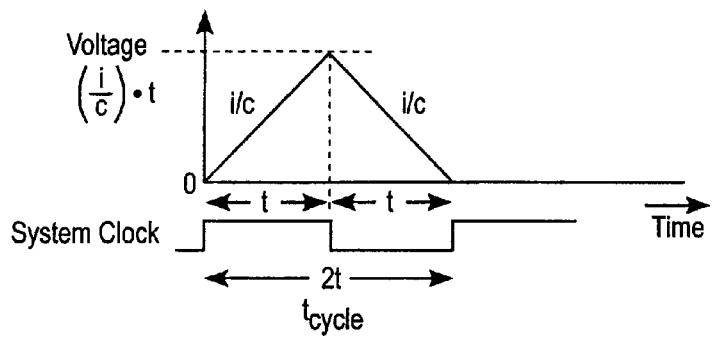
FIG. 28A is a graph of the accumulated voltage between the integration nodes of the integrator of the present invention when integrating a system clock with a fifty percent duty cycle.

Referring to FIG. 28A, when the system clock signal is integrated by the integrator (e.g., when the integrator is functioning as a phase detector in a delay-locked loop (DLL) or phase-locked loop (PLL), the accumulated output voltages between the integration nodes increase during a first phase of the system clock and decrease during the second phase of the system clock. The period of the system clock $t_{cycle}$ is defined as $2t$; and each phase of the system clock extends for an interval t. At the end of the second phase of the system clock, the accumulated output voltage is equal to zero. The voltage increases and decreases at a rate equal to the integration current (i) divided by the capacitance (C). The maximum voltage between the output nodes occurs when the first phase transitions to the second phase and is equal to the integration current i divided by the capacitance C, multiplied by the time t, (i.e., $(i/C) \cdot t$).

Figure 28B:
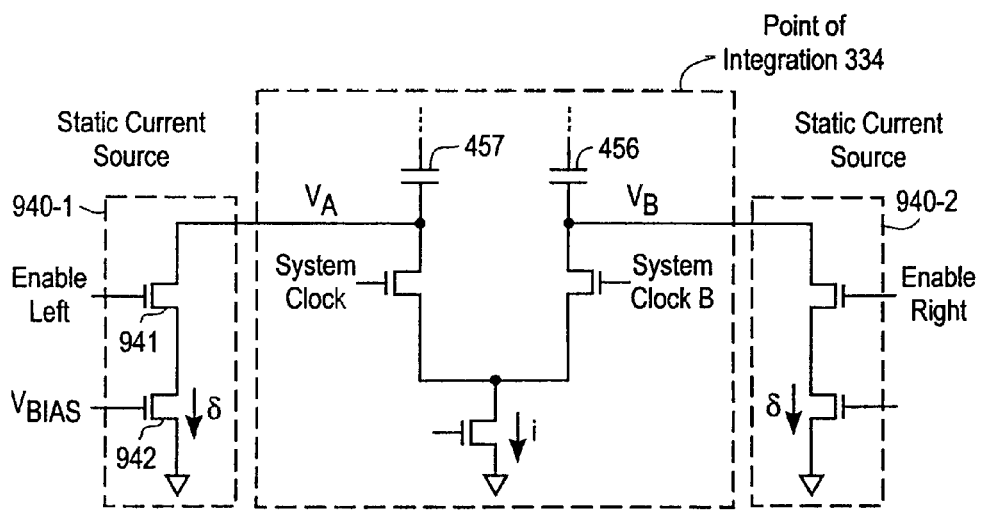
FIG. 28B is a circuit diagram of a phase detector that adds static current sources to the integrator of the present invention to determine the phase of the system clock.

In FIG. 28B, in one embodiment of the integrator 334 as a phase detector, static current sources 940 are added to the integrator 334 at nodes B and D by connecting to the capacitive elements 436, 438. When enabled, the static current sources 940 generate the same amount of current δ which is subtracted from the integration nodes. Each static current source 940 is enabled separately with enable left and enable right signals. In an alternate embodiment, the static current sources increase the amount of current supplied to the integration nodes, such a integration nodes A and C. By adding or subtracting the current δ from the integration nodes, the system timing can be adjusted by fractions of the cycle time, independent of process, voltage and temperature.

Figure 28C:
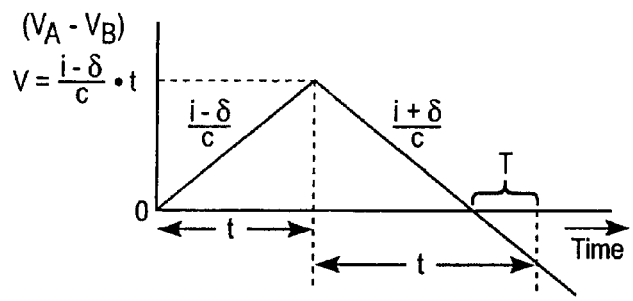
FIG. 28C is a graph of the voltage between the integration nodes of the circuit of FIG. 28B.

In FIG. 28C, for example, a graph of the voltage between the integration nodes A and C is shown when static current is injected into the integration nodes. The integrator output voltage increases at a rate equal i/C and decreases at a rate equal to the integration current i plus the static current δ (i+δ) divided by the capacitance (C), (i.e., v=(i+δ)/C). At the end of the system clock period 2t, the integrated output voltage has a negative value. Therefore, the additional static current δ causes the zero crossing during the second phase of the system clock to occur earlier. The difference in the timing between this zero crossing and the end of the second phase of the system clock is referred to as τ. Since the clock recovery circuit of FIG. 18 adjusts the timing of the on-chip-system clock to match the zero crossings of the accumulated voltage integration at the integration node, this difference in the timing or timing offset τ is used to shift the phase of the system clock by a predetermined amount. The timing offset τ is defined by the following relationship:

$$\tau = (\delta/(i+\delta)) \cdot t_{cycle},$$

where $t_{cycle}$ is the period of the system clock which is equal to $2t$.

Note that the timing offset τ is independent of process, voltage and temperature and is equal to the ratio of the added current to the total current. Therefore the timing offset τ provides a simple and inexpensive way to provide a phase offset.

The static current sources 940 are the same, and therefore only static current source 940-1 will be described. Two NMOS transistors 941 and 942 are connected in series between the integration node and ground. An enable signal causes the NMOS transistor 941 to become active and allow the static current δ to flow. Because transistor 942 is a current source, transistor 942 is connected to a bias voltage $V_{BIAS}$. The magnitude of the bias voltage is set by the desired offset current. Alternatively, the switched static current source 940-2 could be used to produce a negative timing offset, −τ.

Figure 28D:
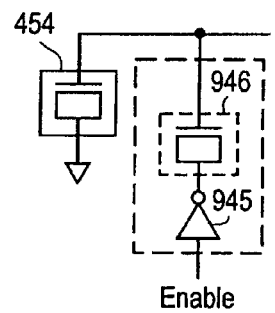
FIG. 28D is a circuit diagram of a phase detector that increases the capacitance of a capacitive element of the integrator of the present invention to determine the phase of the system clock.

In FIG. 28D, an alternate embodiment provides a phase detector by connecting a delta-capacitor circuit 944 at the one of the capacitive elements of the integration node. The delta-capacitor circuit adjusts the capacitance of one side of the integrator, and therefore the output voltage will appear as in FIG. 28C. When the enable signal is high, the inverter 945 enables the delta-capacitive-element 946 to accumulate charge.

Multi-PAM

Referring back to FIG. 6, in the embodiments of the invention described thus far, signals transmitted on each signal line of the bus have either of two voltage levels representing a binary zero or one for binary digital communication. For example, an output voltage equal to the voltage level $V_{TERM}$ set by the voltage source at one end of the termination resistor $Z_0$ may represent a binary zero, while an output voltage level equal to $V_{TERM}-(I \cdot Z_0)$ may represent a binary one, where the output driver circuit sinks an amount of current equal to I. In this way, the bus driver circuits can be implemented as switched current sources which sink current when driving binary one's onto the signal lines. When receiving data, the receiver circuits detect whether the voltage on the signal line is greater than or less than $V_{TERM}-0.5 \; (I \cdot Z_0)$ to determine whether the data is a binary zero or one, respectively. In one embodiment, data is transmitted and received on each edge of the system clock to achieve a data bit rate equal to twice the frequency of the system clock. In an alternate embodiment, data is transmitted once per clock cycle of the system clock.

Although the multi-PAM signaling of the present invention will be described with respect to a current mode bus, multi-PAM signaling can also be used in a voltage mode bus.

In various embodiments of the present invention, the data rate on the bus is increased without increasing either the system clock frequency or the number of signal lines. Output drivers generate and receivers detect multi-pulse-amplitude-modulated (multi-PAM) signals that allow multiple (k) bits to be transmitted or received as one of $2^k$ possible voltages or data symbols at each clock edge. For example, in a 4-PAM system two bits are represented by $2^2$ or four voltages or possible data symbols, and the two bits are transferred at every clock edge by transferring the appropriate one of the four voltages. Therefore, the data rate of a 4-PAM system is twice that of a binary or 2-PAM system.

Multi-PAM is not traditionally used in multi-drop bus systems due to the lower signal-to-noise ratio in systems in which even the signal to noise ratio for binary signals is barely adequate. Prior art memory systems have been implemented as only binary systems. In particular, in this invention, an integrating receiver is used in a multi-PAM system to increase the signal-to-noise ratio to an acceptable level.

Figure 29:
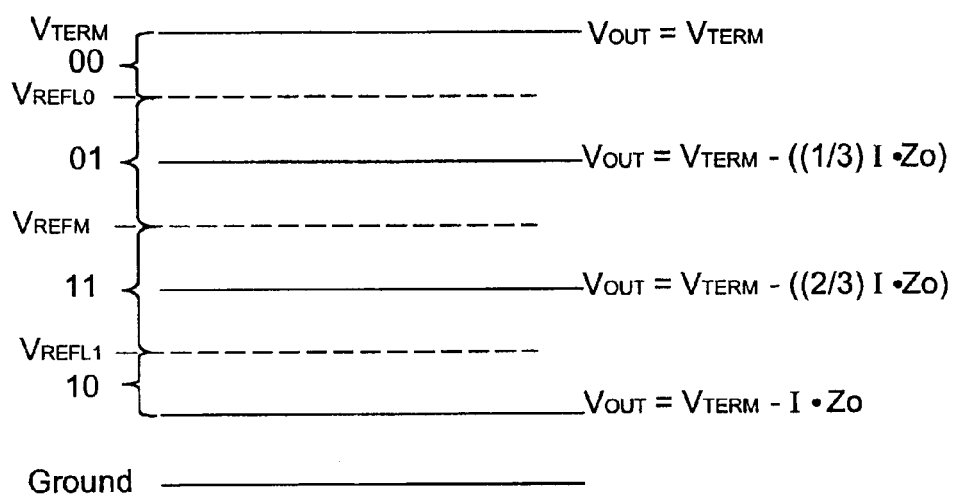
FIG. 29 is a graph of the transitions between data bits in a multi-PAM system that encodes the voltage levels of two data bits using Gray coding.

In FIG. 29, a graph shows one embodiment of the 4-PAM signaling voltages. In one embodiment, the multi-PAM voltage levels are assigned consecutive binary values or symbols such as 00, 01, 10 and 11, from the lowest voltage to the highest voltage. In the embodiment of FIG. 29, the binary values are assigned to voltage levels using Gray coding. Gray coding reduces the probability of dual-bit errors because only one of the two bits changes at each transition between voltages levels. If a received 4-PAM voltage symbol is misinterpreted as an adjacent symbol, a single-bit error will occur.

The y-axis shows the associated 4-PAM output voltages $V_{OUT}$ for each symbol. To provide the appropriate voltage to transmit a 4-PAM symbol, the output driver sinks a predetermined amount of current for that symbol. In particular, each symbol is associated with a different amount of current. To transmit a "00", the output driver sinks no current and the signal line is pulled up to $V_{TERM}$. To transmit a "01", the bus output driver sinks a predetermined amount of current $I_{o1}$ to cause the output voltage $V_{OUT}$ to equal $$V_{TERM} - \frac{1}{3}(I \cdot Zo),$$

where $I_{o1}$ is equal $$\frac{1}{3}I.$$

To transmit a "11", the bus output driver sinks a predetermined amount of current $I_{11}$ to cause the output voltage $V_{OUT}$ to equal $$V_{TERM} - \frac{2}{3}(I \cdot Zo),$$

where $I_{11}$ is equal to $$\frac{2}{3}I.$$

To transmit a "10", the bus output driver sinks a predetermined amount of current I to cause the output voltage $V_{OUT}$ to equal $V_{TERM}-(I \cdot Z_0)$.

To improve noise immunity, the 4-PAM receiver identifies a received symbol based on a voltage range or range of voltages associated with that symbol. A set of reference voltages $V_{REFL0}$, $V_{REFM}$ and $V_{REFL1}$ function as thresholds to define ranges of voltages associated with each 4-PAM symbol. The reference voltages $V_{REFL0}$, $V_{REFM}$ and $V_{REFL1}$ are set at the midpoint voltage between neighboring symbols. For example, the symbol "00" is associated with voltage range from $V_{REFL0}$ to $V_{TERM}$. The symbol "10" is associated with a range of voltage from $V_{REFL1}$ to $V_{TERM}-(I \cdot Z_0)$. The symbol "11" is associated with a range of voltage from $V_{REFL1}$ to $V_{REFM}$. The symbol "01" is associated with a range of voltage from $V_{REFM}$ to $V_{REFL0}$. The reference voltages $V_{REFL0}$, $V_{REFM}$ and $V_{REFL1}$ are threshold voltages at which a multi-PAM data bit is determined to be one of an adjacent set of bits. For example, if the voltage of a received symbol is between $V_{REFM}$ and $V_{REFL0}$, that bit is determined to represent "01."

4-PAM symbols or signals also allow for direct compatibility with 2-PAM or binary signaling. When operating in 4-PAM mode, the received data bits are compared to the three reference voltages, $V_{REFL0}$, $V_{REFM}$ and $V_{REFL1}$, to determine the 4-PAM symbol and the associated two bits. Since the most significant bit (MSB) is determined by comparing the received data bit to $V_{REFM}$, the multi-PAM system can be used as a 2-PAM system by ignoring the least significant bit LSB) and using the MSB. To transmit 2-PAM symbols using the gray code of FIG. 29, the LSB is set equal to zero (low) while the MSB determines the output voltage.

Multi-PAM signaling increases the data rate with a small increase in power consumption because the number of input/output (I/O) pins and the system clock frequency is the same as that used for binary signaling. The major factor in the power consumption of CMOS circuits is the $CV^2F$ power which depends directly on the system clock frequency. Therefore increasing the system clock frequency to increase the data rate directly increases the power consumption. Although some additional power is used for the additional circuitry of the multi-PAM interface, described below, this increase in power is much less than the increase in power that would occur if either the number of I/O pins or the system clock frequency were increased to increase the data rate.

Multi-PAM signaling also increases the data rate without a corresponding increase in the electro-magnetic interference (EMI). If the data rate were increased by increasing the number of I/O pins or by increasing frequency, the EMI would increase proportionally. Because multi-PAM signaling does not increase the number of I/O pins, the EMI does not increase if the total voltage amplitude of the multi-PAM I/O pins remains the same as that used in binary signaling. The total voltage amplitude may be increased to provide greater voltage margin to improve system reliability. Although the EMI would increase correspondingly, the increase would be smaller than that incurred by increasing the number of I/O pins with binary signaling.

The circuits described below use 4-PAM signaling, but can be expanded for use in 8-PAM, 16-PAM, and more generally, N-PAM signaling.

Multi-Pam Output Driver

Figure 30:
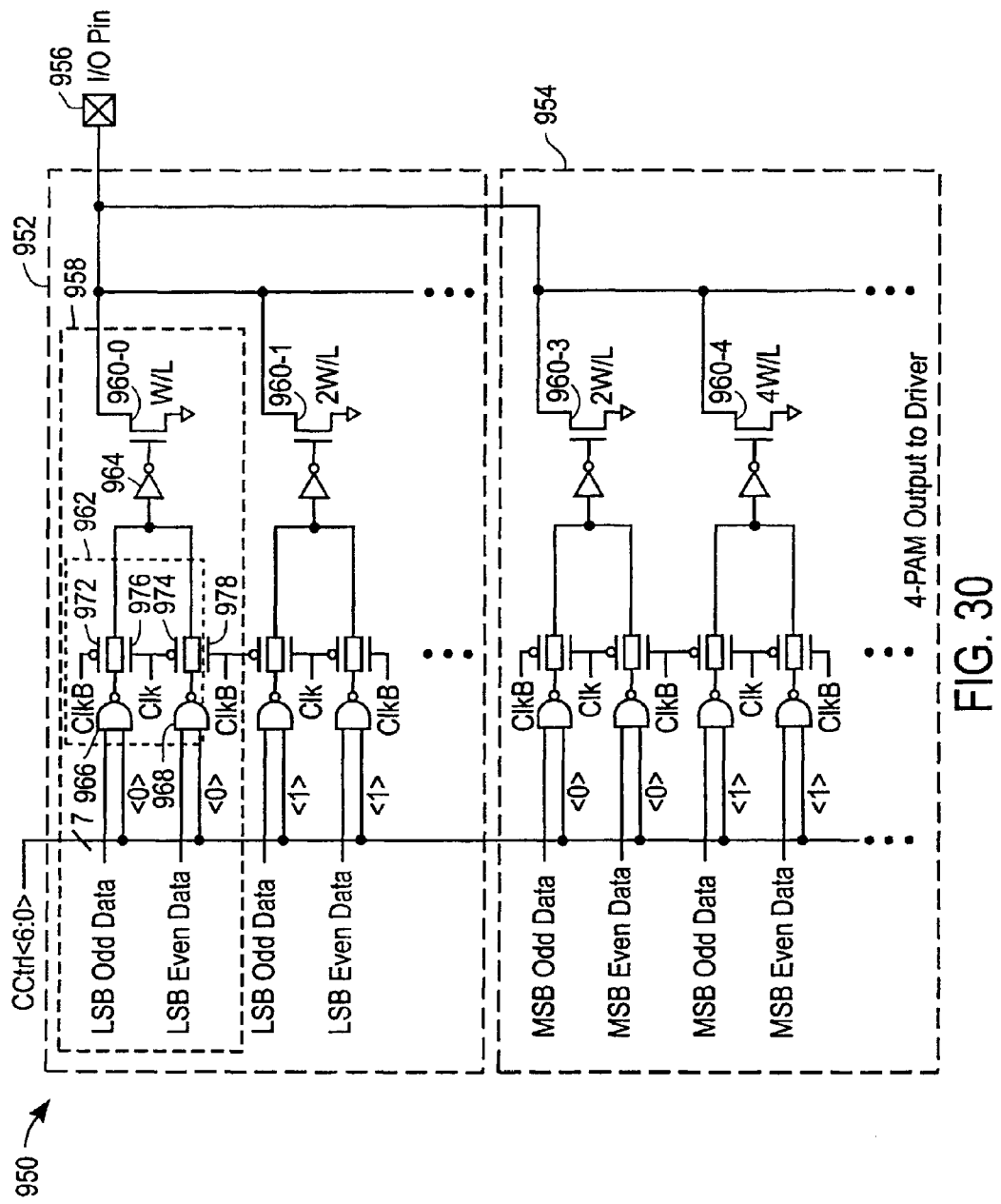
FIG. 30 is a circuit diagram of a multi-PAM output driver according to an embodiment of the present invention.

In FIG. 30, a 4-PAM output driver circuit 950 is used with current control bits (CCtrl<6:0>) to produce desired output voltage levels over a set of on-chip process, voltage and temperature (PVT) conditions. In the output driver 950, a first driver circuit 952 and a second driver circuit 954 connects to an I/O pin 956. The first driver circuit 952 drives the LSB, while the second driver circuit 954 drives the MSB. The first driver circuit 952 and the second driver circuit have a set of driver blocks 958 that are connected in parallel. Since the driver blocks have the same components, one driver block 958 will be described. Each driver block has a binary weighted driver transistor 960-0 with a width to length (W/L) ratio as shown. The driver transistors 960 of the second driver circuit 954 are twice as large as the driver transistors of the first driver circuit 952 because the second driver circuit 954 drives the MSB while the first driver circuit 952 drives the LSB. In other words, the MSB is driven with twice as much current as the LSB.

In driver block 958, odd and even data bits are multiplexed onto the driver transistors 960 via passgates 962 and an inverter 964. Odd data is transmitted at the rising edge of the clock, while even data is transmitted at the falling edge of the clock. NAND gates 966, 968 connect to current control bit zero <0>, and the LSB Odd Data bit and the LSB even data bit, respectively. When the respective current control bit zero <0> is high, the NAND gates 966, 968 are responsive to the odd and even data. When the respective current control bit is low, the output of the NAND gates 966, 968 is low and the driver block 958 does not respond to the data bit. The current control bits provide the specified amount of current to cause the desired voltage swing regardless of the PVT conditions. The circuit of FIG. 28 uses seven current control bits. Techniques for determining the setting of the current control bits corresponding to the PVT conditions are not part of the present invention but part of the context in which this invention operates and will not be further described.

The passgates 962 include two transistor pairs, each pair including a PMOS transistor 972, 974 connected in parallel with an NMOS transistor 976, 978. The clock and clock_b signals connect in an opposite manner to the gates of the transistors of the transistor pairs.

Although FIG. 30 shows that the first driver circuit 952 drives the LSB and the second driver circuit drives the MSB 954, in an alternate embodiment, the first driver circuit 954 drives the MSB and the second driver circuit drives the LSB. Alternately, any arbitrary coding scheme can be produced by placing combinational logic to combine the data bits before sending the combined data bit to the driver block 958.

Table 1 below shows two 4-PAM encoding schemes that can be implemented using the output driver 950 of FIG. 28.

TABLE 1

Encoding Schemes

| Coding Scheme | Data Bits (Symbol) to be Transmitted | MSB Input | LSB Input | Output Voltage |
|---|---|---|---|---|
| Binary | 00 | 0 | 0 | $V_{TERM}$ |
|  | 01 | 0 | 1 | $V_{TERM} - \frac{1}{3}(I \cdot Z_0)$ |
|  | 10 | 1 | 0 | $V_{TERM} - \frac{2}{3}(I \cdot Z_0)$ |
|  | 11 | 1 | 1 | $V_{TERM} - (I \cdot Z_0)$ |

TABLE 1-continued

Encoding Schemes

| Coding Scheme | Data Bits (Symbol) to be Transmitted | MSB Input | LSB Input | Output Voltage |
|---|---|---|---|---|
| Gray | 00 | 0 | 0 | $V_{TERM}$ |
|  | 01 | 0 | 1 | $V_{TERM} - \frac{1}{3}(I \cdot Z_0)$ |
|  | 10 | 1 | 1 | $V_{TERM} - (I \cdot Z_0)$ |
|  | 11 | 1 | 0 | $V_{TERM} - \frac{2}{3}(I \cdot Z_0)$ |

TABLE 2

Mapping of Data Bits to ABC Inputs and Encoding Schemes

| Coding Scheme | Data Bits (Symbol) to be Transmitted | A | B | C | Output Voltage |
|---|---|---|---|---|---|
| Binary | 00 | 0 | 0 | 0 | $V_{TERM}$ |
|  | 01 | 1 | 0 | 0 | $V_{TERM} - \frac{1}{3}(I \cdot Z_0)$ |
|  | 10 | 1 | 1 | 0 | $V_{TERM} - \frac{2}{3}(I \cdot Z_0)$ |
|  | 11 | 1 | 1 | 1 | $V_{TERM} - (I \cdot Z_0)$ |
| Gray | 00 | 0 | 0 | 0 | $V_{TERM}$ |
|  | 01 | 1 | 0 | 0 | $V_{TERM} - \frac{1}{3}(I \cdot Z_0)$ |
|  | 10 | 1 | 1 | 1 | $V_{TERM} - (I \cdot Z_0)$ |
|  | 11 | 1 | 1 | 0 | $V_{TERM} - \frac{2}{3}(I \cdot Z_0)$ |

Figure 31:
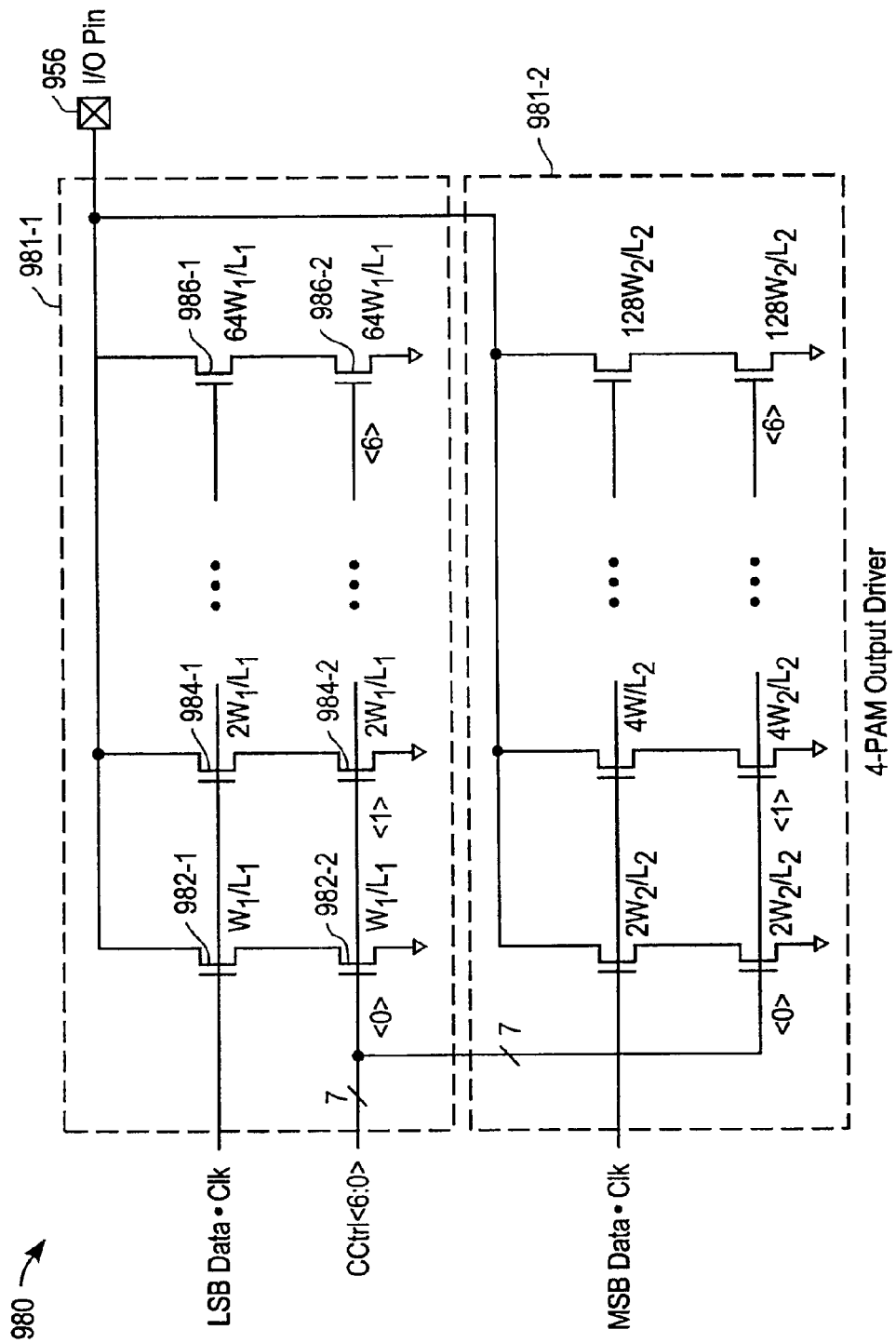
FIG. 31 is a circuit diagram of a multi-PAM output driver according to another embodiment of the present invention.

In another embodiment shown in FIG. 31, an 4-PAM output driver 980 uses current control bits to produce the specified amount of current resulting in the desired output voltage levels. Two sets 981-1 and 981-2 of binary weighted transistors 982-986 combine the current control bits with 4-PAM signal generation. The current control bits directly control current-control NMOS transistors 982-2, 984-2, 986-2 that are connected in series with the driver transistors 982-1, 984-1, 986-1, respectively, that receive the data. For odd data, the driver transistors 982-1, 984-1, 986-1, cause current to flow to the I/O pin 956 when the respective data bit and the clock signal are high, and the associated current control bit is high to place NMOS transistors 982-2, 984-2 and 986-2 in the active state.

The circuit for even data is not shown, but a separate set of current control NMOS transistors connects in series with a set of driver transistors that respond to the logical "AND" of the respective data bit and the complement of the clock signal Clock_b for even data.

The output voltages of the circuits of FIGS. 30 and 31 have gds distortion. In FIG. 32A, a graph shows gds distortion. The x-axis shows the drain-to-source voltage, and the y-axis shows the drain current. FIG. 32B shows the data bits, not in gray code, and the effect of gds distortion on the output voltage $V_{OUT}$. FIG. 32C shows the data bits in gray code, and the effect of gds distortion on the output voltage $V_{OUT}$. As the output voltage $V_{OUT}$ decreases, the incremental voltage difference between adjacent bit pairs decreases. Because of gds distortion, the voltage increments between the 4-PAM voltages are not equal.

Figure 33A:
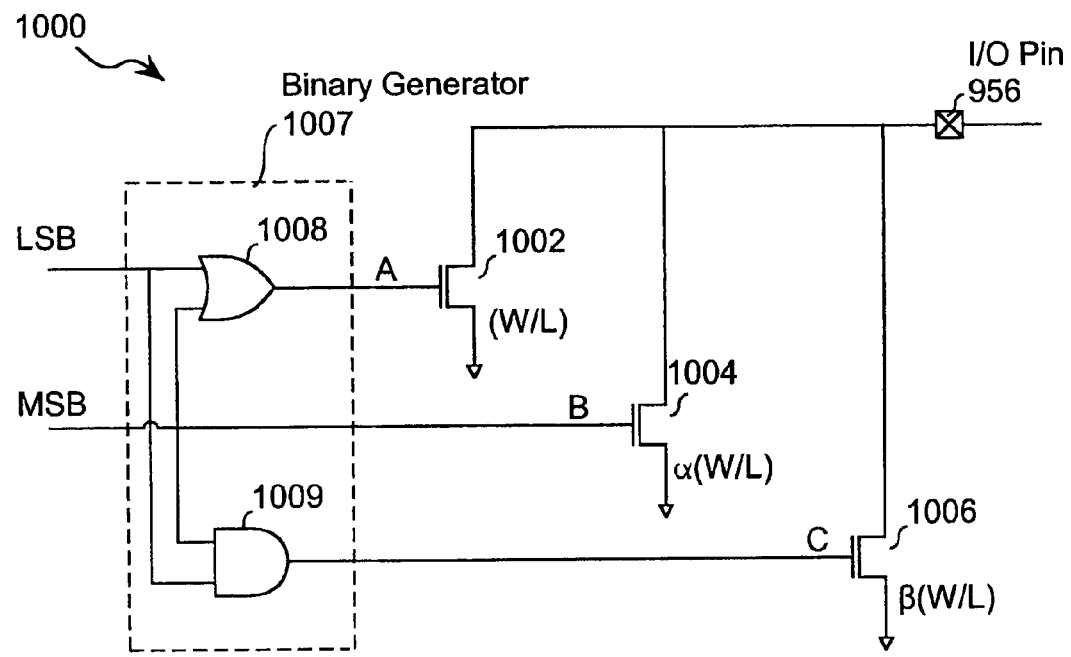
FIG. 33A is a circuit diagram of a multi-PAM output driver that corrects for gds distortion.

In FIG. 33A, a 4-PAM output driver 1000 corrects for gds distortion. For simplicity the current control bits are not shown. The gds distortion is eliminated by adjusting the width to length (W/L) ratio of transistors 1002, 1004, and 1006 by factors α and β such that β>α>1 and the incremental voltage difference between adjacent 4-PAM levels is constant. Transistors 1002, 1004 and 1006 have a width to length ratio of W/L, α(W/L) and β(W/L), respectively. For example, input signals A, B, and C are derived from the MSB and LSB of a signal to be transmitted to produce the 4-PAM levels as shown in Table 2 below. This output driver uses combinational logic 1007 to produce the A, B, C inputs according to the data bits to be transmitted.

In the combinational logic 1007, an OR gate 1008 generates the A signal by performing an OR operation between the LSB and MSB. The B input is the MSB. An AND gate 1009 generates the C signal by performing an AND operation between the LSB and MSB.

Figure 33B:
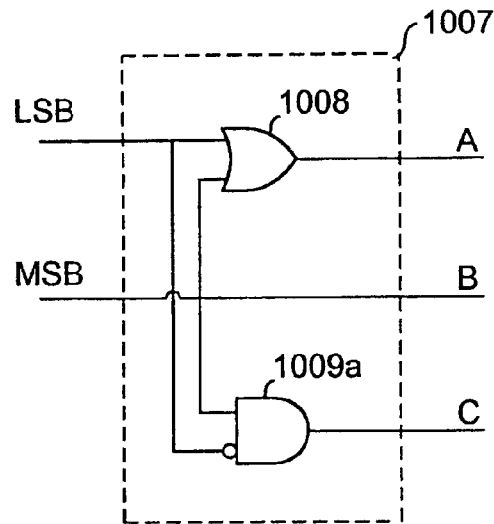
FIG. 33B is a circuit diagram of an alternate embodiment of a combinational logic circuit of FIG. 33A.

In FIG. 33B, the combinational logic 1007 encodes the LSB and MSB using gray code. The combinational logic circuit 1007 of FIG. 33B is the same as the combinational logic circuit 1007 of FIG. 33A except that, to generate the C signal, the AND gate 1009a receives the complement of the LSB rather than the LSB.

On-chip, single-ended output drivers, as shown in FIGS. 30, 31 and 32, generate switching noise. For example, when the transistors in the output driver transition from sinking no current such as when driving the "00" symbol, to sinking maximum current such as when driving the gray-coded "10" symbol, the current surges through the I/O pin 956 and through a ground pin. The path between I/O pin 956 and ground has inherent inductance which opposes the current surge and produces significant switching noise (i.e., ground bounce). Because the voltage margins for multi-PAM signaling are less than the voltage margins for binary signaling, switching noise may cause errors.

Figure 34:
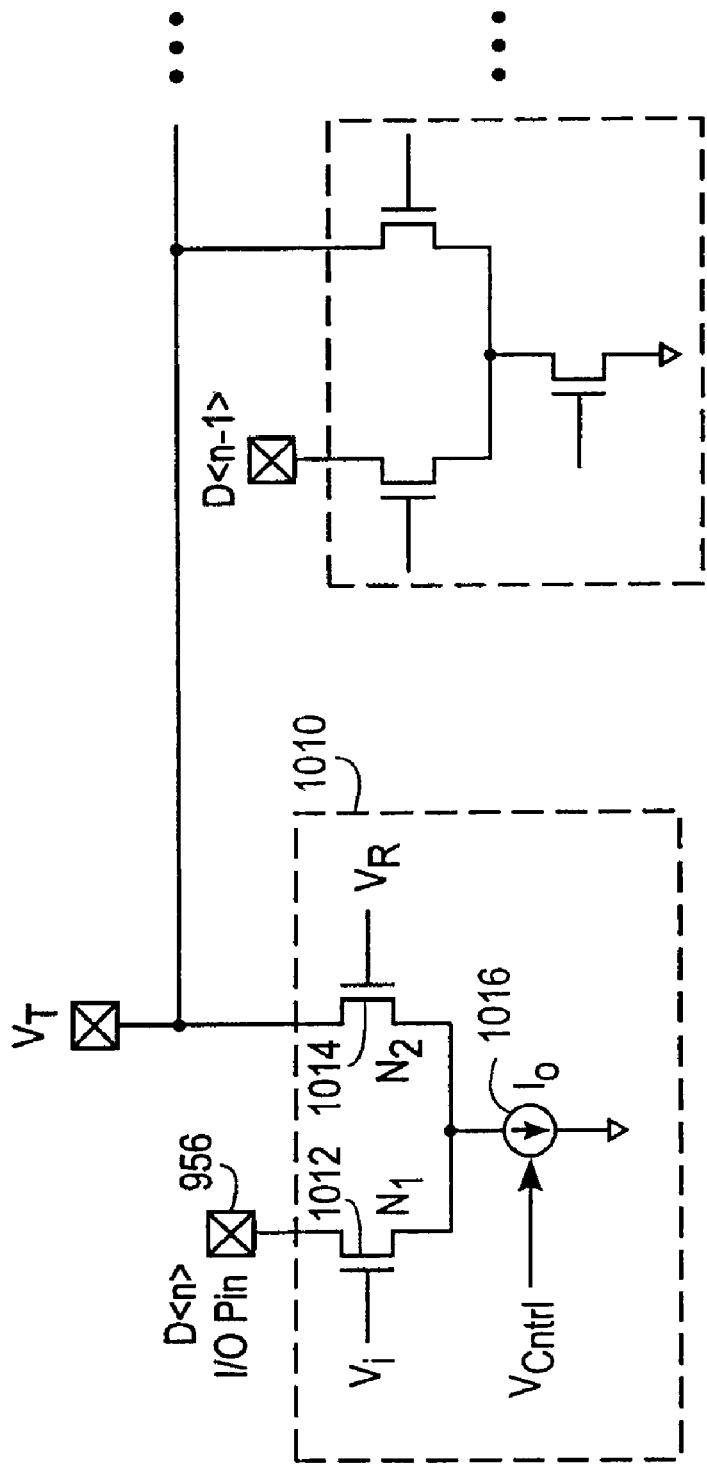
FIG. 34 is a circuit diagram of circuit to reduce switching noise at an output pin.

To reduce sensitivity to switching noise, output drivers can provide a constant or semi-constant current to ground regardless of the output current being driven. As shown in FIG. 34, each single-ended transistor branch 960 (FIGS. 30) and 986 (FIG. 31) in the output drivers of FIGS. 30 and 31 is replaced with a differential pair 1010.

When the output driver sinks output current from the I/O pin 956, current is steered through transistor N1 1012 to ground. When transistor N1 1012 is inactive, transistor N2 1014 becomes active to allow the same or substantially the same amount of current to flow to ground. In this way, a substantially constant amount of current continuously flows to ground to eliminate a large portion of the output driver switching noise and provide a quieter on-chip ground, thereby improving the performance of the 4-PAM signaling. The signal $V_R$ that controls transistor N2 1014, is the complement of the signal Vi, the signal that drives transistor N1 1012. Alternately the signal $V_R$ that drives transistor N2 1014 is a reference voltage between ground and Vi. In response to an input voltage $V_{Cntrl}$, the current source 1016 sinks a predetermined amount of current $I_o$ to ground.

Figure 35:
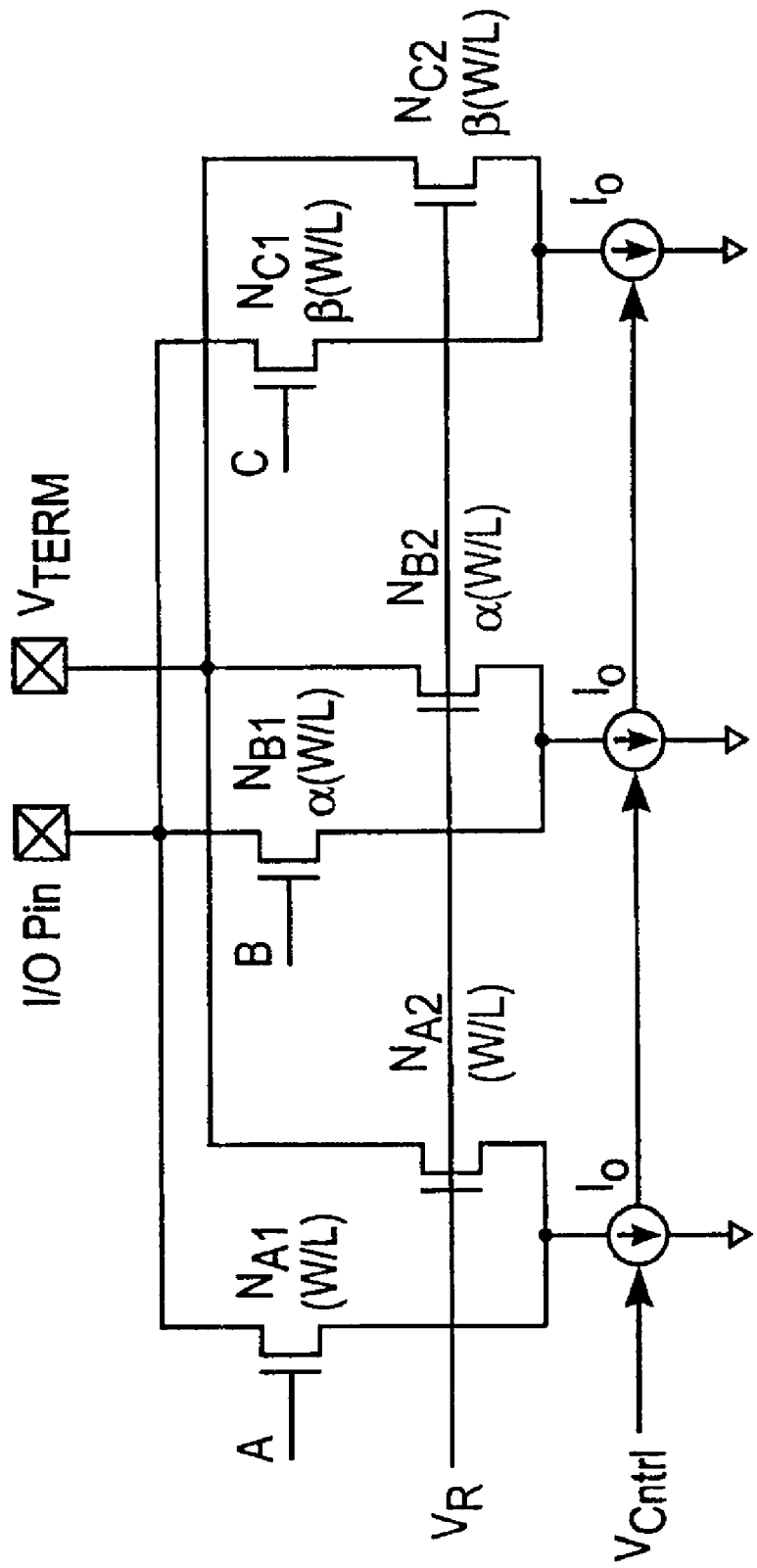
FIG. 35 is a circuit diagram of a multi-PAM output driver that corrects for gds distortion as shown in FIG. 33A and reduces switching noise as shown in FIG. 34.

FIG. 35 is another embodiment of a multi-PAM output driver which combines the circuit of FIG. 33A, which eliminates gds distortion, with the circuit of FIG. 34 to reduce sensitivity to switching noise.

Figure 36:
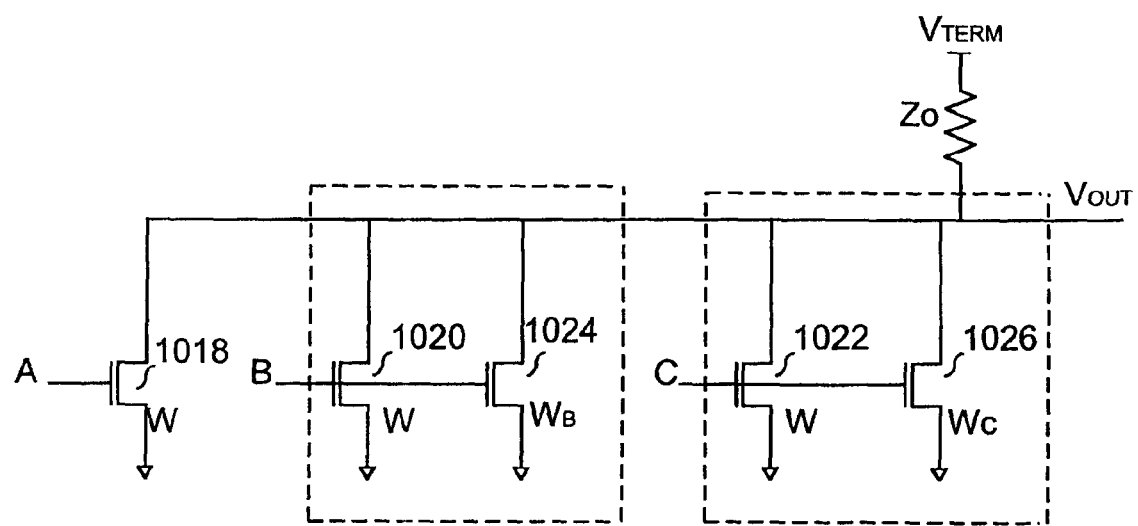
FIG. 36 is a circuit diagram of an alternate embodiment of a multi-PAM output driver that corrects for gds distortion.

In FIG. 36, yet another gds compensated 4-PAM output driver is shown. In the 4-PAM output driver, the A, B, and C signals drive equal-sized NMOS transistors 1018, 1020, 1022 having width W. In the present invention, signals B and C also drive NMOS transistors 1024, 1026 of width $W_B$ and $W_C$, respectively, to compensate for gds distortion. The widths of the NMOS transistors 1024 and 1026, $W_B$ and $W_C$, respectively, are chosen such that the difference between output levels for adjacent bits is substantially the same, such as ⅓ ($I \cdot Z_0$). The widths of the transistors 1018-1026 have the following relationship:

$$W_B < W_C \ll W.$$

Figure 37A:
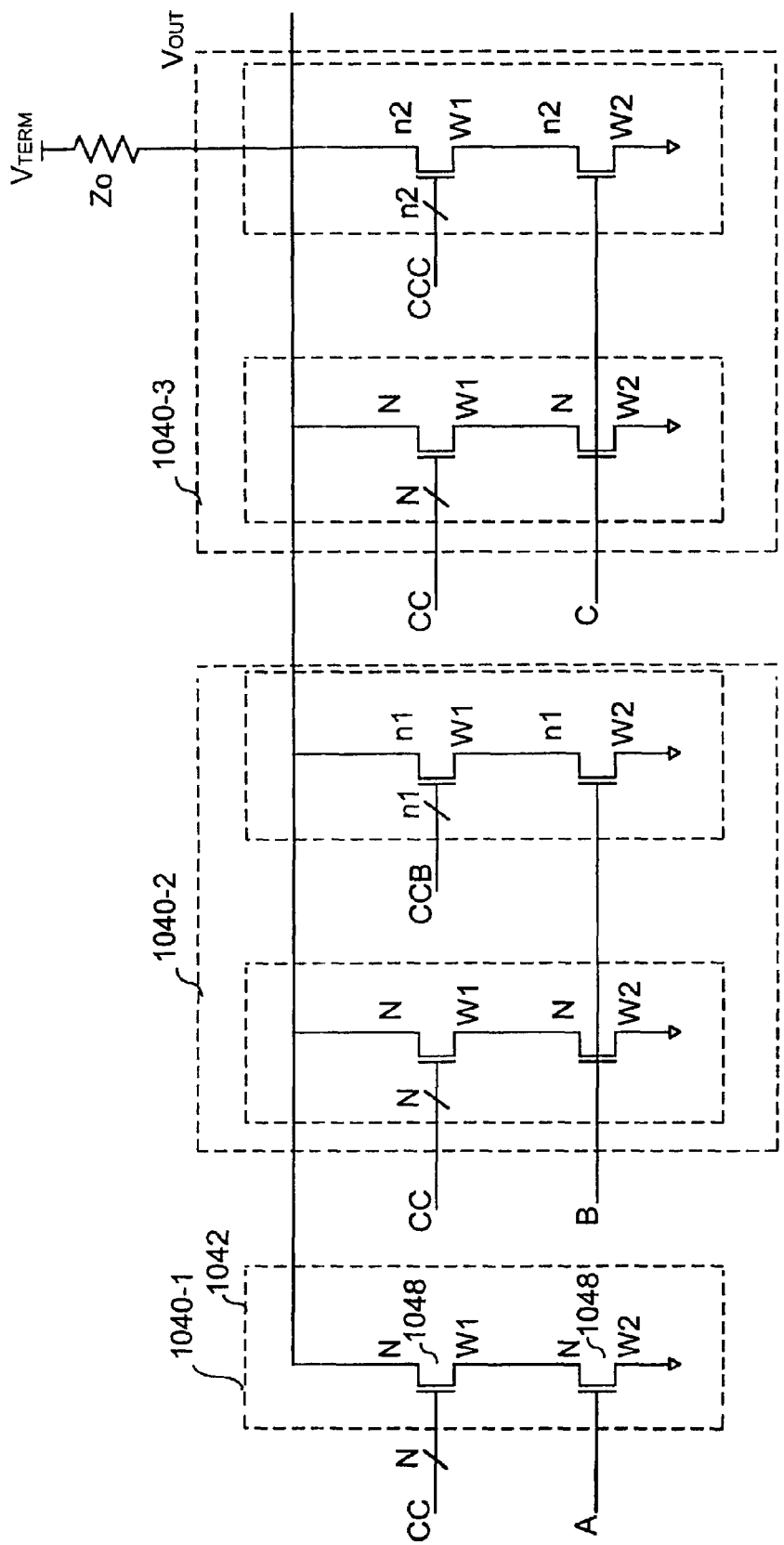
FIG. 37A is a circuit diagram of a multi-PAM output driver that corrects for gds distortion and provides current control.

In FIG. 37A, a 4-PAM output driver corrects for gds distortion and provides current control. As described above, the signals A, B and C determine the output voltage or symbol in accordance with the gray-coded binary signaling shown in Table 2, above. In addition, three sets of current control calibration bits, CC, CCB and CCC, respectively, determine the amount of current supplied by the output driver for various combinations of A, B and C. The first set of control bits CC provides primary current control, while the second and third sets of current control bits, CCB and CCC, respectively, fine tune the amount of current. The first set of current control bits CC has N bits; the second set of current control bits CCB has n1 bits; and the third set of current control bits CCC has n2 bits. In one embodiment, the relationship between the number of current control bits is as follows:

$$n1 \leq n2 \leq N.$$

There may be different relationships between N, n1 and n2 in alternative embodiments.

Each of the A, B and C signals is associated with a current drive block 1040 to drive a predetermined amount of current associated with the symbol. Each current drive block 1040 includes one or more sets of stacked transistor pairs 1042 that are associated with each set of current control bits for that current drive block 1040. For example, the current drive block 1040-1 that drives the A signal receives current control bits CC. The current drive block 1040-2 that drives the B signal receives current control bits CC and CCB. The amount of current supplied by current drive block 1040-2 is adjusted for gds distortion using the CCB bits. The current drive block 1040-3 that drives the C signal receives current control bits CC and CCC. The amount of current supplied by current drive block 1040-3 is adjusted for gds distortion using the CCC bits.

Figure 37B:
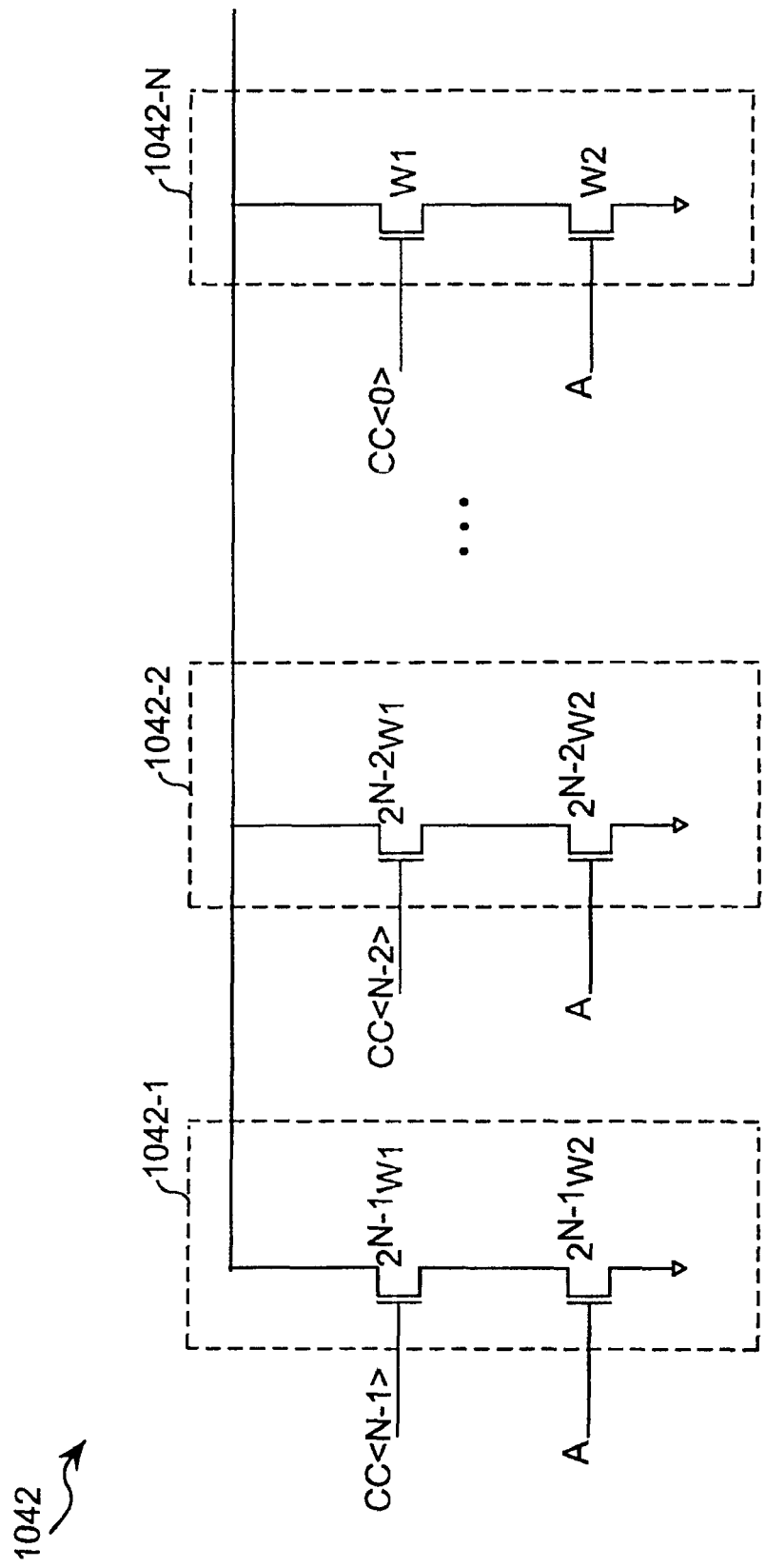
FIG. 37B is a circuit diagram of a set of stacked transistor pairs of the circuit of FIG. 37A.

Referring also to FIG. 37B, a set of stacked transistor pairs 1042 is shown. Each stacked transistor pair 1042 includes two NMOS transistors 1046, 1048 connected in series. The lower NMOS transistor 1046 connects to one of the A, B, or C signals associated with the current drive block 1040. The upper NMOS transistor 1048 connects to a current control bit. The lower NMOS transistor 1046 is preferably wider than the upper NMOS transistor 1048. Because there are N CC bits, there are N stacked transistors pairs. For example, the current control block 1040 has N stacked transistor pairs 1042-1 to 1042-N, and each stacked transistor pair connects to one of the current control bits, CC<0> to CC<N-1>.

The transistors of the stacked transistor pairs are binary weighted with respect to a minimum width of W1 for the upper transistors, and W2 for the lower transistors. The widths W1 and W2 are chosen to determine output characteristics such as output resistance and capacitance. Generally, the widths W1 and W2 are chosen such that W1 is less than W2.

The circuit diagram of FIG. 37B also applies to the sets of stacked transistor pairs associated with the CCB and CCC current control bits.

Figure 38:
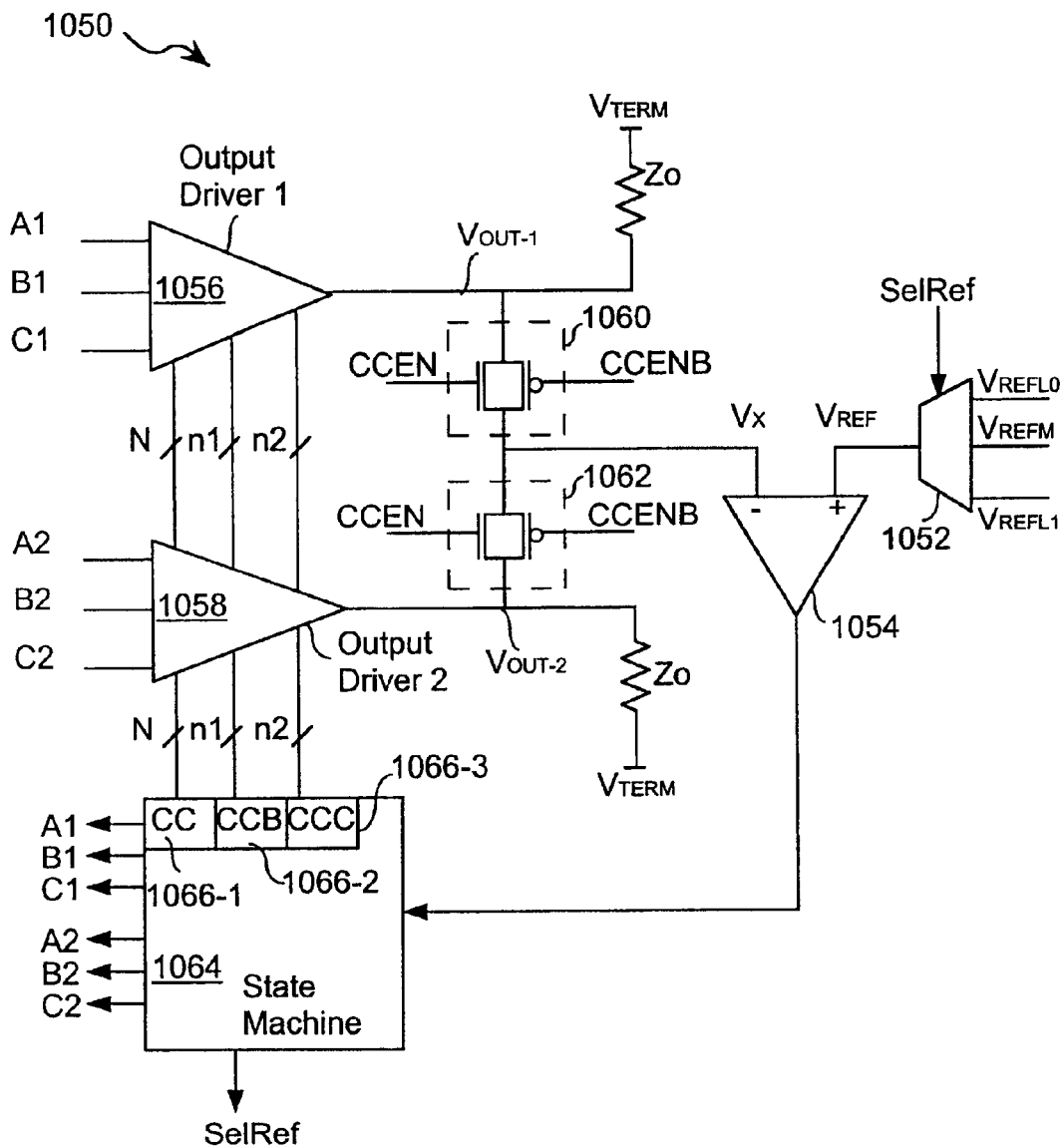
FIG. 38 is a circuit diagram of a current control calibration circuit that sets the current control bits of FIG. 37A.

As shown in FIG. 38, a current control calibration circuit 1050 determines the settings for the current control bits CC, CCB and CCC by selecting a current control reference voltage $V_{REF}$; and comparing the current control reference voltage $V_{REF}$ to a voltage at a mid-point between two calibration output voltages $V_{OUT-1}$ and $V_{OUT-2}$. The current control calibration circuit 1050 determines settings for each of the sets of current control bits CC, CCB and CCC for each 4-PAM output voltage such that $V_{OUT-1}$ and $V_{OUT-2}$ provide each adjacent pair of voltage levels to the circuit.

A multiplexor 1052 receives the three 4-PAM reference voltages, $V_{REFL0}, V_{REFM}$ and $V_{REFL1}$. A select reference voltage signal, SelRef, selects one of the reference voltages as the selected current control reference voltage $V_{REF}$. A comparator 1054 compares the selected current control reference voltage $V_{REF}$ to a mid-point voltage $V_X$ and generates a comparison signal.

To generate the mid-point voltage $V_X$, output driver 1 1056 sinks a first amount of current to provide the first output voltage $V_{OUT-1}$ and output driver 2 1058 sinks a second amount of current to provide the second output voltage $V_{OUT-2}$. Two passgate pairs 1060, 1062, in response to a current control enable and its complementary signal, act as a resistor divider to provide the midpoint voltage $V_X$ between the first output voltage $V_{OUT-1}$ and the second output voltage $V_{OUT-2}$.

A state machine 1064 includes first, second and third counters, 1066-1, 1066-2, and 1066-3, that provide the first, second and third sets of current control bits, CC, CCB, and CCC, respectively. If the comparison signal indicates that the midpoint signal $V_X$ is greater than the reference voltage $V_{REF}$, the state machine 1064 increments an associated set of current control bits by one to increase the amount of current that is sunk by the output driver, thereby decreasing the midpoint voltage. If the midpoint signal $V_X$ is less than the current control reference voltage $V_{REF}$, the state machine 1064 decrements the associated current control bits by one, thereby increasing the midpoint voltage.

In one embodiment, the current control bits are calibrated during a power-up sequence. The theory of operation for calibrating the current control bits is as follows. The first set of current control bits CC provide the primary amount of current control for each current control block 1040. To compensate for gds distortion, the CCB and CCC current control bits fine tune the amount of current associated with the Gray-coded "11" and "10" signals, respectively. The current control bits are calibrated in the following order: CC, CCB, then CCC.

In an alternate embodiment, the current control bits may be calibrated after power-up in response to triggering events, e.g., lapse of a period of time, or in response to a threshold number of errors.

Referring also to FIG. 32B, the first and main set of current control bits CC are set using the voltage difference between the "00" and "01" symbols. The first set of current control bits CC are set to provide an amount of current to provide the output voltage for the "01" symbol such that $V_{REFL0}$ is placed at the midpoint between the output voltage for the "00" symbol and the output voltage for the "01" symbol. Because the difference in output voltage Vout is the greatest between the "00" and "01" symbols, the voltage difference between the "01" and "11" symbols, as well as the "11" and "10" symbols will then be set equal to the voltage difference of the "00" and "01" symbols during system calibration.

As shown in FIG. 32B, because of gds distortion, without compensation, the voltage difference between the "01" symbol and the "11" symbol is less than the voltage difference between the "00" symbol and the "01" symbol. To compensate for the gds distortion, the output voltage for the "11" symbol is decreased by increasing the amount of current sunk by the output driver. The second set of current control bits CCB are set to increase the current sunk by the output driver such that the output voltage becomes equal to the desired voltage level when the midpoint voltage between output voltage for the "01" and "11" is equal to $V_{REFM}$.

Finally, the third set of current control bits CCC is adjusted to compensate for the gds distortion between the voltage associated with the "11" symbol and the voltage associated with the "10" symbol.

Figure 39A:
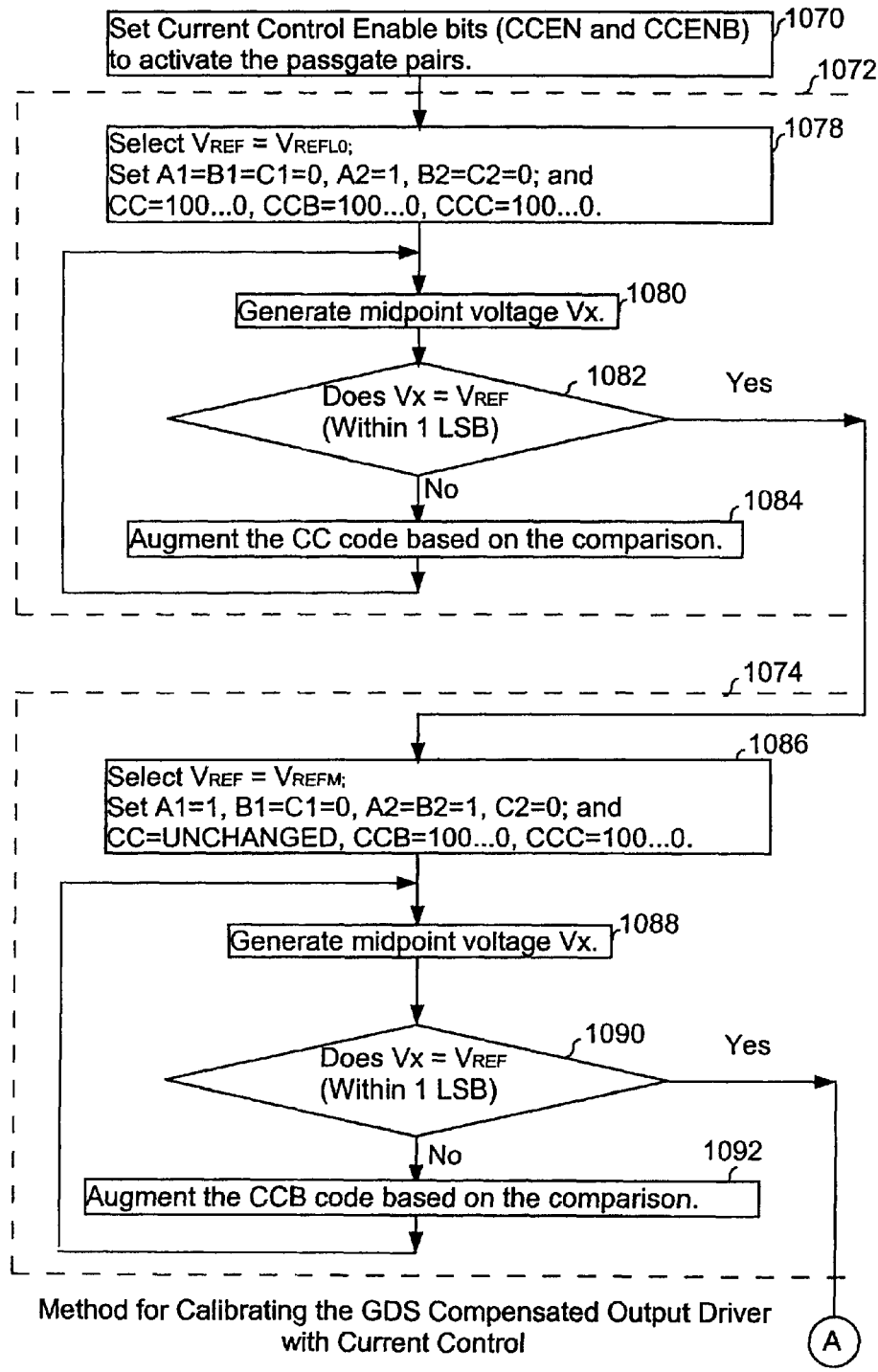
FIGS. 39A and 39B are a flowchart of a method of calibrating the current control bits using the circuit of FIG. 38 for the output driver of FIG. 37A.
Figure 39B:
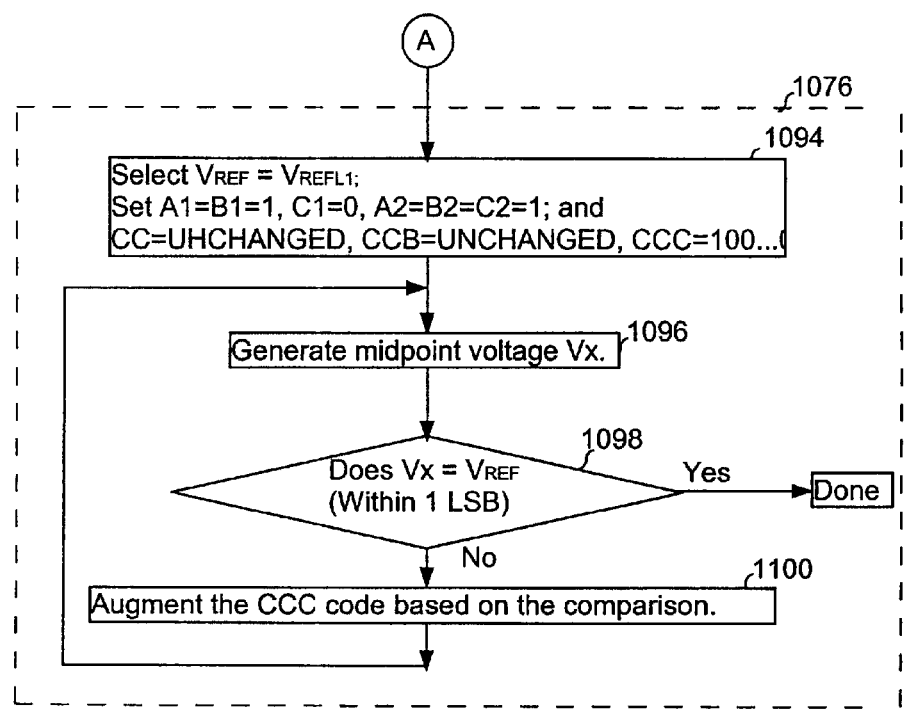

Referring to FIGS. 38, 39A and 39B, the operation of the circuit 1050 including the state machine 1064 will be described. The flowchart of FIG. 39 uses gray coded output voltages. In step 1070, the current control enable signal (ccen) and its complement (ccenb) are set to activate the passgate pairs 1060 and 1062 and output the midpoint voltage $V_X$, described above.

Three major blocks of steps 1072, 1074 and 1076 set the current control bits, CC, CCB and CCC, respectively.

In block 1072, step 1078 sets the initial conditions for determining the settings for the first set of current control bits CC. The state machine 1064 outputs the select reference voltage signal (SelRef) which causes the multiplexor 1054 to output the reference voltage $V_{REFL0}$ to the comparator 1054. A "00" symbol is supplied to output driver 1 1056 by outputting multi-PAM bit selection signals A1, B1 and C1 with values of zero. A "01" symbol is supplied to output driver 2 1058 by outputting multi-PAM bit selection signals A2 with a value of one, and B2 and C2 with a value of zero. The initial state of the first, second and third current control bits is as follows:

CC={1 0 0 ... 0};

CCB={1 0 0 ... 0}; and

CCC={1 0 0 ... 0}.

The current control bits are initially set such that the stacked transistor pair sinking the most current will be activated.

In step 1080, the output drivers 1 and 2 output the voltages corresponding to the symbols "00" and "01" and the midpoint voltage $V_X$ is generated. In step 1082, the comparator 1054 compares the midpoint voltage $V_X$ to the selected reference voltage $V_{REFL0}$. When the midpoint voltage is within one least significant bit of the reference voltage $V_{REFL0}$, the first set of current control bit have the proper setting. The state machine 1058 determines that the midpoint voltage $V_X$ is within one least significant bit of the reference voltage $V_{REFL0}$ when the current control bits begin to oscillate between two settings. In other words, the output of the comparator will alternate between a zero and a one.

In step 1084, when the midpoint voltage $V_X$ is not within one least significant bit of the reference voltage $V_{REFL0}$, the state machine 1064 augments the first set of current control bits depending on the result of the comparison. The term "augment" is used to indicate either incrementing or decrementing the current control bits. The process proceeds to step 1080.

If, in step 1082, the state machine 1064 determines that the midpoint voltage $V_X$ is within one least significant bit of the reference voltage, the process proceeds to step 1086 to calibrate the second set of current control bits, CCB.

In step 1086, the initial conditions for calibrating the second set of current control bits CCB are set. The state machine 1064 outputs the select reference voltage signal (SelRef) which causes the multiplexor 1054 to output the reference voltage $V_{REFM}$ to the comparator 1054. A "01" symbol is supplied to output driver 1 1056 by outputting multi-PAM bit selection signals A1 with a value of one, and B1 and C1 with values of zero. A "11" symbol is supplied to output driver 2 1058 by outputting multi-PAM bit selection signals A2 and B2 with a value of one, and C2 with a value of zero. The state of the first set of current control signals CC remains unchanged. The initial state of the second and third sets of current control bits, CCB and CCC, respectively, is as follows:

CCB={1 0 0 ... 0};

CCC={1 0 0 ... 0}.

In step 1088, the output drivers 1 1056 and 2 1058 output the voltages corresponding to the symbols "01" and "11", and the passgate pairs 1060, 1062 output the midpoint voltage $V_X$. In step 1090, the comparator 1054 compares the midpoint voltage $V_X$ to the selected reference voltage $V_{REFM}$. When the midpoint voltage is not within one least significant bit of the reference voltage $V_{REFM}$, as described above with respect to $V_{REFL0}$, in step 1092, the state machine 1064 augments the second set of current control bits CCB by one and the process repeats at step 1086.

When the midpoint voltage is within one least significant bit of the reference voltage $V_{REFM}$, as described above with respect to $V_{REFL0}$, the second set of current control bits CCB have the proper setting and the process proceed to step 1094 to calibrate the third set of current control bits, CCC.

In step 1094, the initial conditions for calibrating the third set of current control bits CCC are set. The state machine 1064 outputs the select reference voltage signal (SelRef) which causes the multiplexor 1054 to output the reference voltage $V_{REFL1}$ to the comparator 1054. A "11" symbol is supplied to output driver 1 1056 by outputting multi-PAM bit selection signals A1 with a value of one, and B1 and C1 with values of zero. A "10" symbol is supplied to output driver 2 1058 by outputting multi-PAM bit selection signals A2 and B2 with a value of one, and C2 with a value of zero. The state of the first and second sets of current control signals CC and CCB, respectively, remains unchanged. The initial state of the third sets of current control bits CCC is as follows:

CCC={1 0 0 ... 0}.

In step 1096, the output drivers 1 1056 and 2 1058 output the voltages corresponding to the symbols "11" and "10", and the passgate pairs 1060, 1062 output the midpoint voltage $V_X$. In step 1098, the comparator 1054 compares the midpoint voltage $V_X$ to the selected reference voltage $V_{REFL1}$. When the midpoint voltage is not within one least significant bit of the reference voltage $V_{REFL1}$, as described above with respect to $V_{REFL0}$, in step 1100, the state machine 1064 augments the third set of current control bits CCC by one and the process repeats at step 1094.

In step 1098, when the midpoint voltage is within one least significant bit of the reference voltage $V_{REFL1}$, the appropriate settings for the first, second and third sets of current control bits, CC, CCB and CCC, respectively, are determined and the calibration is complete.

Multi-Pam Receiver

Figure 40:
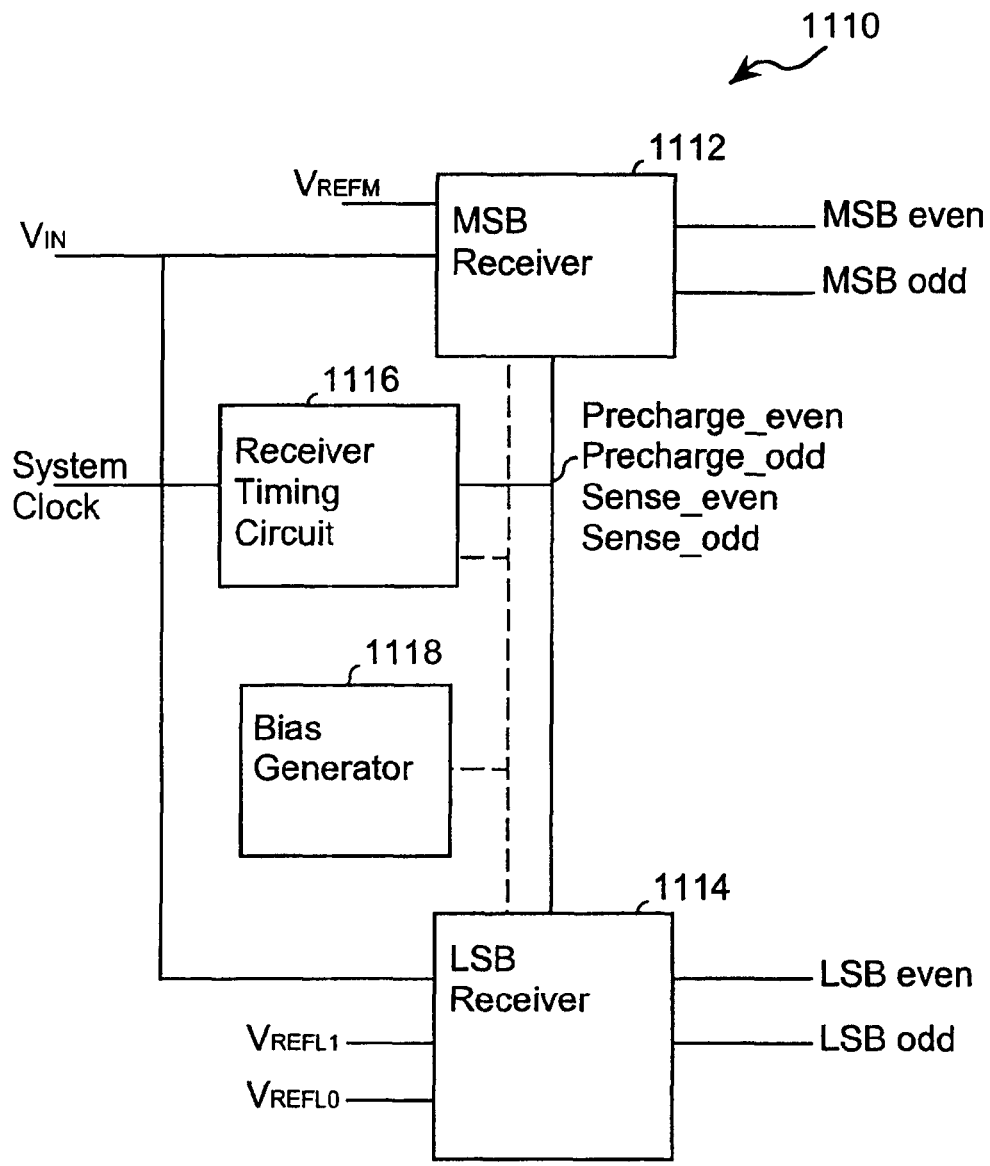
FIG. 40 is a block diagram of a multi-PAM receiver system.

In FIG. 40, a 4-PAM receiver 1110 has a most-significant bit (MSB) receiver block 1112 that receives the input voltage Vin and generates the most-significant bit of the 4-PAM signal for the even and odd phases of the system clock. The 4-PAM receiver 1110 also has a LSB receiver block 1114 that receives the input voltage Vin and generates the least-significant bit of the 4-PAM signal for the even and odd phases of the system clock. A receiver timing circuit 1116 generates the precharge and sense signals for the even and odd phases of the system clock in accordance with the timing diagrams and circuitry discussed above. The receiver timing circuit 1116 receives the system clock and provides the precharge and sense signals to the MSB receiver 1112 and LSB receiver 1114. A bias generator 1118 generates bias voltages used by the receiver timing circuit 1116, MSB receiver 1112, and the LSB receiver 1114.

In the MSB receiver 1112, the input voltage $V_{IN}$ is compared to the reference voltage $V_{REFM}$ to generate the MSB. In the LSB receiver 1114, the input voltage $V_{IN}$ is compared to the $V_{REFL0}$ and $V_{REFL1}$ reference voltages to generate the LSB.

Figure 41:
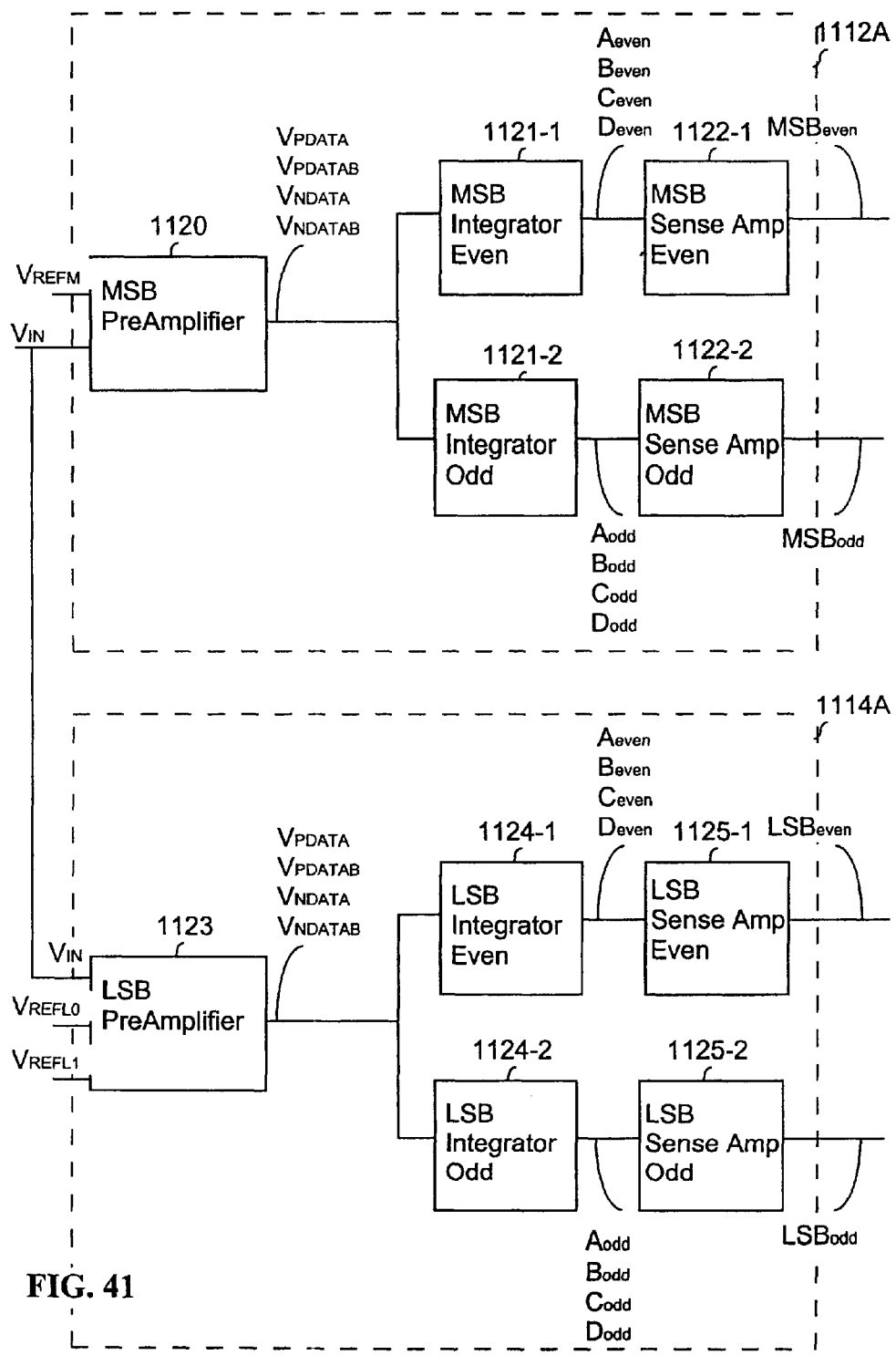
FIG. 41 is a block diagram of the MSB and LSB receivers of FIG. 40 that uses a preamplifier to compare an input voltage to a reference voltage for even and odd data.

In FIG. 41, an embodiment of an MSB receiver 1112A and LSB receiver 1114A is shown in more detail. In this implementation, the MSB receiver 1112A compares the input voltage $V_{IN}$ to the reference voltage $V_{REFM}$ in the preamplifier 1120. The MSB preamplifier 1120 receives the input voltage $V_{IN}$ and provides two pairs of differential output voltages $V_{PDATA}$ and $V_{PDATAB}$, and $V_{NDATA}$ and $V_{NDATAB}$, during each phase of the clock cycle for the even and odd MSB integrators 1121. The MSB preamplifier 1120 will be discussed in further detail below.

The MSB integrators 1121 output two pairs of differential integration voltages on nodes A, B, C, and D. In one implementation, the MSB integrators 1121 use the integrator of FIG. 11C. In another implementation, the MSB integrators 1121 use the integrator of FIG. 12. Each MSB integrator 1121 supplies the integration voltages to the corresponding (even or odd) MSB Sense Amplifier 1122. In one implementation, the MSB sense amplifiers 1122 use the sense amplifier of FIG. 14A. In an alternate implementation, the MSB sense amplifiers 1122 use the sense amplifier of FIG. 14B.

In the LSB receiver 1114A, the LSB preamplifier 1123 compares the input voltage $V_{IN}$ to the reference voltages $V_{REFL0}$ and $V_{REFL1}$ prior to integration. The LSB preamplifier 1123 receives the input voltage $V_{IN}$ and provides two pairs of differential output voltages $V_{PDATA}$ and $V_{PDATAB}$, and $V_{NDATA}$ and $V_{NDATAB}$, during each phase of the clock cycle for the even and odd LSB integrators 1124. The LSB integrators 1124 and LSB sense amplifiers 1125 are the same as the MSB integrators 1121 and MSB sense amplifiers 1122, respectively, described above.

In an alternate embodiment, the MSB and LSB integrators, 1121 and 1124, respectively, are not used, and the sense amplifier of FIG. 15 is used. In other words, a sense amplifier of FIG. 15, which performs the integration function within the sense amplifier, replaces each integrator-sense amplifier pair.

Figure 42:
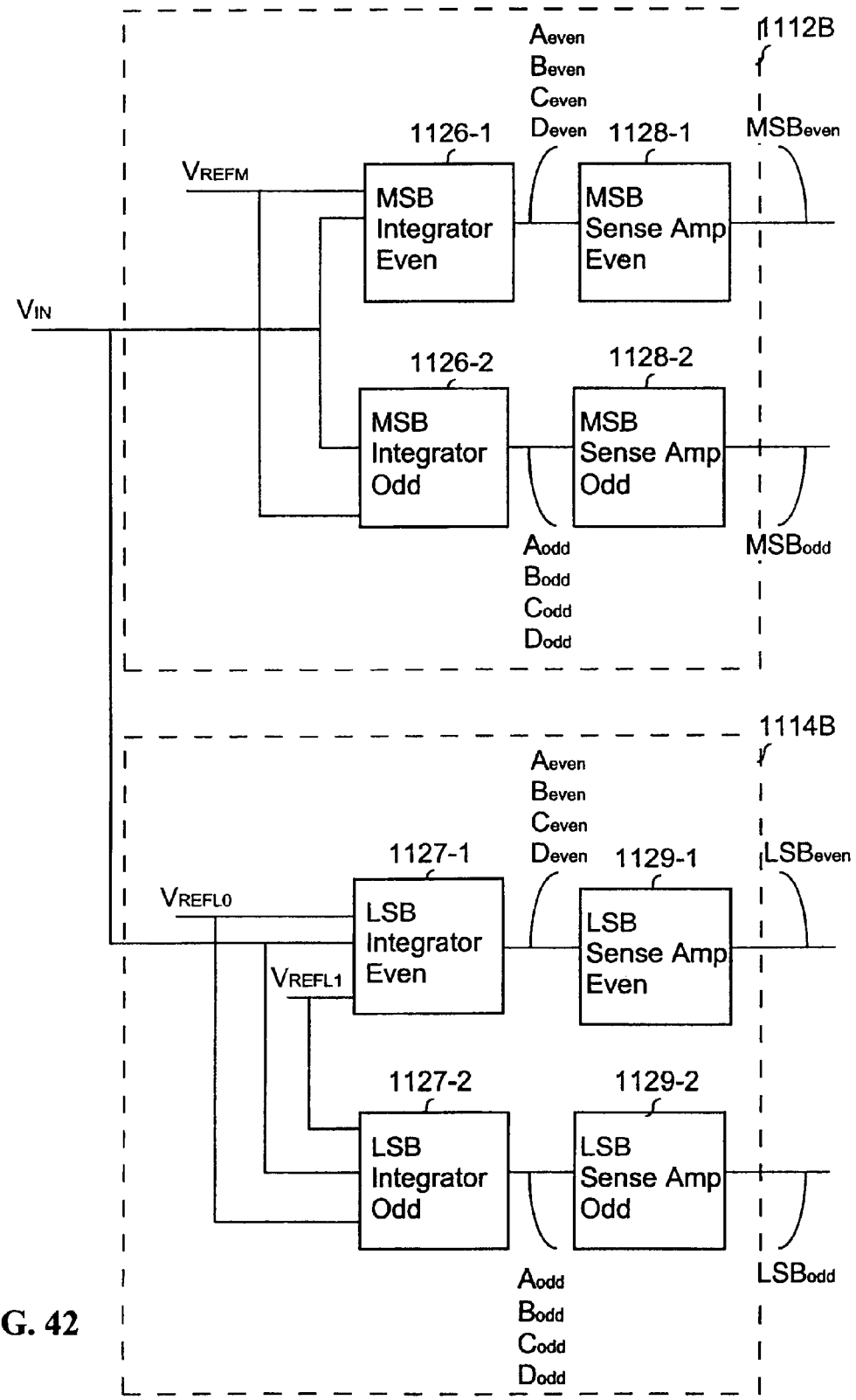
FIG. 42 is a block diagram of an alternate embodiment of the MSB and LSB receivers of FIG. 40 that does not use a preamplifier and compares the input voltage to the reference voltage in the integrator for even and odd data.

As shown in FIG. 42, in an alternate embodiment, the MSB preamplifier 1120 and LSB preamplifier 1123 of FIG. 41 are not used, and the integrators 1126, 1127 compare the input voltage $V_{IN}$ to the reference voltages. The MSB reference voltage $V_{REFM}$ is supplied to the MSB integrators 1126. The LSB reference voltages $V_{REFL0}$ and $V_{REFL1}$ are supplied directly to the LSB integrators 1127. The MSB and LSB sense amplifiers, 1128 and 1129, respectively, are the same as the MSB and LSB sense amplifiers of FIG. 41. In one implementation, the MSB integrators 1126 use the circuit of FIG. 11B. In an alternate implementation, the MSB integrators 1126 use the circuit of FIG. 11C.

Various embodiments of the LSB integrators 1127 will be discussed below. The LSB sense amplifiers 1129 are the same as the MSB sense amplifiers.

Figure 43:
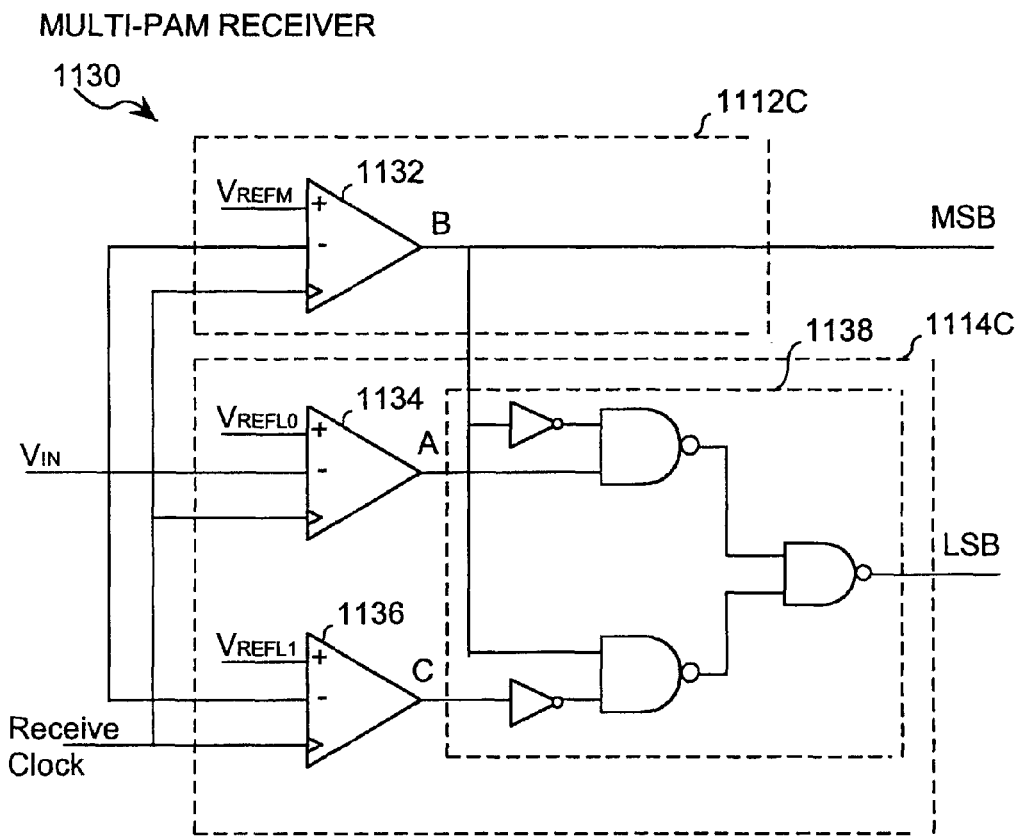
FIG. 43 is a circuit diagram of a multi-PAM receiver for odd data according to an embodiment of the present invention.

In FIG. 43, a multi-PAM receiver 1130 receives the multi-PAM symbols transmitted by the output driver. In particular, the 4-PAM receiver 1130 receives and decodes a 4-PAM input signal $V_{IN}$. In the MSB receiver 1112C, a latching comparator 1132 compares the value of the voltage of the received input signal $V_{IN}$ to the reference voltage $V_{REFM}$ and latches the value of the result of the comparison B in response to a receive clock signal. In the LSB receiver 1114C, two latching comparators 1134 and 1136 compare the value of the voltage of the received input signal $V_{IN}$ to the reference voltages $V_{REFL0}$ and $V_{REFL1}$, and latch the value of the result of the comparison A and C, respectively, in response to the receive clock signal.

The output B from the MSB receiver 1112C represents the MSB. To decode the LSB, the signals from the comparator outputs B, A, and C are then passed through combinational logic 1138. The combinational logic 1138 decodes Gray coded signals as shown in Table 2 above. The 4-PAM input receiver incurs additional clock-to-output latency because of the combinational logic 1138.

The timing of the receive clock signal is such that the latching comparators 1132-1136 sample the input data between 4-PAM signal transitions. Because data is sent on both edges of the receive clock, two receiver circuits 1130 are used—one for odd data, and one for even data.

Conventional latching comparators are susceptible to high frequency noise spikes which cause errors during latching, especially in multi-PAM systems. Implementing the latching comparators as integrating receivers, described above, reduces the sensitivity of the output signal to noise because the output signal depends on the integration of the voltage of the input signal $V_{IN}$ over most or all of the bit cycle.

In CMOS, the integrator steers integration current according to the relative voltages on the inputs. The ideal saturating integrator does not integrate the difference between the input voltages, but integrates a predetermined amount of current for the time during which one input has a voltage exceeding the voltage on the other input. To improve the integration process, a pre-amplifier conditions the input signals $V_{IN}$ to provide a constant differential voltage with a polarity that depends on the relative polarity of the input signals. Therefore, the integrator integrates the integration current based on which of the two inputs has the higher voltage, not the actual voltage difference between the two inputs, e.g., integrating polarity over time, rather than amplitude over time.

A preamplifier can be implemented as a resistor-loaded differential pair which provides a differential voltage +/−ΔV equal to IR, at its outputs. The sense amplifier and latch, described above with respect to FIG. 14, operates with the multi-PAM integrator, amplifies the result of the integration to the full CMOS voltage level representing a one or a zero, and stores the full CMOS voltage level.

Figure 44:
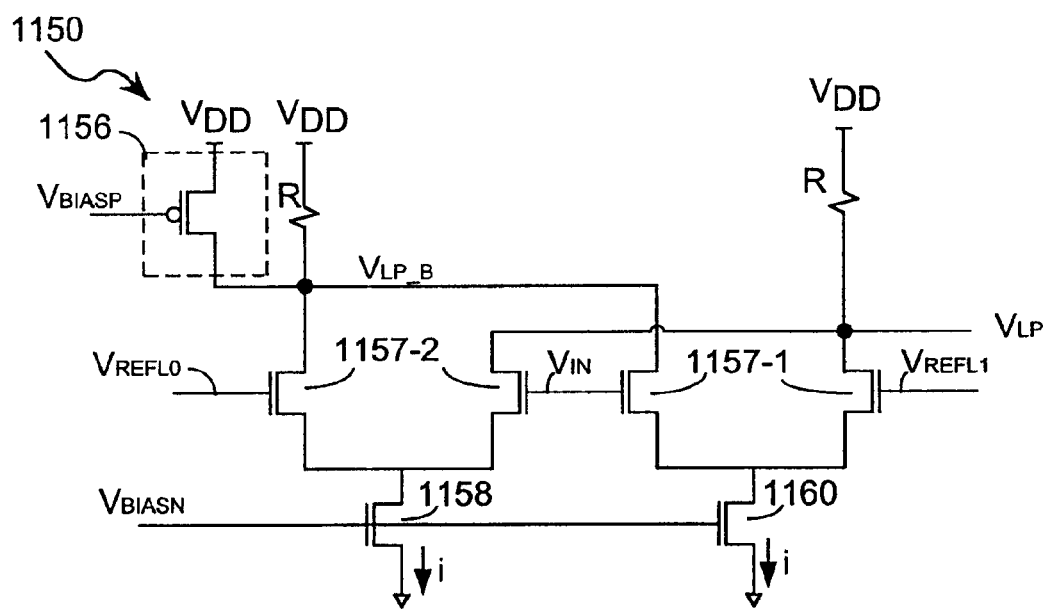
FIG. 44 is a circuit diagram of a preamplifier for the multi-PAM receiver according to another embodiment of the present invention.

In FIG. 44, to reduce the input-to-output latency from the combinational logic 1138, a preamplifier 1150 combines the function of preamplifying the difference between the input voltage $V_{IN}$ and the reference voltages with the function of decoding the 4-PAM input voltages into the MSB and LSB. The preamplifier 1150 is used in the comparator circuit that determines the LSB, while a simple resistor-loaded differential pair is used as the preamplifier in the circuit that determines the MSB. Using the preamplifier 1150, only two comparators of FIG. 43 are used to receive a data bit—one comparator for the MSB, the other comparator for the LSB. This circuit also reduces input-to-output latency, uses less chip-area and reduces power consumption.

To produce the LSB from the Gray-coded 4-PAM levels, when the input voltage $V_{IN}$ is between that of $V_{REFL0}$ and $V_{REFL1}$, the differential transistor pairs 1157-1 and 1157-2, provide an output voltage $V_{LP}$ equal to the supply voltage $V_{DD}$. When the input voltage $V_{IN}$ is not between that of $V_{REFL0}$ and $V_{REFL1}$, the differential transistor pairs 1157-1 and 1157-2 provide an output voltage $V_{LP}$ equal to the supply voltage $V_{DD}$ minus the bias current i multiplied by the value of the pull-up resistor R. The output voltage $V_{LP}$ is supplied to a comparator circuit or an integrating receiver. In an alternate embodiment, the resistor R is replaced with an active load such as a grounded-gate PMOS transistor. In another alternate embodiment, the preamplifier circuit is "flipped" by substituting PMOS current sources and PMOS differential pairs for the NMOS current sources and NMOS differential pairs.

To provide a differential output $V_{LP}$ and $V_{LP\_B}$, a matching PMOS current source 1156 is used. Table 3 below describes the output voltages as a function of the input voltage $V_{IN}$.

TABLE 3

| $V_{IN}$ | $V_{LP}$ | $V_{LP\_B}$ |
|---|---|---|
| $V_{IN} > V_{REFL0} > V_{REFL1}$ | $V_{DD} - iR$ | $V_{DD}$ |
| $V_{REFL0} > V_{IN} > V_{REFL1}$ | $V_{DD}$ | $V_{DD} - iR$ |
| $V_{REFL0} > V_{REFL1} > V_{IN}$ | $V_{DD} - iR$ | $V_{DD}$ |

Figure 45A:
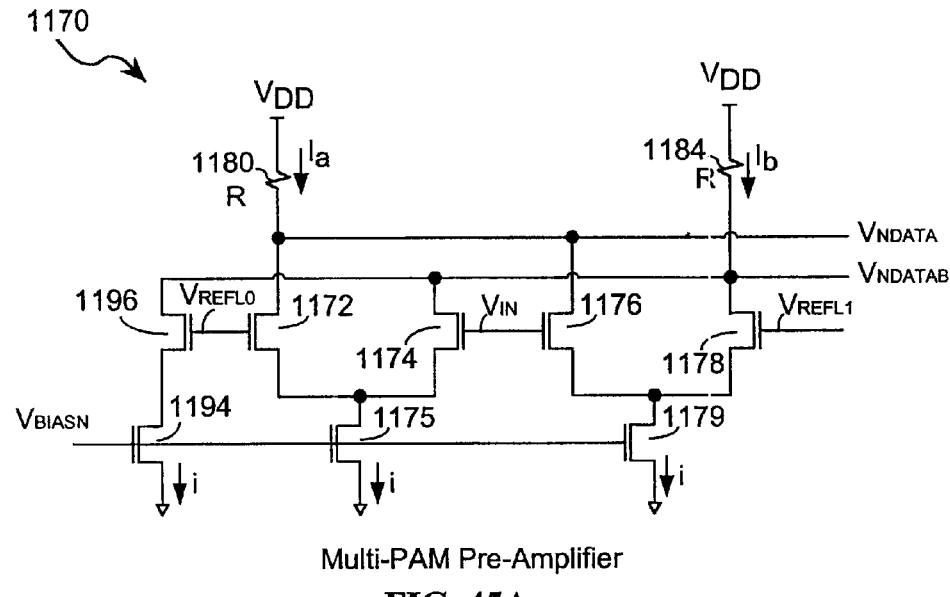
FIG. 45A is a circuit diagram of a NMOS multi-PAM preamplifier according to another embodiment of the present invention.
Figure 45B:
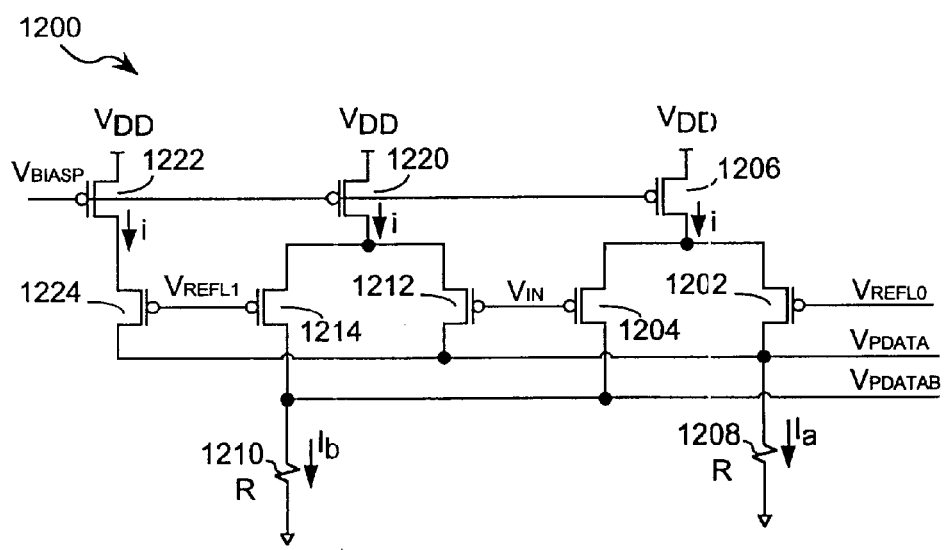
FIG. 45B is a circuit diagram of a PMOS multi-PAM preamplifier according to an alternate embodiment of the present invention.

In FIGS. 45A and 45B, the PMOS current source 1156 of FIG. 44 is eliminated. It is difficult to build a PMOS current source 1156 (FIG. 44) that matches the NMOS current sources 1158, 1160 (FIG. 44) exactly. In combination the NMOS and PMOS preamplifiers, 1170 and 1200, respectively, provide two pairs of differential output voltages $V_{NDATA}$ and $V_{NDATA\_B}$ and $V_{PDATA}$ and $V_{PDATA\_B}$ for the LSB. Table 4 below describes the output voltages from the preamplifier circuits as a function of the input signal $V_{IN}$.

TABLE 4

| | NMOS Preamplifier (FIG. 45A) | | PMOS Preamplifier (FIG. 45B) | |
|---|---|---|---|---|
| $V_{IN}$ | $V_{NDATA}$ | $V_{NDATA\_B}$ | $V_{PDATA}$ | $V_{PDATA\_B}$ |
| $V_{IN} > V_{REFL0} > V_{REFL1}$ | $V_{DD} - iR$ | $V_{DD} - 2iR$ | 2iR | iR |
| $V_{REFL0} > V_{IN} > V_{REFL1}$ | $V_{DD} - 2iR$ | $V_{DD} - iR$ | iR | 2iR |
| $V_{REFL0} > V_{REFL1} > V_{IN}$ | $V_{DD} - iR$ | $V_{DD} - 2iR$ | 2iR | iR |

FIG. 45A shows an NMOS preamplifier 1170 for input signals $V_{IN}$ having a common mode range close to the supply voltage. Two differential pairs 1172, 1174 and 1176, 1178 compare the input signal $V_{IN}$ to two reference voltages, $V_{REFL0}$ and $V_{REFL1}$, respectively. The reference voltages, signal levels and relative voltage levels were described above. Load transistors 1180, 1184, depicted as resistive loads, provide a path for current to flow through the transistors of the differential pairs from the supply voltage $V_{DD}$. The transistors of the first differential pair 1172, 1174 differentially receive the reference voltage $V_{REFL0}$ and the input signal $V_{IN}$ at their gates, respectively. The sources of the first differential pair 1172, 1174 are connected to a current source transistor 1175 which supplies current i in response to the bias voltage $V_{BiasN}$ applied to their gates. The drains of the transistors 1172, 1174 of the first differential pair provide the output $V_{OUT}, V_{OUT\_B}$. When the difference between the differential input voltage ($V_{IN}$-$V_{REFL0}$) is positive the differential output voltage ($V_{NDATA}$-$V_{NDATA\_B}$) is positive.

The transistors of the second differential pair 1176, 1178 differentially receive the input signal $V_{IN}$ and the reference voltage $V_{REFL1}$ on their gates, respectively. The sources of the second differential pair 1176, 1178 connect to a current source transistor 1179 which supplies current i to the second differential pair in response to the bias voltage $V_{BiasN}$ on the gate of transistor 1192. Resistive loads 1180 and 1184 are connected between the supply voltage and the respective drains of the second differential transistor pair 1176, 1178. The drains of the second differential pair 1176, 1178 provide the differential outputs $V_{NDATA}$, $V_{NDATA\_B}$. When the difference between the differential input voltages ($V_{IN}$-$V_{REFL1}$) is negative, the differential output ($V_{NDATA}$-$V_{NDATA\_B}$) is positive.

To balance the total current swing, another current source transistor 1194 provides additional current to $V_{NDATA\_B}$ via transistor 1196. Transistor 1196 is added to simply improve the current matching to transistors 1175 and 1179.

The circuit of FIG. 45A implements a comparator function within the preamplifier to determine when the input signal $V_{IN}$ is less than $V_{REFL0}$ and greater than $V_{REFL1}$, (i.e., between $V_{REFL0}$ and $V_{REFL1}$). When the input signal $V_{IN}$ is within this range, transistors 1172 and 1176 are active and transistors 1174 and 1178 are inactive. Under these conditions, the current flowing through resistor 1180 Ia is equal to 2I, and the current flowing through resistor 1182 Ib is equal to I. The differential output voltage ($V_{NDATA}$-$V_{NDATA\_B}$) is equal to the negative of the product the current I multiplied by the resistance R (i.e., −IR). When the input voltage $V_{IN}$ is outside of the range defined by $V_{REFL0}$ and $V_{REFL1}$, either transistors 1172 and 1178 are active or transistors 1174 and 1176 are active, while the other transistors in the differential pairs are inactive. Under these conditions, the current Ia is equal to I, Ib is equal to 2I, and the differential output voltage ($V_{NDATA}$-$V_{NDATA\_B}$) is equal to the product of the current I and the resistance R (i.e., +IR).

In FIG. 45B, a preamplifier 1200 is used for input signals having a common mode range closer to ground. The circuit of FIG. 45B is a PMOS implementation of the circuit of FIG. 45A. A first differential pair 1202, 1204 receives the input voltage $V_{IN}$ and the reference voltage $V_{REFL0}$ on its gates and produces output voltages $V_{PDATA}$ and $V_{PDATA\_B}$ on its drains. When the differential input ($V_{IN}$-$V_{REFL0}$) is positive, the sign of the difference of the differential output voltages ($V_{PDATA}$-$V_{PDATA\_B}$) is positive. The first differential pair 1202, 1204 is supplied with current from current source transistor 1206. The current source transistor 1206 is biased by $V_{BIASP}$ on its gate and is connected between the supply voltage $V_{DD}$ and the sources of transistors 1202, 1204. A pair of load resistors 1208 and 1210 having resistance R is connected between the drains of transistors 1202, 1204, respectively, and ground. A second differential pair 1212, 1214 receives the input voltage $V_{IN}$ and the reference voltage $V_{REFL1}$ on its gates and produces differential outputs $V_{PDATA}$ and $V_{PDATA\_B}$ such that when the sign of the difference of the differential input voltages ($V_{IN}$-$V_{REFL1}$) is negative, the sign of the difference of the differential output voltages ($V_{PDATA}$-$V_{PDATA\_B}$) is positive. Resistors 1216 and 1218 with resistance R are connected between the drains of the second differential pair 1212, 1214, respectively, and ground. A current source transistor 1220 is connected between the supply voltage $V_{DD}$ and the sources of second differential pair 1212, 1214, and supplies current I.

Another current source transistor 1222 supplies current I to $V_{PDATA}$ via transistor 1224 which is biased in the active state by $V_{REFL1}$. Current source transistors 1206, 1220, and 1222 have their gates connected to bias voltage $V_{BiasP}$.

When the input signal $V_{IN}$ is less than $V_{REFL0}$ and greater than $V_{REFL1}$ (i.e., the input signal is in a range between the two reference voltages), the current flowing through resistors 1208 and 1210, Ia is equal to I and Ib is equal to 2I, respectively, and the differential output voltage ($V_{PDATA}$-$V_{PDATA\_B}$) is equal to the negative product of the current I and resistance R (−IR). When the input signal $V_{IN}$ is outside of the range defined by the reference voltages $V_{REFL0}$ and $V_{REFL1}$, the current Ia flowing through resistor 1108 is equal to 2I and the current Ib flowing through resistor 1210 is equal to I. The differential output voltage ($V_{PDATA}$-$V_{PDATA\_B}$) is equal to the product of the current I and resistance R (+IR). The preamplifier 1200 performs a comparator and amplifier function similar to preamplifier 1170 of FIG. 45A. When the preamplifiers of FIGS. 45A and 45B are both used, the preamplifiers provide a pair of differential voltage outputs, and each preamplifier operates at a different common mode voltage for use by the integrator.

Figure 46:
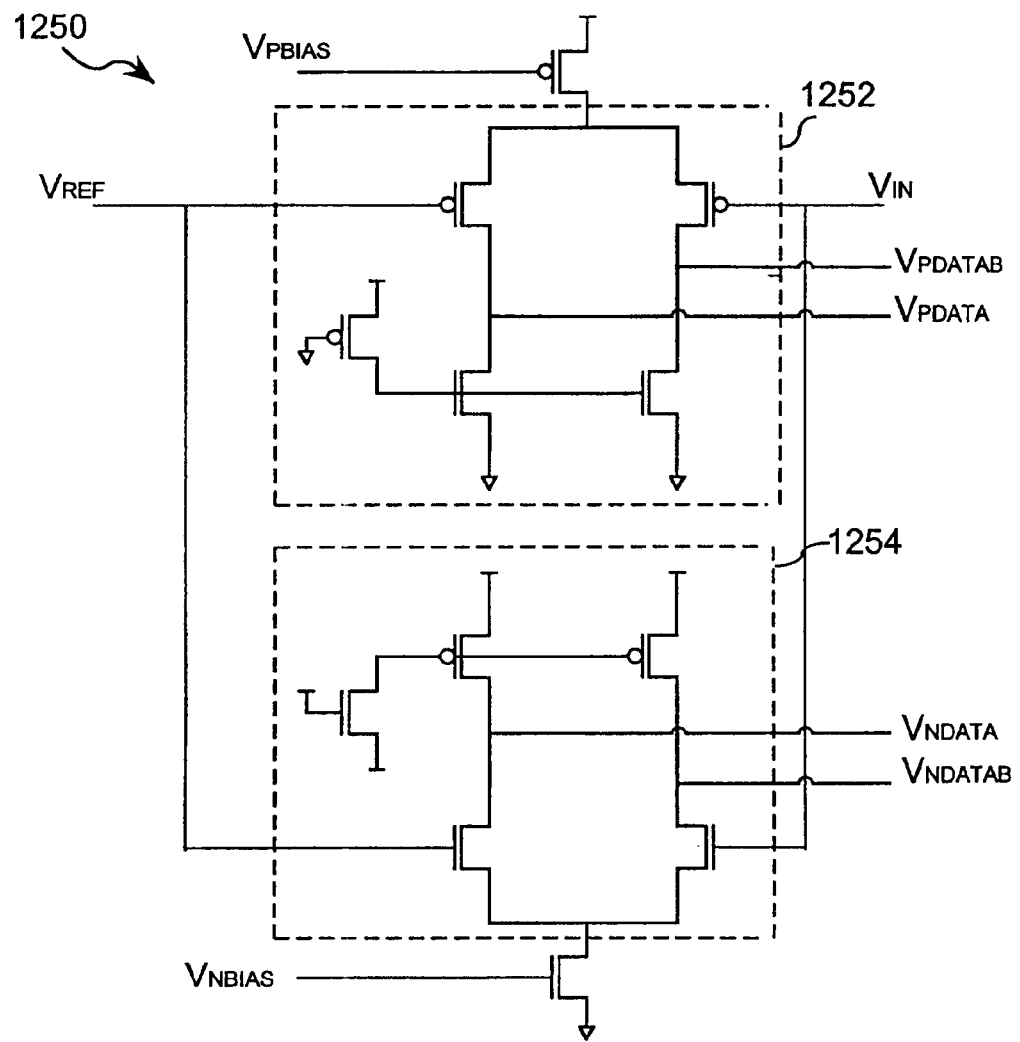
FIG. 46 is a circuit diagram of a 4-PAM preamplifier for the MSB.

In FIG. 46, a 4-PAM preamplifier for the MSB receives the input signal $V_{IN}$, compares the input signal to a predetermined voltage $V_R$, and provides two pairs of differential output voltages, $V_{NDATA}$ and $V_{NDATA\_B}$, and $V_{PDATA}$ and $V_{PDATA\_B}$, for the MSB. In one embodiment, the predetermined voltage $V_R$ is equal to the complement of the input voltage $V_{IN\_B}$. In an alternate embodiment, the predetermined voltage $V_R$ is equal to $V_{REFM}$. A PMOS preamplifier 1252 provides outputs $V_{PDATA}$ and $V_{PDATA\_B}$. An NMOS preamplifier 1254 provides outputs $V_{NDATA}$ and $V_{NDATA\_B}$. The PMOS and NMOS preamplifiers 1252 and 1254 operate in the same way as the PMOS and NMOS preamplifiers 1200 and 1170 of FIGS. 45A and 45B, respectively, except that the predetermined voltage $V_R$ is used, and the load resistors R are implemented with transistors.

In a receiver, the preamplifier 1250 of FIG. 46 can be used with the integrators of FIGS. 11C and 12. In addition, the preamplifier 1250 can be used directly with the sense amplifier of FIG. 15.

A Multi-PAM Integrator

Figure 47:
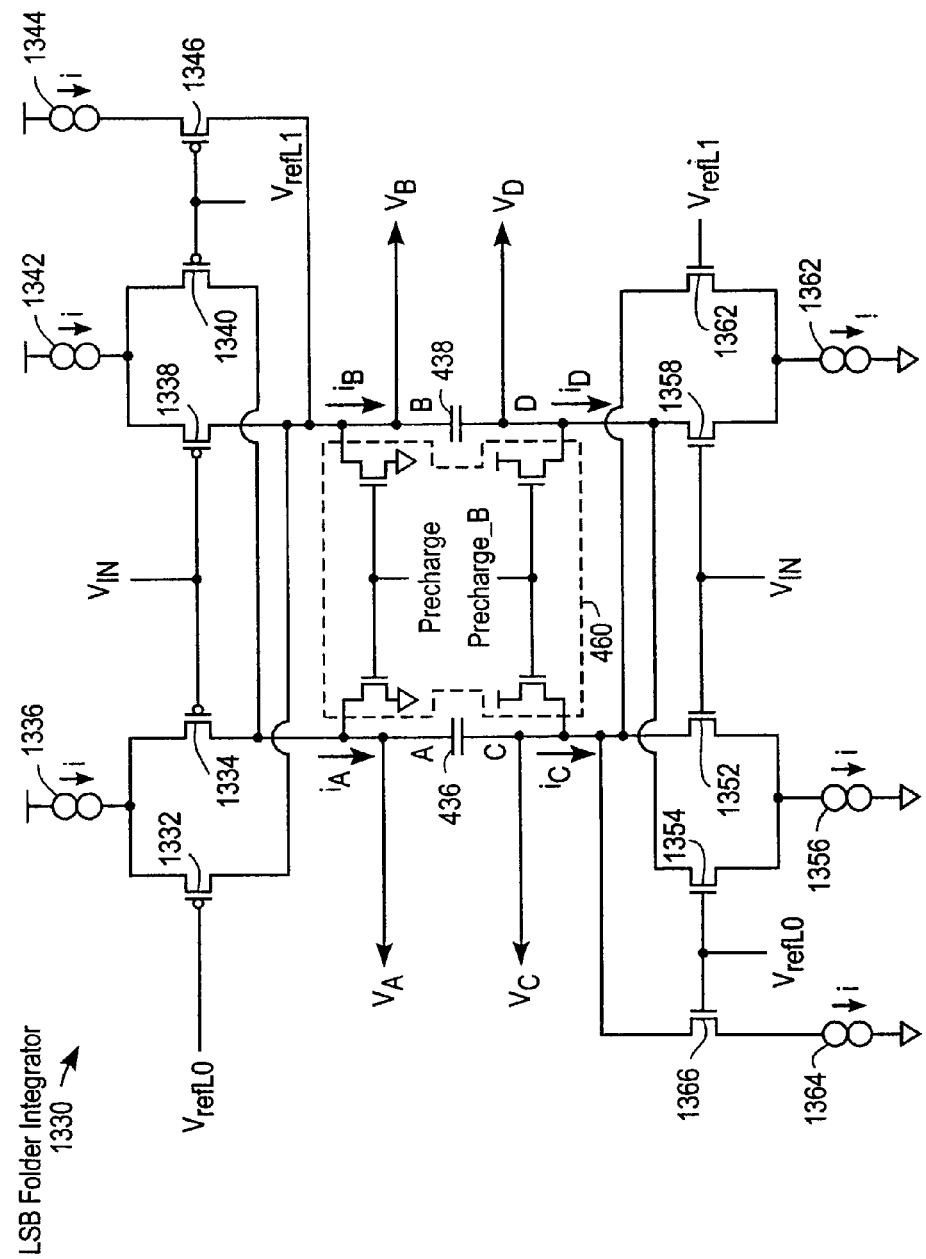
FIG. 47 is a circuit diagram of a multi-PAM integrator according to an embodiment of a LSB folded integrator of FIG. 41.

In FIG. 47, a LSB folded integrator 1330 combines the function of comparing the reference voltages with the integration process. In particular, the integrator 1330 is used to determine the LSB. The PAM input signal may be supplied directly to the integrator 1330 via the bus without going through the preamplifier. Alternately a multi-PAM preamplifier, discussed above, conditions the received 4-PAM input signal for subsequent integration.

To determine the MSB of the 4-PAM signal, the integrator of FIG. 11A, 11B or 13 can be used without change, or, alternately, by supplying the middle reference voltage $V_{REFM}$, discussed above, to the $V_{IN\_B}$ input.

The integrator 1330 receives a multi-level input signal $V_{IN}$ and compares that signal against two voltage reference levels $V_{REFL0}$ and $V_{REFL1}$ to implement a comparator function in combination with the integrator function. The circuit of FIG. 47 is similar to the circuit of FIG. 11B except that two current-steering transistor pairs and two current sources are added. These additional current-steering pairs and current sources implement a window comparator to determine whether the multilevel input signal $V_{IN}$ is within a predefined range of voltage levels. In combination with the second integrator that determines the MSB, each of the four conditions of $V_{IN}$, discussed above, is decoded.

Figures 48, 49:
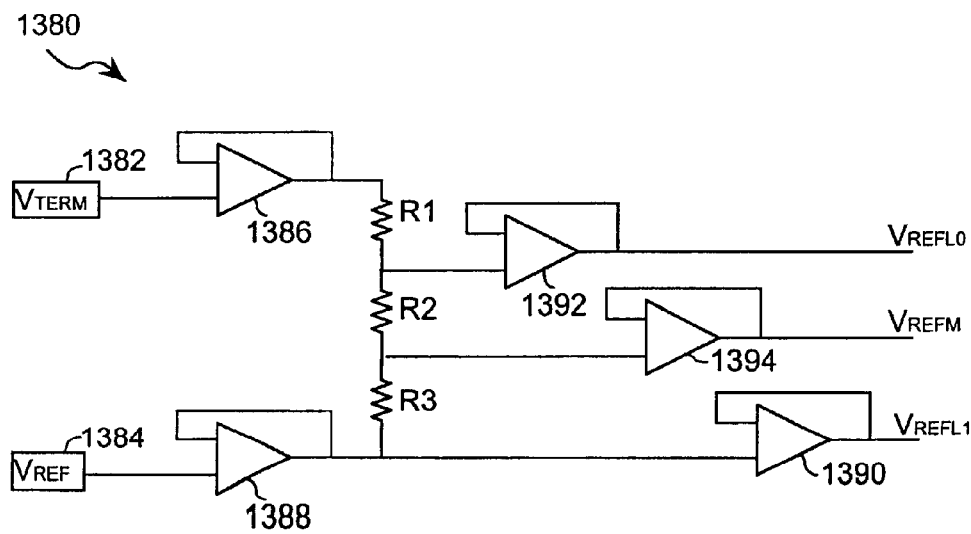
FIG. 48 is a table showing the correspondence between the input signal voltage levels and the currents in the integrator of FIG. 47.
FIG. 49 is a circuit diagram of an on-chip multi-PAM reference voltage generator.

FIG. 48 shows the various voltage reference levels $V_{REFL0}$, $V_{REFM}$ and $V_{REFL1}$, the four states $V_{IN}<V_{REFL1}$, $V_{REFL1}<V_{IN}<V_{REFM}$, $V_{REFM}<V_{IN}<V_{REFL0}$ and $V_{IN}>V_{REFL0}$, and the two bits, the MSB and LSB, which are derived from comparing the input signal $V_{IN}$ with these voltage levels of the four states. The integrator of FIG. 47 compares the input signal $V_{IN}$ against the upper and lower reference voltages, $V_{REFL0}$ and $V_{REFL1}$, respectively, to determine the least significant bit, LSB, for the four states. Another integrator compares $V_{IN}$ to the middle voltage $V_{REFM}$ to determine the most significant bit, MSB, for the four states. Any of the integrators described above may be modified to perform this comparison by supplying $V_{IN}$ and the reference voltage $V_{REFM}$ as the differential input signal.

FIG. 48 also shows the value of the current flowing $i_A$, $i_B$, $i_C$, and $i_D$ through the integration nodes of the integrator of FIG. 47 for each state. When the input voltage $V_{IN}$ is between $V_{REFL0}$ and $V_{REFL1}$, the currents $i_A$, $i_B$, $i_C$, and $i_D$ are equal to $2i$, $i$, $i$, and $2i$, respectively. When the input voltage $V_{IN}$ is not between $V_{REFL0}$ and $V_{REFL1}$, the current $i_A$, $i_B$, $i_C$, and $i_D$ is equal to $i$, $2i$, $2i$, and $i$, respectively.

Referring back to FIG. 47, a first current-steering transistor pair 1332, 1334 provides a path for current i from the current source 1336 to flow to integration nodes A and B and a second current-steering transistor pair 1338, 1340 provides a path for current i from current source 1342 to flow to capacitive elements 436, 438 connected to integration nodes A and B, respectively. The capacitive elements 436, 438 were described above. An additional current source 1344 provides current i to node B via transistor 1346 which is biased on by voltage $V_{REFL1}$. A precharge circuit 460, discussed above with respect to FIG. 11B, precharges integration nodes A and B to ground.

A third current-steering transistor pair 1352, 1354 provides a path for current i to flow from the capacitive element 436 at integration node C through the current source 1156 to ground. A fourth current-steering transistor pair 1358, 1360 provides a path for current i to flow from current source 1362 from the capacitive element 438 at integration node D. An additional current source 1364 sinks current from integration node C via transistor 1366 which is biased in the active state by reference voltage $V_{REFL0}$. The precharge circuit 460 precharges integration nodes C and D to the supply voltage $V_{DD}$. The current sources, 1336, 1342, 1344, 1356, 1362, 1364 source or sink the same amount of current i.

Referring also to FIG. 48, the states of the integrator are distinguishable, as follows. When $V_{IN}$ is greater than $V_{REFL0}$ or less than $V_{REFL1}$ node A is charged with current i, node B is charged with current $2i$, node C is discharged with current $2i$ and node D is discharged with current i. When $V_{IN}$ is less than $V_{REFL0}$ and greater than $V_{REFL1}$, node A is charged with current $2i$, node B is charged with current i, node C is discharged with current i, and node D is discharged with current $2i$. When $V_{IN}$ is between $V_{REFL0}$ and $V_{REFL1}$ the output voltage $V_{OUT}$ of the integrator, which is defined by the following relationship: $(V_A-V_B)+(V_C-V_D)$, is interpreted as a logical one, otherwise the output voltage $V_{OUT}$ is interpreted as a logical zero by a subsequent sense amplifier, such as the sense amplifier 600 of FIG. 14, and stored in the latch 650 (FIG. 14).

In an alternate embodiment, integration nodes A and C are connected to one end of the capacitive element 436, while the other end of the capacitive element 436 is connected to ground; and, integration nodes B and D are connected to one end of the capacitive element 438, while the other end of the capacitive element 438 is connected to ground.

In another embodiment, the integration nodes of the multi-PAM integrator 1330 are coupled to the equalization circuit 900 of FIG. 26A to compensate for inter-symbol interference. In another alternate embodiment, the voltage offset cancellation circuit 930 of FIG. 27A is coupled to the integration nodes of the multi-PAM integrator 1330. In yet another alternate embodiment, the static current sources 940 are coupled to the integration nodes of the multi-PAM integrator 1330. Alternately, the delta-capacitor circuit 944 of FIG. 28D is coupled to one of the integration nodes of the multi-PAM integrator 1330.

The multi-PAM receiver system works in accordance with the timing diagram of FIG. 8. In another embodiment, the multi-PAM receiver system is used as the receivers 780 in the multi-phased configuration of FIG. 24, and operated in accordance with the timing diagram of FIG. 25.

In an alternate embodiment, the timing diagram of FIG. 16 applies to the multi-PAM receiver system. In yet another embodiment, the circuit to generate the "reliable data window" of FIG. 17B is used with the multi-PAM receiver system. In yet another alternate embodiment, the multi-PAM integrating receiver is used as a phase detector in the clock recovery circuit 751 of FIG. 18. Alternately, the adjustment system of FIG. 20 sets the timing of each receiver in a system having multiple integrating receivers. In an alternate embodiment, the adjustment circuit of FIG. 23A adjusts the timing of the precharge and sense signals for a set of pins that receive incoming signals.

A Multi-PAM Reference Voltage Generator

In FIG. 49, a 4-PAM reference voltage generator 1380 generators the multi-PAM reference voltages $V_{REFL0}$, $V_{REFM}$ and $V_{REFL1}$ from external voltages $V_{TERM}$ and $V_{REF}$ supplied on input pins 1382, 1384, respectively. Unity gain amplifiers 1386, 1388 receive and output the input voltages $V_{TERM}$ and $V_{REF}$, respectively. A voltage divider, including series-connected resistors R1, R2, and R3, is coupled between the outputs of the unity gain amplifiers 1386 and 1388. The lowest voltage $V_{REF}$ is selected to drive $V_{REFL1}$ via a power driver 1390. Power drivers 1392, 1394 are coupled between resistors R3, R2 and R2 to provide reference voltages $V_{REFL0}$ and $V_{REFM}$, respectively. The power drivers 1390-1394 are connected as unity gain amplifiers.

In one embodiment, the resistor values are selected such that resistors R2 and R3 have twice the resistance of resistor R1, and $V_{REF}$, which is supplied externally, is equal to the desired $V_{REFL1}$ voltage.

An Exemplary Multi-PAM Receiver Timing Circuit

Figure 50:
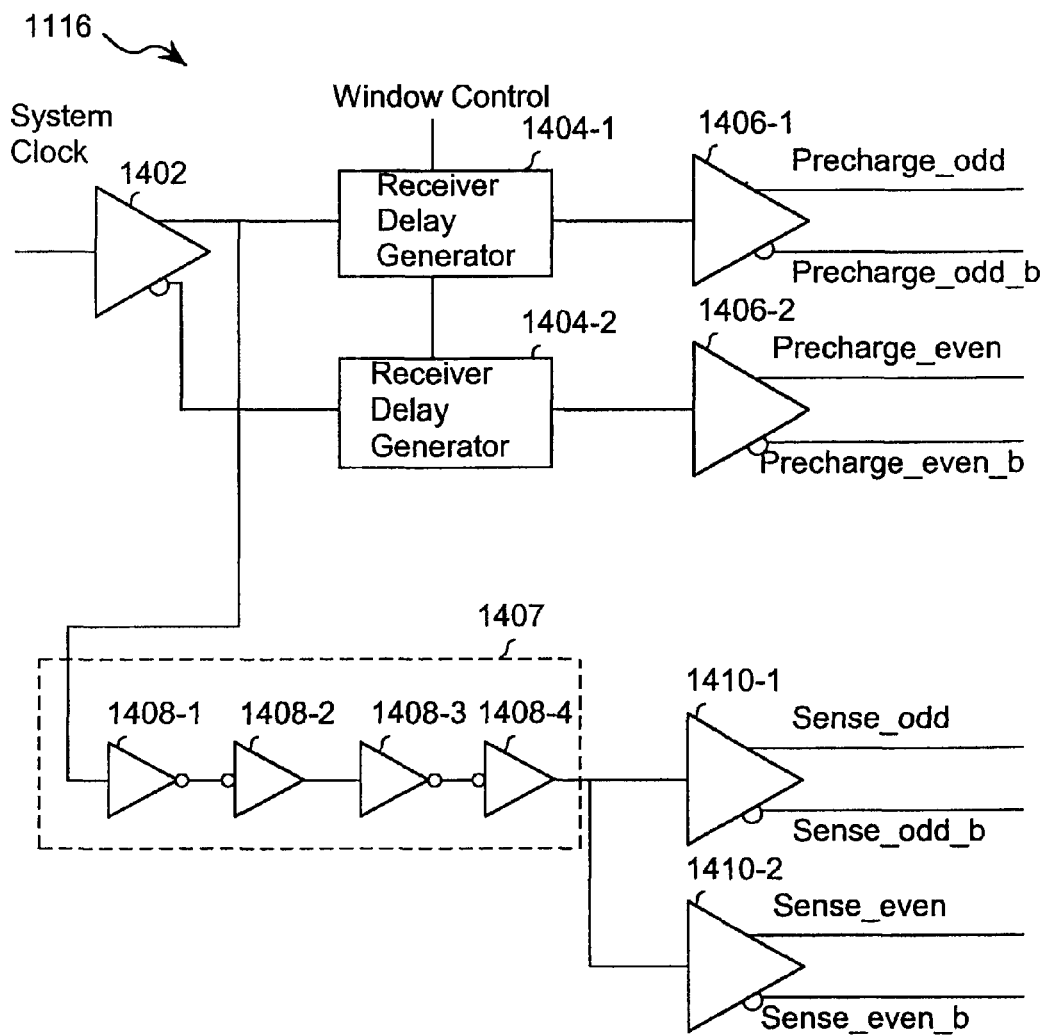
FIG. 50 is a circuit diagram of a receiver timing circuit of FIG. 40.

In FIG. 50, the receiver timing circuit 1116 of FIG. 40 is shown. The receiver timing circuit 1116 operates in accordance with the timing diagram of FIG. 17C. The system clock is input to a phase splitter 1402 to generate phase aligned true and complementary system clock signals. Receiver delay generators 1404 delay the true and complementary signals in accordance with the window control signals. Phase splitters 1406 generate the true and complementary precharge signals for the odd and even data.

Because the receiver delay generators provide a fixed or "overhead" delay in addition to the specified delay, delay element 1407 provides that same amount of delay to the true system clock signal to generate the sense signal to provide a desired phase relationship between the precharge and sense signals. To generate the sense signal, a delay element 1407 delays the true system signal for the same amount of time as the receiver delay generators 1404. In one implementation of delay element 1407, the true system clock is delayed by four inverters 1408, which provide the same delay as the fixed or inherent delay of delay generator blocks 1404. Two phase splitters 1410 generate the true and complementary sense signals for the even and odd data. In an ideal embodiment, the receiver delay generators 1404 do not provide the fixed amount of delay in addition to the specified delay, and the delay element 1407 is not used.

Figure 51:
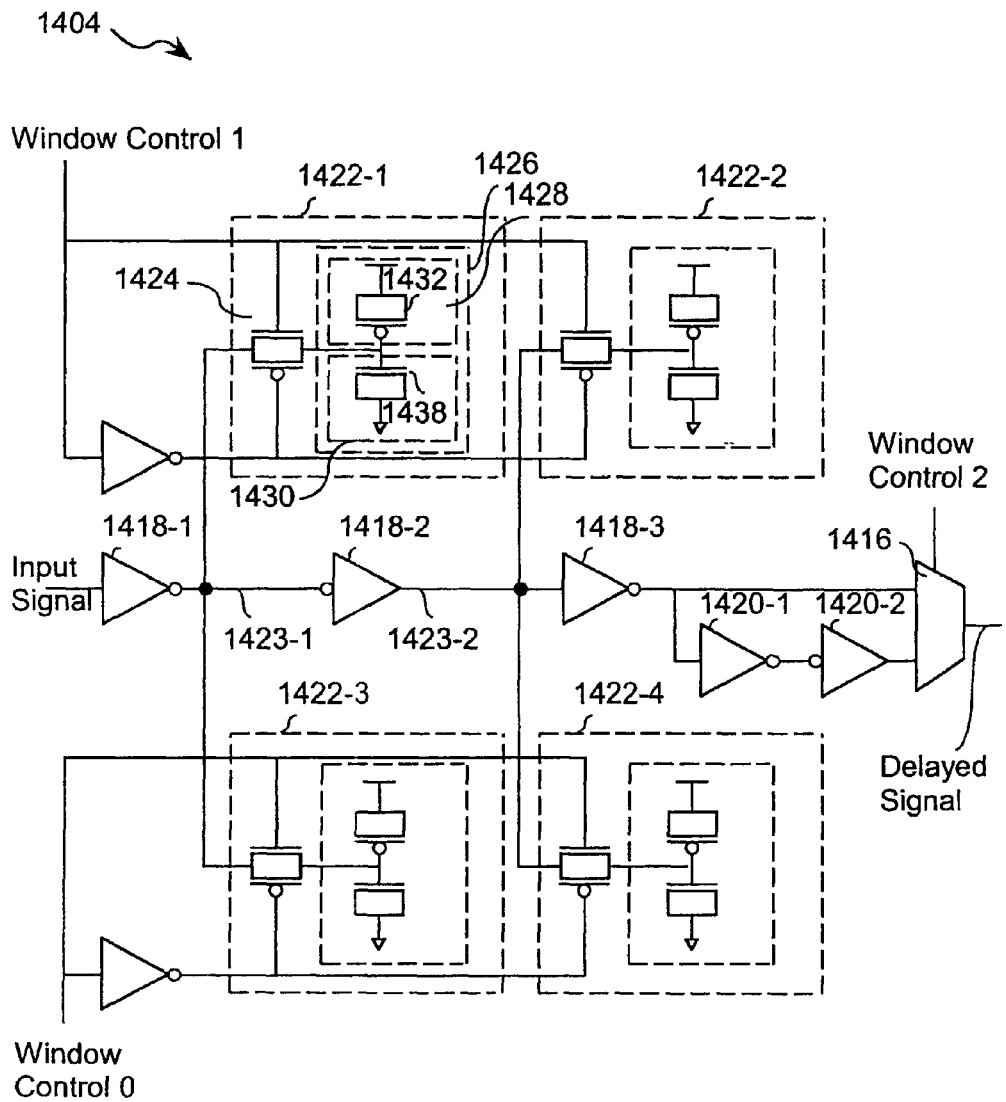
FIG. 51 is a circuit diagram of a receiver delay generator of FIG. 50.

In FIG. 51, a circuit diagram of one embodiment of a receiver delay generator 1404 is shown. Three window control signals (Window Control 0, Window Control 1 and Window Control 2) determine the amount of delay to the input signal. The input signal is supplied to a multiplexor 1416 through two paths, a first path includes a first set of three inverters 1418, and a second path includes a second set of inverters 1418 and the first set of inverters 1420. Window control 2 selects either the first or second path, whereas Window Control 0 and Window Control 1 adjust the fan-out seen by inverters 1418-1 and 1418-2.

To increase the amount of delay, selectable delay elements 1422 are connected to the nodes 1423-1, 1423-2 between the inverters of the first set of inverters 1418. Window control 1 controls selectable delay elements 1422-1 and 1422-2. Window control 2 controls selectable delay elements 1422-3 and 1422-4. Pairs of selectable delay elements are binary weighted. Selectable delay elements 1422-3 and 1422-4 add twice as much delay as selectable delay elements 1422-1 and 1422-2. Each selectable delay element increases the amount of delay to the input signal. Since the selectable delay elements are the same, except for the binary weighting, the operation of selectable delay element 1422-1 will be described. When window control 1 is activated, passgate pair 1424 becomes active and couples a delay element 1426 to the first set of inverters 1418. In the delay element 1426, first and second delay blocks, 1428 and 1430, respectively, are connected in series between the supply voltage and ground. The first delay block 1428 includes a PMOS transistor 1432 with its source and drain connected together to the supply voltage. The second delay block 1430 includes an NMOS transistor 1438 with its source and drain connected together to ground.

By adding capacitive load to the input signal path, the input signal is delayed. The amount of delay is proportional to the capacitive load added to nodes 1423-1 and 1423-2.

An Exemplary Multi-PAM System

Figure 52A:
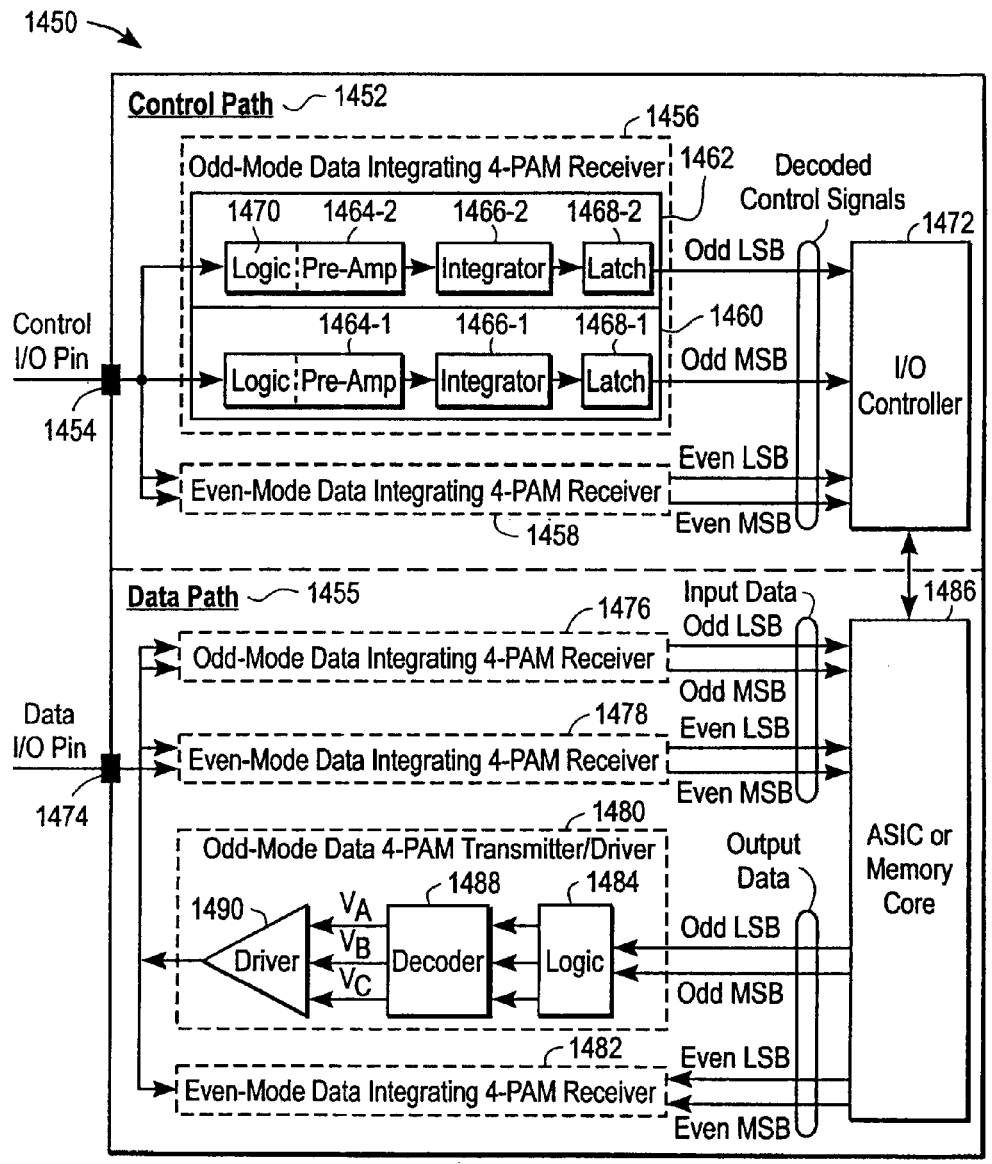
FIG. 52A is a block diagram of a chip using the multi-PAM receiver system of the present invention.

In FIG. 52A, a semiconductor device 1450 uses the multi-PAM output drivers and receivers of the present invention. A control path 1452 receives a control signal from a control input/output (I/O) pin 1454. Control signals are received on both the odd and even phases of the system clock. An odd mode integrating receiver 1456 determines the control signals in the odd phase, while an even mode integrating receiver 1458 determines the control signals during the even phase. Except for being active on different phases, the even and odd mode integrating receivers, 1456 and 1458, respectively, are the same.

In the odd mode integrating receiver 1456, one series of components 1460 decodes the MSB from the control signal, and a second series of components 1462 decodes the LSB from the control signal. Each series of components includes a multi-PAM preamplifier 1464, a multi-PAM integrator 1466 and a latch 1468, which were discussed above. As discussed above, in the second series of components 1462 that determine the LSB, the preamplifier 1464-2 includes additional logic 1470. The decoded control signals are supplied to an I/O controller 1472.

In the data path 1455, a data signal is received on a data I/O pin 1474. As discussed above, even and odd data are received and decoded by an odd mode integrating receiver 1476 and an even mode integrating receiver 1478. The data path 1455 includes an odd mode output driver 1480 and an even mode output driver 1482 to output a multi-PAM signal onto the data bus 1474. Except for being active in different phases of the system clock, the odd and even mode output drivers, 1480 and 1482, respectively, are the same.

In the odd mode output driver 1480, a logic circuit 1484, discussed above, receive the odd LSB and MSB from another circuit, such as a memory 1486. The logic circuit 1484 generates the multi-PAM A, B, and C signals, discussed above, which are supplied to the multi-PAM decoder 1488. The multi-PAM decoder 1488 outputs three voltage levels $V_A$, $V_B$ and $V_C$ which are supplied to an output driver 1490.

The I/O controller 1472 communicates with the memory 1486 to synchronize the timing of the control signals and data signals.

Referring back to FIG. 41, in an alternate embodiment, the even and odd mode integrating receivers for the control 1452 and data path 1455 share a single a single preamplifier. In another alternate embodiment, no preamplifier is used as shown in FIG. 42.

Figure 52B:
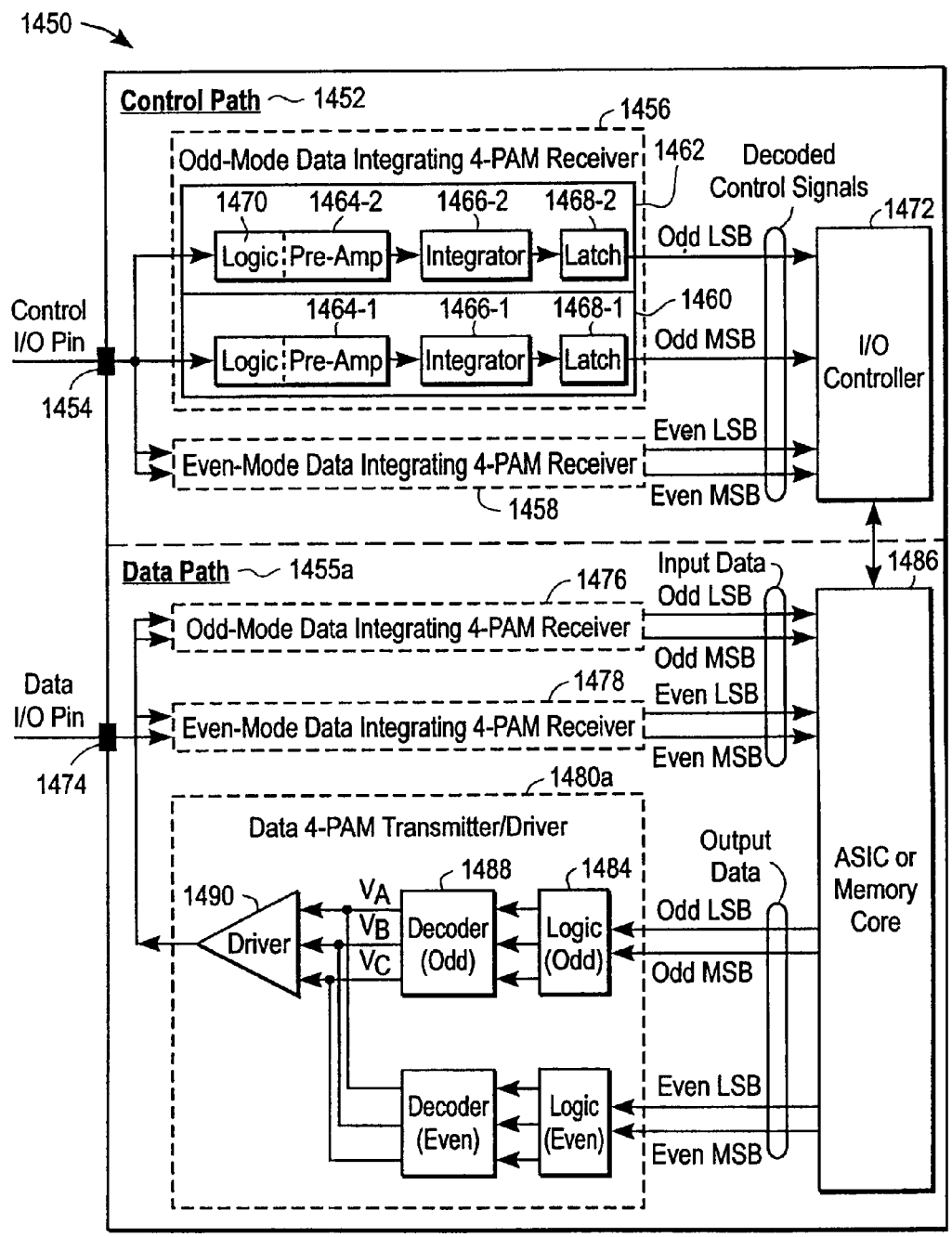
FIG. 52B is a block diagram of a chip using an alternate embodiment of the multi-PAM receiver system of the present invention.

FIG. 52B is a block diagram of a chip using an alternate embodiment of the multi-PAM receiver system of the present invention. This embodiment is the same as FIG. 52A except that the same output driver 1490 is used to drive both even and odd mode data.

Automatic Detection of a Multi-PAM Mode

Figure 53:
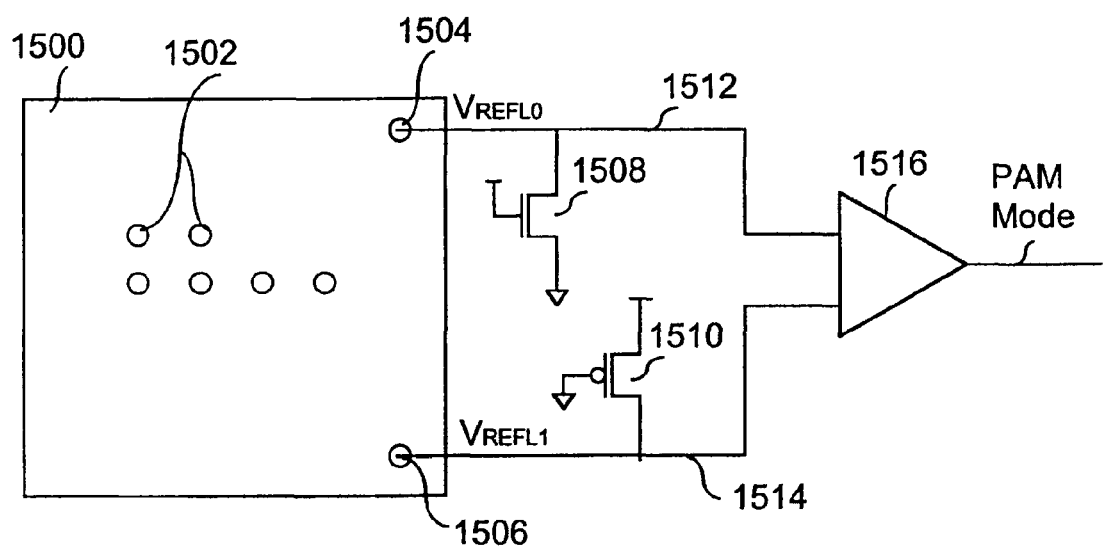
FIG. 53 is a diagram of a circuit for automatically detecting a multi-PAM mode.

In FIG. 53, a package and circuit configuration are used to automatically detect whether a device is installed in a 2-PAM or a 4-PAM system. The bottom of the device package 1500 has a "footprint" of metal contacts 1502. In particular, two contacts 1504 and 1506 are used to determine whether the package is installed in a 2-PAM or a 4-PAM system. In a 2-PAM system, the contacts 1504 and 1506 will not be connected to the reference voltages $V_{REFL0}$ and $V_{REFL1}$, respectively. In a 4-PAM system, the contacts 1504 and 1506 will be connected to the reference voltages $V_{REFL0}$ and $V_{REFL1}$, respectively. In the device, transistors 1508, 1510 are weak transistors to pull-up and pull-down lines 1512 and 1514 to the supply voltage and ground, respectively. In a 2-PAM system, when the reference voltages $V_{REFL0}$ and $V_{REFL1}$ are not supplied, lines 1512 and 1514 are at ground and the supply voltage, respectively; therefore the comparator 1516 outputs a zero as the mode signal. In a 4-PAM system, when the reference voltages $V_{REFL0}$ and $V_{REFL1}$ are supplied, lines 1512 and 1514 are at $V_{REFL0}$ and $V_{REFL1}$, respectively; therefore the comparator 1516 outputs a one as the mode signal, and 4-PAM mode is enabled.

A Multi-PAM Device and Bus

Figure 54A:
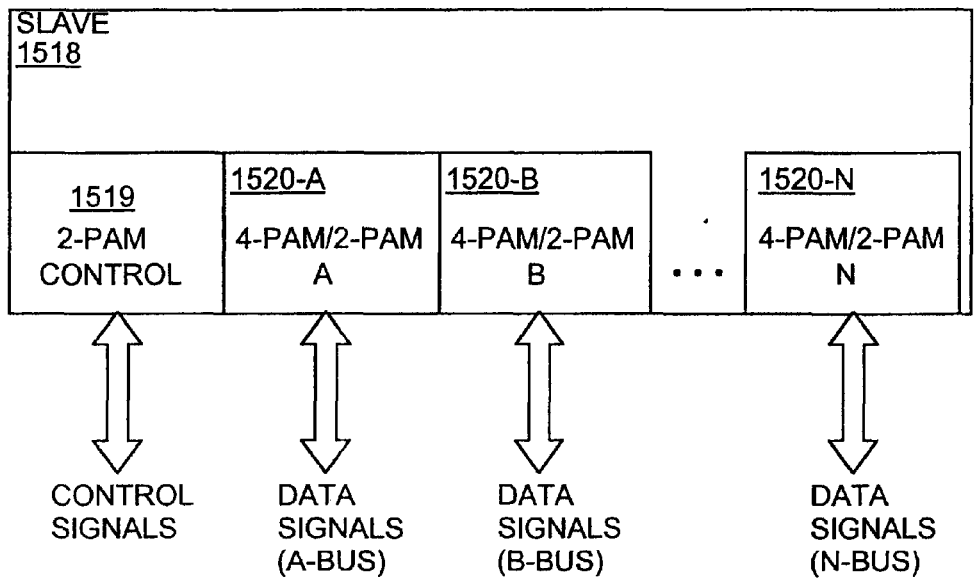
FIG. 54A is a diagram of an exemplary slave device capable of operating at either 2-PAM or 4-PAM in accordance with an embodiment of the present invention.

In FIG. 54A, to provide compatibility with 2-PAM legacy systems and 4-PAM systems, an exemplary slave device 1518 is capable of operating at either 2-PAM or 4-PAM in accordance with an embodiment of the present invention. A control block 1519 provides control signals on control signal lines of the bus. The control signals operate at 2-PAM. Data interface blocks 1520 drive and receive subsets of the data signals on the data bus. In one implementation, each subset of data is one byte. Each data interface block 1520 can operate at both 2-PAM and 4-PAM. In one embodiment, the circuit of FIG. 53 determines whether the slave device operates at 2-PAM or 4-PAM.

Figure 54B:
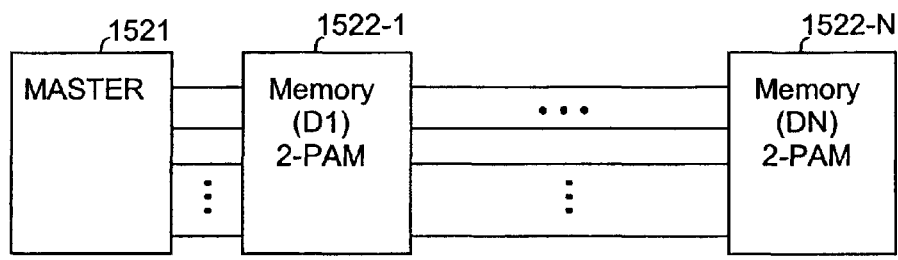
FIG. 54B is a diagram of a data bus operating at 2-PAM using the device of FIG. 54A.

FIG. 54B is a diagram of an exemplary legacy data bus operating at 2-PAM using the device of FIG. 54A. The master device 1521 and memory devices 1522 operate at 2-PAM.

Figure 54C:
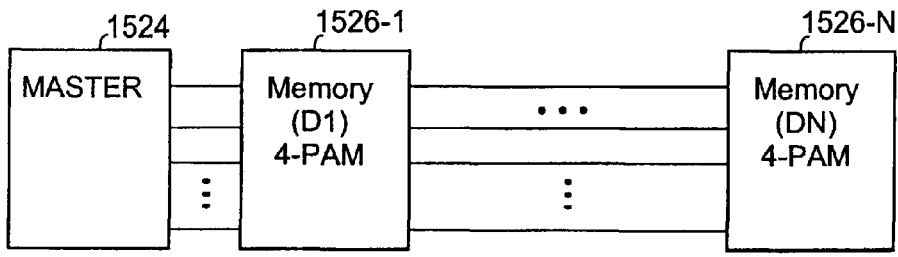
FIG. 54C is a diagram of a data bus operating at 4-PAM using the device of FIG. 54A.

FIG. 54C is a diagram of an exemplary data bus operating at 4-PAM using the device of FIG. 54A. The master device 1524 and memory devices 1526 operate at 4-PAM.

Controlling the Data Rate in a 2-PAM/4-PAM System

Figure 55:
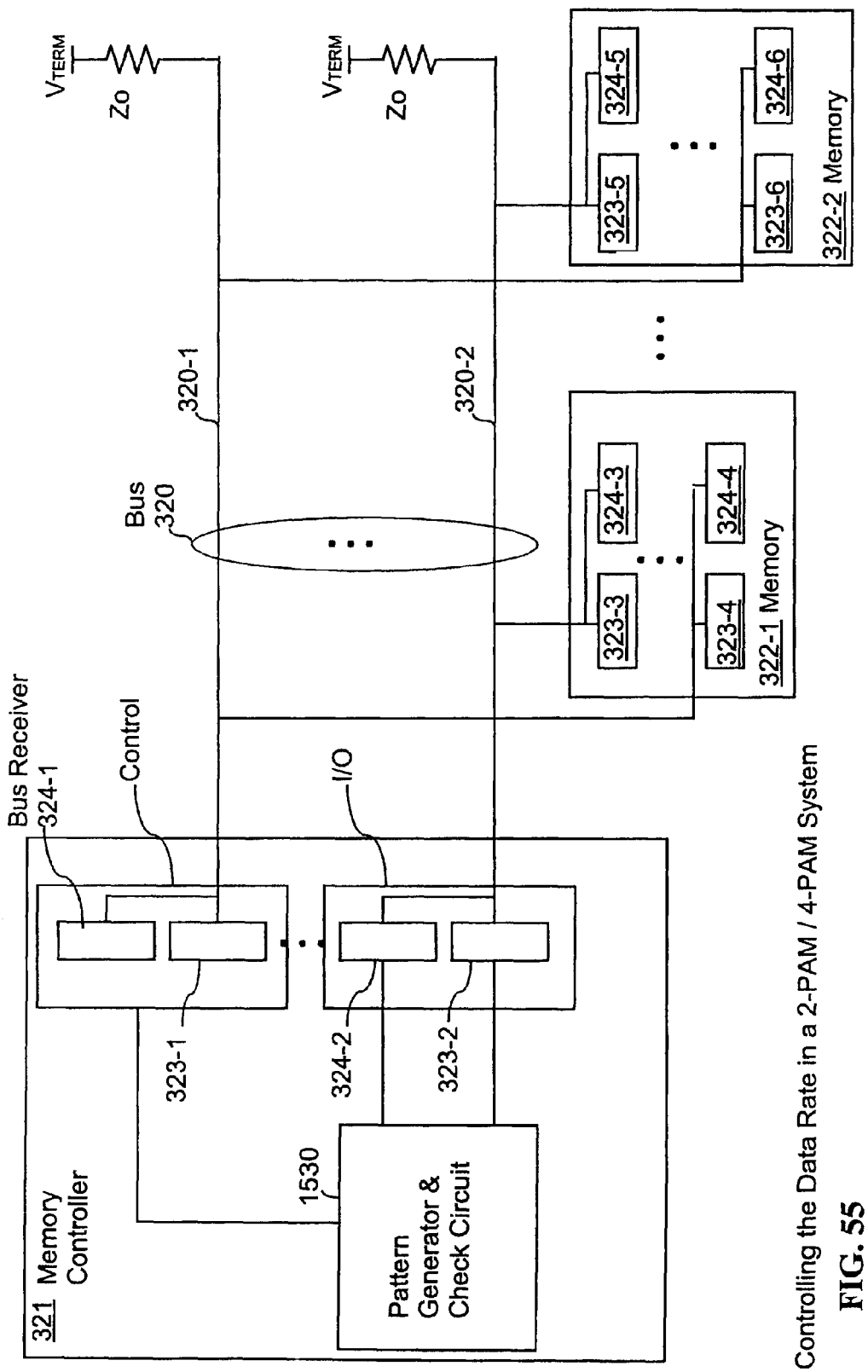
FIG. 55 is a block diagram of a multi-PAM bus system.

In FIG. 55, a multi-PAM bus 320 connects the memory controller 321 to memories 322. In the memory controller 321, the bus output drivers 323 and receivers 324 can operate in either 2-PAM or 4-PAM mode. In one embodiment, the control, address and data signals use the same multi-PAM mode, such as 4-PAM. However, because 4-PAM may be more susceptible to errors from noise than 2-PAM, to improve system reliability, in another embodiment, the control signals use the 2-PAM mode.

Additionally, the data may alternate between 2-PAM mode and 4-PAM mode. By setting the LSB to zero and using the MSB to transmit data, 4-PAM signaling is converted to 2-PAM signaling. 2-PAM signaling reduces the data rate by one-half, but increases the signal voltage margins.

To control the data rate, at the beginning of system operation, a pattern generator 1530 exchanges data with the memories 322, and determines the error rate. If the error rate is above a predetermined threshold, 2-PAM signaling is used. In one implementation, the pattern generator periodically determines the error rate, and determines whether to operate the system at 2-PAM or 4-PAM.

Figure 56:
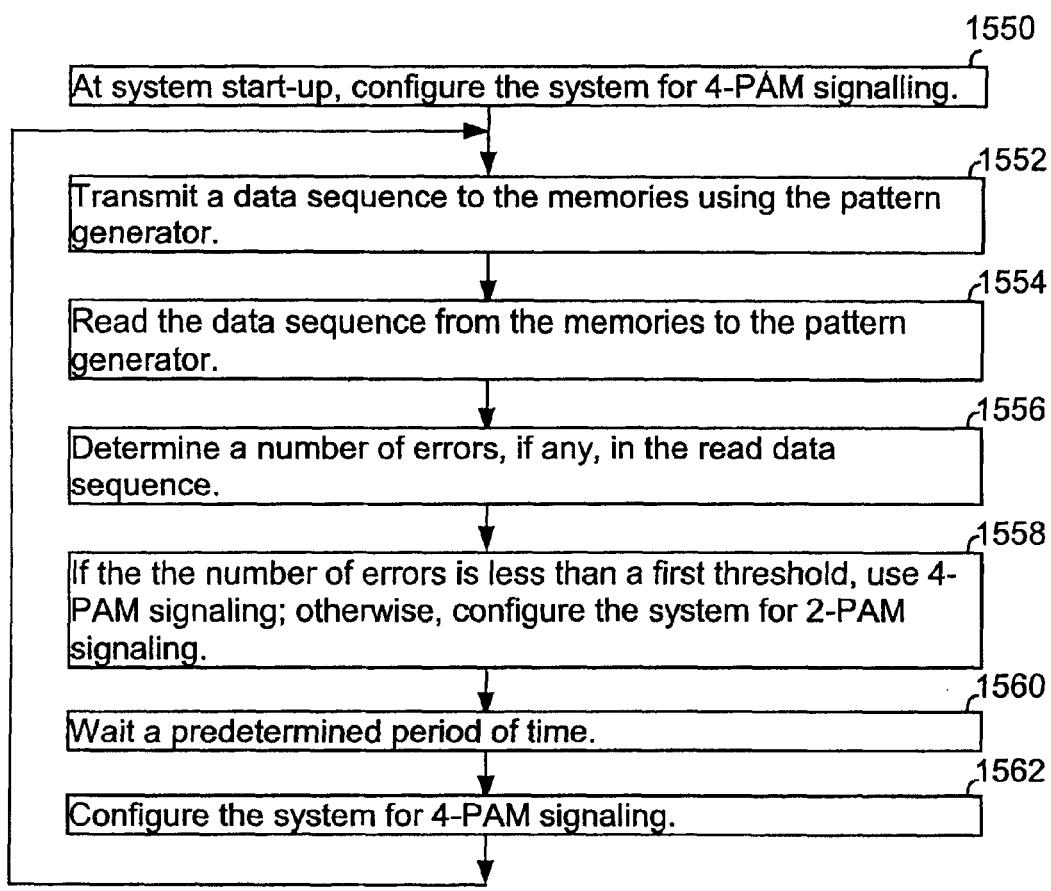
FIG. 56 is a flowchart of a method for determining a multi-PAM mode as a function of error rate.

In FIG. 56, a flowchart of a method for determining whether to operate a data bus 320 (FIG. 55) at 2-PAM or 4-PAM is shown. In step 1550, at system start-up, the bus controller 321 (FIG. 55) configures the system for 4-PAM signaling. In step, 1552, the pattern generator 1530 of the bus controller 321 (FIG. 55) transmits a data sequence to the memories 322 (FIG. 55). In step 1554, the pattern generator 1530 (FIG. 55) reads the data sequence from the memories 322 (FIG. 55). In step 1556, the number of errors, if any, and the error rate of the data sequence is determined. In step 1558, if the number of errors is less than a first threshold, the bus controller 321 configures the system for 4-PAM signaling; otherwise the bus controller 321 configures the system for 2-PAM signaling. In step 1560, the bus controller 321 waits for a predetermined period of time. In step 1562, the bus controller 321 configures the system for 4-PAM signaling, then repeats the process at step 1552.

Error Correction

Transmission errors in a multi-PAM system can be corrected both by changing PAM modes and by changing the speed of the bus.

Figure 57:
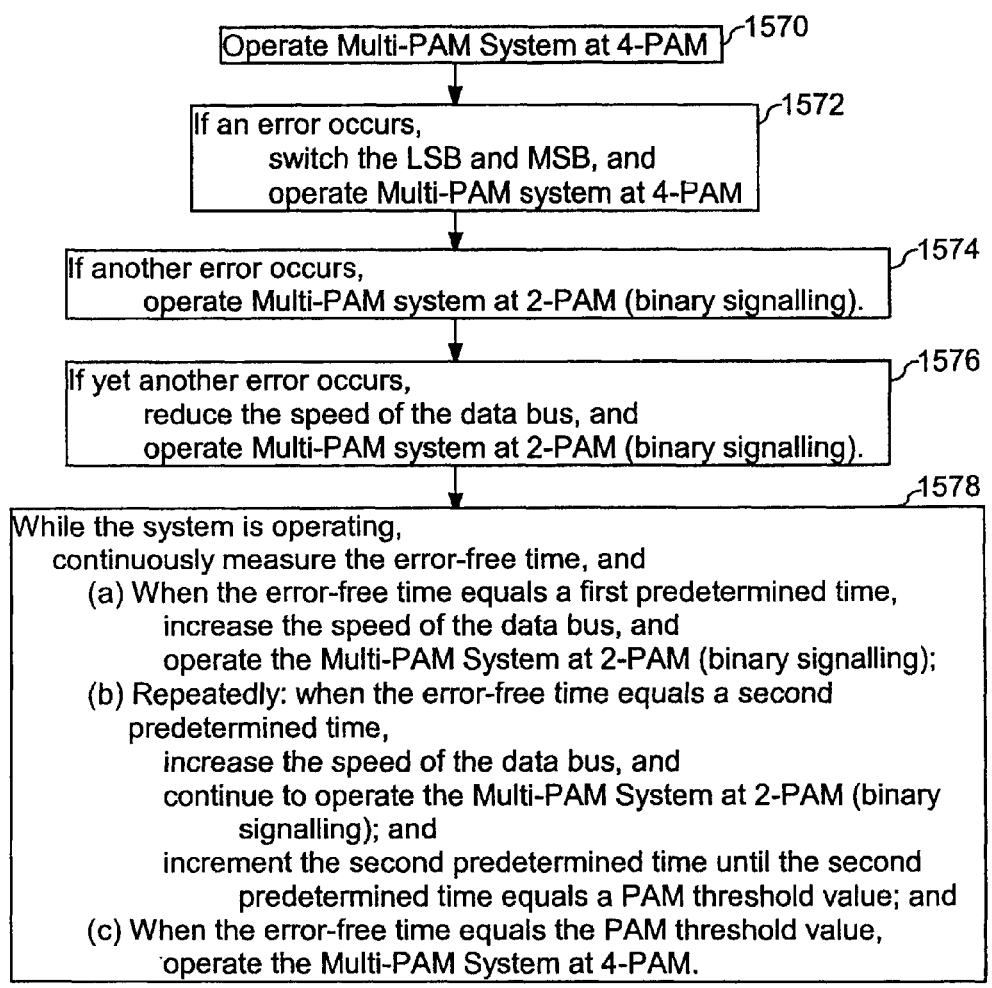
FIG. 57 is a flowchart of a method of error recovery for a multi-PAM system.

As shown in FIG. 57, a method for correcting for errors in the Multi-PAM system of FIG. 55 is shown. In step 1570, the system is operated at 4-PAM. In step 1572, if an error occurs, the LSB and MSB are switched and the system continues to operate at 4-PAM. In other words, a first binary digit is assigned as the LSB, and a second binary digit is assigned as the MSB. To switch the LSB and MSB, the first binary digit is assigned as the MSB and the second binary digit is assigned as the LSB in both the transmitter (output driver) and receiver. In this way, the signature of the transmitted data is changed, and the error may be corrected. In step 1574, if another error occurs, the system is then operated at 2-PAM, which is standard binary signaling. In step 1576, if yet another error occurs, the speed of the data bus is reduced, and the system continues to operate at 2-PAM. In step 1578, while the system is operating, the error-free time is continuously monitored and measured. When the error-free time equals a first predetermined time, the speed of the data bus is increased, and the system continues to operate at 2-PAM. Repeatedly, when the error-free time equals a second predetermined time, the speed of the data bus is increased, the second predetermined time is incremented, and the system continues to operate at 2-PAM, until the second predetermined time equals a PAM threshold value. When the second predetermined time equal the PAM threshold value, the system is operated at 4-PAM.

In an alternate embodiment, when an error occurs, the bus speed is reduced by one-half and data is re-transmitted using 4-PAM. If the first re-transmission fails, the system changes to 2-PAM mode and remains at the reduced bus speed.

Bidirectional Simultaneous Transmission

Figure 58:
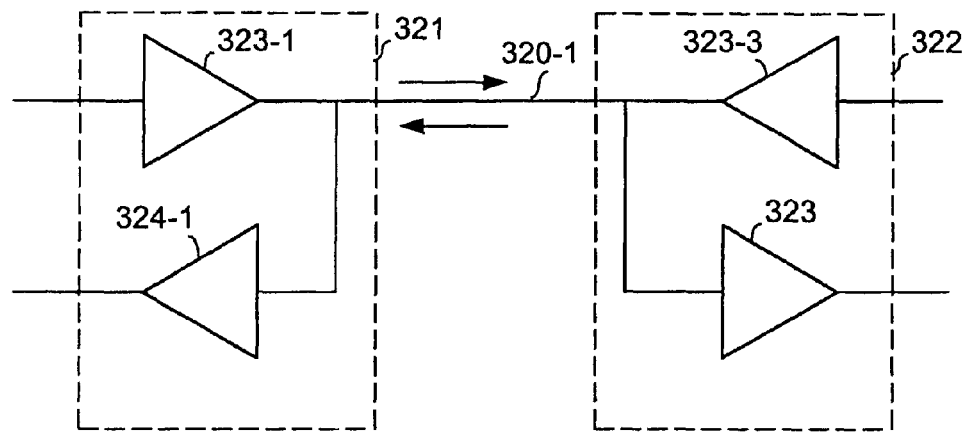
FIG. 58 is a block diagram of a signal line of a bidirectional bus that simultaneously transmits signals in both directions that uses the multi-PAM receiver of the present invention.

In FIG. 58, in one embodiment, the multi-PAM receiver is used to support simultaneous bidirectional communication in which multiple output drivers simultaneously drive the same bus signal line. A signal line 320-1 of a bus is attached to the memory controller 321 and a memory 322. The memory controller 321 and the memory 322 have bus output drivers 323 and receivers attached to the signal line 320-1. Both output drivers 323 simultaneously transmit a 2-PAM signal. The 2-PAM signals are effectively added on the bus. Since the memory controller 321 and the memory 322 know what signal it transmitted on the bus at any time, the memory controller 321 and the memory 322 can subtract its own signal from the received signal. In this way the effective data rate of the signal line 320-1 is doubled.

To achieve the bi-directional bus, three voltage levels need to be present on the bus. However, this makes it difficult for any other device on the bus to discern a single "one" level. A device in the middle of the bus would be unable to determine which other component is transmitting the data. This problem is overcome by using a 4-PAM bus, and requiring that one device transmit a "one" to two-thirds of the full voltage swing, and the other device transmit a "one" to one-third of the full voltage swing. In this way, devices in the middle of the bus can determine, from the voltage levels, which other device is transmitting information.

Figure 59:
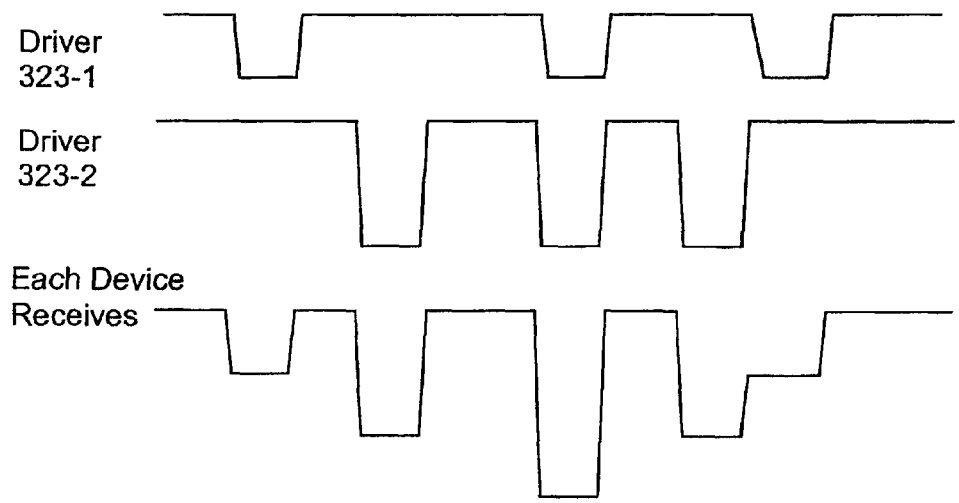
FIG. 59 is a timing diagram showing the superposition of signals in the bidirectional bus of FIG. 58.

In FIG. 59, a timing diagram shows the superposition of the signals. Using the multi-PAM receiver, the sequence of the superimposed data bits can be determined.

The efficiency of a memory subsystem often depends on the ratio of read operations to write operations. In typical memory systems, a read operation can immediately follow a write operation without a delay; however, a write operation followed by a read operation must wait a predetermined amount of time before the read operation. At a minimum, the predetermined amount of time is one clock cycle. As the frequency of switching from write to read operations increases, the effective bus efficiency decreases. Using simultaneous bidirectional transmission, an application that operates the bus at a fifty percent data rate (in each direction) can allow the bus to be one hundred percent efficient. Thus, by switching from 4-PAM transmission to simultaneous bidirectional transmission, the efficiency can be improved.

In another embodiment, 4-PAM encoding represents two streams of binary data, such that two reads or two writes from two different memory locations are encoded on the bus during a single data cycle. Such a memory has two data ports. In one embodiment, the ports are for half of the memory such that each port retrieves data from only one-half of the memory. A bidirectional mode bit that is set by the system determines whether the system operates in the simultaneous bidirectional mode, or one of the PAM modes. The system chooses the mode that maximizes efficiency depending on the mix of read and write operations in the application. For an application with an equal percentage of reads and writes, simultaneous bidirectional transmission would be chosen. For an application with significantly more reads than writes, 4-PAM transmission would be chosen. An example of an application with equal percentages of reads and writes is a data buffer. An example of an application having significantly more reads than writes is a look-up table.

Multi-PAM Receiver Testing Method

Conventional digital testing involves the use of 2-PAM signals, so a means for evaluating Multi-PAM signals must be devised. A 2-PAM signal may be characterized by its "eye" diagram. The "eye" diagram represents the ranges of transmission voltages and signal transmission times for which data transmission is successful. The width of each "eye" represents the range of signal transition times, as compared to an ideal center time, which still results in successful data transmission. The height of each "eye" represents the amount of voltage error and noise that the device under test can tolerate. In general, the larger the "eye", the better the device characteristics. A larger "eye" means larger timing and voltage margins and increased tolerance to noise and timing skew.

Figure 60A:
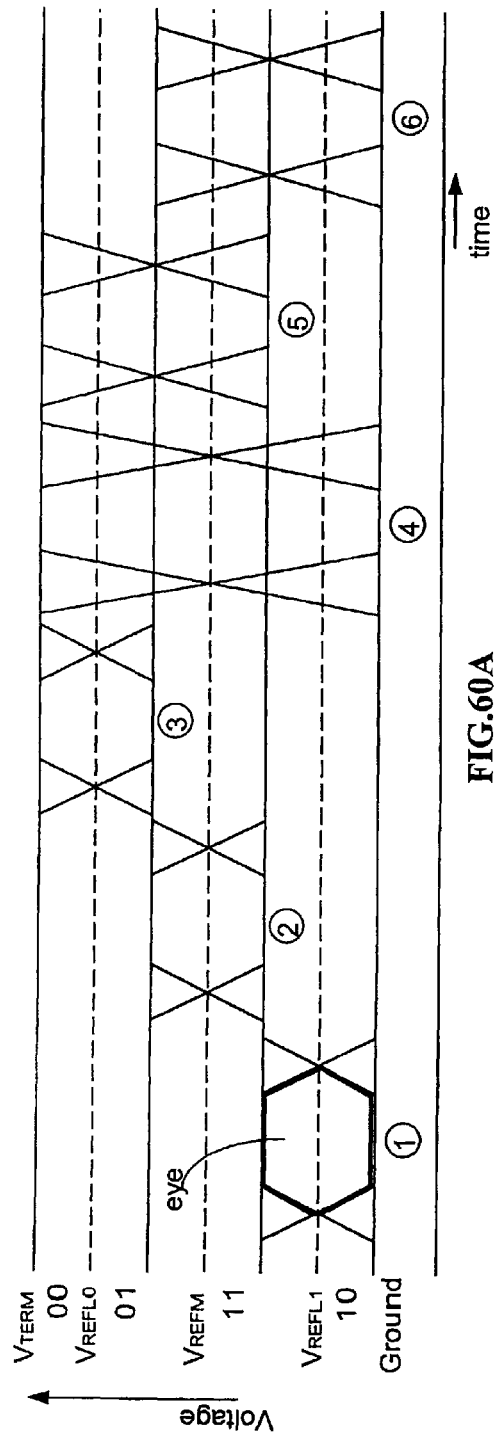
FIG. 60A is a diagram of ideal eye-patterns generated while testing a multi-PAM receiver to determine operational limits.

Testing determines the range of transmission voltages and signal transition times for which the device under test can successfully receive data and compares this region to some voltage and timing criteria appropriate for the system. Receiver testing may be done by repeatedly sending data to the device under test using different transmission voltages and signal transmission times and measuring the region for which transmission was successful. As shown in FIG. 60A, a 4-PAM signal has six possible distinct, 2-PAM transitions. Each of these transitions will have its own "eye" pattern.

Figure 60B:
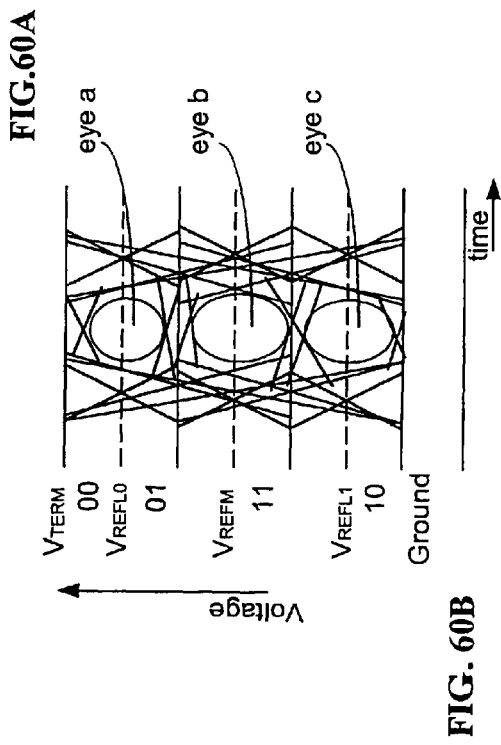
FIG. 60B is a diagram of a combination of the eye-patterns of FIG. 60A.

Receiver testing may be done by individually measuring the six eyes and comparing each of them to timing and voltage criteria. As shown in FIG. 60B, after determining the "eye" for each transition, the corresponding eye patterns are overlayed (e.g., logically ANDed together) to generate the overall device performance characteristics.

Although the present invention has been described in considerable detail with reference to certain preferred versions thereof, other versions are possible. Therefore, the spirit and scope of the appended claims should not be limited to the description of the preferred versions contained herein.

What is claimed is:

1. An integrated circuit device, comprising:
  a sense amplifier comprising an input to receive a present signal representing a present bit, the sense amplifier to produce a decision regarding a logic level of the present bit;
  a circuit to precharge the input of the sense amplifier by applying to the input of the sense amplifier a portion of a previous signal representing a previous bit; and
  a latch, coupled to the sense amplifier, to output the logic level.

2. The integrated circuit device of claim 1, further comprising an integrator to generate the present signal by integrating an input signal over a regulated time interval.

3. The integrated circuit device of claim 2, where:
  the integrator comprises an output coupled to the input of the sense amplifier; and
  the circuit to precharge the input of the sense amplifier is coupled to the output of the integrator to adjust integration by the integrator.

4. The integrated circuit device of claim 3, where the circuit to precharge the input of the sense amplifier is to precharge the output of the integrator prior to the integrator integrating the input signal over the regulated time interval.

5. The integrated circuit device of claim 1, where the circuit to precharge the input of the sense amplifier is to compensate for intersymbol interference dynamically as sequential bits are received by adding or subtracting respective voltages generated for respective previously received bits to respective precharge values for integration of the sequential bits.

6. The integrated circuit device of claim 1, where the circuit to precharge the input of the sense amplifier is further to adjust the present signal to compensate for an offset error associated with the sense amplifier.

7. The integrated circuit device of claim 1, where the circuit to precharge the input of the sense amplifier is further to receive the present signal and adjust a future signal by an amount corresponding to a portion of a charge associated with the present bit, where the future signal represents a bit received after the present bit.

8. The integrated circuit device of claim 7, where the circuit to precharge the input of the sense amplifier comprises a register to store an equalization control value, the equalization control value to determine the amount of adjustment to the future signal.

9. The integrated circuit of claim 8, where the circuit to precharge the input of the sense amplifier further comprises a digital-to-analog converter to convert the equalization control value stored in the register to an analog signal.

10. The integrated circuit of claim 1, where the present signal and the logic level as output by the latch are each differential signals.

11. The integrated circuit device of claim 1, embodied as a multiphase receiver, the multiphase receiver comprising an instance of at least the sense amplifier and the latch for each one of first and second phases of an input signal during a clock cycle, each phase corresponding to a respective bit, where:
the instance of the sense amplifier and the latch for the first phase is to resolve a previous bit;
the circuit to precharge the input of the sense amplifier is to adjust the present signal to compensate for intersymbol interference associated with the previous bit; and
the instance of the sense amplifier and the latch for the second phase is to resolve the present bit.

12. The integrated circuit device of claim 11, embodied as a two-phase receiver, where:
the instance of the sense amplifier and the latch for the first phase is to resolve a future bit; and
the circuit to precharge the input of the sense amplifier is to adjust a future signal representing the future bit to compensate for intersymbol interference with the present bit.

13. The integrated circuit device of claim 12, where the circuit to precharge the input of the sense amplifier comprises circuitry corresponding to each one of the first and second phases, including circuitry to adjust the present signal to compensate for intersymbol interference associated with the previous bit and circuitry to adjust the future signal to compensate for intersymbol interference associated with the present bit.

14. The integrated circuit device of claim 12, where the two-phase receiver further comprises, for each phase, an integrator to generate a respective signal by integrating an input signal over a respective regulated time interval.

15. The integrated circuit device of claim 12, where the circuit to precharge the input of the sense amplifier is further to compensate for an offset error associated with an instance of the sense amplifier.

16. A multiphase receiver integrated circuit device, comprising:
a first receive path, comprising:
a first sense amplifier comprising a first input to receive a first signal representing a first bit, the first sense amplifier to produce a decision regarding a first logic level of the first signal;
first circuitry to precharge the first input of the first sense amplifier by applying to the first input a portion of a previous signal representing a previous bit; and
a first latch to output the first logic level; and
a second receive path, comprising:
a second sense amplifier comprising a second input to receive a second signal representing a second bit, the second sense amplifier to produce a decision regarding a second logic level of the second signal;
second circuitry to precharge the second input of the second sense amplifier by applying to the second input a portion of the first signal; and
a second latch to output the second logic level.

17. The multiphase receiver integrated circuit device of claim 16, further comprising:
a third receive path, comprising:
a third sense amplifier comprising a third input to receive a third signal representing a third bit, the third sense amplifier to produce a decision regarding a third logic level of the third signal;
third circuitry to precharge the third input of the third sense amplifier by applying to the third input a portion of the second signal; and
a third latch to output the third logic level.

18. The multiphase receiver integrated circuit device of claim 16, where:
the second sense amplifier is to produce a decision regarding a logic level of the previous signal, and
the first circuitry is coupled to the second receive path to compensate for intersymbol interference with the previous bit.

19. The multiphase receiver integrated circuit device of claim 16, where each receive path further comprises an integrator to generate a respective signal by integrating an input signal over a respective regulated time interval.

20. The multiphase receiver integrated circuit device of claim 19, where:
the first circuitry is coupled to the integrator of the first receive path to adjust integration by the integrator of the first receive path; and
the second circuitry is coupled to the integrator of the second receive path to adjust integration by the integrator of the second receive path.

21. The multiphase receiver integrated circuit device of claim 20, where:
the first circuitry is to precharge the integrator of the first receive path prior to the integrator of the first receive path integrating the input signal over the respective regulated time interval for the first receive path; and
the second circuitry is to precharge the integrator of the second receive path prior to the integrator of the second receive path integrating the input signal over the respective regulated time interval for the second receive path.

22. The multiphase receiver integrated circuit device of claim 16, where the first circuitry and second circuitry are each to compensate for intersymbol interference dynamically as data bits are received by adding or subtracting a voltage generated for a previously received bit to a precharge value for integration of a bit that is to be processed via the corresponding receive path.

23. The multiphase receiver integrated circuit device of claim 16, where the first circuitry and second circuitry are each further to adjust a respective signal to compensate for offset error associated with a corresponding sense amplifier.

24. The multiphase receiver integrated circuit device of claim 16, further comprising, for each receive path, a register to store a control value, the control value to determine an amount of adjustment to a respective signal to be applied by a corresponding one of the first circuitry and second circuitry.

25. The multiphase receiver integrated circuit device of claim 16, further comprising, for each receive path, a register to store an offset error control value, the offset error control value to determine an amount of adjustment to a respective signal to be applied by a respective one of the first circuitry and second circuitry to compensate for input voltage offset error.

26. The multiphase receiver integrated circuit device of claim 16, further comprising, for each receive path, a register to store an equalization control value, the equalization control value to determine an amount of adjustment to a respective signal to be applied by a respective one of the first circuitry and second circuitry to compensate for intersymbol interference with an immediately prior bit.

27. A receiver integrated circuit device, comprising
a receive path, comprising:
a first sense amplifier comprising a first input to receive a first signal representing a first bit, the first sense amplifier to produce a decision regarding a first logic level of the first signal;
first circuitry to precharge the first input of the first sense amplifier by applying to the first input a portion of a previous signal representing a previous bit; and
a first latch to output the first logic level.

28. The receiver integrated circuit device of claim 27, where the first bit is an odd-phase bit and the previous bit is an even-phase bit,
the receiver integrated circuit device further comprising a second receive path comprising:
a second sense amplifier comprising a second input to receive signals representing even-phase bits, the second sense amplifier to produce decisions regarding logic levels of the signals representing the even-phase bits;
second circuitry to precharge the second input of the second sense amplifier by applying to the second input portions of signals representing respective odd-phase bits; and
a second latch to output the logic levels of the signals representing the even-phase bits;
where the first circuitry is coupled to the second receive path to precharge the first input of the first sense amplifier by applying to the first input of the first sense amplifier portions of signals representing respective even-phase bits.

29. The receiver of claim 28, further comprising a phase-adjustment circuit to adjust per-pin timing associated with the signals.

30. The receiver of claim 28, further comprising a data clock recovery system to generate a clock from the signals.

31. The receiver of claim 28, wherein the first circuitry is to add or subtract the portions of the signals representing the respective even-phase bits.

* * * * *